US008569829B2

(12) United States Patent
Kiyotoshi

(10) Patent No.: US 8,569,829 B2
(45) Date of Patent: Oct. 29, 2013

(54) NONVOLATILE SEMICONDUCTOR MEMORY DEVICE

(75) Inventor: Masahiro Kiyotoshi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 758 days.

(21) Appl. No.: 12/784,032

(22) Filed: May 20, 2010

(65) Prior Publication Data

US 2011/0156132 A1 Jun. 30, 2011

(30) Foreign Application Priority Data

Dec. 28, 2009 (JP) ................................ 2009-298269
Feb. 10, 2010 (JP) ................................ 2010-028060

(51) Int. Cl.
*H01L 27/115* (2006.01)

(52) U.S. Cl.
USPC .................................. 257/326; 257/E27.103

(58) Field of Classification Search
USPC .......................... 257/390, 324–327, E27.103
See application file for complete search history.

(56) References Cited

U.S. PATENT DOCUMENTS

| | | | | |
|---|---|---|---|---|
| 8,008,732 | B2 * | 8/2011 | Kiyotoshi et al. | 257/390 |
| 8,169,826 | B2 * | 5/2012 | Hishida et al. | 365/185.11 |
| 8,178,917 | B2 * | 5/2012 | Tanaka et al. | 257/324 |
| 2008/0073635 | A1 | 3/2008 | Kiyotoshi et al. | |
| 2009/0121271 | A1 | 5/2009 | Son et al. | |
| 2009/0267135 | A1 | 10/2009 | Tanaka et al. | |
| 2009/0321813 | A1 | 12/2009 | Kidoh et al. | |
| 2010/0155818 | A1 * | 6/2010 | Cho et al. | 257/324 |

FOREIGN PATENT DOCUMENTS

| | | |
|---|---|---|
| JP | 2007-180389 | 7/2007 |
| JP | 2007-317874 | 12/2007 |
| JP | 2008-98602 | 4/2008 |
| JP | 2008-98641 | 4/2008 |
| JP | 2008-171918 | 7/2008 |
| JP | 2008-186868 | 8/2008 |
| JP | 2009-94214 | 4/2009 |
| JP | 2009-111049 | 5/2009 |
| JP | 2009-117843 | 5/2009 |
| JP | 2009-146942 | 7/2009 |
| JP | 2009-267243 | 11/2009 |
| WO | WO 2010/143306 A1 | 12/2010 |

OTHER PUBLICATIONS

U.S. Appl. No. 12/532,030, filed Sep. 18, 2009, Masahiro Kiyotoshi.
U.S. Appl. No. 13/326,972, filed Dec. 15, 2011, Kiyotoshi.
U.S. Appl. No. 13/218,868, filed Aug. 26, 2011, Kiyotoshi.

* cited by examiner

*Primary Examiner* — Matthew W Such
*Assistant Examiner* — Ali Naraghi
(74) *Attorney, Agent, or Firm* — Oblon, Spivak, McClelland, Maier & Neustadt, L.L.P.

(57) ABSTRACT

A nonvolatile semiconductor memory device according to an embodiment includes memory strings which have a plurality of transistors including gate electrode films formed over sides of columnar semiconductor films on gate dielectric films in a height direction of the semiconductor films, and which are arranged in a matrix shape substantially perpendicularly above a substrate. The gate electrode films of the transistors at same height of the memory strings arranged in a first direction are connected to one another. A distance between the semiconductor films at least in a forming position of the transistor at an uppermost layer of the memory strings adjacent to each other in the first direction is smaller than double of thickness of the gate dielectric films.

8 Claims, 79 Drawing Sheets

FIG.54A
FIG.54B
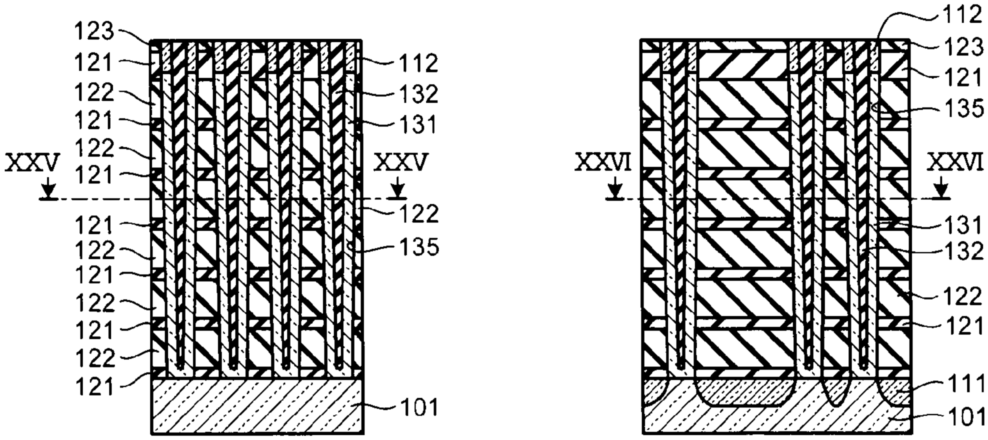
FIG.54C
FIG.54D
FIG.54E
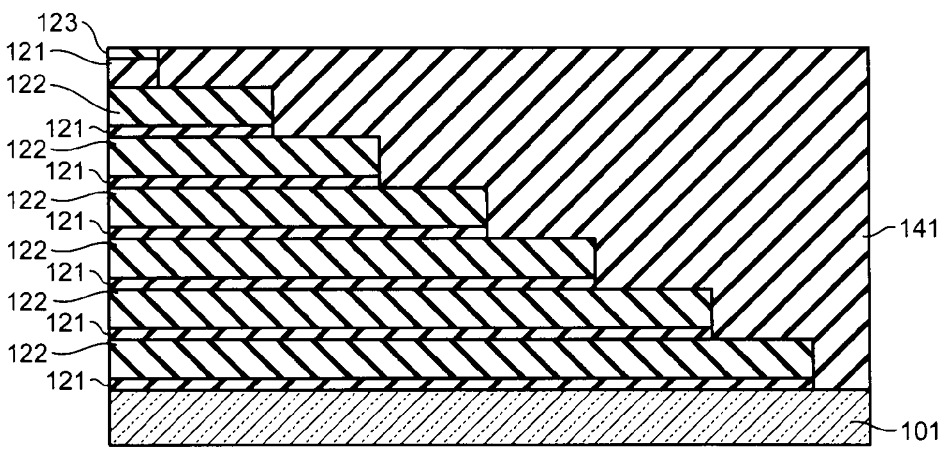
FIG.54F
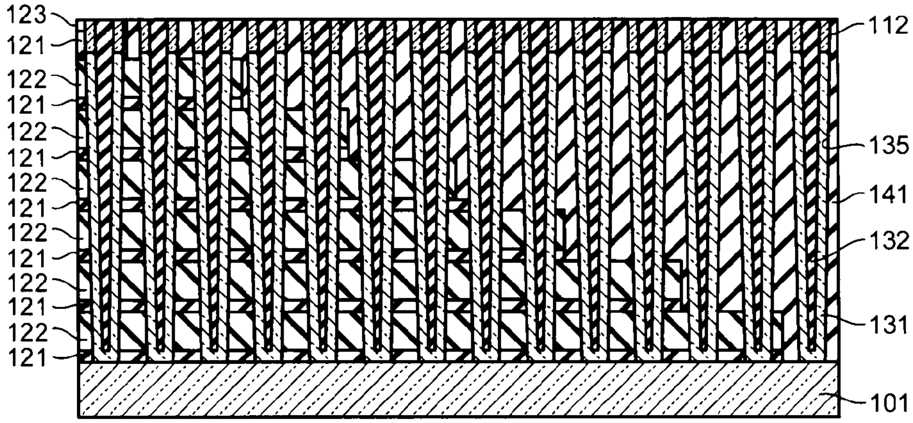

NONVOLATILE SEMICONDUCTOR MEMORY DEVICE

CROSS-REFERENCE TO RELATED APPLICATIONS

This application is based upon and claims the benefit of priority from the prior Japanese Patent Applications No. 2009-298269, filed on Dec. 28, 2009; and No. 2010-28060, filed on Feb. 10, 2010; the entire contents of all of which are incorporated herein by reference.

BACKGROUND

1. Field

Embodiments described herein relate generally to a nonvolatile semiconductor memory device.

2. Description of the Related Art

In the field of NAND flash memories, a stacked memory that can attain high bit density without being restricted by the limit of the resolution of the lithography technique attracts attention. For example, a nonvolatile semiconductor memory device is proposed that has a structure in which memory strings having a plurality of planar electrodes arranged at a predetermined interval in the height direction to cross columnar semiconductor films having dielectric films as charge storage layers formed to coat sides thereof are two-dimensionally arranged in a matrix shape and a planer electrode is shared by the memory strings adjacent to each other in a predetermined direction (see, for example, Japanese Patent Application Laid-Open No. 2009-267243).

Such a nonvolatile semiconductor memory device is manufactured as explained below. First, a plurality of layers of doped polysilicon films, which function as control gates, and silicon oxide films, which function as dielectric films among control gates, are alternately stacked on a semiconductor substrate on which a peripheral circuit is formed. Subsequently, a memory plug hole is formed to penetrate through a stacked film including the polysilicon films and the silicon oxide films. An ONO film is formed only on the inner wall of the memory plug hole and an amorphous silicon film is formed to fill the memory plug hole and finally crystallized, whereby the nonvolatile semiconductor memory device having the structure explained above is obtained.

In this way, in the method in the past, the columnar amorphous silicon layer has to be formed after the ONO film is formed in the memory plug hole formed in the stacked film of the polysilicon films and the silicon oxide films. Therefore, because the planar electrodes are placed among the memory strings adjacent to one another in a direction in which the electrodes are shared, it is difficult to reduce a distance between the columnar amorphous silicon layer and a columnar amorphous silicon layer adjacent thereto. In this way, there is a constraint on the arrangement of memory cells on a plane and there is a limit in a reduction of a cell area. Therefore, to increase bit density, the number of stacked memory layers has to be increased. For example, when a target of a half pitch is set to 20 nanometers, because the half pitch of about 65 nanometers to 50 nanometers is a limit of downsizing in the structure in the past, the number of stacked memory layers is equal to or larger than ten.

BRIEF DESCRIPTION OF THE DRAWINGS

FIGS. 51A to 58F are schematic sectional views of an example of a procedure of a method of manufacturing the nonvolatile semiconductor memory device according to the sixth embodiment;

DETAILED DESCRIPTION

Figure 1:
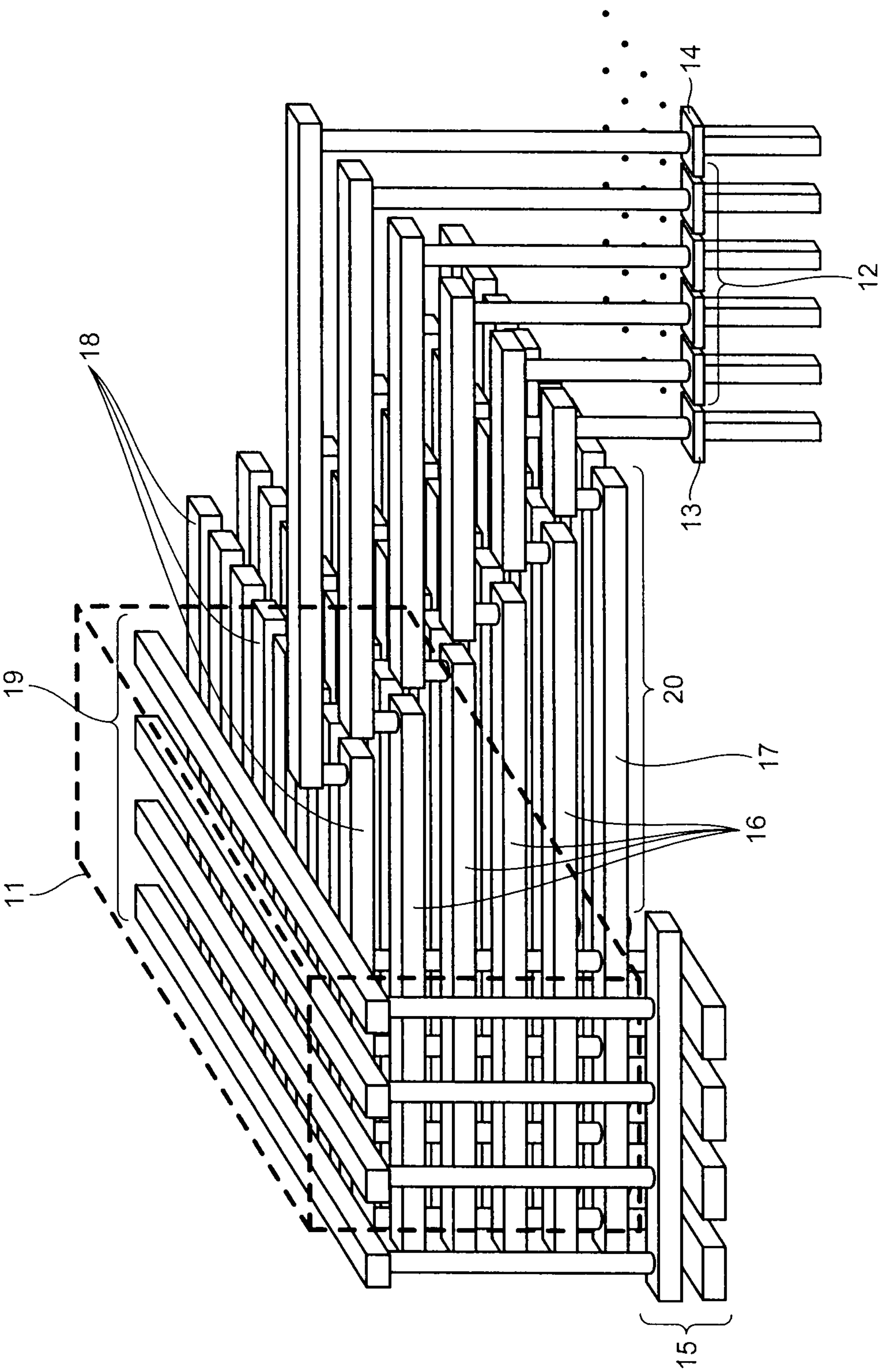
FIG. 1 is a schematic perspective view of an example of the structure of a nonvolatile semiconductor memory device.

A nonvolatile semiconductor memory device according to an embodiment includes: memory strings which have a plurality of transistors including gate electrode films formed on gate dielectric films over sides of columnar semiconductor films in a height direction of the semiconductor films, and which are arranged in a matrix shape substantially perpendicularly above a substrate, wherein the gate electrode films of the transistors at same height of the memory strings arranged in a first direction are connected to one another, and a distance between the semiconductor films at least in a forming position of the transistor at an uppermost layer of the memory strings adjacent to each other in the first direction is smaller than double of thickness of the gate dielectric films.

A nonvolatile semiconductor memory device according to an embodiment includes: memory strings which have a plurality of transistors including gate electrode films formed on gate dielectric films over sides of columnar semiconductor films in a height direction of the semiconductor films, and which are arranged in a matrix shape substantially perpendicularly above a substrate, wherein the gate electrode films of the transistors at same height of the memory strings arranged in a first direction are connected to one another, and the nonvolatile semiconductor memory device further including a film that is provided between the columnar semiconductor films adjacent to each other in the first direction to electrically separates the gate electrode films in a second direction perpendicular to the first direction.

A nonvolatile semiconductor memory device according to an embodiment includes: memory strings which have a plurality of transistors including gate electrode films formed on gate dielectric films over sides of columnar semiconductor films in a height direction of the semiconductor films, and which are arranged substantially perpendicularly above a substrate, wherein the memory strings are arranged above the substrate such that memory string groups each having two memory string rows, in which the gate electrode films of the transistors at same height of the memory strings arranged in a first direction are connected, arranged in parallel adjacent to each other in a second direction perpendicular to the first direction are arranged at a predetermined interval in the second direction, and the nonvolatile semiconductor memory device further including a film that is formed between the two memory string rows arranged in parallel adjacent to each other in the second direction in the memory string group to electrically separate between the gate electrode films provided to respectively correspond to the two memory string rows.

Exemplary embodiments are explained in detail below with reference to the accompanying drawings. The present invention is not limited by the embodiments. Perspective views and sectional views of nonvolatile semiconductor memory devices referred to in the embodiments are schematic. A relation between the thickness and the width of a layer, a ratio of the thicknesses of layers, and the like are different from actual ones. Film thicknesses explained below are examples. Film thicknesses in the present invention are not limited to these film thicknesses.

The embodiments are applied to a nonvolatile semiconductor memory device having a structure in which a plurality of memory cells (transistors) of a metal-oxide-nitride-oxide-semiconductor (MONOS) type are provided in the height direction. The memory cells have semiconductor films as channels provided in a columnar shape on a substrate and gate electrode films provided on charge storage layers over the sides of the semiconductor films. Therefore, first, an example of the basic structure of such a nonvolatile semiconductor memory device is explained. Then, the embodiments are explained.

FIG. 1 is a schematic perspective view of an example the structure of the nonvolatile semiconductor memory device. A nonvolatile semiconductor memory device 1 includes a memory cell region 11, word-line driving circuits 12, a source-side-selection-gate-line driving circuit 13, a drain-side-selection-gate-line driving circuit 14, a sense amplifier 15, word lines 16, source-side selection gate lines 17, drain-side selection gate lines 18, and bit lines 19.

The memory cell region 11 has a configuration in which memory strings having a plurality of memory cell transistors (hereinafter simply also referred to as "memory cells") and drain-side selection transistors and source-side selection transistors respectively provided at the upper ends and the lower ends of memory cell transistors are arranged on a substrate in a matrix shape. As explained later, the memory cell transistors have a structure in which control gate electrodes are provided on charge storage layers as gate dielectric films over the sides of columnar semiconductor films, which function as channels. The drain-side selection transistors and the source-side selection transistors have a structure in which selection gate electrodes are provided on charge storage layers as gate dielectric films over the sides of columnar semiconductor films. In the example, four layers of memory cells are provided in one memory string.

The word lines 16 connect control gate electrodes of the memory cells at the same height of the memory strings adjacent to one another in a predetermined direction. A direction in which the word lines 16 extend is referred to as word line direction below. The source-side selection gate lines 17 connect the selection gate electrodes of the source-side selection transistors of the memory strings adjacent to one another in the word line direction. The drain-side-selection gate lines 18 connect the selection gate electrodes of the drain-side selection transistors of the memory strings adjacent to one another in the word line direction. The bit lines 19 are provided to connect upper portions of the memory strings in a direction (i.e., an orthogonal direction) crossing the word line direction. A direction in which the bit lines 19 extend is referred to as bit line direction below.

The word-line driving circuits 12 are circuits that control voltage applied to the word lines 16. The source-side-selection-gate-line driving circuit 13 is a circuit that controls voltage applied to the source-side selection gate lines 17. The drain-side-selection-gate-line driving circuit 14 is a circuit that controls voltage applied to the drain-side selection gate lines 18. The sense amplifier 15 is a circuit that amplifies potential read out from a selected memory cell. In the following explanation, when it is unnecessary to distinguish the source-side-selection gate lines 17 and the drain-side-selection gate lines 18, the source-side-selection gate lines 17 and the drain-side-selection gate lines 18 are simply referred to as selection gate lines. When it is unnecessary to distinguish the source-side selection transistors and the drain-side selection transistors, the source-side selection transistors and the drain-side selection transistors are simply referred to as selection transistors.

The word lines 16, the source-side selection gate lines 17, and the drain-side selection gate lines 18 of the memory cell region and the word-line driving circuits 12, the source-side-selection-gate-line driving circuit 13, and the drain-side-selection-gate-line driving circuit 14 are connected respectively via contacts in a word-line contact region 20 provided in the memory cell region 11. The word-line contact region 20 is provided on the word-line driving circuits 12 side of the memory cell region 11. The word-line contact region 20 has a structure in which the word lines 16 connected to the memory cells at respective heights and the selection gate lines 17 and 18 connected to the selection transistors are processed in a step shape.

Figure 2A:
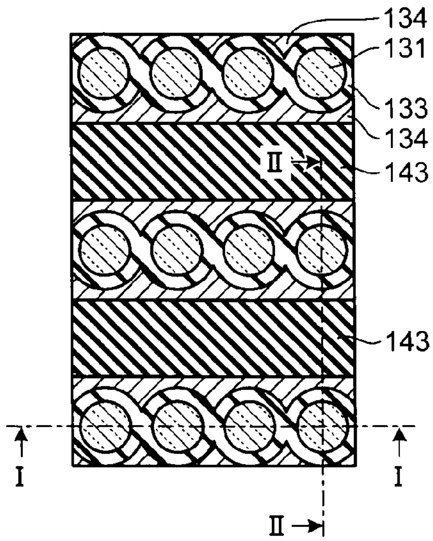
FIGS. 2A to 2D are schematic sectional views of an example of the configuration of a nonvolatile semiconductor memory device according to a first embodiment.
Figure 2B:
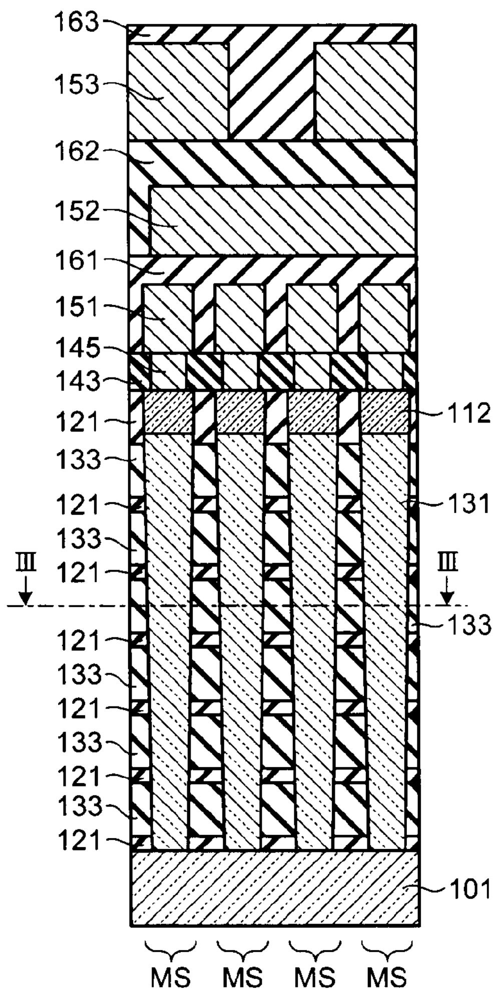
Figure 2C:
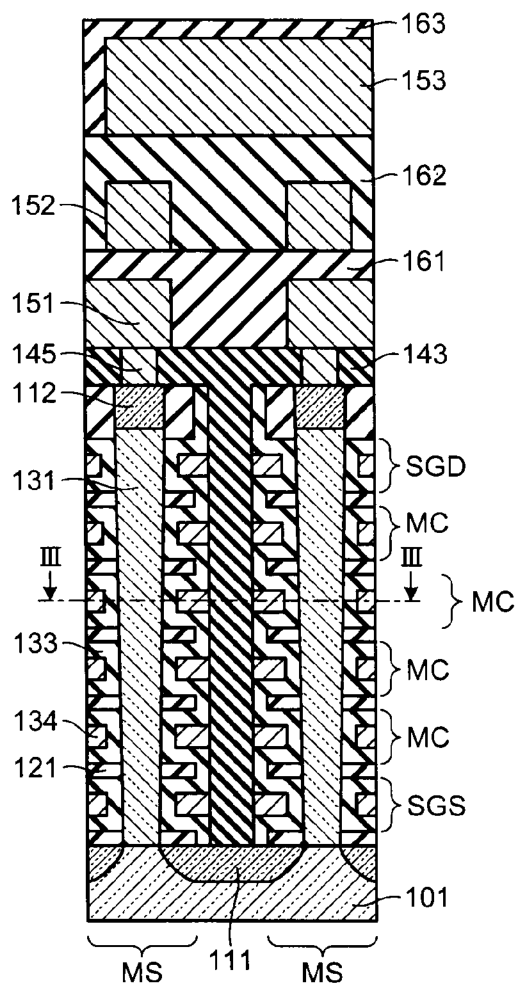
Figure 2D:
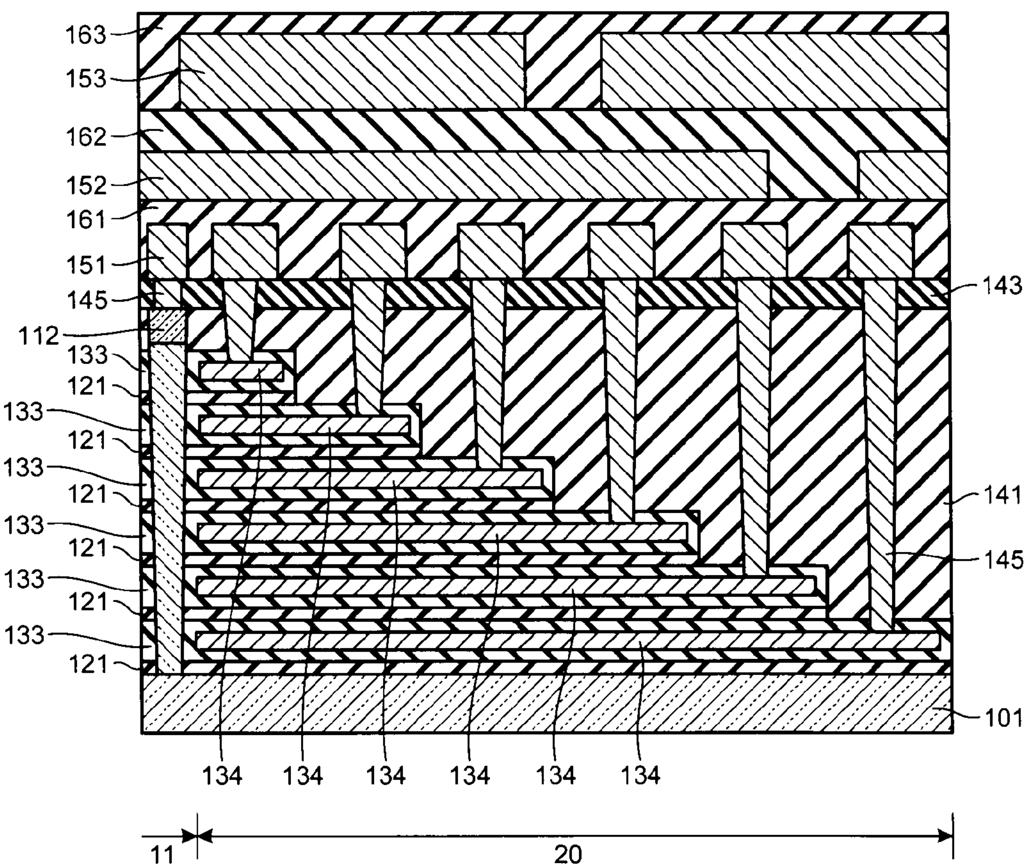
Figure 3:
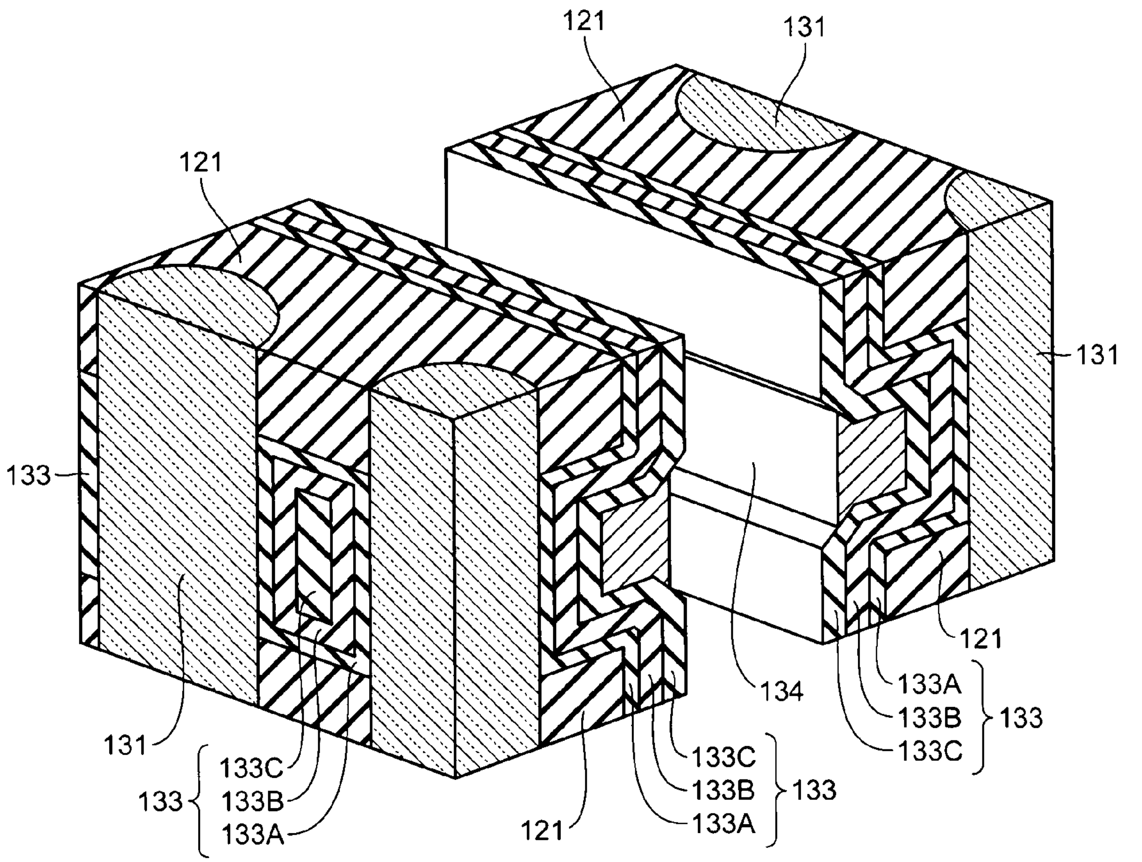
FIG. 3 is a perspective view of a cut-out perspective view of a part of an area where memory cell transistors are formed in a memory cell region.
Figure 4A:
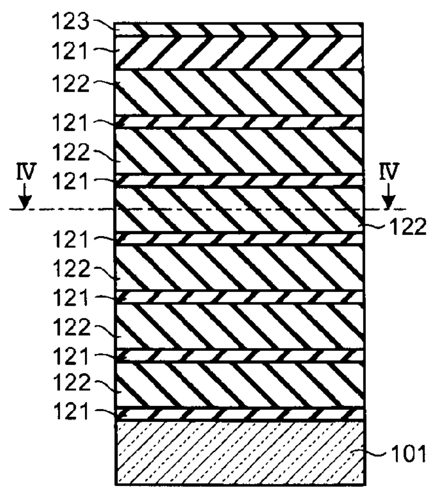
FIGS. 4A to 13E are schematic sectional views of an example of a procedure of a method of manufacturing the nonvolatile semiconductor memory device according to the first embodiment.
Figure 4B:
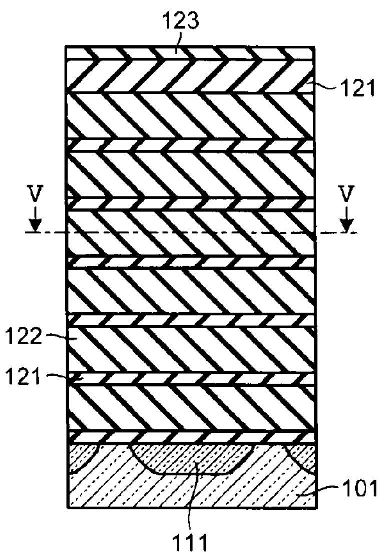
Figure 4C:
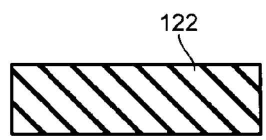
Figure 4D:
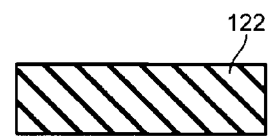
Figure 4E:
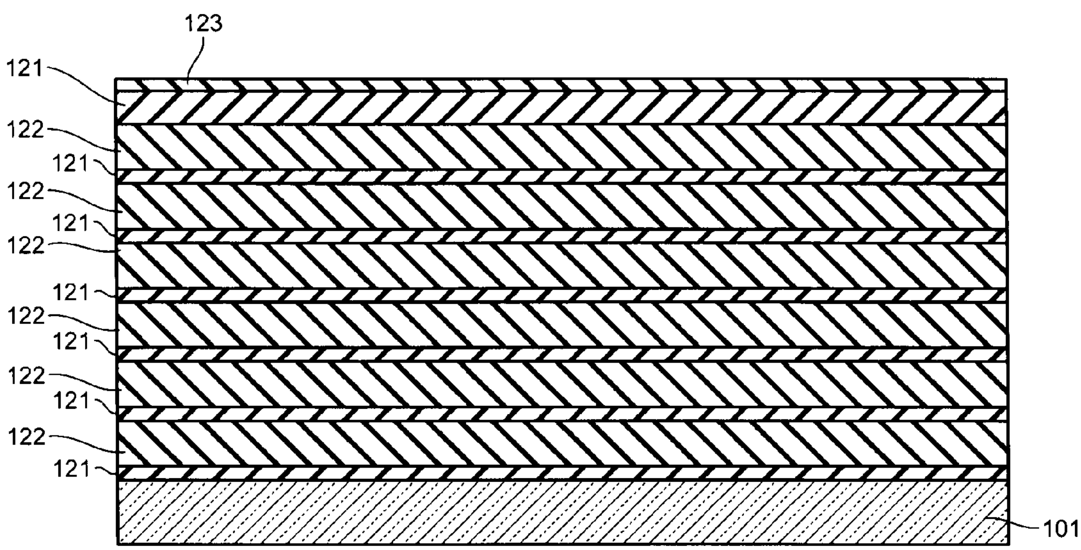
Figure 5A:
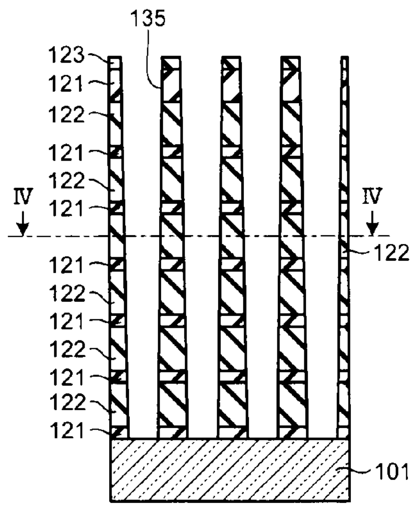
Figure 5B:
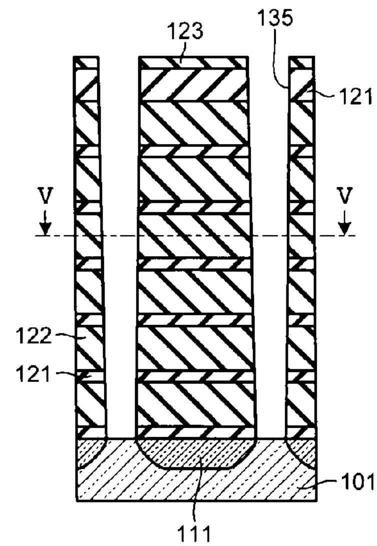
Figure 5C:
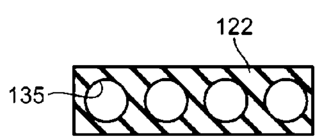
Figure 5D:
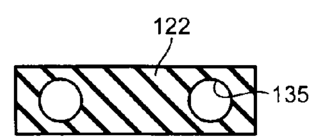
Figure 5E:
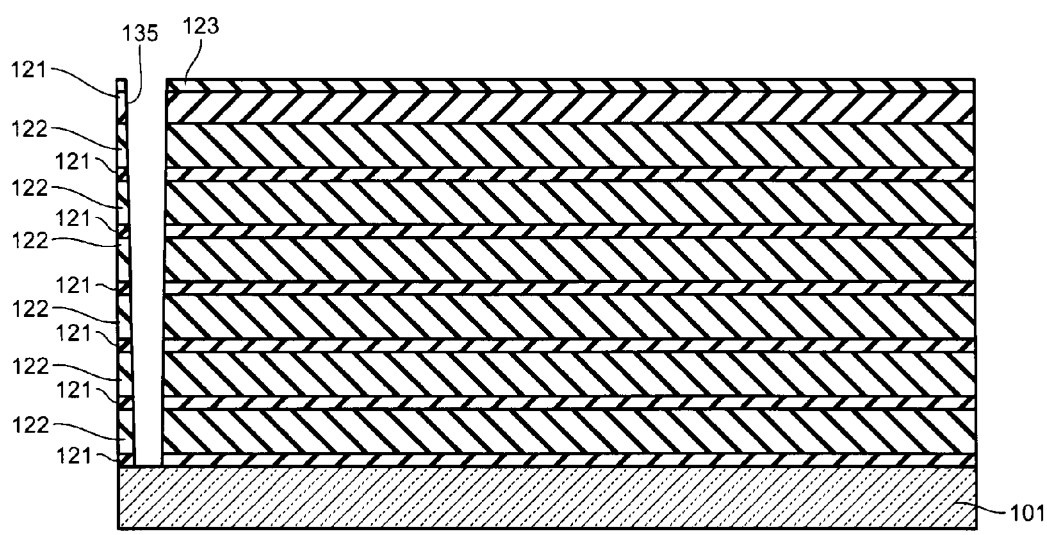
Figure 6A:
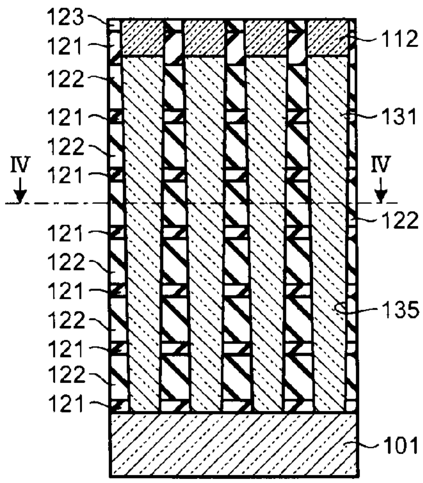
Figure 6B:
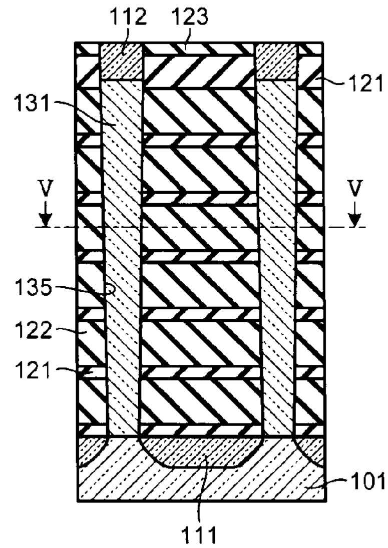
Figure 6C:
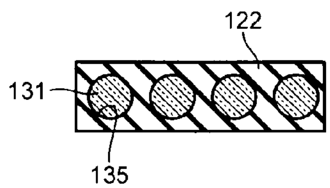
Figure 6D:
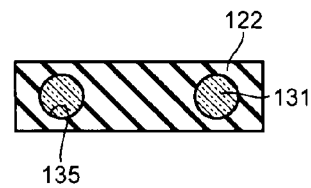
Figure 6E:
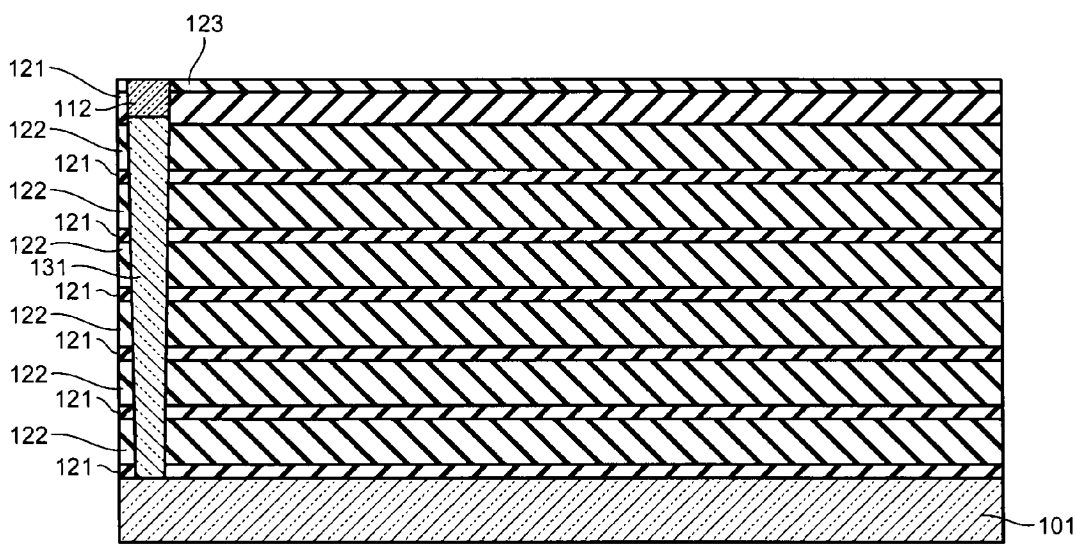
Figure 7A:
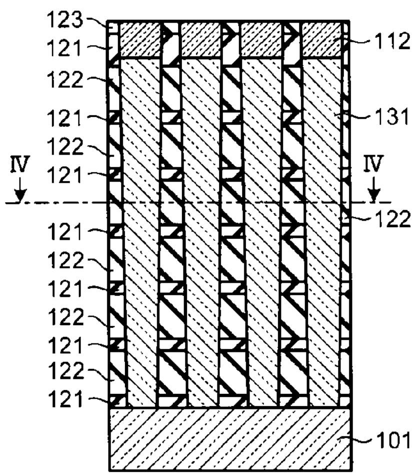
Figure 7B:
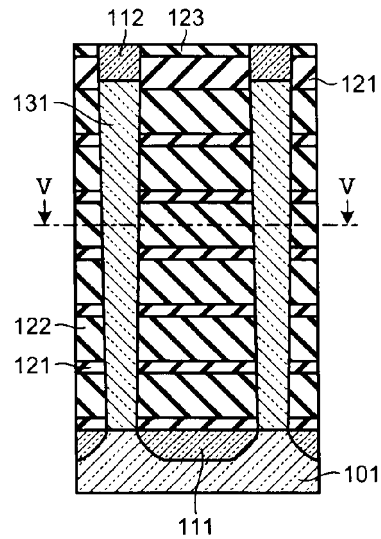
Figure 7C:
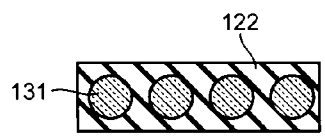
Figure 7D:
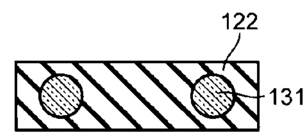
Figure 7E:
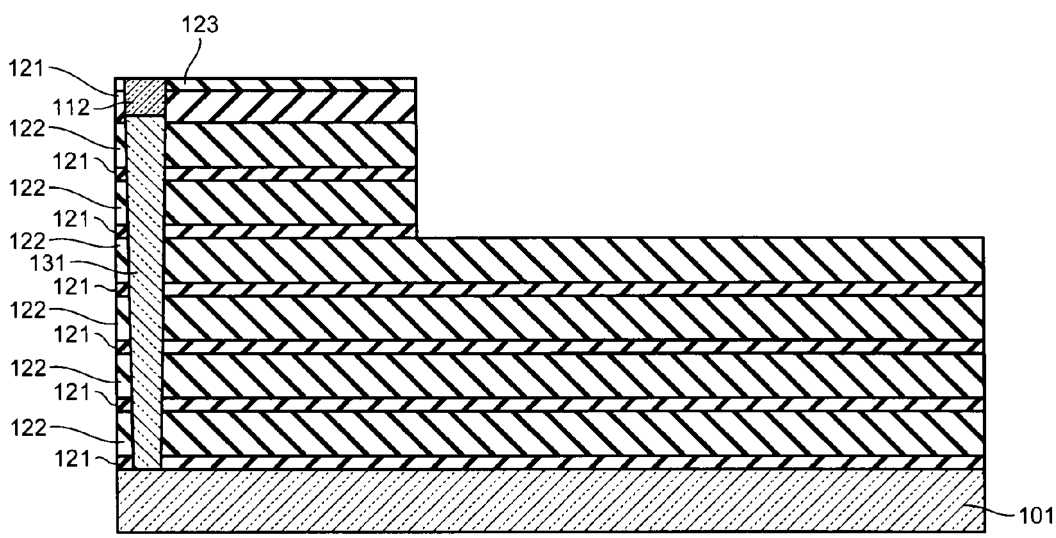
Figure 8A:
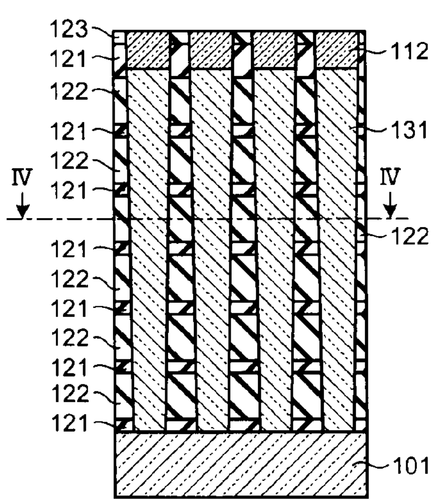
Figure 8B:
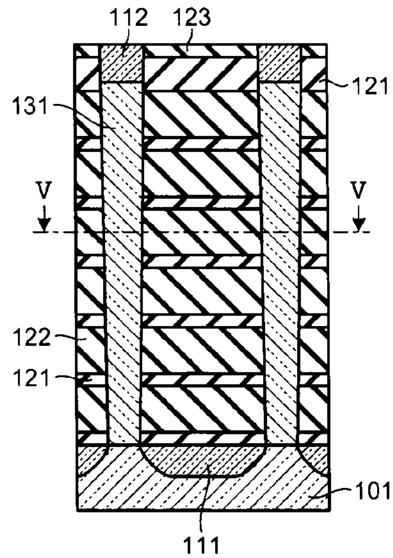
Figure 8C:
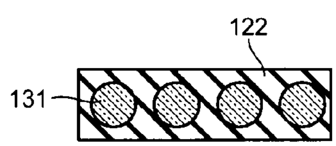
Figure 8D:
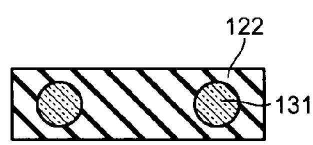
Figure 8E:
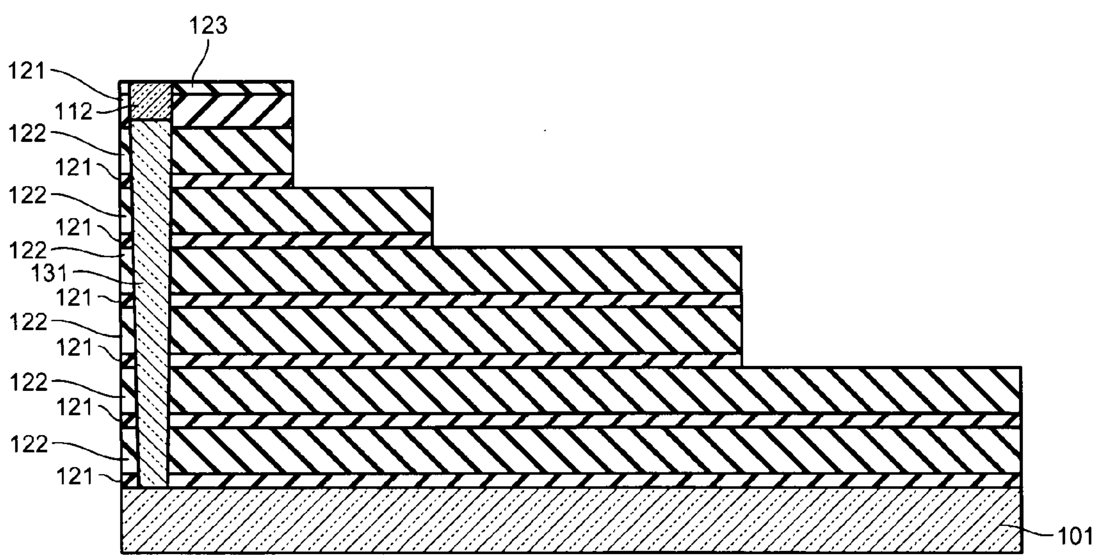
Figure 9A:
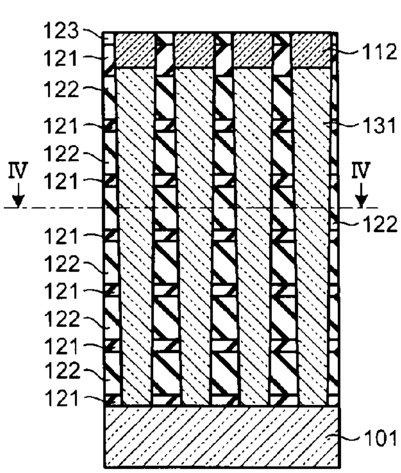
Figure 9B:
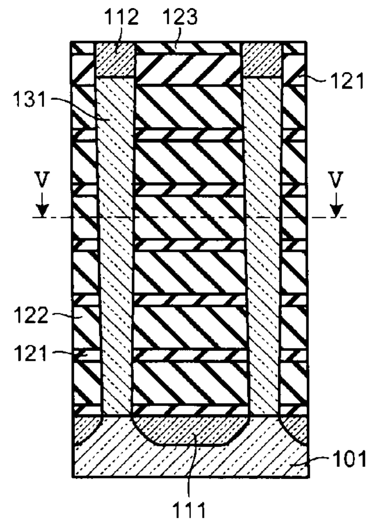
Figure 9C:
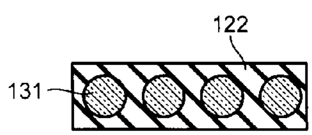
Figure 9D:
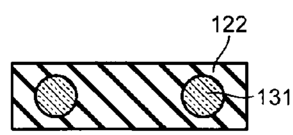
Figure 9E:
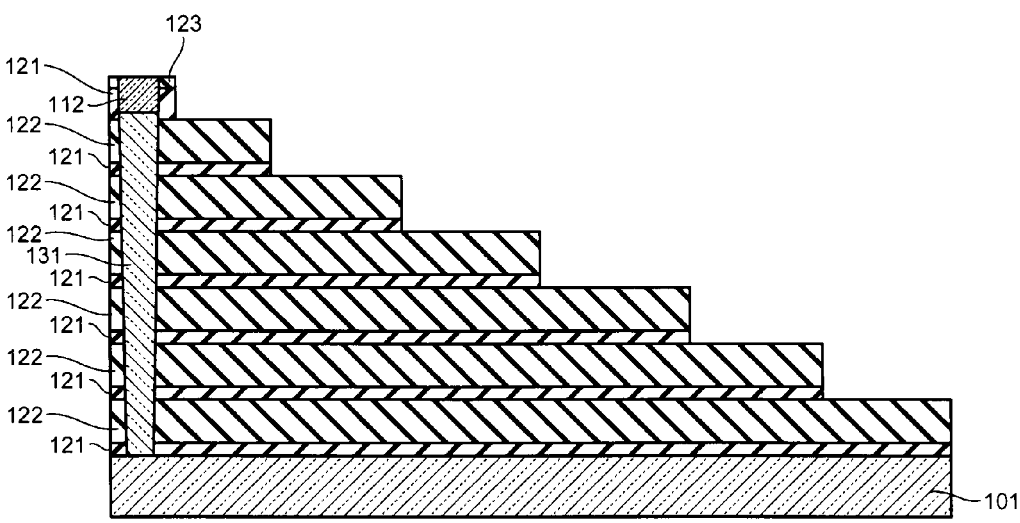
Figure 10A:
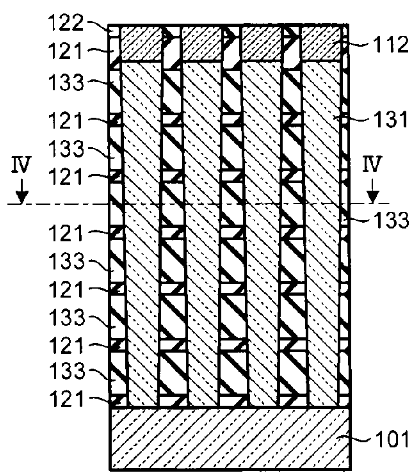
Figure 10B:
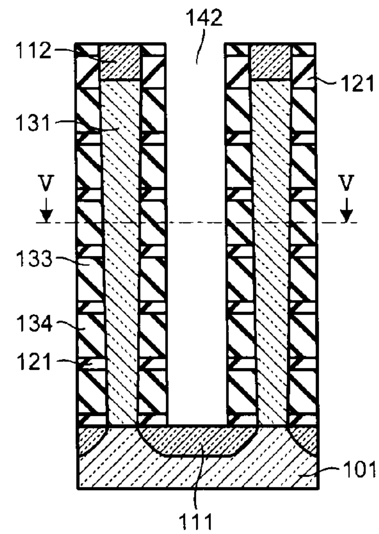
Figure 10C:
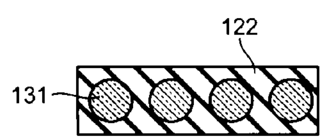
Figure 10D:
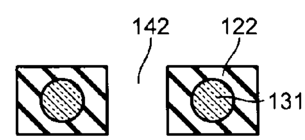
Figure 10E:
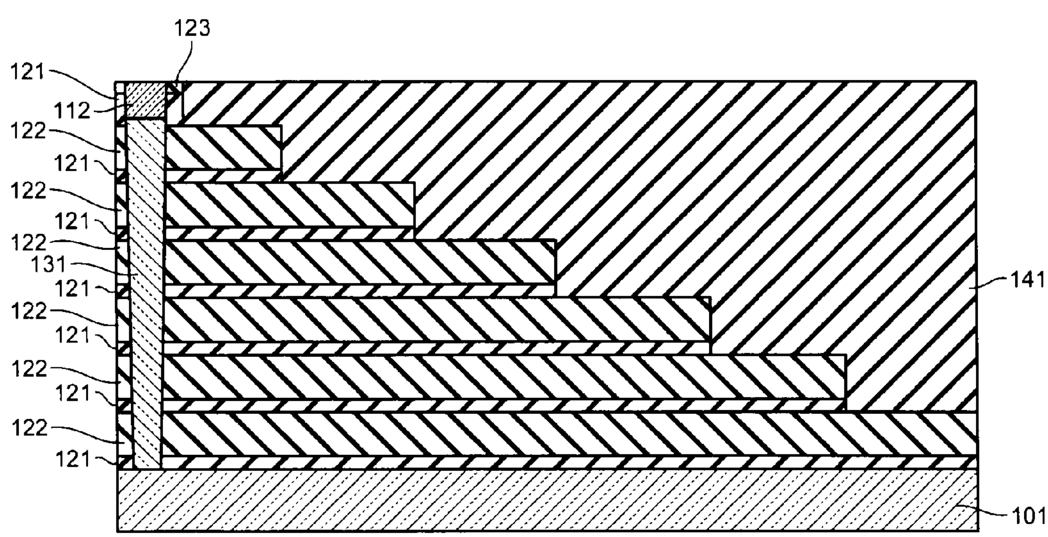
Figure 11A:
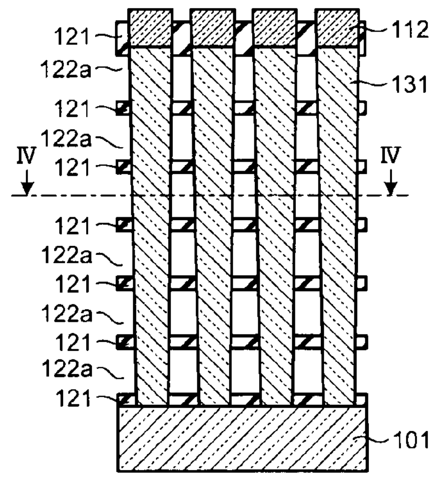
Figure 11B:
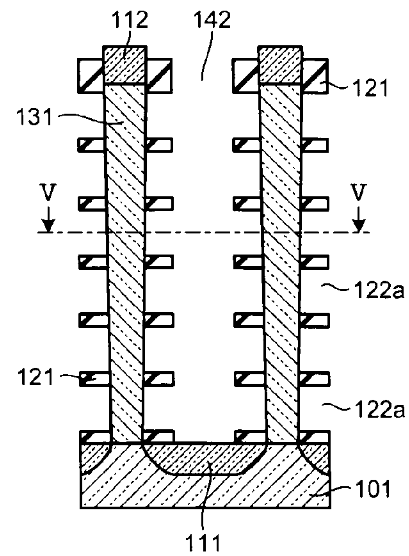
Figure 11C:
Figure 11D:
Figure 11E:
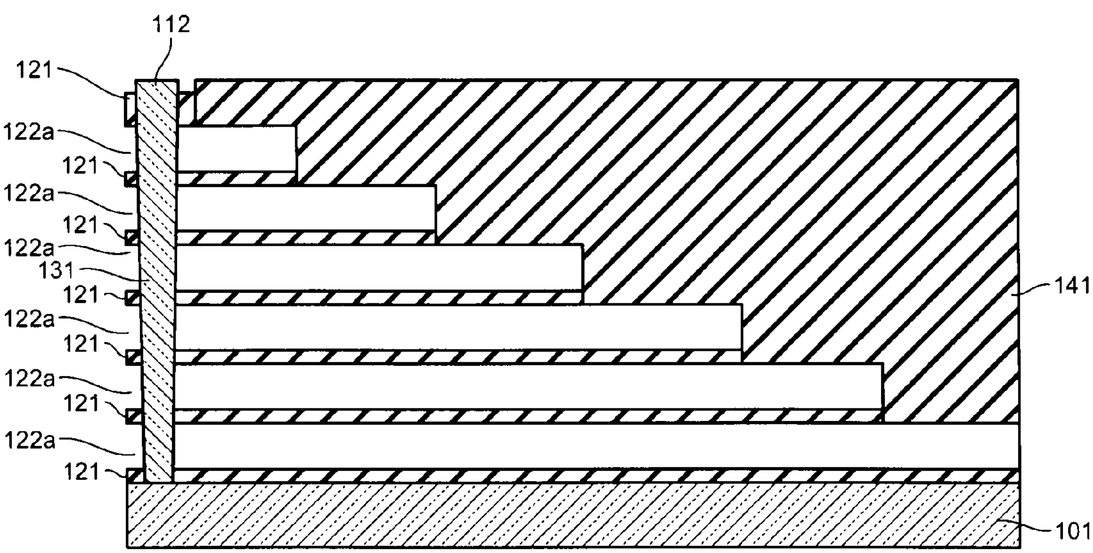
Figure 12A:
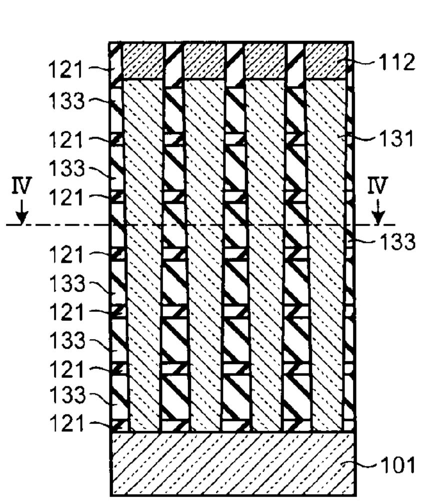
Figure 12B:
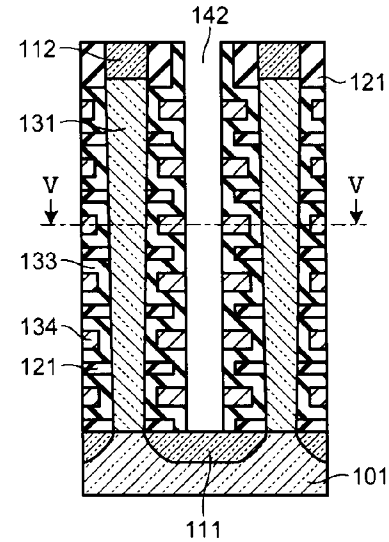
Figure 12C:
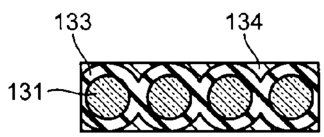
Figure 12D:
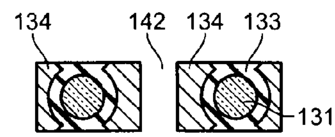
Figure 12E:
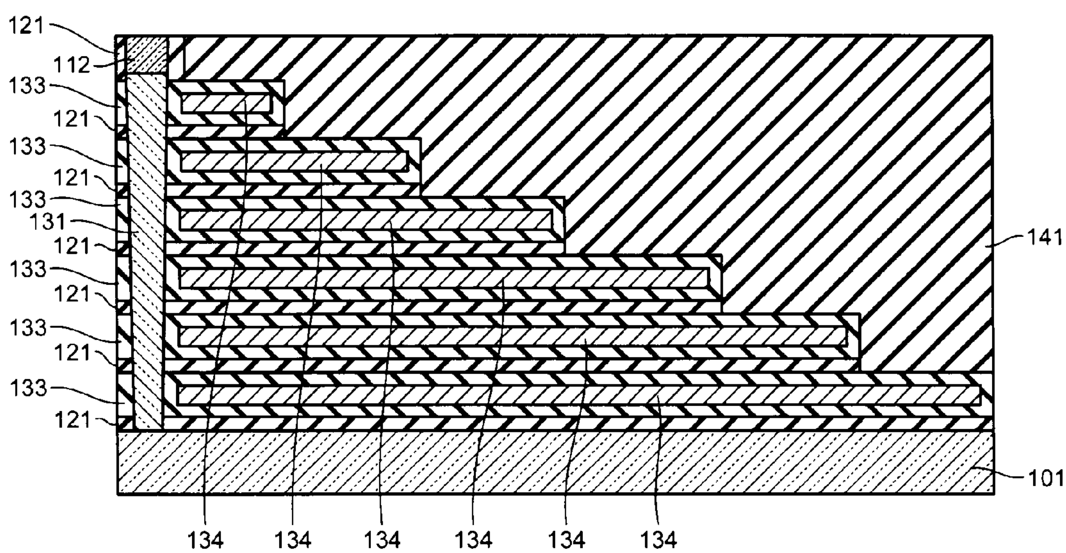
Figure 13A:
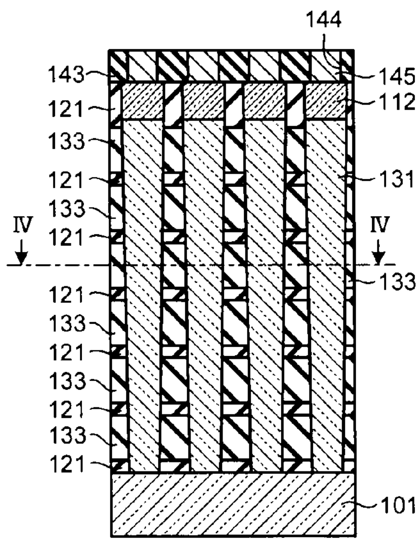
Figure 13B:
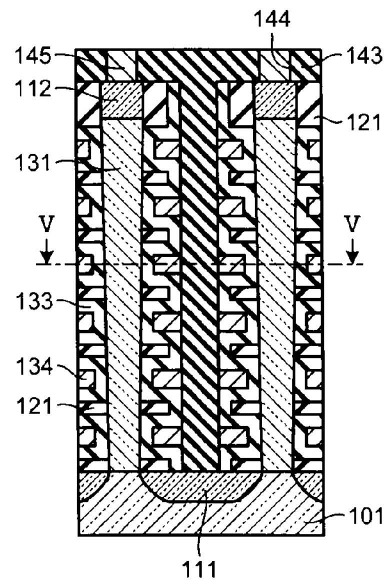
Figure 13C:
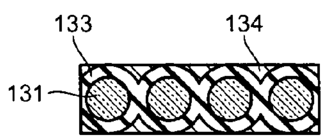
Figure 13D:
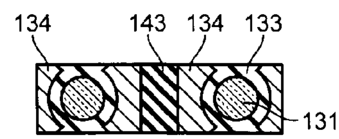
Figure 13E:
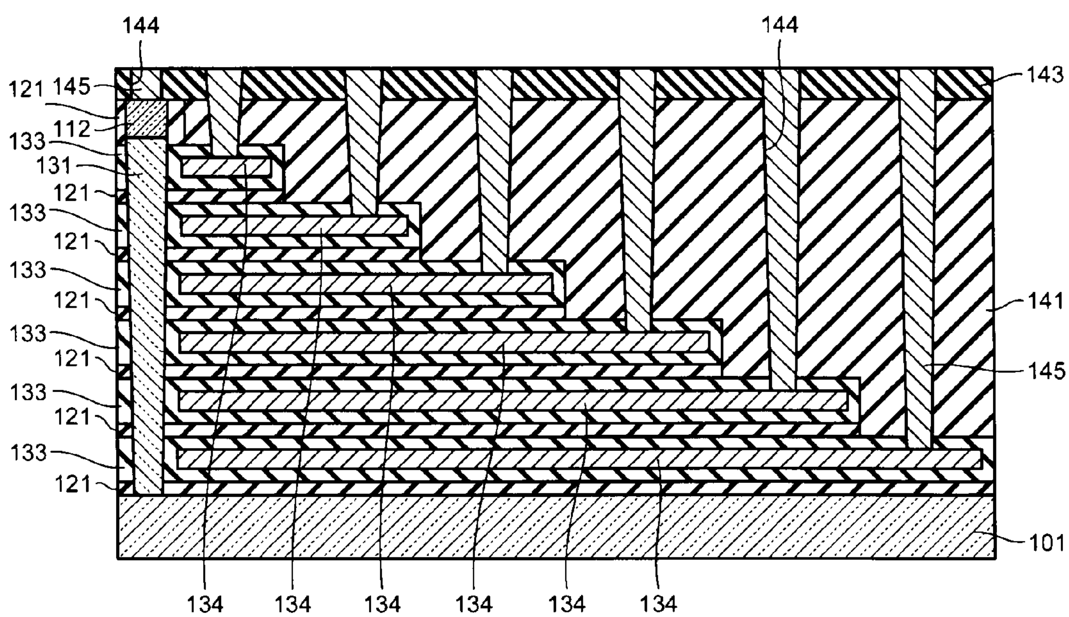

FIGS. 2A to 2D are schematic sectional views of an example of the configuration of a nonvolatile semiconductor memory device according to a first embodiment. FIG. 2A is a plan sectional view of a memory cell region. FIG. 2B is a sectional view taken along line I-I in FIG. 2A. FIG. 2C is a sectional view taken along line II-II in FIG. 2A. FIG. 2D is a sectional view in a direction perpendicular to a bit line direction of a word-line contact region. FIG. 2A is equivalent to a section taken along line III-III in FIGS. 2B and 2C. FIG. 3 is a cut-out perspective view of a part of an area where memory cell transistors are formed in the memory cell region.

In a memory cell region 11, as shown in FIGS. 2A to 2C, memory strings MS including memory cells MC in which gate electrode films 134 are formed on the charge storage layers 133 over the sides of columnar semiconductor films 131 are arranged in a matrix shape on a semiconductor substrate 101 on which source regions 111 are formed. It is assumed that the columnar semiconductor films 131 are formed of a P-type semiconductor material such as P-type polysilicon.

Each of the memory string MS has a structure in which a plurality of transistors are connected in series in the height direction. The transistors have a structure in which the gate electrode films 134 are formed on the charge storage layers 133 over the sides of the columnar semiconductor films 131. Among the transistors, the transistors at the upper and lower ends are selection transistors. In FIGS. 2B and 2C, a source-side selection transistor SGS is arranged on the lower side and a drain-side selection transistor SGD is arranged on the upper side. One or more memory cell transistors MC are formed at a predetermined interval between the two selection transistors SGS and SGD. As explained above, in the first embodiment, the structure of the selection transistors SGS and SGD is the same as the structure of the memory cell transistors MC. A drain region 112 is formed at the upper end of the memory string MS. In the memory cell region 11, selection gate electrodes of the selection transistors SGS and SGD of the memory strings MS arrayed in a predetermined direction are connected to one another. Control gate electrodes of the memory cell transistors MC at the same height of the memory strings MS arrayed in the predetermined direction are also connected to one another. In the following explanation, when it is unnecessary to distinguish the control gate electrodes and the selection gate electrodes, the control gate electrodes and the selection gate electrodes are referred to as gate electrode films 134.

Specifically, as shown in FIG. 2C, on the sides of the columnar semiconductor films 131 functioning as channels, spacer films 121 surrounding the semiconductor films 131 are formed at a predetermined interval in the height direction. The charge storage layers 133 coat the sides of the columnar semiconductor films 131 including the spacer films 121. Each of the gate electrode films 134 is formed on the charge storage layer 133 over the side of the columnar semiconductor film 131 in an area between the upper and lower spacer films 121. An area between the upper and lower spacer films 121 where the gate electrode film 134 is formed on the charge storage layer 133 over the side of the columnar semiconductor film 131 functions as one transistor. The transistors arranged at both the upper and lower ends of the memory string MS are the selection transistors SGS and SGD. One or more transistors between the two selection transistors SGS and SGD are the memory cell transistors MC. In the figure, four memory cell transistors MC are formed between the two selection transistors SGS and SGD.

In the word-line contact region 20, as shown in FIG. 2D, the gate electrode films 134 extended from the memory cell region 11 are arranged to be stacked. The gate electrode films 134 have a step-like structure such that the gate electrode films 134 in lower layers are exposed. In the word-line contact region 20, the gate electrode films 134 are surrounded by the charge storage layers 133. The spacer films 121 are formed among the gate electrode films 134 surrounded by the charge storage layers 133 adjacent to one another in the vertical direction.

A planarization film 141 is formed on the step-like gate electrodes 134 in the word-line contact region 20. An interlayer dielectric film 143 is formed on the memory strings MS in the memory cell region 11, on the planarization film 141 in the word-line contact region 20, and among the memory strings MS adjacent to one another in the bit line direction. As the planarization film 141, for example, a silicon oxide film can be used. As the interlayer dielectric film 143, for example, a tetraethoxysilane (TEOS)/$O_3$ film can be used.

On the interlayer dielectric film 143, a multilayer wiring layers having bit lines, source-side selection gate lines, drain-side selection gate lines, and the like is formed. Specifically, on the interlayer dielectric film 143, wiring layers 151, an interlayer dielectric film 161, wiring layers 152, an interlayer dielectric film 162, wiring layers 153, and an interlayer dielectric film 163 are formed in order. The wiring layers 151 are connected to the upper surfaces of the memory strings MS of the memory cell region 11 and the gate electrode films 134 of word-line contact region 20 by contacts 145. As a material of the contacts 145 and the wiring layers 151 and 153, for example, W or Al can be used.

A material of the semiconductor substrate 101 and the columnar semiconductor films 131 can be selected out of, for example, Si, Ge, SiGe, SiSn, PbS, GaAs, InP, GaP, GaN, ZnSe, and InGaAsP. The columnar semiconductor film 131 can be formed of a single-crystal semiconductor or can be formed of a polycrystalline semiconductor.

As the charge storage layers 133, a layer having the structure of a tunnel dielectric film/a charge trapping film/a charge blocking film can be used. For example, an ONO (a silicon oxide film/a silicon nitride film/a silicon oxide film) structure can be used or an ANO (an alumina film/a silicon nitride film/a silicon oxide film) structure can be used. Instead of the alumina film of the ANO structure, a metal oxide film of $HfO_2$, $La_2O_3$, $Pr_2O_3$, $Y_2O_3$, $ZrO_2$, or the like or a film formed by combining a plurality of kinds of such a metal oxide film can be used. In these structures, an ONO film can be used as the tunnel dielectric film.

As a material of the gate electrode films 134, for example, a conductor film such as W, TaN, TiN, TiAlN, WN, WSi, CoSi, NiSi, PrSi, NiPtSi, PtSi, Pt, Ru, $RuO_2$, or B-doped polysilicon film or a P-doped polysilicon film can be used independently or can be stacked. As a material of the spacer films 121, for example, a silicon oxide film can be used or an organic film can be used.

In the first embodiment, as shown in FIG. 3, at least in the transistors formed at the top of the memory strings MS, the charge storage layers 133 are crossed among the transistors adjacent to one another such that the gate electrode films 134 are not inserted among the transistors at the same height of the memory strings MS adjacent to one another in the word line direction. Specifically, in the transistors that share the gate electrode films 134, the charge storage layers 133 of at least the transistors in the uppermost layer are partially shared among the memory cell transistors adjacent to one another.

To form such a structure, the memory strings MS (the semiconductor films 131) are arranged such that the following Formula (1) holds in a transistor forming position in the uppermost layer of the memory strings MS adjacent to one another in the word line direction. A distance between the semiconductor films 131 (channels) adjacent to each other is represented as L, the thickness of tunnel dielectric films 133A is represented as $t_{TNL}$, the thickness of charge trapping films 133B is represented as $t_{CT}$, and the thickness of charge blocking films 133C is represented as $t_{CB}$. The distance L between the adjacent semiconductor films 131 is not a distance between the centers but is a distance between nearest outer circumferential portions opposed to each other.

$$L<(t_{TNL}+t_{CT}+t_{CB})\times 2 \quad (1)$$

In the structure that meets the condition of Formula (1), parts of the charge blocking films 133C cross (merge) at least in two transistors adjacent to each other in the uppermost layer. Therefore, it is possible to reduce the distance between the semiconductor films 131 adjacent to each other in the word line direction. Further downsizing can be realized by crossing even the charge trapping films 133B among the transistors adjacent to one another. However, it is undesirable to cross the charge trapping films 133B because, if the charge trapping films 133B are crossed, it is likely that charges stored in the charge trapping films 133B leak to the adjacent transistors via crossing sections. Therefore, it is desirable to set the distance L between the adjacent semiconductor films 131 to meet the following Formula (2):

$$L>(t_{TNL}+t_{CT})\times 2 \quad (2)$$

In this structure, the charge storage layers 133 are coated on the sides of the columnar semiconductor films 131. Therefore, curvature radii are different in the tunnel dielectric films 133A and the charge blocking films 133C. Therefore, because an electric field can be more intensely concentrated on the tunnel dielectric films 133A having the smaller curvature radius, it is possible to substantially improve writing and erasing characteristics compared with the plane MONOS structure. This is effective in performing multi-level cell (MLC) operation.

In the above explanation, the semiconductor films 131 are formed of the P-type polysilicon film to form a stacked memory in which transistors of an inversion type are connected to one another. The transistors of the inversion type are transistors that connect depletion layers formed by applying voltage to gate electrodes to form channels. Because electrons are generally not present in the channels, malfunction due to program disturb or read disturb hardly occurs even if $V_{pass}$ is applied to an unselected cell. Because the semiconductor films 131 functioning as the channels are the P type, it is easy to draw electrons from the charge trapping film 133B to the semiconductor substrate 101 during erasing. Therefore, an erasing characteristic is excellent. Further, as explained later, unlike a depletion type, it is unnecessary to form selection transistors according to purposes. In the above explanation, it is also possible to form the semiconductor films 131 with an N-type polysilicon film and drive the semiconductor films 131 as transistors of the depletion type. However, in this case, to use the selection transistors SGS and SGD arranged at the upper and lower ends of the memory cell MC row as normally-off selection transistors, channel portions thereof only have to be formed of the P-type polysilicon film and driven as the transistors of the inversion type.

A method of manufacturing the nonvolatile semiconductor memory device having such a structure is explained. FIGS. 4A to 13E are schematic sectional views of an example of a procedure of a method of manufacturing the nonvolatile semiconductor memory device according to the first embodiment. Among these figures, a section in the word line direction of the memory cell region is shown in FIGS. 4A, 5A, 6A, 7A, 8A, 9A, 10A, 11A, 12A, and 13A. A section in a direction perpendicular to the word line direction of the memory cell region is shown in FIGS. 4B, 5B, 6B, 7B, 8B, 9B, 10B, 11B, 12B, and 13B. A plane section taken along line IV-IV in FIGS. 4A, 5A, 6A, 7A, 8A, 9A, 10A, 11A, 12A, and 13A is shown in FIGS. 4C, 5C, 6C, 7C, 8C, 9C, 10C, 11C, 12C, and 13C. A plane section taken along line V-V in FIGS. 4B, 5B, 6B, 7B, 8B, 9B, 10B, 11B, 12B, and 13B is shown in FIGS. 4D, 5D, 6D, 7D, 8D, 9D, 10D, 11D, 12D, and 13D. A section in the word line direction of the word-line contact region is shown in FIGS. 4E, 5E, 6E, 7E, 8E, 9E, 10E, 11E, 12E, and 13E.

First, a not-shown peripheral circuit of the nonvolatile semiconductor memory device is formed on the semiconductor substrate 101. As shown in FIGS. 4A to 4E, impurities of a predetermined conduction type are implanted in the memory cell region of the semiconductor substrate 101 by an ion implantation method and activated to form the source regions 111. The source regions 111 can be, for example, an N type.

Subsequently, a plurality of the spacer films 121 forming memory cells and sacrificial films 122 are alternately stacked over the entire surface of the semiconductor substrate 101 by a film forming method such as a plasma-enhanced chemical vapor deposition (PECVD) method. The stack ends with the spacer film 121. A stopper film 123 functioning as a polishing stopper during chemical mechanical polishing (CMP) processing is formed on the spacer film 121 in the uppermost layer to form a stacked film. Specifically, six sacrificial films 122 are stacked. As a material of the sacrificial films 122, a material having a large etching rate compared with the spacer films 121 in processing by wet etching performed later is selected. For example, as the spacer films 121, a silicon oxide film can be used. As the sacrificial films 122, for example, a silicon nitride film can be used. As the stopper film 123, for example, a silicon nitride film can be used. As a method of forming the stacked film, besides the PECVD method, it is also possible to appropriately combine and use techniques such as a sub-atmospheric CVD (SACVD) method, a low pressure CVD (LPCVD) method, a sputtering method, and spin-on dielectric (SOD).

Thereafter, as shown in FIGS. 5A to 5E, a not-shown mask film is formed over the entire surface of the stopper film 123.

The stacked film including the spacer films 121, the sacrificial films 122, and the stopper film 123 is collectively processed by the lithography technique and the reactive ion etching technique (hereinafter referred to as reactive ion etching (RIE) method) to form through-holes 135, in which the semiconductor films 131 functioning as the channels later are embedded, in the memory cell region. The through-holes 135 are arranged in a matrix shape in the memory cell region and the bottoms thereof communicate with the semiconductor substrate 101. As the mask film, for example, a CVD carbon film can be used. Subsequently, the mask film is removed. Consequently, a mold of the semiconductor film 131 is formed.

Subsequently, as shown in FIGS. 6A to 6E, the semiconductor films 131 functioning as the channels are formed by a film forming method such as the LPCVD method. The semiconductor films 131 are filled in the through-holes 135 and formed such that the lower ends thereof are connected to the semiconductor substrate 101. As the semiconductor films 131, for example, a B-doped polysilicon film can be used. The concentration of B can be set to, for example, $1\times10^{17}$ to $1\times10^{18}$ $cm^{-3}$. The semiconductor films 131 can be formed to be completely filled in the through-holes 135 or can be formed to be deposited on the inner wall of the through-holes 135 in a macaroni shape. When the semiconductor films 131 are deposited in a macaroni shape, the thickness of the semiconductor films 131 controlled by the gate electrode films 134 is equal among the stacked memory cells MC. This is effective for suppressing fluctuation in a threshold voltage ($V_{th}$). In an example explained below, the semiconductor films 131 are formed to be completely filled in the through-holes 135. As the semiconductor films 131, a polysilicon film or a single-crystal silicon film crystallized by laser anneal or a Ni catalyst method other than the LPCVD method can be used.

Thereafter, etch-back is performed by the RIE method to remove the semiconductor films 131 above the stopper film 123. Consequently, the semiconductor films 131 remain only in the through-holes 135. Subsequently, an impurity element of a predetermined conduction type is ion-implanted in upper portions of the semiconductor films 131 by using the lithography technique and the ion implantation technique to form the drain regions 112. As the impurity element, for example, arsenic can be used.

Subsequently, as shown in FIGS. 7A to 9E, processing for forming the stacked film in the word-line contact region in a step shape is performed by using the lithography technique and the RIE method. The stacked film includes a first spacer film 121, a first sacrificial film 122, a second spacer film 121, a second sacrificial film 122, . . . , a sixth spacer film 121, a sixth sacrificial film 122, and a seventh spacer film 121, which are formed on the semiconductor substrate 101 in order.

First, in FIGS. 7A to 7E, the films from the stopper film 123 to the fifth spacer film 121 are removed in an area extending from near the center of the word-line contact region to the end on the opposite side of the memory cell region. Consequently, two steps are formed. Thereafter, the word-line contact region having a structure in which the sacrificial films 122 in the respective layers are exposed in a step shape is processed by repeating the same processing twice. Specifically, the films from the stopper film 123 to the sixth spacer film 121 are removed in an area extending from near the center of a flat portion in an upper stage to a step portion in the first stage formed in FIGS. 7A to 7E. At the same time, the films from the fourth sacrificial film 122 to the third spacer film 121 are removed in an area extending from near the center of a flat portion in a lower stage to the end on the opposite side of the memory cell region. Consequently, four steps are formed as shown in FIGS. 8A to 8E. The stopper film 123 and the sixth spacer film 121 are removed in an area extending from near a region adjacent to the memory cell region in a flat portion at the uppermost stage to the first step portion from the top formed in FIGS. 8A to 8E. At the same time, in flat portions in the second and third stages, the sacrificial film 122 and the spacer film 122 for one layer are removed in an area extending from near the center of each of the flat portions to the end on the opposite side of the memory cell region. Consequently, seven steps are formed as shown in FIGS. 9A to 9E and the word-line contact region is formed.

Subsequently, as shown in FIGS. 10A to 10E, the planarization film 141 is formed over the entire surface of the semiconductor substrate 101. As the planarization film 141, for example, a silicon oxide film can be used. Thereafter, the planarization film 141 is planarized by the CMP technique until the stopper film 123 is exposed.

Thereafter, a not-shown mask film is formed over the entire surface of the semiconductor substrate 101. The stacked film including the spacer films 121, the sacrificial films 122, and the stopper film 123 and the planarization film 141 are collectively processed by the lithography technique and the RIE method to form trenches 142. The trenches 142 have a shape extending in the word line direction to separate the semiconductor films 131 adjacent to each other in the bit line direction. As the mask film, for example, a CVD carbon film can be used. After the trenches 142 are formed, the mask film is removed.

Subsequently, as shown in FIGS. 11A to 11E, the sacrificial films 122 are selectively removed by wet etching to form hollows 122*a* among the upper and lower spacer films 121. Because the semiconductor films 131 function as columns and support the spacer films 121, the hollows 122*a* are not collapsed. When silicon oxide films are used as the spacer films 121 and silicon nitride films are used as the sacrificial films 122, as a chemical for the wet etching, for example, hot phosphoric acid can be used such that the silicon nitride films are more selectively etched compared with the silicon oxide films. The hollows 122*a* after the sacrificial films 122 are removed function as a mold in forming a MONOS structure later.

Thereafter, as shown in FIGS. 12A to 12E, the charge storage layers 133 forming MONOS cells are formed by a film forming method such as the CVD method such that the sides of the columnar semiconductor films 131 partially covered with the spacer films 121 are covered. The charge storage layers 133 have a stacking structure of a tunnel dielectric film/a charge trapping film/a charge blocking film. As the tunnel dielectric film, for example, an ONO film formed by the LPCVD method can be used. As the charge trapping film, a silicon nitride film formed by an atomic layer deposition (ALD) method can be used. As the charge blocking film, an alumina film formed by the ALD method can be used. At least in the transistors at the uppermost layer adjacent to each other in an extending direction of the trenches 142 (the word line direction), parts of the charge storage layers 133 forming the MONOS cells cross in the word line direction as shown in FIG. 3. The relation of Formula (1) holds at least in the transistors in the uppermost layer.

This is attained by forming the through-holes 135 formed in FIGS. 5A to 5E to meet the following Formula (3). However, a distance between the adjacent through-holes 135 is not a distance between the centers but is a distance between nearest outer circumferential portions opposed to each other.

$$\text{Distance between adjacent through-holes} < (t_{TNL}+t_{CT}+t_{CB})\times 2 \quad (3)$$

In this way, a distance between the channels adjacent to each other in the word line direction can be reduced. Therefore, it is possible to realize higher bit density per memory chip area.

The gate electrode films 134 are formed on the sides of the columnar semiconductor films 131, in which the charge storage layers 133 are formed, by a film forming method such as the CVD method. Thereafter, the gate electrode films 134 formed on the bottoms of the trenches 142 and the like are recessed by the dry etching method and divided to be electrodes for the stacked transistors. As a material of the gate electrode films 134, for example, a tantalum nitride/tungsten stacked film can be used. As an etching gas for dry etching, for example, plasma-excited $NF_3$ can be used.

Subsequently, as shown in FIGS. 13A to 13E, the interlayer dielectric film 143 is formed over the entire surface of the semiconductor substrate 101 by a film forming method such as the CVD method to fill the trenches 142. As the interlayer dielectric film 143, a TEOS/$O_3$ film can be used. The surface of the interlayer dielectric film 143 is planarized by the CMP technique.

Subsequently, contact holes 144 connecting with the columnar semiconductor films 131 in the memory cell region and the gate electrode films 134 in the word-line contact region are formed by the lithography technique and the RIE method. Thereafter, conductive material films are filled in the contact holes 144 by a film forming method such as the CVD method. The conductive material films are planarized by the CMP technique until the interlayer dielectric film 143 is exposed. Consequently, the contacts 145 are formed. As a material of the contacts 145, for example, tungsten can be used.

Thereafter, the wiring layers 151 to 153 and the like connected to the contacts 145 are formed via the interlayer dielectric films 161 to 163 to form a multilayer wiring layer. Consequently, the nonvolatile semiconductor memory device having the structure shown in FIGS. 2A to 2D is obtained.

In the first embodiment, the word line is prevented from entering between the semiconductor films 131 adjacent to each other in the word line directions. As a result, it is possible to reduce the distance between the semiconductor films 131 in the word line direction to be close to a processing limit. Therefore, it is possible to substantially reduce a memory cell pitch in the word line direction compared with the structure in the past in which the word lines (the gate electrode films 134) are inserted among the adjacent semiconductor films 131.

For example, when the diameter of the semiconductor films 131 functioning as the channels is set to 50 nanometers and the thickness of the charge storage layers 133 (the ONO films) forming a MONOS is set to 25 nanometers, in the structure in the past in which the gate electrode films are inserted among the adjacent semiconductor films 131, the memory cell pitch in the word line direction is calculated by the following Formula (4):

Memory cell pitch in the word line direction=charge storage layer thickness+semiconductor film diameter+charge storage layer thickness+gate electrode film width restricted by processing conditions=25 nm+50 nm+25 nm+50 nm=150 nm (4)

On the other hand, in the structure of the first embodiment, the memory cell pitch in the word line direction is calculated by the following Formula (5):

Memory cell pitch in the word line direction=semiconductor film diameter+total of thicknesses of the tunnel dielectric film and the charge trapping film in the charge storage layer+total of thicknesses of the tunnel dielectric film and the charge trapping film in the charge storage layer+distance between nearest charge trapping films=50 nm+10 nm+10 nm+5 nm=75 nm (5)

When Formulas (4) and (5) are compared, with the structure of the first embodiment, compared with the structure in the past, it is expected that the memory cell pitch in the word line direction can be reduced to nearly a half. This indicates that about double bit density can be realized by the number of stacked layers equivalent to that in the technology in the past or bit density equivalent to a memory formed by the technology in the past can be attained by about a half number of stacked layers.

In this way, according to the first embodiment, it is possible to realize higher bit density with a smaller number of stacked layers, i.e., a lower solid structure. Therefore, it is possible to provide a nonvolatile semiconductor memory device having higher bit density without imposing large load on integration.

It is possible to stack the transistors by collectively processing the stacked film without substantially increasing the number of steps. Therefore, it is possible to improve a bit density per memory chip unit area even if downsizing is not performed. Further, the semiconductor films 131 are formed by being filled in the independent through-holes 135 before the gate electrode films 134 are formed. Therefore, the channels are not short-circuited even if the distance between the channels (the semiconductor films 131) is reduced.

In the first embodiment, the nonvolatile semiconductor memory device having the structure in which the memory strings having the selection transistors formed at both the upper and lower ends are arranged in a matrix shape perpendicular to the substrate is explained. In a second embodiment, a nonvolatile semiconductor memory device having a structure in which a pair of memory strings adjacent to each other in a bit line direction are connected in lower portions is explained.

Figure 14A:
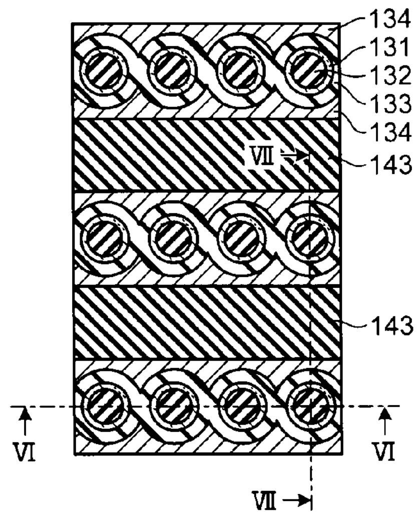
FIGS. 14A to 14D are schematic sectional views of an example of the configuration of a nonvolatile semiconductor memory device according to a second embodiment.
Figure 14B:
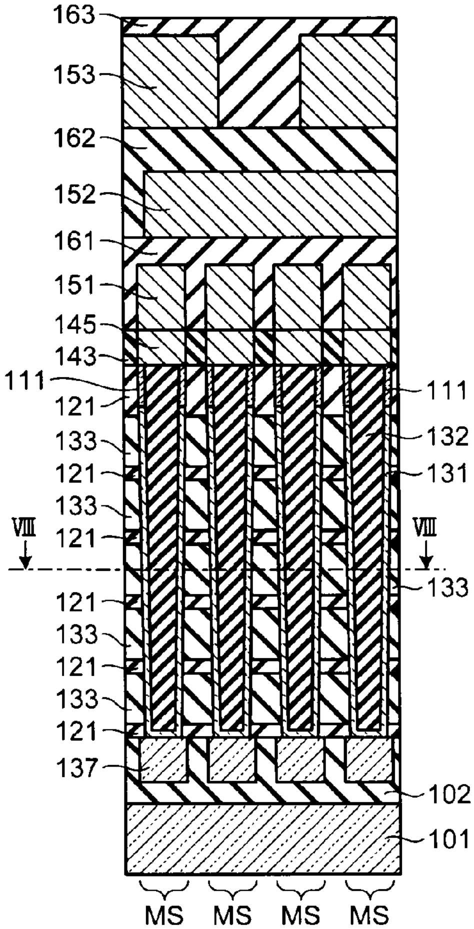
Figure 14C:
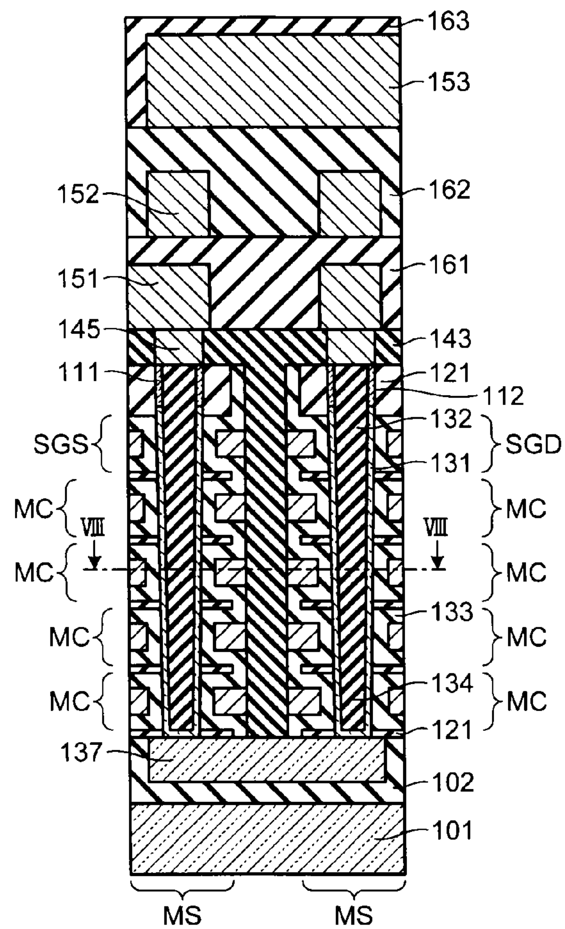
Figure 14D:
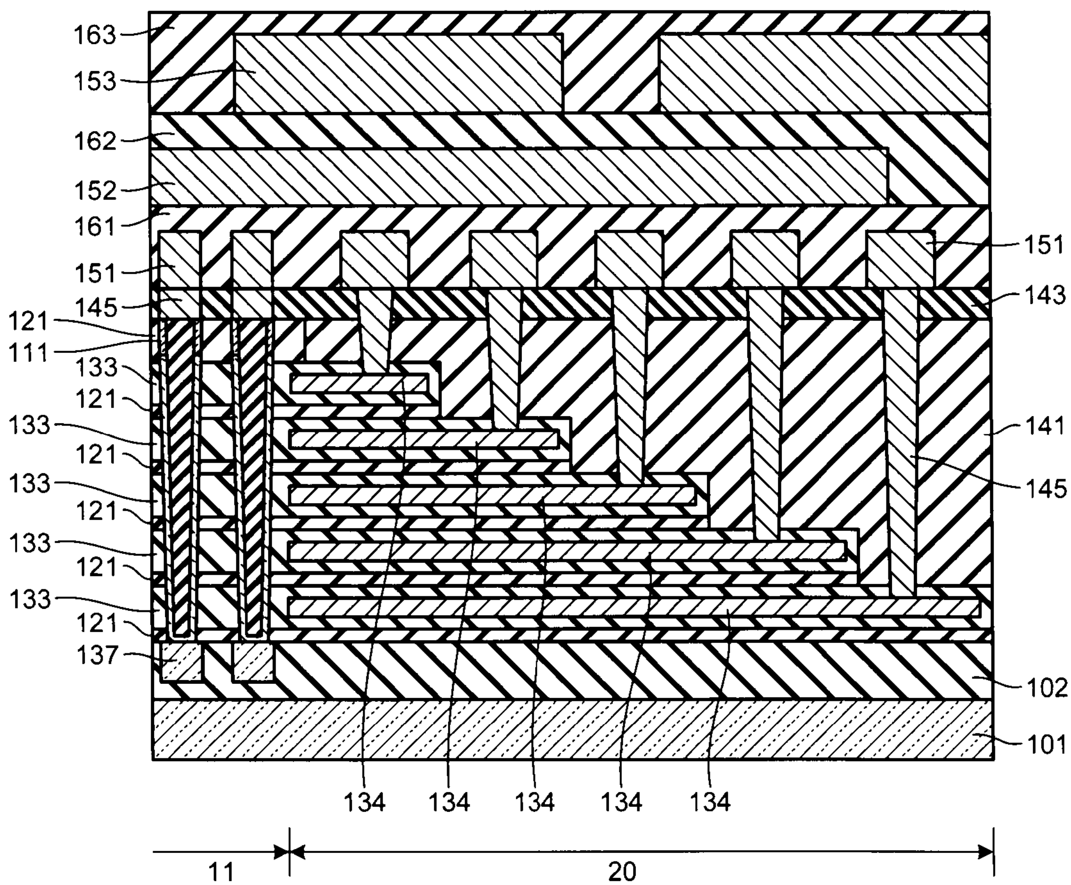
Figure 15A:
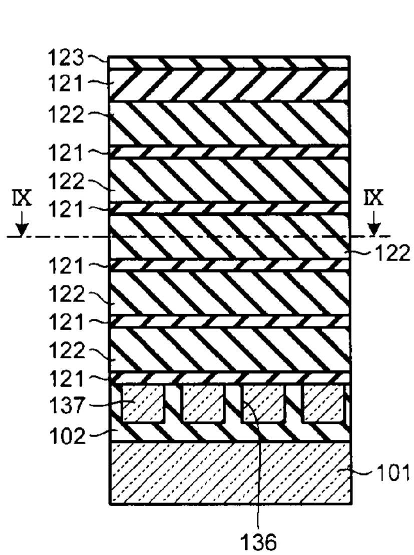
FIGS. 15A to 24E are schematic sectional views of an example of a procedure of a method of manufacturing the nonvolatile semiconductor memory device according to the second embodiment.
Figure 15B:
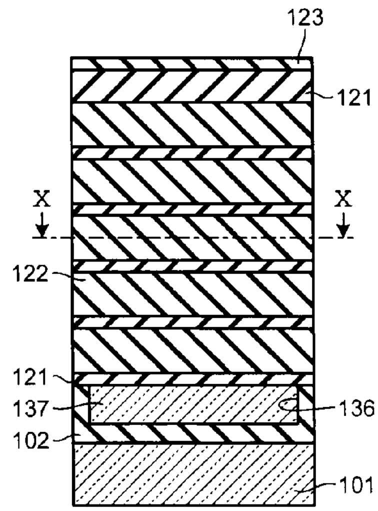
Figure 15C:
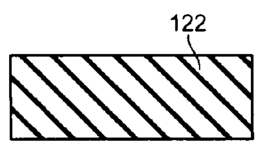
Figure 15D:
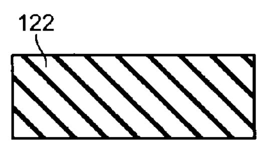
Figure 15E:
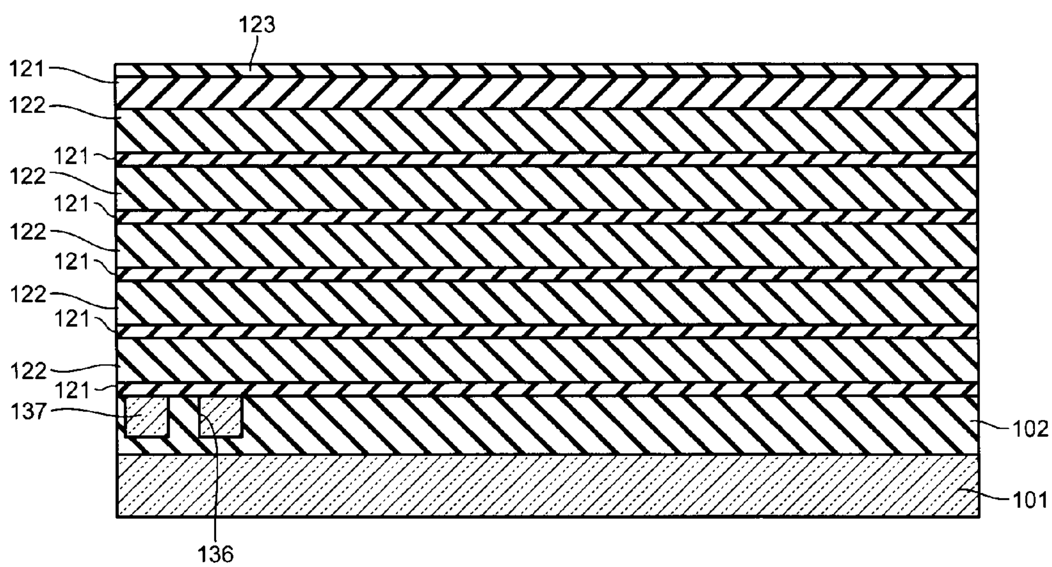
Figure 16A:
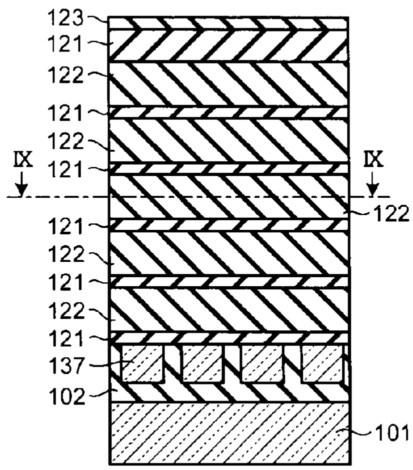
Figure 16B:
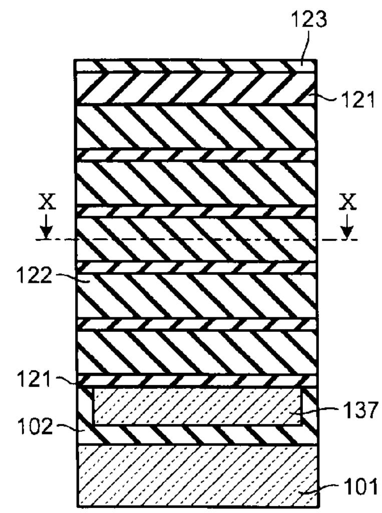
Figure 16C:
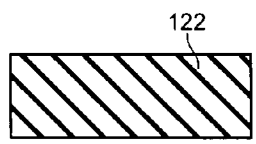
Figure 16D:
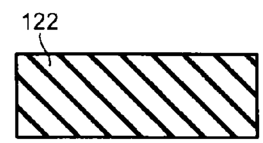
Figure 16E:
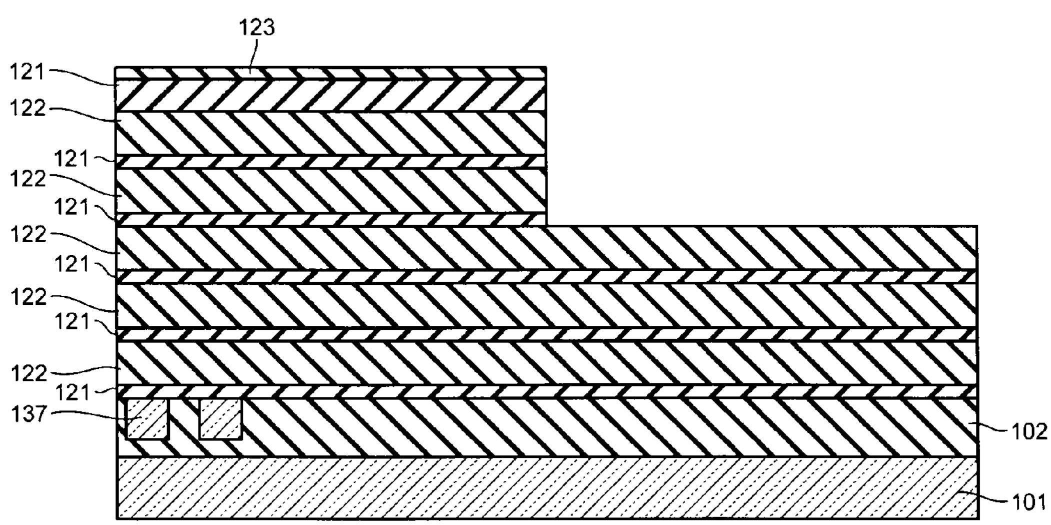
Figures 17A, 17B, 17C, 17D, 17E:
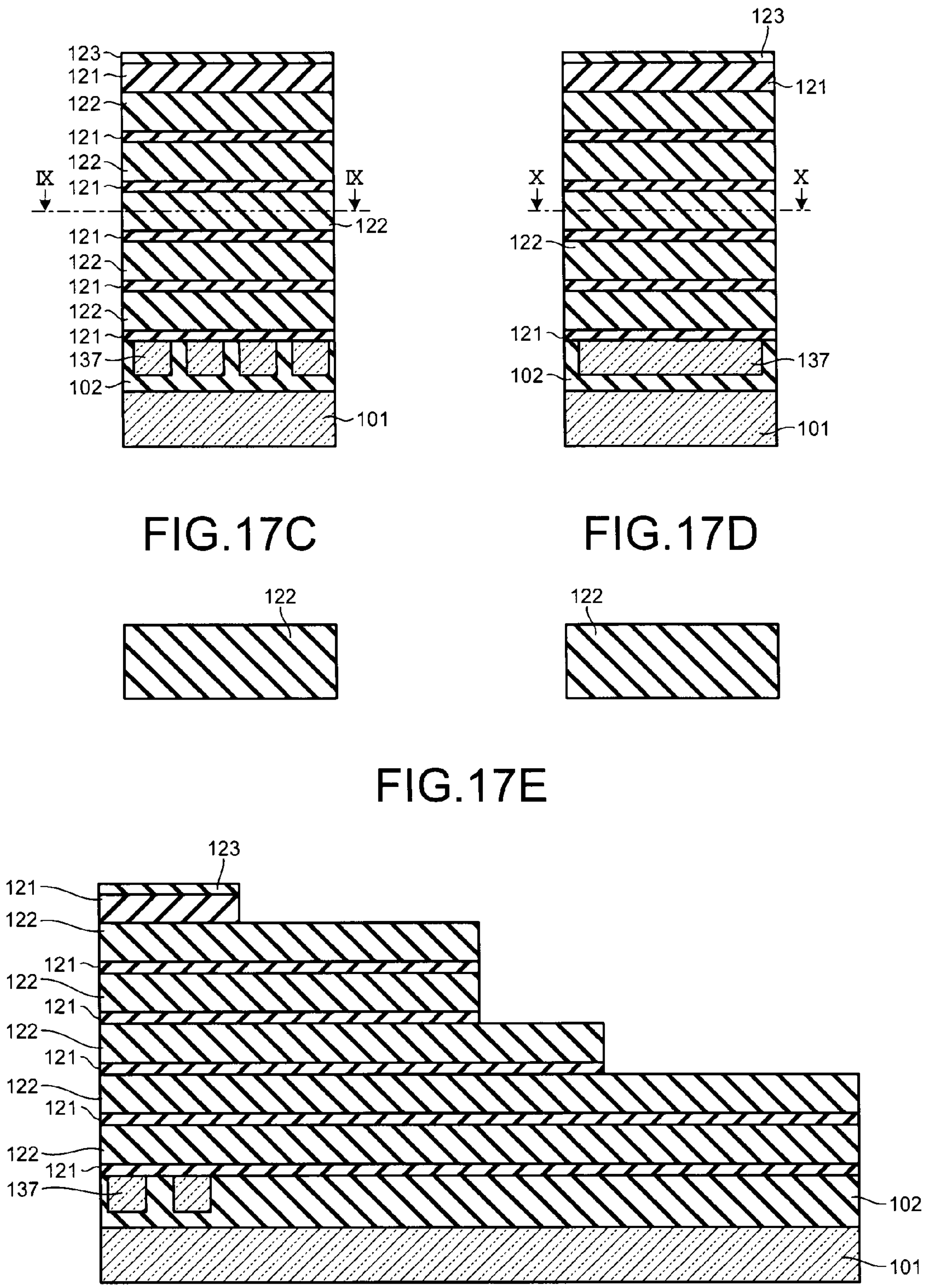
Figure 18A:
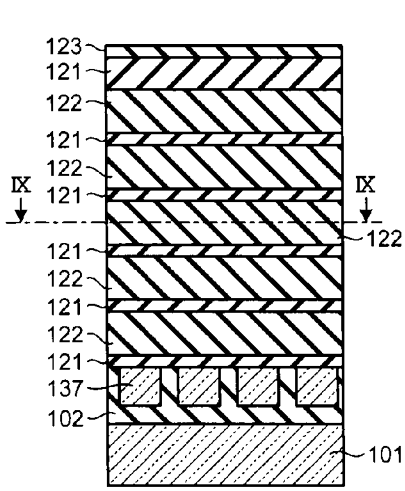
Figure 18B:
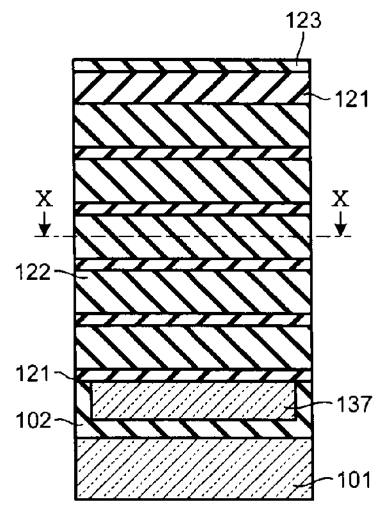
Figure 18C:
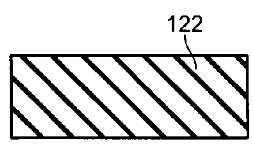
Figure 18D:
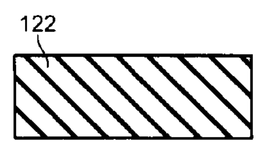
Figure 18E:
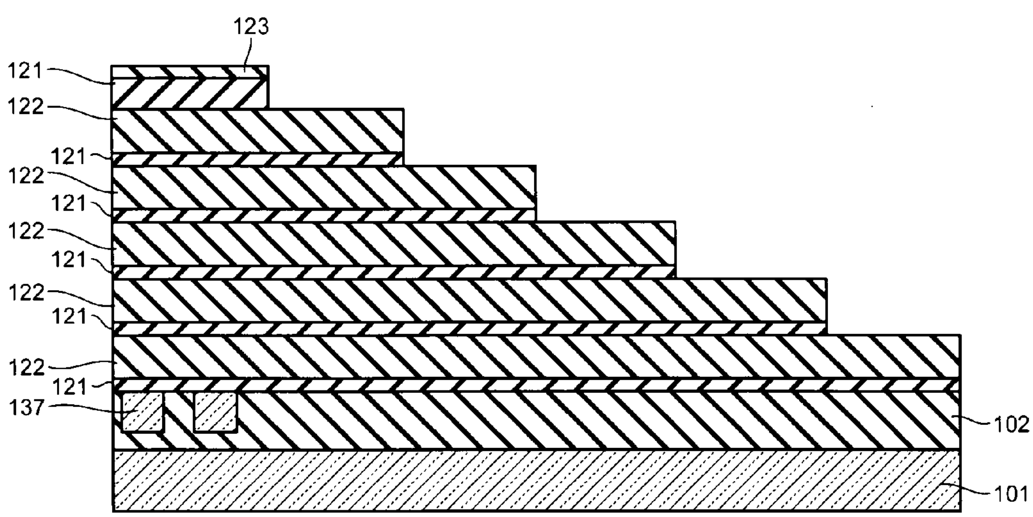
Figure 19A:
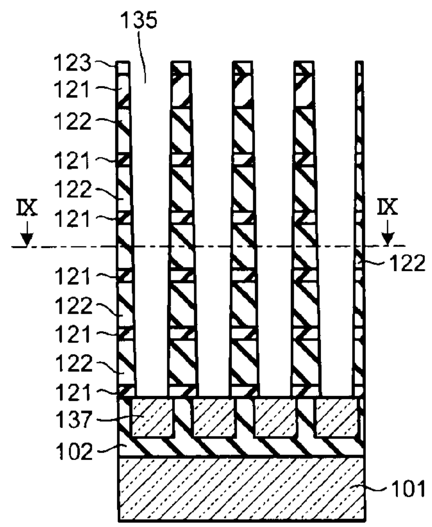
Figure 19B:
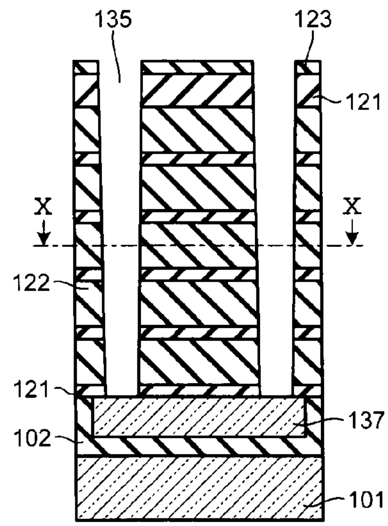
Figure 19C:
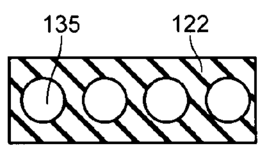
Figure 19D:
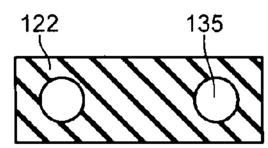
Figure 19E:
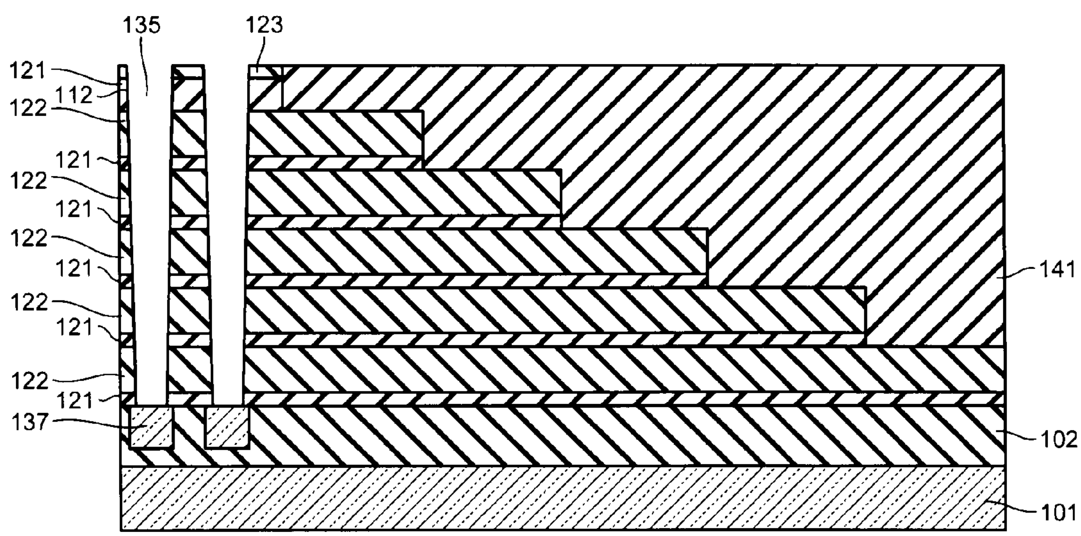
Figure 20A:
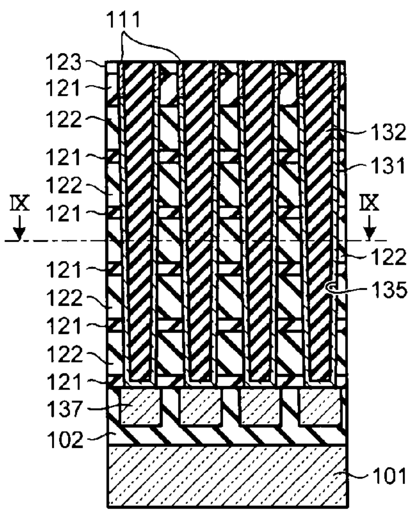
Figure 20B:
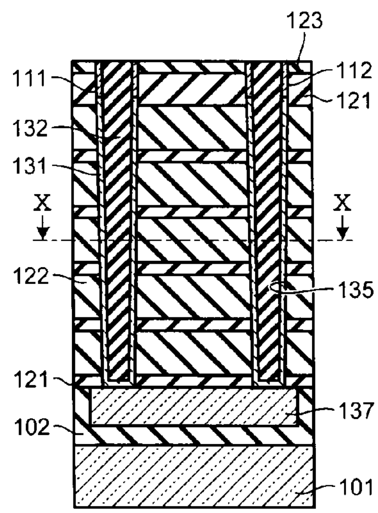
Figure 20C:
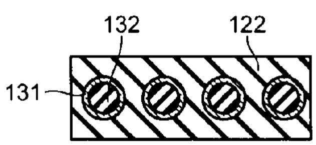
Figure 20D:
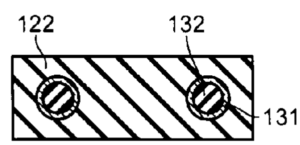
Figure 20E:
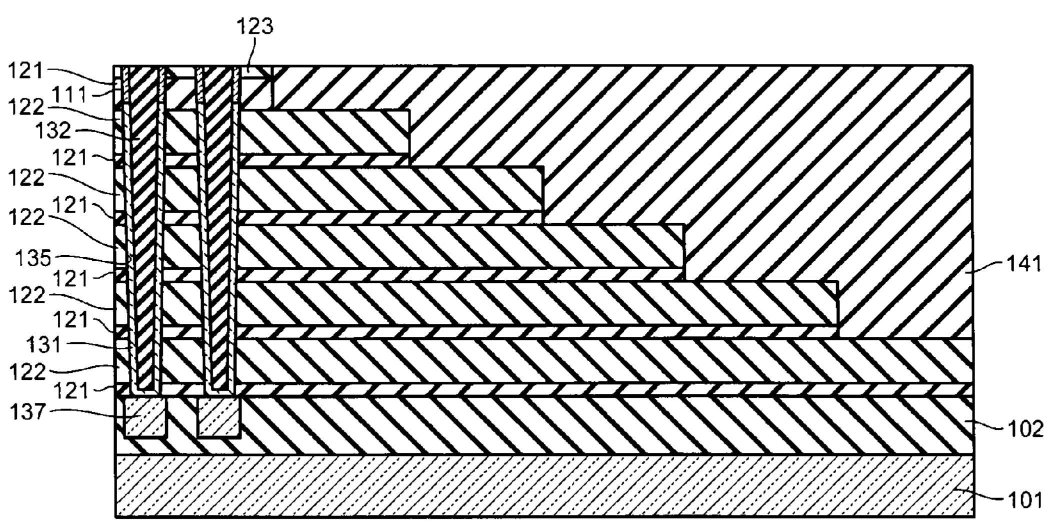
Figure 21A:
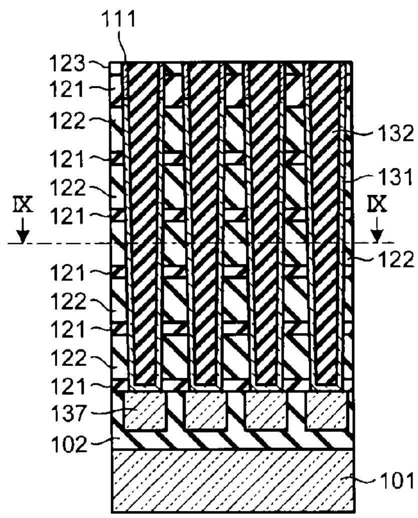
Figure 21B:
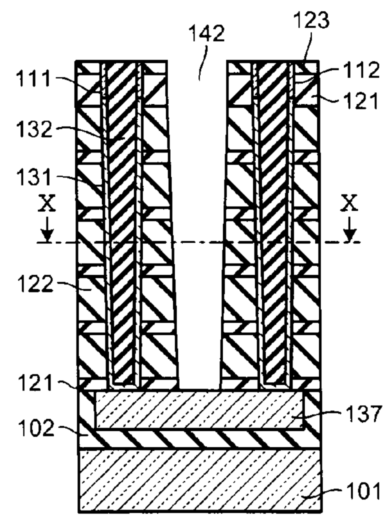
Figure 21C:
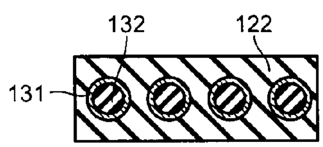
Figure 21D:
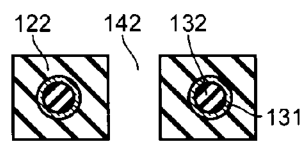
Figure 21E:
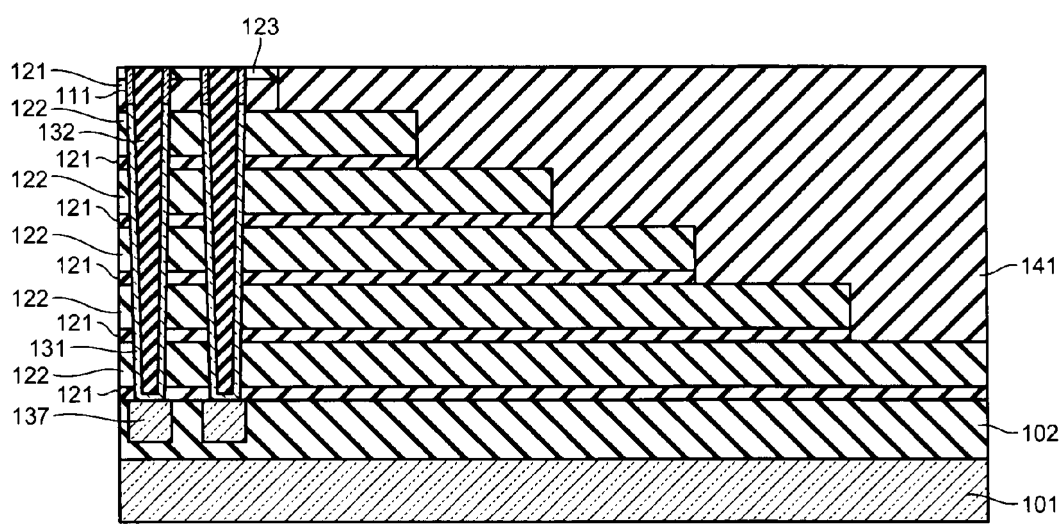
Figure 22A:
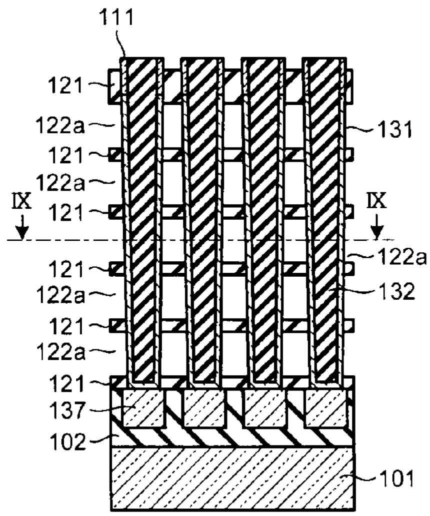
Figure 22B:
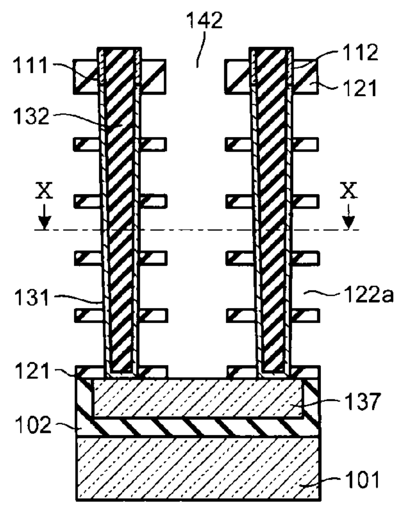
Figure 22C:
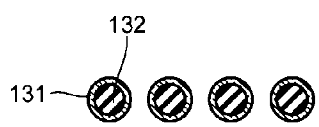
Figure 22D:
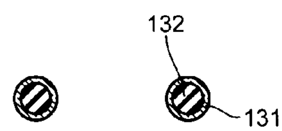
Figure 22E:
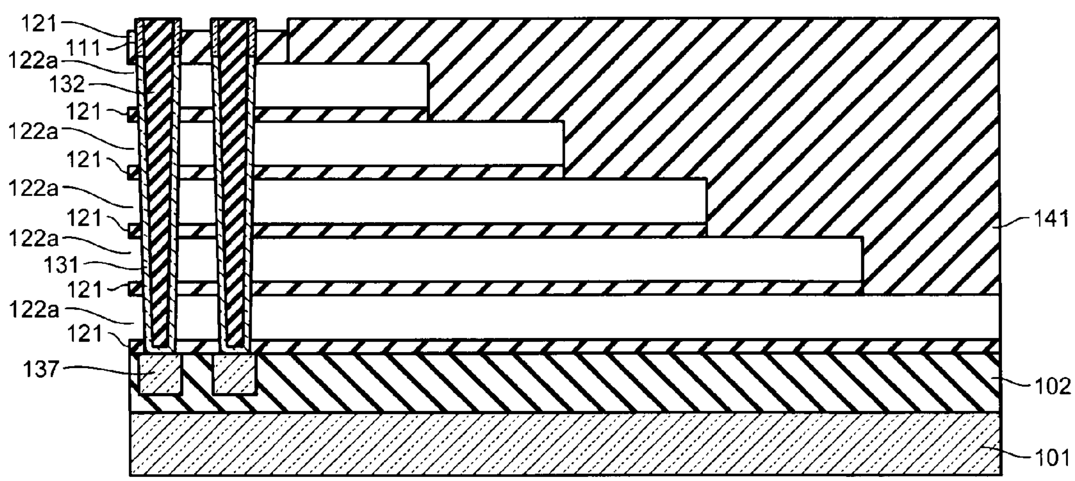
Figure 23A:
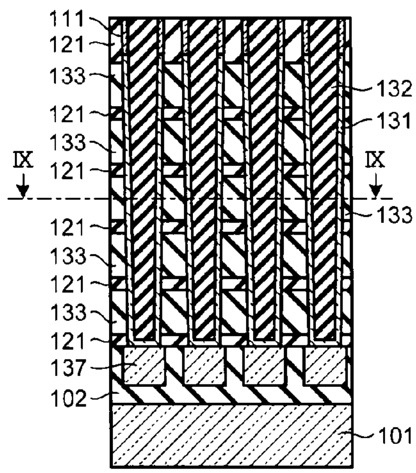
Figure 23B:
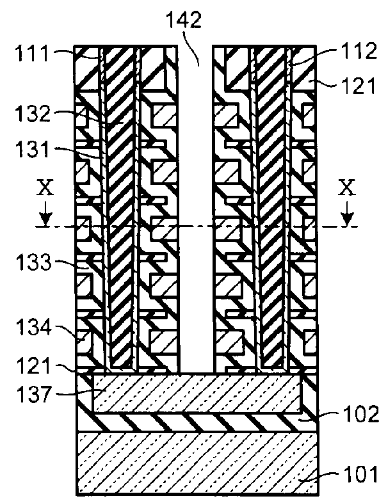
Figure 23C:
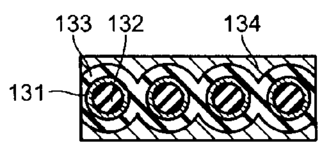
Figure 23D:
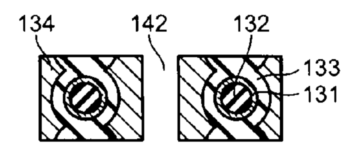
Figure 23E:
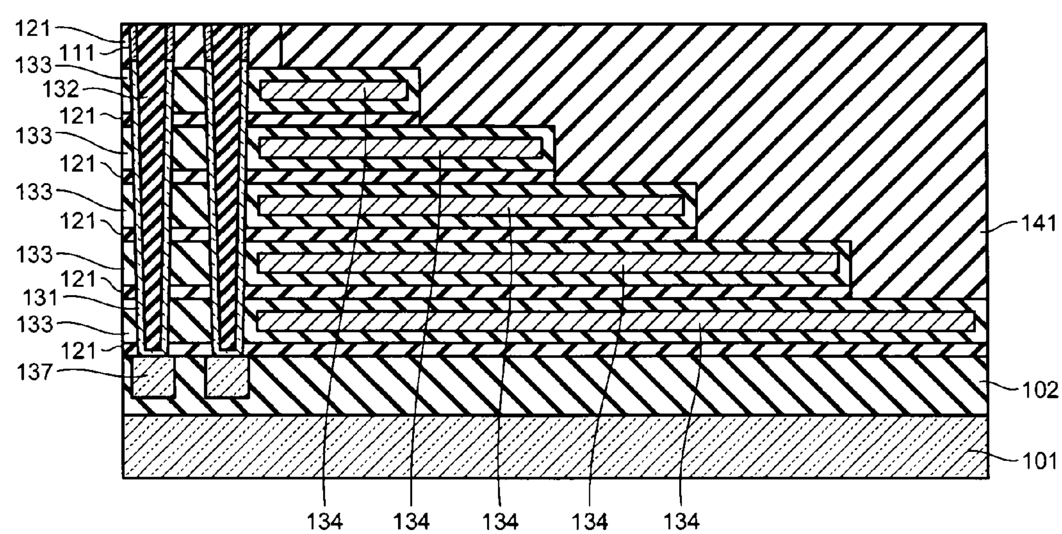
Figure 24A:
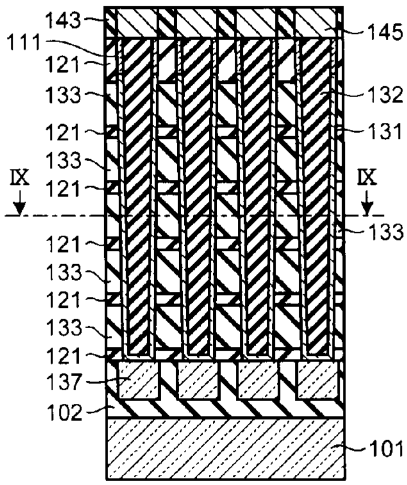
Figure 24B:
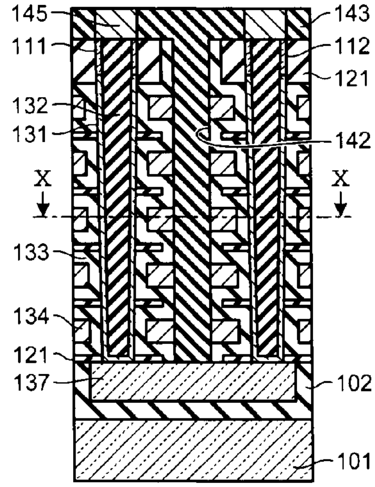
Figure 24C:
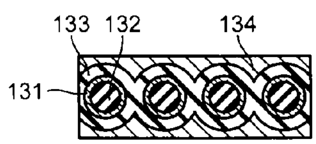
Figure 24D:
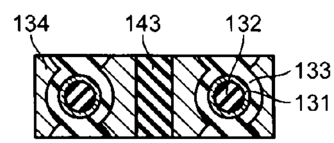
Figure 24E:
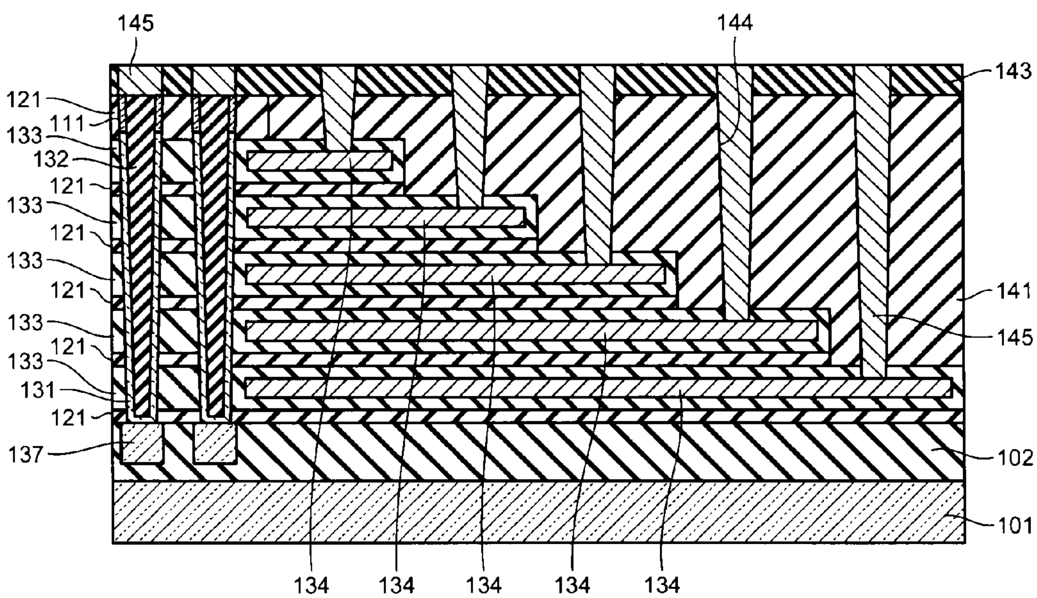

FIGS. 14A to 14D are schematic sectional views of an example of the configuration of a nonvolatile semiconductor memory device according to the second embodiment. FIG. 14A is a plan sectional view of a memory cell region. FIG. 14B is a sectional view taken along line VI-VI in FIG. 14A. FIG. 14C is a sectional view taken along line VII-VII in FIG. 14A. FIG. 14D is a sectional view in a direction perpendicular to the bit line direction of a word-line contact region. FIG. 14A is equivalent to a section taken along line VIII-VIII in FIGS. 14B and 14C.

In the second embodiment, the memory cell region 11 and the word-line contact region 20 are formed on the interlayer dielectric film 102 formed on the semiconductor substrate 101. In the memory cell region 11, as shown in FIGS. 14A to 14C, the memory strings MS including the memory cells MC having the gate electrode films 134 formed on the charge storage layers 133 over the sides of the columnar (hollow cylindrical) semiconductor films 131 are arranged in a matrix shape substantially perpendicularly on the interlayer dielectric film 102. It is assumed that the hollow cylindrical semiconductor films 131 are formed of a P-type semiconductor material such as P-type polysilicon. The bottoms of the hollow cylindrical semiconductor films 131 have not ring shape but plate-like shape. The dielectric films 132 such as silicon oxide films are formed to fill the inside of the hollow cylindrical semiconductor films 131.

In this way, because the semiconductor films 131 are formed in a hollow cylindrical shape (a macaroni shape), the thickness of the channels (the semiconductor films 131) controlled by the gate electrode films 134 is equal among the stacked memory cells MC. Therefore, it is possible to suppress fluctuation in a threshold voltage ($V_{th}$).

Each of the memory strings MS has a structure in which a plurality of transistors having the gate electrode films 134 formed on the charge storage layers 133 over the sides of the hollow cylindrical semiconductor films 131 are connected in series in the height direction. Among the transistors, the transistor at the upper end is the selection transistor SGS or SGD. One or more memory cell transistors MC are formed below the selection transistor SGS or SGD (on the semiconductor substrate 101 side). In the figures, four memory cell transistors MC are formed. In the second embodiment, the structure of the selection transistors SGS and SGD is the same as the structure of the memory cell transistors MC. The structure of the selection transistors SGS and SGD and the memory cell transistors MC forming the memory strings MS is the same as that in the first embodiment. Therefore, explanation of the structure is omitted. In the memory cell region 11, selection gate electrodes of the selection transistors SGS and SGD of the memory strings MS arrayed in a predetermined direction are connected to each other. Control gate electrodes of the memory cell transistors MC at the same height of the memory strings MS arrayed in the predetermined direction are connected to each other.

A pair of memory strings MS adjacent to each other in a direction crossing the gate electrode films 134 (e.g., an orthogonal direction) are connected by channel connection layers 137 formed in the interlayer dielectric film 102. The channel connection layers 137 are formed of a semiconductor material having polarity different from that of the semiconductor films 131, for example, an N-type semiconductor material such as N-type polysilicon.

In this way, in the second embodiment, the two memory strings MS connected by the channel connection layers 137 form one memory cell row. Therefore, the selection transistor of one memory string MS functions as the source-side selection transistor SGS and the selection transistor of the other memory cell string MS functions as the drain-side selection transistor SGD. The source region 111 is formed at the upper end of the semiconductor film 131 of the memory string MS in which the source-side selection transistor SGS is formed. The drain region 112 is formed at the upper end of the semiconductor film 131 of the memory string MS in which the drain-side selection transistor SGD is formed.

As a material of the semiconductor substrate 101, the spacer films 121, the semiconductor films 131, the charge storage layers 133, and the gate electrode films 134, a material same as that in the first embodiment can be used. Other components are substantially the same as those in the first embodiment. Therefore, components same as those in the first embodiment are denoted by the same reference numerals and signs and explanation of the components is omitted.

In the second embodiment, as in the first embodiment, the memory strings MS are formed such that a distance between nearest adjacent channels at a transistor forming position in the uppermost layer of the memory strings MS adjacent to each other in the word line direction (the extending direction of the gate electrode films 134) meets the relation of Formula (1).

A method of manufacturing the nonvolatile semiconductor memory device having such a structure is explained below. FIGS. 15A to 24E are schematic sectional views of an example of a procedure of a method of manufacturing the nonvolatile semiconductor memory device according to the second embodiment. Among the figures, a section in the word line direction of the memory cell region is shown in FIGS. 15A, 16A, 17*a*, 18A, 19A, 20A, 21A, 22A, 23A, and 24A. A section in a direction perpendicular to the word line direction of the memory cell region is shown in FIGS. 15B, 16B, 17B, 18B, 19B, 20B, 21B, 22B, 23B, and 24B. A plan sectional view taken along line IX-IX in FIGS. 15A, 16A, 17A, 18A, 19A, 20A, 21A, 22A, 23A, and 24A is shown in FIGS. 15C, 16C, 17C, 18C, 19C, 20C, 21C, 22C, 23C, and 24C. A plan sectional view taken along line X-X in FIGS. 15B, 16B, 17B, 18B, 19B, 20B, 21B, 22B, 23B, and 24B is shown in FIGS. 15D, 16D, 17D, 18D, 19D, 20D, 21D, 22D, 23D, and 24D. A section in the word line direction of the word-line contact region is shown in FIGS. 15E, 16E, 17E, 18E, 19E, 20E, 21E, 22E, 23E, and 24E.

First, a not-shown peripheral circuit of the nonvolatile semiconductor memory device is formed on the semiconductor substrate 101. Thereafter, as shown in FIGS. 15A to 15E, the interlayer dielectric film 102 is formed in a forming area of the memory cell region and the word-line contact region of the semiconductor substrate 101 on which the peripheral circuit is formed. Trenches 136 for forming the channel connection layers 137 are formed by the lithography technique and the RIE method. The trenches 136 are formed at length enough for connecting the two memory strings MS adjacent to each other in the bit line direction. Subsequently, after the channel connection layers 137 formed of an N-type semiconductor material are formed on the interlayer dielectric film 102 in which the trenches 136 are formed, the channel connection layers 137 are recessed by a method such as the CMP method until the interlayer dielectric film 102 is exposed. Consequently, the channel connection layers 137 are formed only in the trenches 136. As the interlayer dielectric film 102, for example, a silicon oxide film can be used. As the channel connection layers 137, a P-doped N-type polysilicon film can be used.

Thereafter, a plurality of layers of the spacer films 121 forming memory cells and the sacrificial films 122 to be removed later are alternately stacked over the entire surface of the semiconductor substrate 101 by a film forming method such as the LPCVD method. The stack ends with the spacer film 121 in the uppermost layer. The stopper film 123 functioning as a polishing stopper during CMP processing is formed on the spacer film 121 in the uppermost layer to form a stacked film. Specifically, five sacrificial films 122 are stacked. As the sacrificial films 122, a material having a large etching rate compared with the spacer films 121 in processing by etching performed later is selected. For example, as the spacer films 121, a silicon oxide film can be used. As the sacrificial films 122, a silicon nitride film can be used. As a method of forming the stacked film, besides the LPCVD method, it is possible to appropriately combine and use techniques such as the SACVD method, the PECVD method, the sputtering method, and the SOD.

Subsequently, as shown in FIGS. 16A to 18E, processing for forming the stacked film in the word-line contact region in a step shape is performed by using the lithography technique and the RIE method. The stacked film includes the first spacer film 121, the first sacrificial film 122, the second spacer film 121, the second sacrificial film 122, . . . , the fifth spacer film 121, the fifth sacrificial film 122, and the sixth spacer film 121, which are formed on the interlayer dielectric film 102 in order.

First, in FIGS. 16A to 16E, the films from the stopper film 123 to the fourth spacer film 121 are removed in an area extending from near the center of the word-line contact region to the end on the opposite side of the memory cell region. Consequently, two steps are formed. Thereafter, the word-line contact region having a structure in which the sacrificial films 122 in the respective layers are exposed in a step shape is processed by repeating the same processing twice. Specifically, the films from the stopper film 123 to the sixth spacer film 121 are removed in an area extending from near the center of a flat portion in an upper stage to a step portion formed in FIGS. 16A to 16E. At the same time, the films from the third sacrificial film 122 and the third spacer film 121 are removed in an area extending from near the center of a flat portion in a lower stage to the end on the opposite side of the memory cell region. Consequently, four steps are formed as shown in FIGS. 17A to 17E. The fifth sacrificial film 122 and the fifth spacer film 121 are removed in an area extending from near the center of a flat portion in a second stage from the top to a second step portion from the top formed in FIGS. 17A to 17E. At the same time, in flat portions in a fourth stage from the top, the sacrificial film 122 and the spacer film 122 for one layer are removed in an area extending from near the center of each of the flat portions to the end on the opposite side of the memory cell region. Consequently, six steps are formed as shown in FIGS. 18A to 18E and the word-line contact region is formed.

Subsequently, as shown in FIGS. 19A to 19E, the planarization film 141 is formed over the entire surface of the semiconductor substrate 101. As the planarization film 141, for example, a silicon oxide film can be used. Thereafter, the planarization film 141 is planarized by the CMP technique with the stopper film 123 as a polishing stopper.

Further, a not-shown mask film is formed over the entire surface of the semiconductor substrate 101. The stacked film including the spacer films 121, the sacrificial films 122, and the stopper film 123 is collectively processed by the lithography technique and the RIE method to form the through-holes 135 in the memory cell region. The through-holes 135 are arranged in a matrix shape in the memory cell region and the bottoms thereof connect with the channel connection layers 137. As the mask film, for example, a CVD carbon film can be used. After the through-holes 135 are formed, the mask film is removed. Consequently, a mold for forming the semiconductor films 131 functioning as the channels is formed.

Subsequently, as shown in FIGS. 20A to 20E, the semiconductor films 131 formed of the P-type semiconductor material functioning as the channels are formed by a film forming method such as the LPCVD method. The semiconductor films 131 are filled in the through-holes 135 and formed such that the lower ends thereof are connected to the channel connection layers 137. As the semiconductor films 131, for example, a B-doped polysilicon film can be used. The semiconductor films 131 can be completely filled in the through-holes 135 as in the first embodiment or can be deposited on the inner walls of the through-holes in a macaroni shape. It is assumed that the semiconductor films 131 are deposited in a macaroni shape.

Thereafter, the dielectric films 132 formed of a silicon oxide film or the like are formed by the ALD method to fill the inside of the semiconductor films 131 formed in the hollow macaroni shape. Subsequently, etch-back is performed by the RIE method to remove the semiconductor films 131 and the dielectric films 132 on the stopper film 123. Consequently, the cylindrical semiconductor films 131 and the dielectric films 132 remain only in the through-holes 135. Subsequently, an impurity element of a predetermined conduction type is ion-implanted in upper portions of the semiconductor films 131 by using the lithography technique and the ion implantation technique to form the source regions 111 and the drain regions 112. As the impurity element, for example, arsenic can be used.

Subsequently, as shown in FIGS. 21A to 21E, a not-shown mask film is formed over the entire surface of the semiconductor substrate 101. The stacked film and the planarization film 141 are collectively processed by the lithography technique and the RIE method to form the trenches 142. The trenches 142 have a shape extending in the word line direction to separate the semiconductor films 131 adjacent to each other in the bit line direction. As the mask film, for example, a CVD carbon film can be used. After the trenches 142 are formed, the mask film is removed.

Subsequently, as shown in FIGS. 22A to 22E, the sacrificial films 122 are selectively removed by vapor phase etching to form the hollows **122*a* among the upper and lower spacer films 121. Because the semiconductor films 131 function as columns and support the spacer films 121, the hollows 122*a* are not collapsed. When silicon oxide films are used as the spacer films 121 and silicon nitride films are used as the sacrificial films 122, fluoric acid vapor phase etching can be used such that the silicon nitride films are more selectively etched compared with the silicon oxide films. The hollows 122*a* after the sacrificial films 122** are removed function as a mold in forming a MONOS structure later.

Thereafter, as shown in FIGS. 23A to 23E, the charge storage layers 133 forming MONOS cells are formed such that the sides of the hollow cylindrical semiconductor films 131 partially covered with the spacer films 121 are covered. The charge storage layers 133 have a stacking structure of a tunnel dielectric film/a charge trapping film/a charge blocking film. As the tunnel dielectric film, for example, a thermal oxide film formed by in-situ steam generator (ISSG) oxidation can be used. As the charge trapping film, a silicon nitride film formed by the ALD method can be used. As the charge blocking film, a hafnia film formed by the ALD method can be used. At least in the memory cells at the uppermost layer adjacent to each other in an extending direction of the trenches 142 (the word line direction), parts of the charge storage layers 133 forming the MONOS cells cross in the word line direction. The relation of Formula (1) explained in the first embodiment holds at least in the transistors in the uppermost layer.

This is attained by forming the through-holes 135 shown in FIGS. 19A to 19E to meet Formula (3). Consequently, because a distance between the adjacent channels can be reduced, it is possible to realize higher bit density per memory chip area.

Further, the gate electrode films 134 are formed on the sides of the hollow cylindrical semiconductor films 131, on which the charge storage layers 133 are formed, by a film forming method such as the CVD method. Thereafter, the gate electrode films 134 formed on the bottoms of the trenches 142 and the like are recessed by the dry etching method and divided to be electrodes for the stacked transistors. As a material of the gate electrode films 134, for example, a titanium nitride/tungsten stacked film can be used. As an etching gas for dry etching, for example, diluted $ClF_3$ can be used.

Subsequently, as shown in FIGS. 24A to 24E, the interlayer dielectric film 143 is formed over the entire surface of the semiconductor substrate 101 by a film forming method such as the CVD method to fill the trenches 142. As the interlayer dielectric film 143, a TEOS/$O_3$ film can be used. The surface of the interlayer dielectric film 143 is planarized by the CMP technique.

Subsequently, the contact holes 144 connecting with the hollow cylindrical semiconductor films 131 in the memory cell region and the gate electrode films 134 in the word-line contact region are formed by the lithography technique and the RIE method. Thereafter, conductive material films are filled in the contact holes 144 by a film forming method such as the CVD method. The conductive material films are planarized by the CMP technique until the interlayer dielectric film 143 is exposed. Consequently, the contacts 145 are formed. As a material of the contacts 145, for example, tungsten can be used.

Thereafter, the wiring layers 151 to 153 and the like connected to the contacts 145 are formed via the interlayer dielectric films 161 to 163 to form a multilayer wiring layer. Consequently, the nonvolatile semiconductor memory device having the structure shown in FIGS. 14A to 14D is obtained.

According to the second embodiment, effects same as those of the first embodiment can be obtained.

Figure 25A:
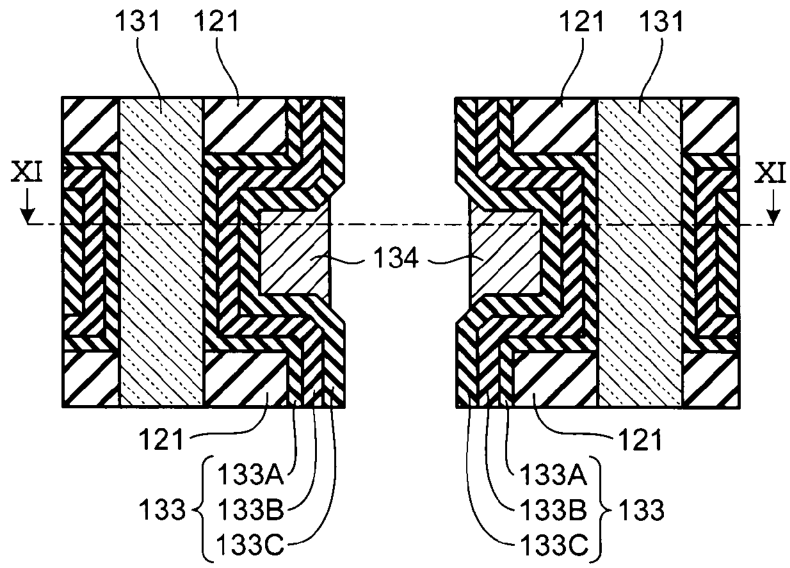
FIGS. 25A and 25B are schematic sectional views of an example of the structure of a memory cell according to the first and second embodiments.
Figure 25B:
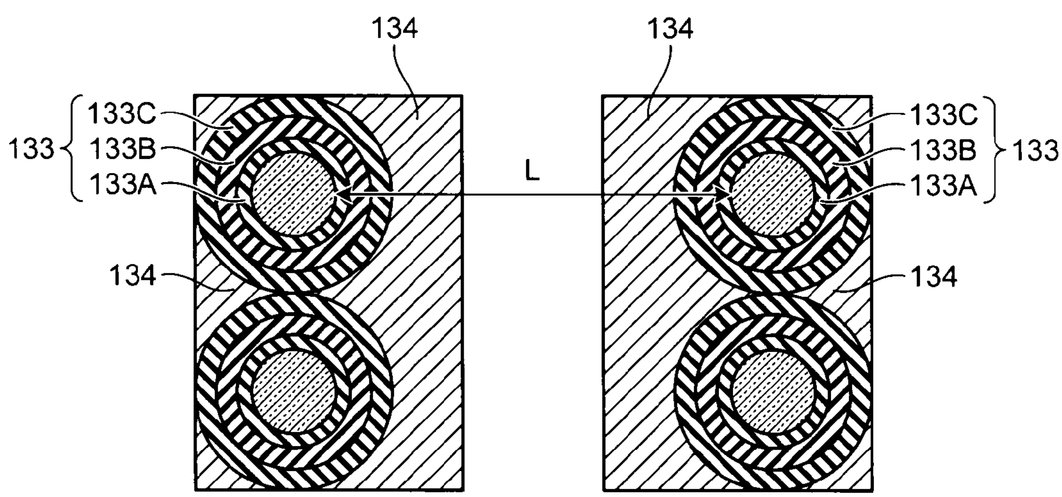
Figure 26:
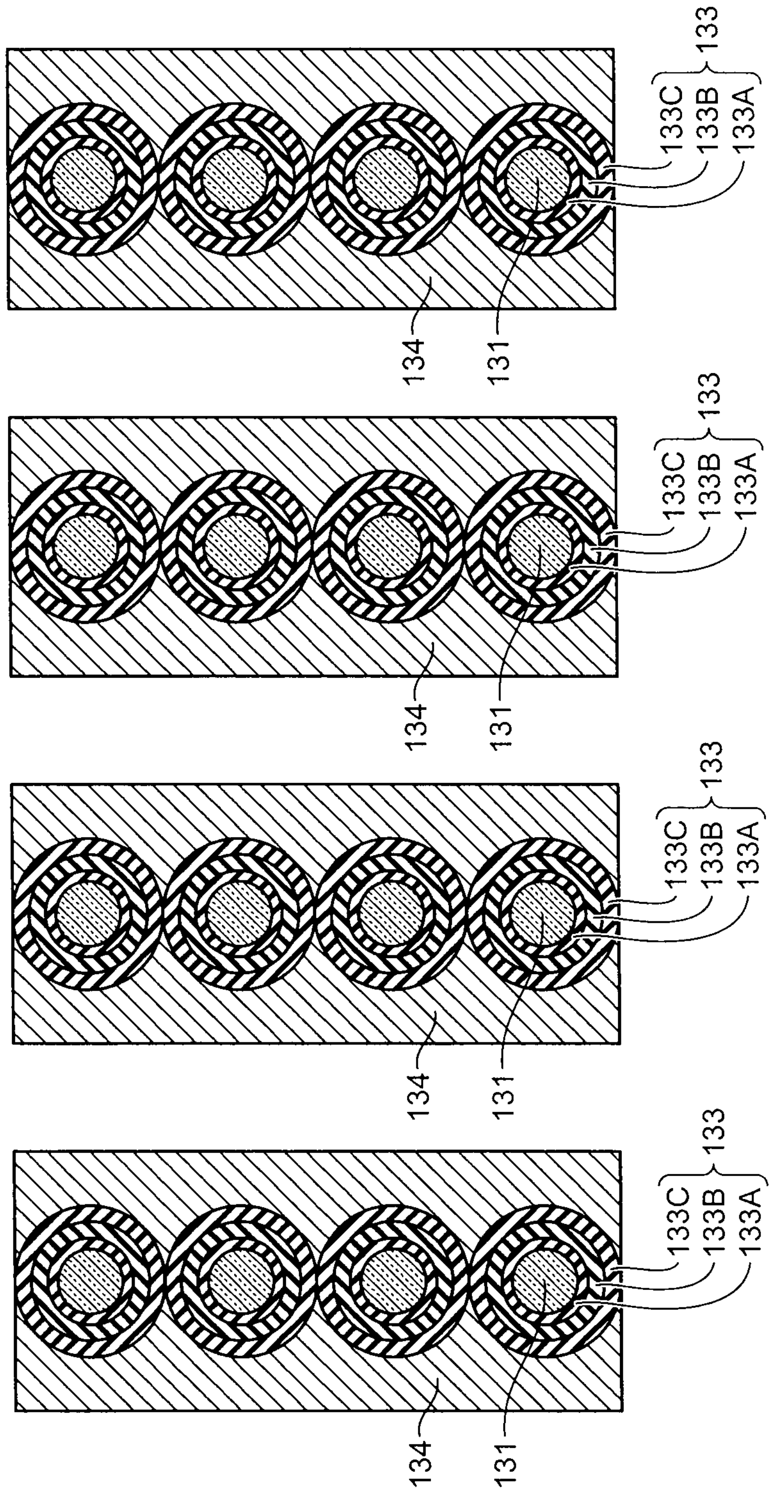
FIG. 26 is a diagram of an example of a method of arranging semiconductor films.

FIGS. 25A to 25B are schematic sectional views of an example of the structure of a memory cell of a nonvolatile semiconductor memory device according to the first and second embodiments. FIG. 25A is a partial sectional view in a bit line direction of a memory cell region. FIG. 25B is a sectional view taken along line XI-XI in FIG. 25A. FIG. 26 is a diagram of an example of a method of arranging semiconductor films.

As explained above, in the manufacturing method according to the first and second embodiments, it is necessary to perform recessing with isotropic etching after the gate electrode films 134 are filled. Therefore, when the width of the spacer films 121 is represented as $t_{Spacer}$ and the thickness of the gate electrode films 134 is represented as $t_{GATE}$, the distance L between the semiconductor films 131 adjacent to each other in the bit line direction is set as indicated by the following Formula (6):

$$L>(t_{INL}+t_{CT}+t_{CB}+t_{Spacer}+t_{GATE})\times 2 \quad (6)$$

This is because, if Formula (6) is not met, the recessing of the gate electrode film 134 between the semiconductor films 131 adjacent to each other in the bit line direction cannot be performed. Specifically, in the structure in the first and second embodiments, downsizing is possible in the word line direction but downsizing in the bit line direction is restricted. Therefore, as shown in FIG. 26, and as explained in the first and second embodiments, when Formula (1) is met in the transistor forming position in the uppermost layer, the semiconductor films 131 having on the sides thereof the charge storage layers 133 crossing in the word line direction are arranged in the bit line direction while meeting Formula (6).

Figure 27:
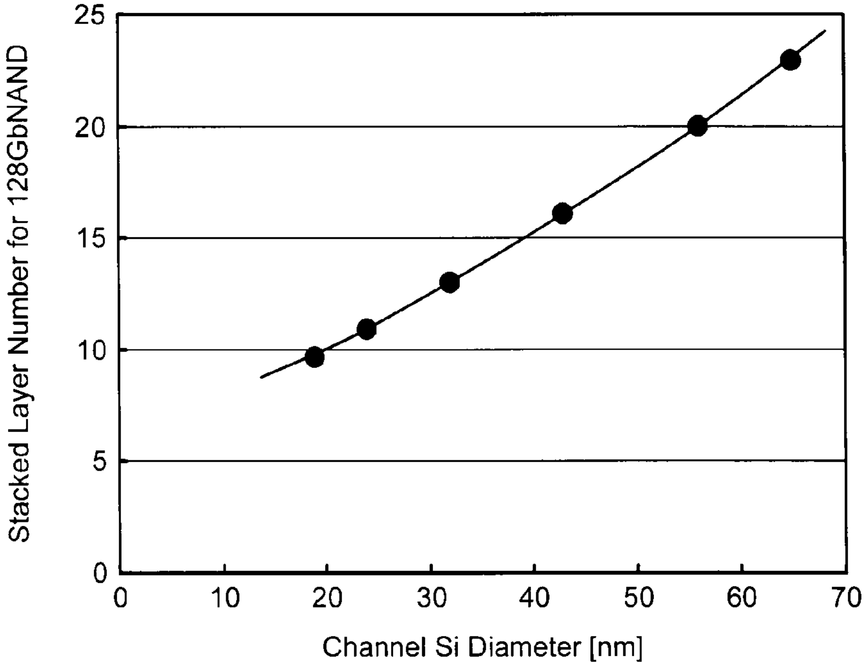
FIG. 27 is a graph of an example of a scaling scenario for the nonvolatile semiconductor memory device having the structure in the first and second embodiments.

FIG. 27 is a graph of an example of a scaling scenario of the nonvolatile semiconductor memory device having the structure in the first and second embodiments. In the figure, it is shown how the number of stacked layers for realizing 128 Gb NAND changes according to the diameter of the semiconductor films 131 functioning as the channels when dimensions in the word line direction and the bit line direction are set to minimum dimensions. Therefore, the abscissa of the figure indicates the diameter (mm) of the semiconductor films 131 functioning as the channels and the ordinate of the figure indicates the number of stacked layers of memory cells necessary for manufacturing a 128 Gb NAND flash memory. As shown in FIG. 27, it is possible to substantially suppress the number of stacked layers by downsizing the diameter of the semiconductor films 131. In particular, when the diameter of the semiconductor films 131 is set to 20 nanometers, it is possible to reduce the number of stacked layers to be equal to or smaller than ten layers.

According to a third embodiment, it is possible to reduce the number of stacked memory layers by reducing the diameter of the semiconductor films 131 functioning as the channels. Compared with a nonvolatile semiconductor memory device having a large number of stacked memory layers, it is possible to manufacture the nonvolatile semiconductor memory device in a small number of manufacturing steps. As a result, it is also possible to further improve bit density as in a 256 Gb NAND flash memory and a 1 Tb NAND flash memory.

Figure 28:
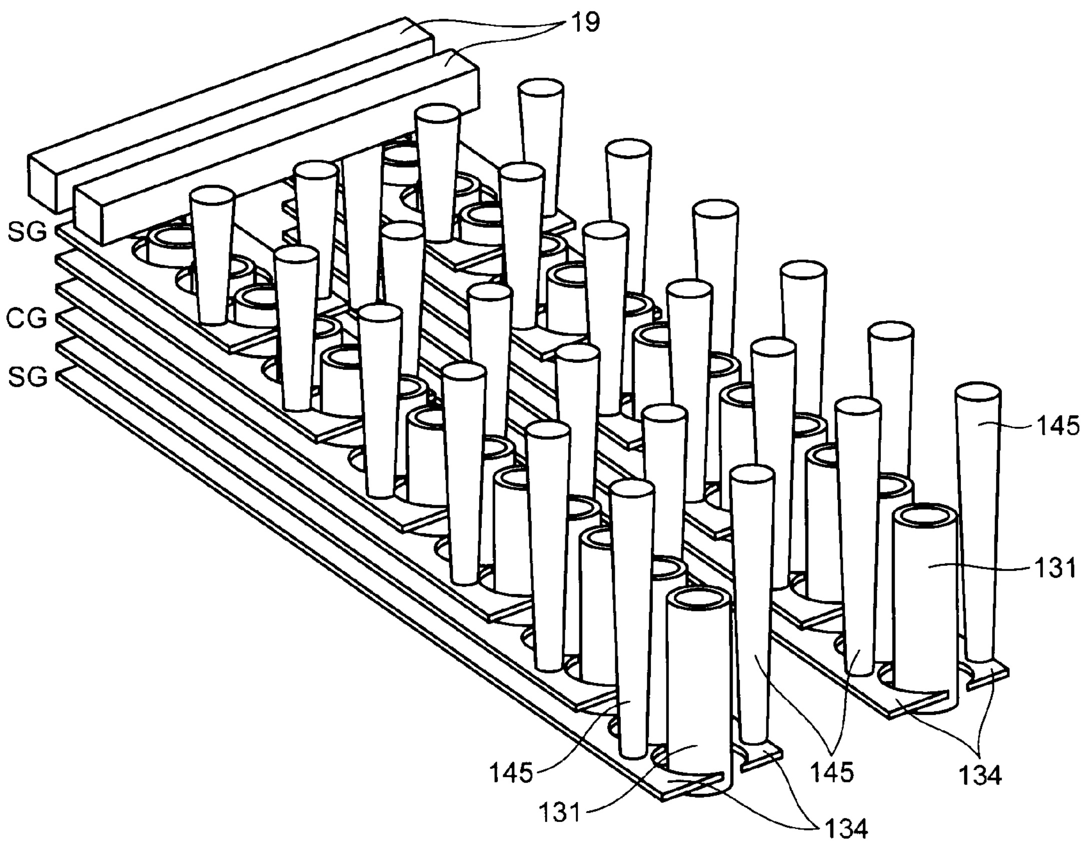
FIG. 28 is a cut-out perspective view of a part of a memory cell region and a word-line contact region of a nonvolatile semiconductor memory device according to a fourth embodiment.
Figure 29A:
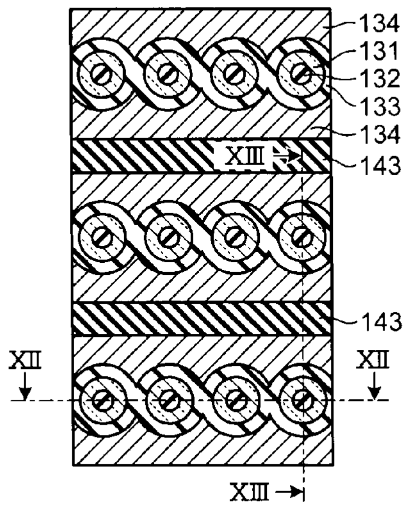
FIGS. 29A to 29E are schematic sectional views of an example of the configuration of the nonvolatile semiconductor memory device according to the fourth embodiment.
Figure 29B:
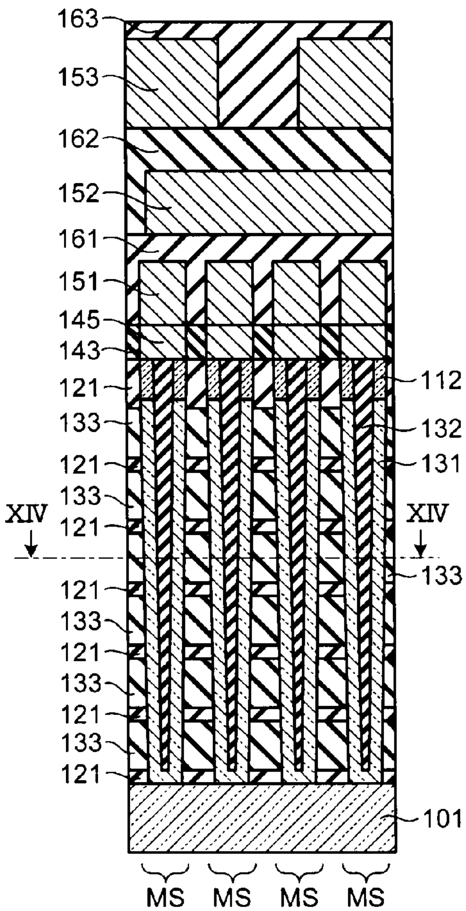
Figure 29C:
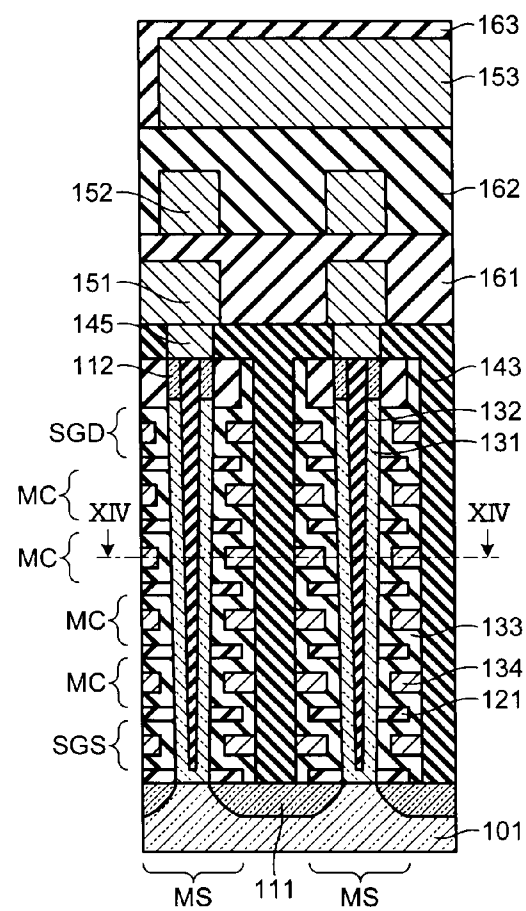
Figure 29D:
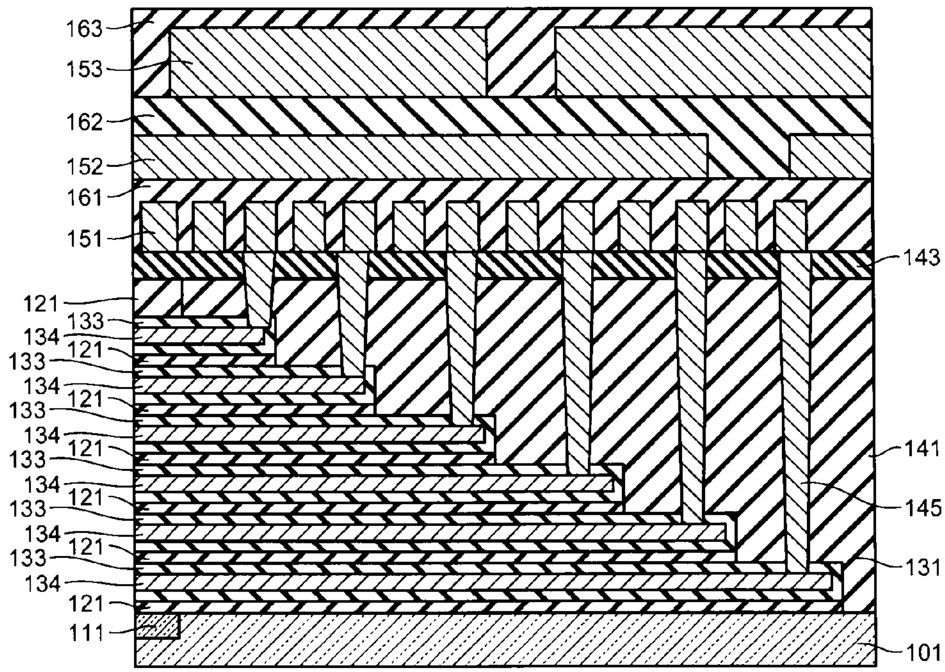
Figure 29E:
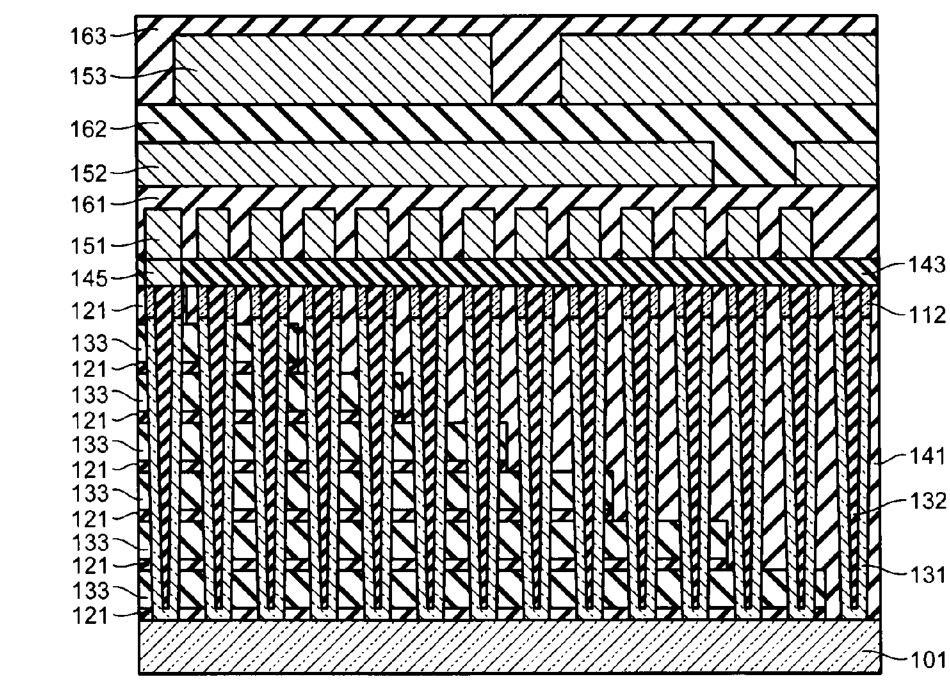
Figure 30A:
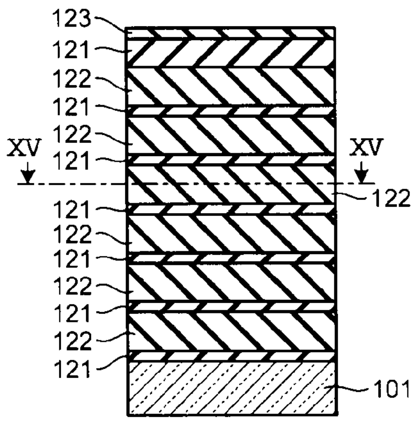
FIGS. 30A to 37F are schematic sectional views of an example of a procedure of a method of manufacturing the nonvolatile semiconductor memory device according to the fourth embodiment.
Figure 30B:
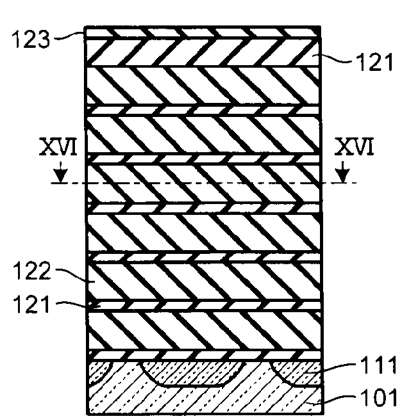
Figure 30C:
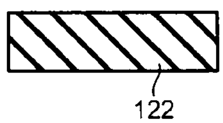
Figure 30D:
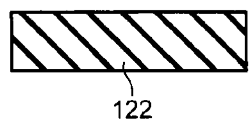
Figure 30E:
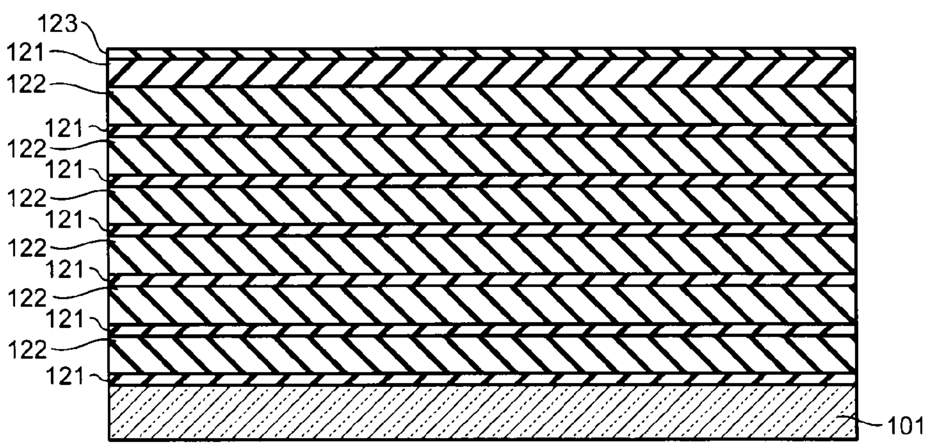
Figure 30F:
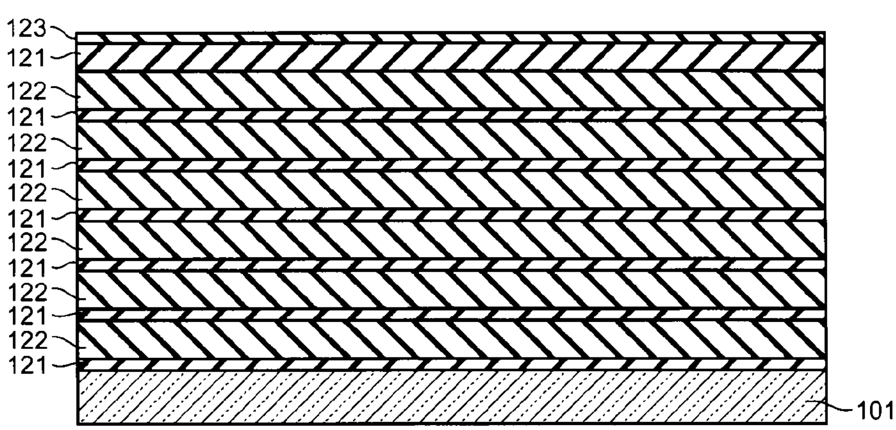
Figure 31A:
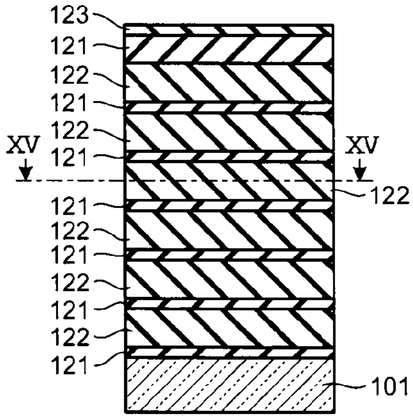
Figure 31B:
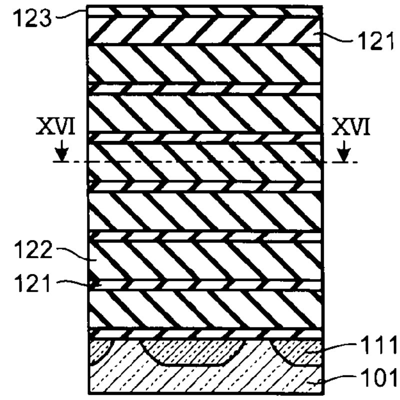
Figure 31C:
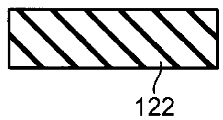
Figure 31D:
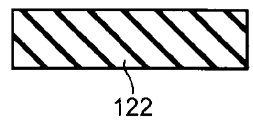
Figure 31E:
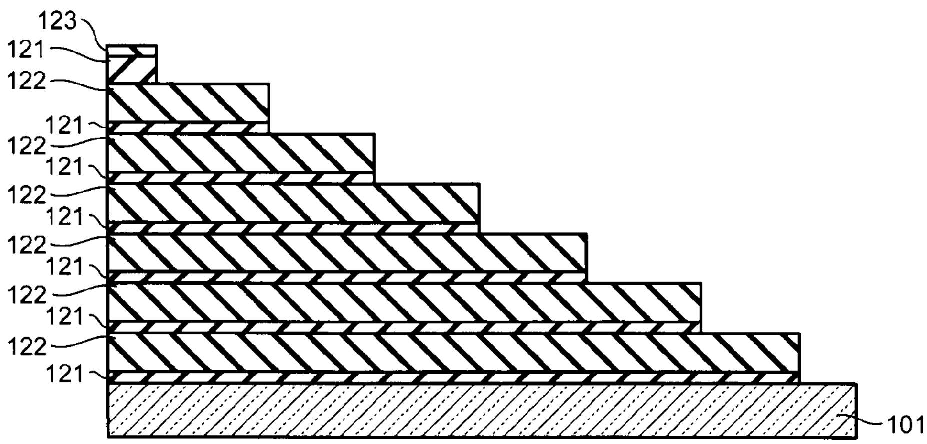
Figure 31F:
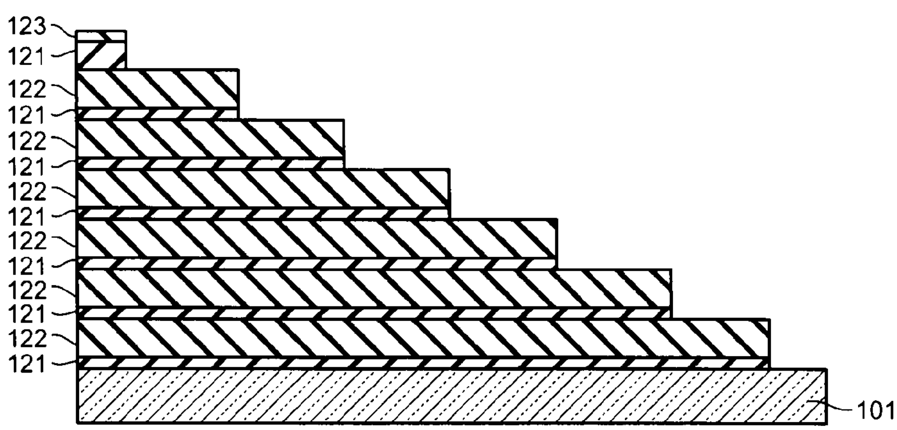

FIG. 28 is a cut-out perspective view of a part of a memory cell region and a word-line contact region of a nonvolatile semiconductor memory device according to a fourth embodiment. FIGS. 29A to 29E are schematic sectional views of an example of the configuration of the nonvolatile semiconductor memory device according to the fourth embodiment. FIG. 29A is a plan sectional view of the memory cell region. FIG. 29B is a sectional view taken along line XII-XII in FIG. 29A. FIG. 29C is a sectional view taken along XIII-XIII in FIG. 29A. FIG. 29D is a sectional view in a direction perpendicular to a bit line direction in a contact forming position of the word-line contact region. FIG. 29E is a sectional view in the direction perpendicular to the bit line direction in a position corresponding to a forming position of memory strings of the word-line contact region. FIG. 29A is equivalent to a section taken along line XIV-XIV in FIGS. 29B and 29C.

In the fourth embodiment, transistors formed at respective heights of the memory strings MS have a structure in which the gate electrode films 134 arranged via the charge storage layers 133 are independent from one another on both sides in the bit line direction across the semiconductor films 131. Specifically, the independent two gate electrode films 134 are arranged at the same height of the semiconductor films 131, whereby bit density is doubled compared with the structures in the first to third embodiments.

To obtain such a structure, as shown in FIG. 28, FIGS. 29A to 29C, and FIG. 29E, the structure in the memory cell region 11 is the same as that in the first embodiment except that the memory strings MS are formed of the columnar (hollow cylindrical) semiconductor films 131 and the inside of the semiconductor films 131 are filled with the dielectric films 132. However, the shape of the word-line contact region 20 is formed to divide the gate electrode film 134 extending from the memory cell region 11 into two in one memory string MS. Specifically, the hollow cylindrical semiconductor films 131 are arranged to be extended to the word-line contact region 20. In the word-line contact region 20, the semiconductor films 131 adjacent to each other in the word line direction are arranged to meet the relation of Formula (1) explained in the first embodiment at the heights of formation of all the gate electrode films 134. Consequently, the gate electrode film 134 cannot enter between the semiconductor films 131 adjacent to each other in the word line direction. This makes it possible to electrically separate the two gate electrode films 134 formed on both the sides in the bit line direction across the semiconductor films 131. The semiconductor films 131 arranged in the word-line contact region 20 do not form the memory strings MS and are dummy semiconductor films 131 for simply separating the gate electrode films 134 arranged on both the sides in the bit line direction across the semiconductor films 131.

As shown in FIGS. 28 and 29D, to connect the two gate electrode films 134 of the memory cells MC formed at certain height of the memory strings MS or the selection transistors SGS and SGD and a not-shown word-line driving circuit or selection-gate-line driving circuit, in the word-line contact region 20, one contact 145 is provided on each of both the sides in the bit line direction of the dummy semiconductor films 131. Components same as those in the first embodiment are denoted by the same reference numerals and signs and explanation of the components is omitted.

A method of manufacturing the nonvolatile semiconductor memory device having such a structure is explained below. FIGS. 30A to 37E are schematic sectional views of an example of a procedure of a method of manufacturing the nonvolatile semiconductor memory device according to the fourth embodiment. Among the figures, a section in the word line direction of the memory cell region is shown in FIGS. 30A, 31A, 32A, 33A, 34A, 35A, 36A, and 37A. A section in a direction perpendicular to the word line direction of the memory cell region is shown in FIGS. 30B, 31B, 32B, 33B, 34B, 35B, 36B, and 37B. A plan sectional view taken along line XV-XV in FIGS. 30A, 31A, 32A, 33A, 34A, 35A, 36A, and 37A is shown in FIGS. 30C, 31C, 32C, 33C, 34C, 35C, 36C, and 37C. A plan sectional view taken along line XVI-XVI in FIGS. 30B, 31B, 32B, 33B, 34B, 35B, 36B, and 37B is shown in FIGS. 30D, 31D, 32D, 33D, 34D, 35D, 36D, and 37D. A section in the word line direction in a contact forming position of the word-line contact region is shown in FIGS. 30E, 31E, 32E, 33E, 34E, 35E, 36E, and 37E. A sectional view in the word line direction in a dummy cell forming position of the word-line contact region is shown in FIGS. 30F, 31F, 32F, 33F, 34F, 35F, 36F, and 37F.

First, a not-shown peripheral circuit of the nonvolatile semiconductor memory device is formed on the semiconductor substrate 101. As shown in FIGS. 30A to 30F, impurities of a predetermined conduction type are implanted in the memory cell region of the semiconductor substrate 101 by an ion implantation method and activated to form the source regions 111. The source regions 111 can be, for example, N type source regions.

Subsequently, a plurality of the spacer films 121 forming memory cells and sacrificial films 122 are alternately stacked over the entire surface of the semiconductor substrate 101 by a film forming method such the PECVD method. The stack ends with the spacer film 121. The stopper film 123 functioning as a polishing stopper during CMP processing is formed on the spacer film 121 in the uppermost layer to form a stacked film. Specifically, six sacrificial films 122 are stacked. As a material of the sacrificial films 122, a material having a large etching rate compared with the spacer films 121 in processing by wet etching performed later is selected. For example, as the spacer films 121, a silicon oxide film can be used. As the sacrificial films 122, for example, a silicon nitride film can be used. As the stopper film 123, for example, a silicon nitride film can be used. As a method of forming the stacked film, besides the PECVD method, it is also possible to appropriately combine and use techniques such as the SACVD method, the LPCVD method, the sputtering method, and the SOD.

Subsequently, as shown in FIGS. 31A to 31F, processing for forming the stacked film in the word-line contact region in a step shape is performed by using the lithography technique and the RIE method to form the word-line contact region having a structure in which the sacrificial films 122 in the respective layers are exposed in a step shape. The formation of the step-like word-line contact region is performed by a method same as the method explained with reference to FIGS. 7A to 9E in the first embodiment.

Thereafter, as shown in FIGS. 32A to 32F, the planarization film 141 is formed over the entire surface of the semiconductor substrate 101. As the planarization film 141, for example, a silicon oxide film can be used. Thereafter, the planarization film 141 is planarized by the CMP technique until the stopper film 123 is exposed.

Figure 32A:
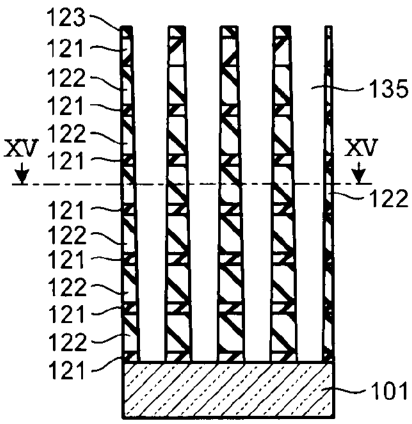
Figure 32B:
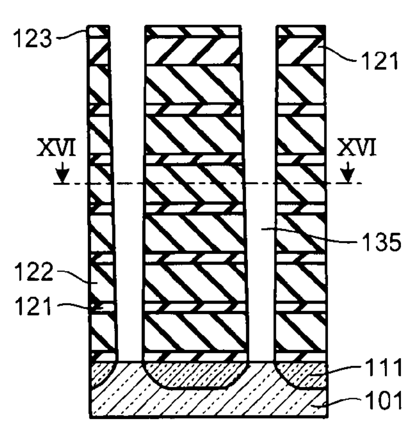
Figure 32C:
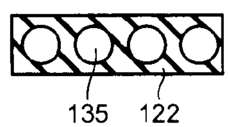
Figure 32D:
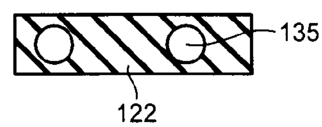
Figure 32E:
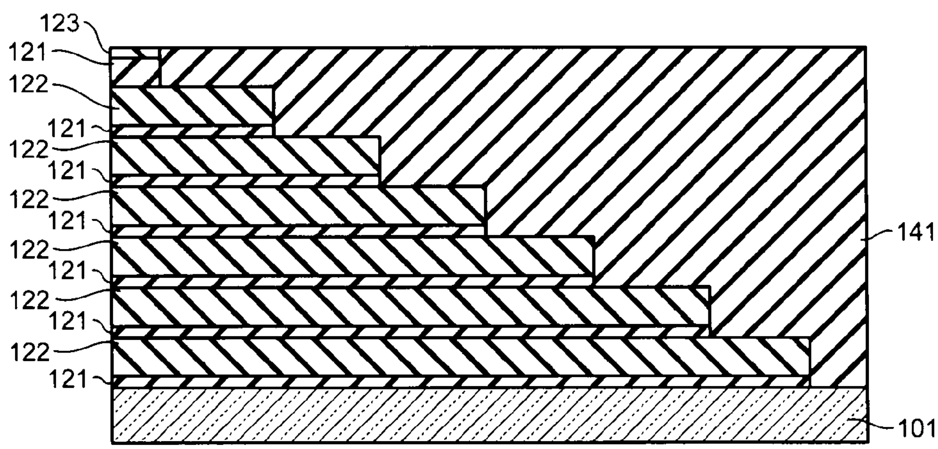
Figure 32F:
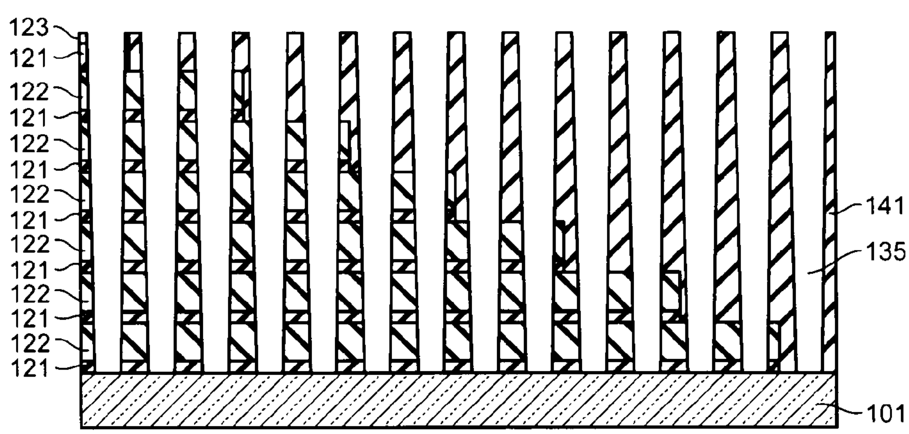
Figure 33A:
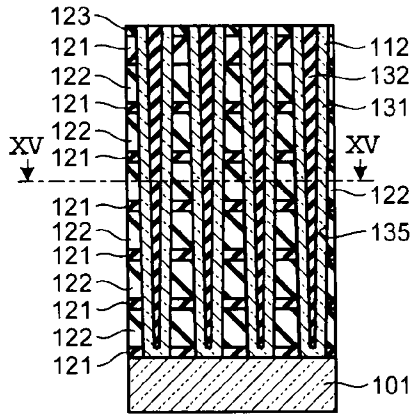
Figure 33B:
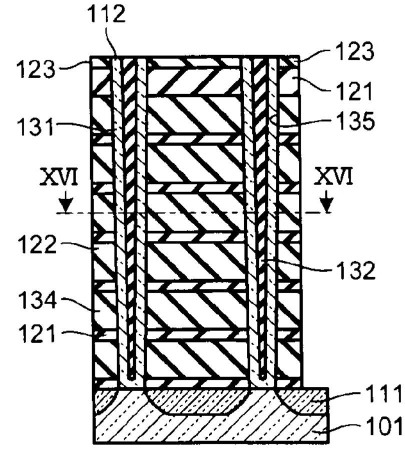
Figure 33C:
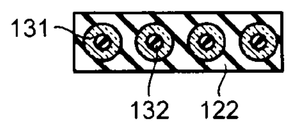
Figure 33D:
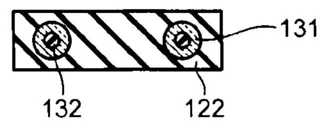
Figure 33E:
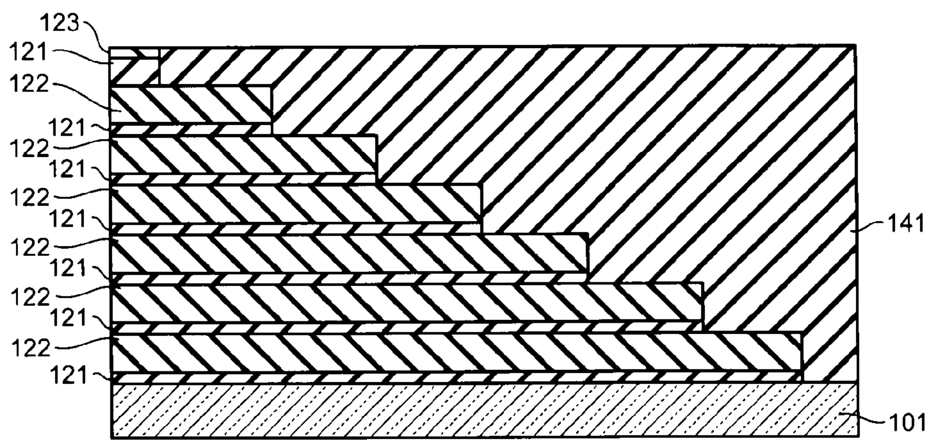
Figure 33F:
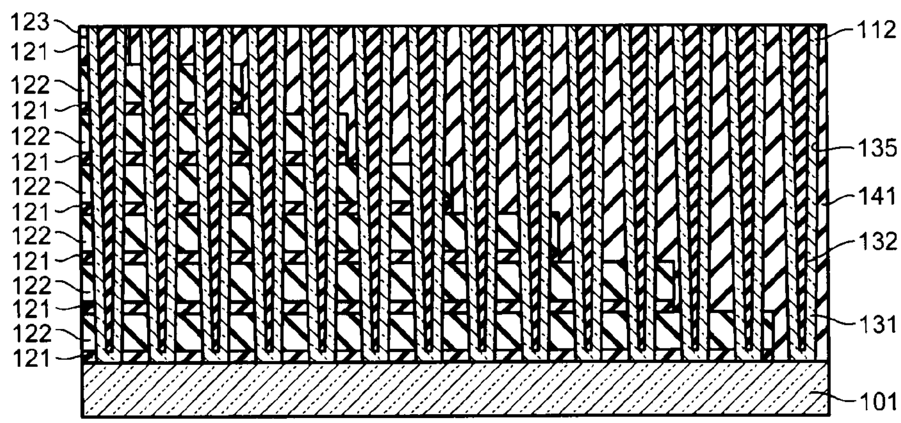
Figure 34A:
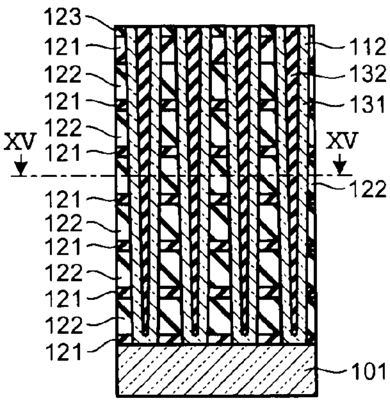
Figure 34B:
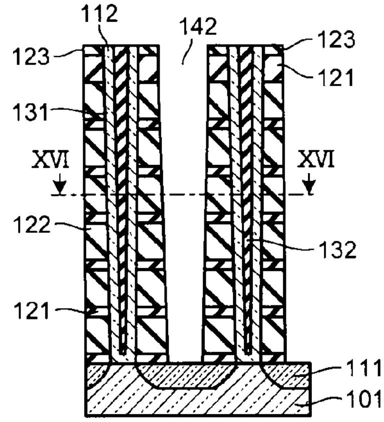
Figure 34C:
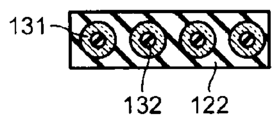
Figure 34D:
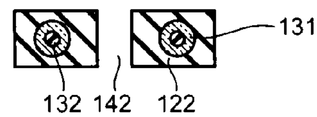
Figure 34E:
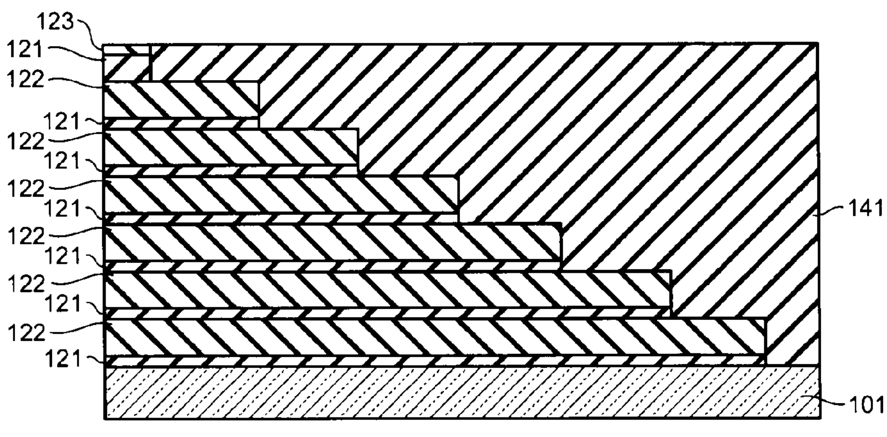
Figure 34F:
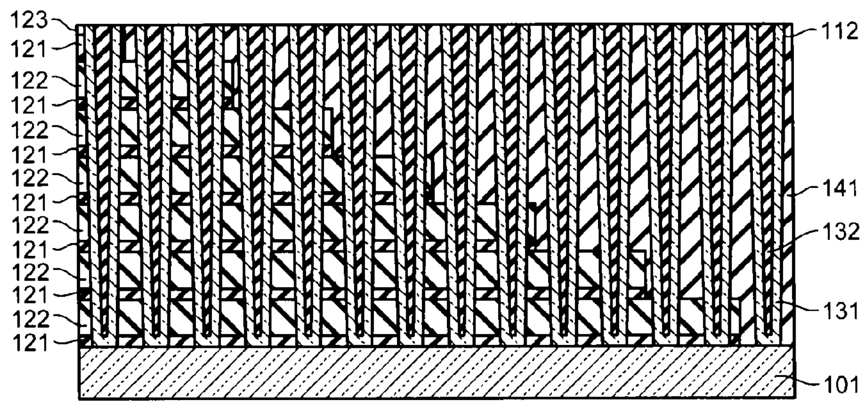
Figure 35A:
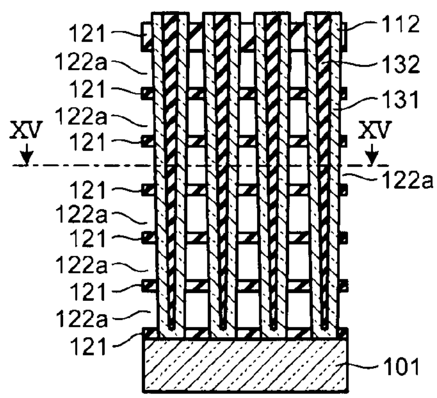
Figure 35B:
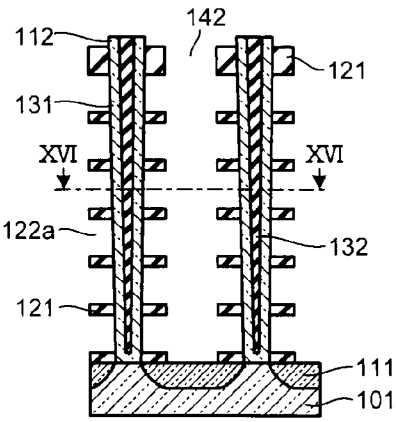
Figure 35C:
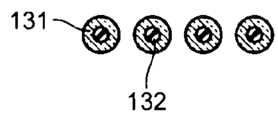
Figure 35D:
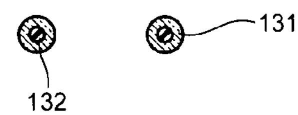
Figure 35E:
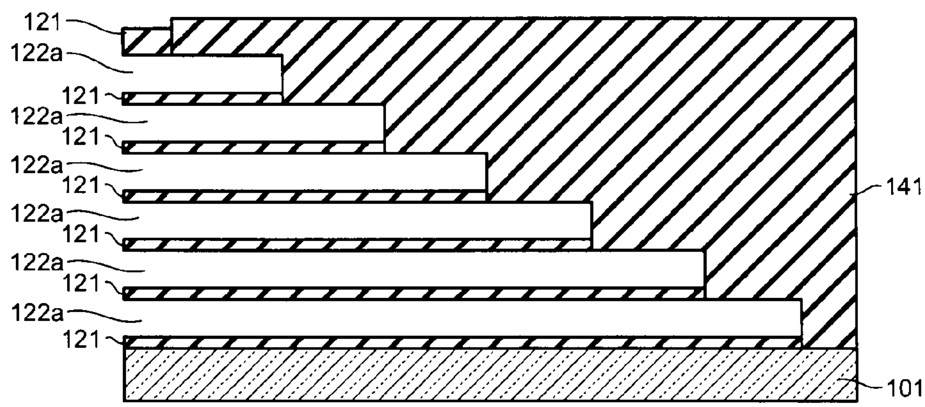
Figure 35F:
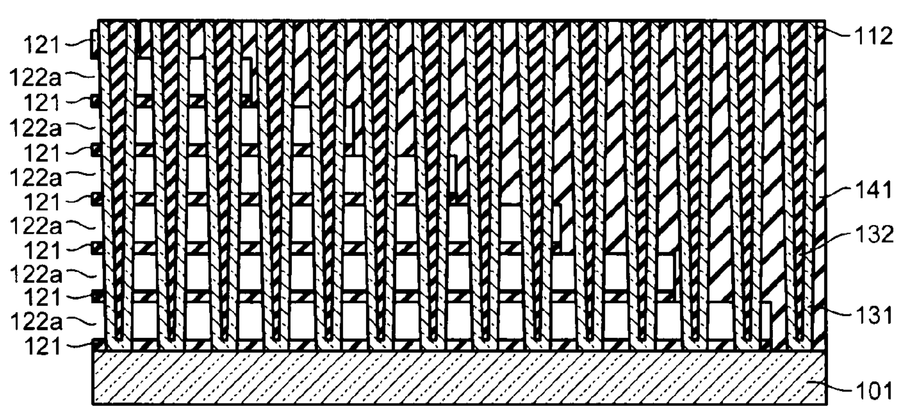
Figure 36A:
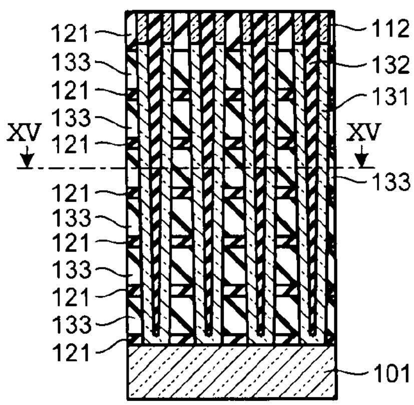
Figure 36B:
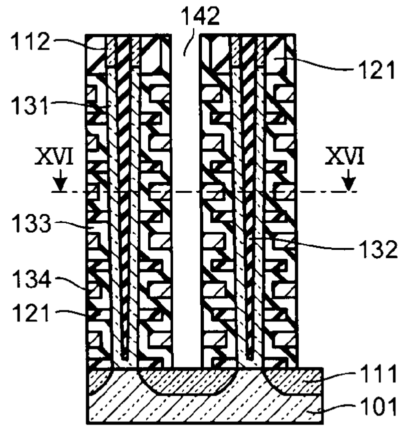
Figure 36C:
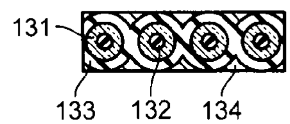
Figure 36D:
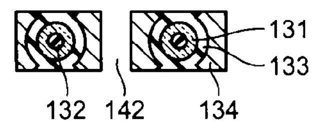
Figure 36E:
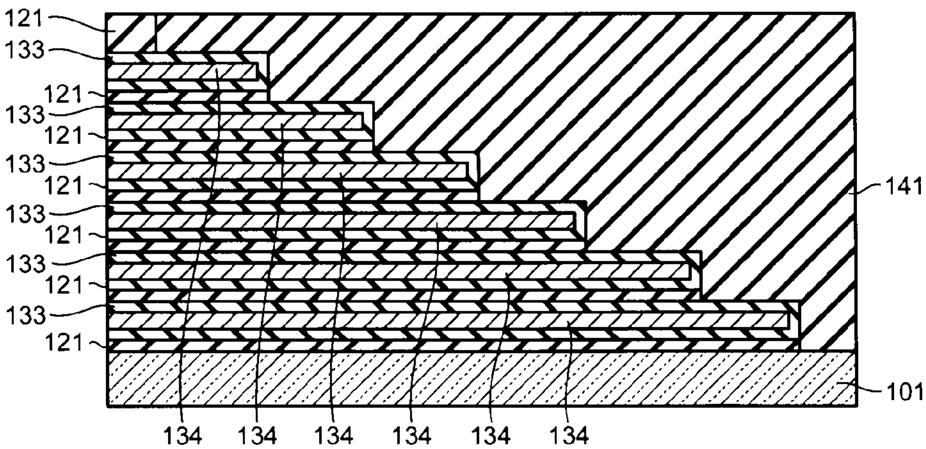
Figure 36F:
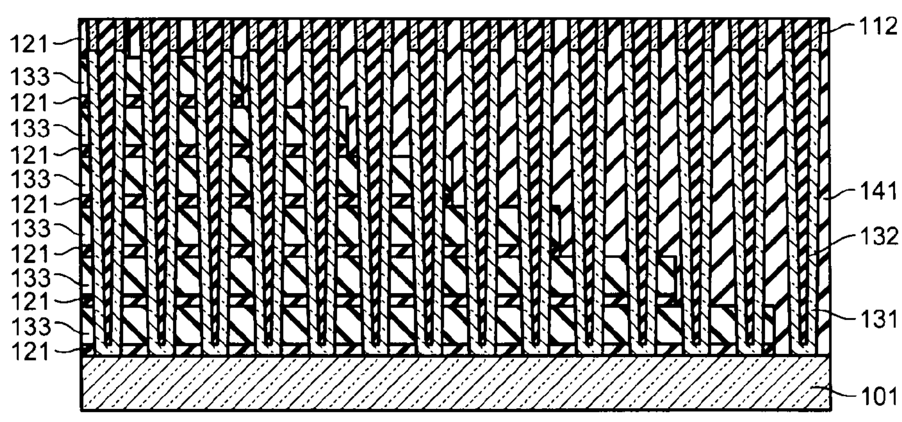
Figure 37A:
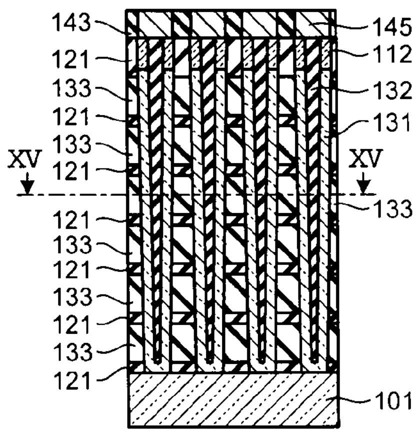
Figure 37B:
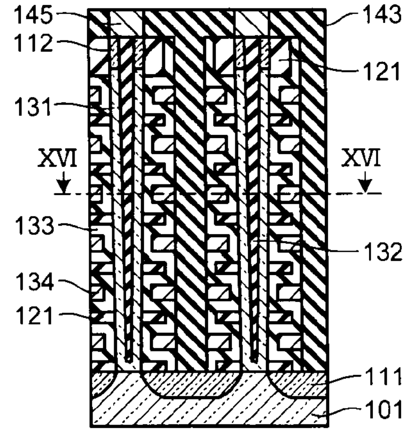
Figure 37C:
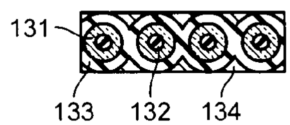
Figure 37D:
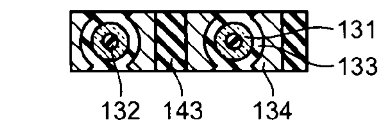
Figure 37E:
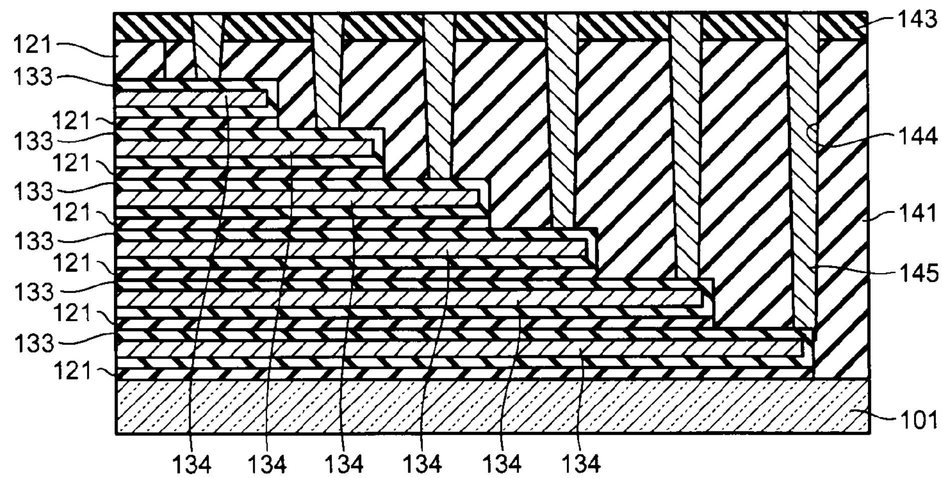
Figure 37F:
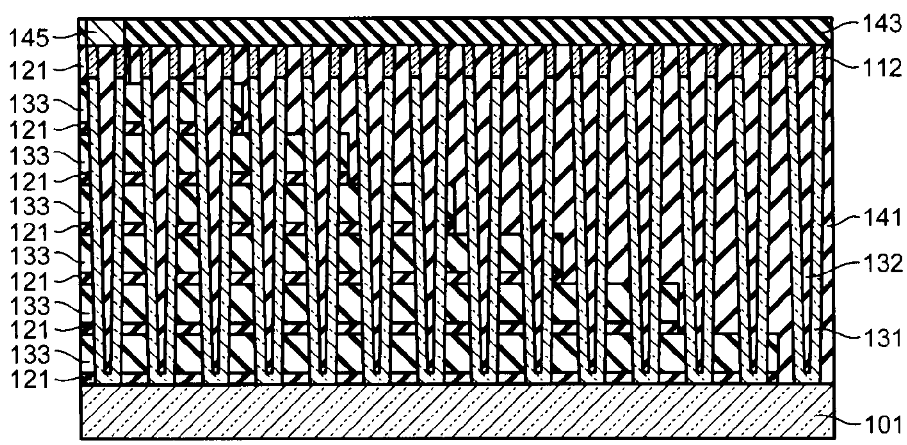

Subsequently, a not-shown mask film is formed over the entire surface of the stopper film 123. The stacked film in the memory cell region and the word-line contact region is collectively processed by the lithography technique and RIE method to form the through-holes 135 connecting with the semiconductor substrate 101. As the mask film, for example, a CVD carbon film can be used. As shown in FIG. 32F, unlike the first embodiment, the through-holes 135 are also formed at the same density in the word-line contact region in which it is unnecessary to form channels. Subsequently, the mask film is removed to form a mold of a channel semiconductor.

Subsequently, as shown in FIGS. 33A to 33F, the semiconductor films 131 functioning as the channels are formed by a film forming method such as the LPCVD method. The semiconductor films 131 are deposited in the through-holes 135 and formed such that the lower ends thereof are connected to the semiconductor substrate 101. As the semiconductor films 131, for example, a B-doped polysilicon film can be used. The concentration of B can be set to, for example, $1\times10^{17}$ to $1\times10^{18}$ $cm^{-3}$. The semiconductor films 131 are formed to be deposited in a macaroni shape along the inner surfaces of the through-holes 135. When the semiconductor films 131 are deposited in a macaroni shape, the thickness of the semiconductor films 131 controlled by the gate electrode films 134 is equal among the stacked memory cells MC. Therefore, it is possible to reduce fluctuation in transistor characteristics among the memory cells MC. Interference among the memory cells MC in independently writing electrons in the memory cells MC on both sides of one channel (semiconductor film) less easily occurs.

Further, the dielectric films 132 formed of a silicon oxide film or the like are formed to fill the inside of the hollow cylindrical semiconductor films 131 by the ALD method. Thereafter, etch-back is performed by a method such as the RIE method to remove the semiconductor films 131 and the dielectric films 132 above the stopper film 123. Consequently, the hollow cylindrical semiconductor films 131 and the dielectric films 132 remain only in the through-holes 135. Subsequently, an impurity element of a predetermined conduction type is ion-implanted in upper portions of the semiconductor films 131 by using the lithography technique and the ion implantation technique to form the drain regions 112. As the impurity element, for example, arsenic can be used.

Thereafter, as shown in FIGS. 34A to 34F, a not-shown mask film is formed over the entire surface of the semiconductor substrate 101. The stacked film and the planarization film 141 are collectively processed by the lithography technique and the RIE method to form the trenches 142. The trenches 142 have a shape extending in the word line direction to separate the semiconductor films 131 adjacent to each other in the bit line direction. As the mask film, for example, a CVD carbon film can be used. After the trenches 142 are formed, the mask film is removed.

Subsequently, as shown in FIGS. 35A to 35F, the sacrificial films 122 are selectively removed by wet etching, whereby hollows 122*a* are formed among the upper and lower spacer films 121. Because the semiconductor films 131 function as columns and support the spacer films 121, the hollows 122*a* are not collapsed. When silicon oxide films are used as the spacer films 121 and silicon nitride films are used as the sacrificial films 122, as a chemical for the wet etching, for example, hot phosphoric acid can be used such that the silicon nitride films are more selectively etched compared with the silicon oxide films. The hollows 122*a* after the sacrificial films 122 are removed function as a mold in forming a MONOS structure later.

Thereafter, as shown in FIGS. 36A to 36F, the charge storage layers 133 forming MONOS cells are formed by a film forming method such as the CVD method such that the sides of the columnar semiconductor films 131 partially covered with the spacer films 121 are covered. The charge storage layers 133 have a stacking structure of a tunnel dielectric film/a charge trapping film/a charge blocking film. As the tunnel dielectric film, for example, an ONO film formed by the LPCVD method can be used. As the charge trapping film, a silicon nitride film formed by the ALD method can be used. As the charge blocking film, an alumina film formed by the ALD method can be used. In the transistors adjacent to each other in an extending direction of the trenches 142 (the word line direction), parts of the charge storage layers 133 forming the MONOS cells cross in the word line direction. The relation of Formula (1) holds in all the transistors on the memory strings MS.

This is attained by forming the through-holes 135 formed in FIGS. 32A to 32F to meet Formula (3) explained in the first embodiment at all depths. In two memory cells adjacent to each other in the word line direction, parts of charge blocking films cross (merge) in the adjacent memory cells. Consequently, it is possible to reduce a distance between the adjacent semiconductor films 131.

Further downsizing is possible by crossing even the charge trapping films among transistors adjacent to one another. However, this is undesirable because, if the charge trapping films are crossed, it is likely that charges stored in the charge trapping films leak to the adjacent transistors via crossing sections. Therefore, when processing accuracy of the through-holes 135 is taken into account, it is possible to more surely cross the charge blocking films among the adjacent transistors by increasing the thickness of the charge blocking films. Therefore, it is desirable to adopt a high dielectric material such as alumina, hafnia, or zirconia as the charge blocking films.

Further, the gate electrode films 134 are formed on the sides of the columnar semiconductor films 131, in which the charge storage layers 133 are formed, by a film forming method such as the CVD method. Thereafter, the gate electrode films 134 formed on the bottoms of the trenches 142 and the like are recessed by the dry etching method and divided to be electrodes for the stacked transistors. As a material of the gate electrode films 134, for example, tungsten can be used. As an etching gas for dry etching, for example, $NF_3$ can be used.

Figure 38:
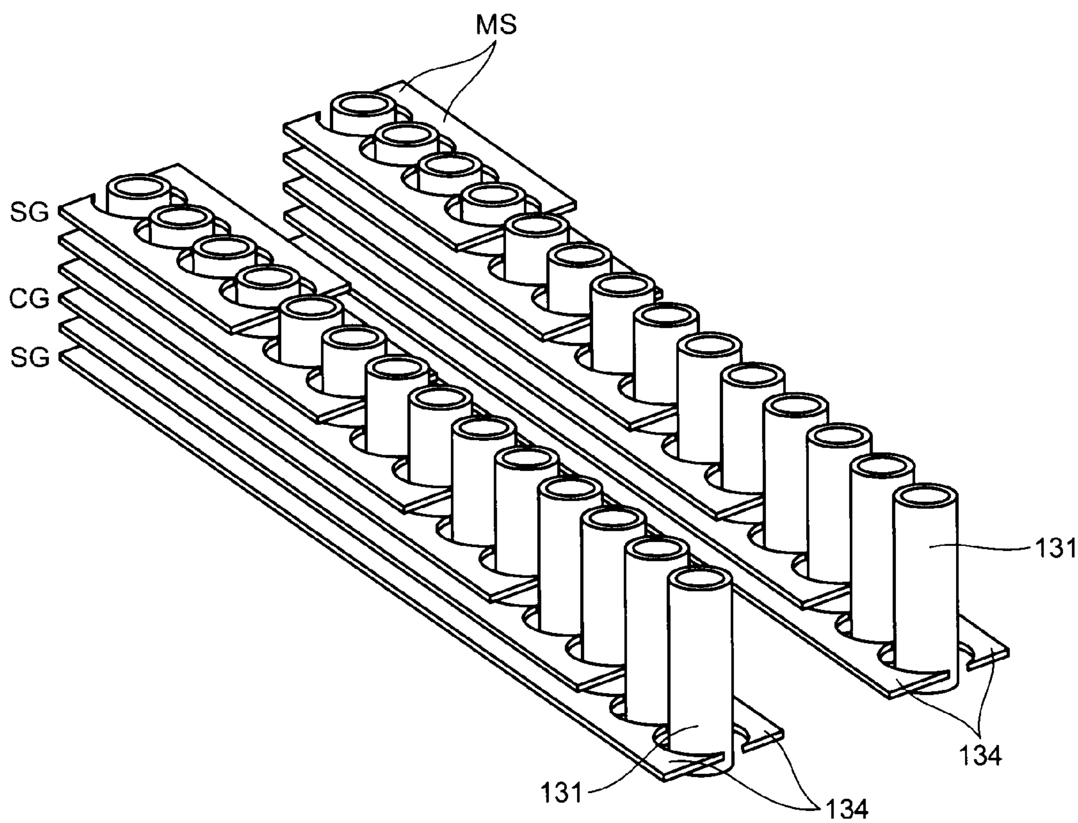
FIG. 38 is a schematic partial perspective view of states of the memory cell region and the word-line contact region in a state in which charge storage layers and gate electrode films are formed in semiconductor films.

FIG. 38 is a schematic partial perspective view of states of the memory cell region and the word-line contact region in a state in which charge storage layers and gate electrode films are formed in semiconductor films. When the gate electrode films 134 are formed, the charge storage layers 133 are formed in spaces among the memory strings MS in the word line direction such that a part of the charge storage layers 133 is shared among the transistors adjacent to one another. Therefore, the gate electrode films 134 are not formed. Specifically, the two gate electrode films 134 formed on both the sides in the bit line direction across the semiconductor films 131 are not physically connected and are formed independently from each other.

In this way, among the transistors adjacent to one another at all the heights of the memory strings MS, a part of the charge blocking films crosses the adjacent transistors. Therefore, it is possible to automatically divide the gate electrode films 134 across the semiconductor films 131 and cause the gate electrode films 134 to function as independent electrodes. In other words, an additional processing step for dividing, in the bit line direction, the gate electrode films 134 formed at the same height of the semiconductor films 131 is unnecessary. Therefore, dummy cells are also provided in the word-line contact region, in which memory cells are not originally provided, to completely divide the gate electrode films 134 in the memory cell region and the word-line contact region.

In the structure in the fourth embodiment, electrodes are formed only on one side of the cylindrical channels (the semiconductor films 131). Only the one side of the cylindrical channels is used as a memory. However, because the memory cells are junction-free inversion-type cells, only the one side of cylindrical channel silicon is inverted and used as channels without any problem in transistor operation.

The gate electrode films 134 for six layers are collectively formed as explained above. The first and sixth gate electrode films 134 from the top are selection gate electrodes (SG). The second to fifth electrodes from the top are control gate electrodes (CG) functioning as word lines.

Subsequently, as shown in FIGS. 37A to 37F, the interlayer dielectric film 143 is formed over the entire surface of the semiconductor substrate 101 by a film forming method such as the CVD method to fill the trenches 142. As the interlayer dielectric film 143, a TEOS/$O_3$ film can be used. The surface of the interlayer dielectric film 143 is planarized by the CMP technique.

Subsequently, contact holes 144 connecting with the columnar semiconductor films 131 in the memory cell region and the gate electrode films 134 in the word-line contact region are formed by the lithography technique and the RIE method. Thereafter, conductive material films are filled in the contact holes 144 by a film forming method such as the CVD method. The conductive material films are planarized by the CMP technique until the interlayer dielectric film 143 is exposed. Consequently, the contacts 145 are formed. As a material of the contacts 145, for example, tungsten can be used.

Thereafter, the wiring layers 151 to 153 and the like connected to the contacts 145 are formed via the interlayer dielectric films 161 to 163 to form a multilayer wiring layer. Consequently, the nonvolatile semiconductor memory device having the structure shown in FIGS. 29A to 29E is obtained.

In the fourth embodiment, the hollow cylindrical semiconductor films 131 are formed in the memory cell region and the word-line contact region such that Formula (1) is met in the forming positions of all the transistors in the height direction of the memory strings MS. Therefore, the two gate electrode films 134 physically (electrically) divided in the bit line direction are formed in the forming positions of the transistors of the semiconductor films 131. There is an effect that it is possible to attain double bit density compared with the first to third embodiments.

In the structure of the fourth embodiment, as in the first to third embodiments, it is possible to reduce the distance between the semiconductor films 131 to be close to a processing limit. Therefore, it is possible to substantially reduce a memory cell pitches in the bit line and word line directions compared with the structure in the past in which the gate electrode films are inserted among the adjacent semiconductor films. For example, when the diameter of the semiconductor films 131 (the outer diameter of the hollow cylindrical semiconductor films 131) is set 50 nanometers and the thickness of the charge storage layers 133 forming MONOS cells is 25 nanometers, in the structure in the past in which the gate electrode film 134 is inserted between the semiconductor films 131 adjacent to each other in the word line direction, the memory cell pitch in the word line direction is calculated by the following Formula (7):

$$\text{Memory cell pitch in the word line direction} = \text{charge storage layer thickness} + \text{semiconductor film diameter} + \text{charge storage layer thickness} + \text{gate electrode film width restricted by processing conditions} = 25\text{ nm} + 50\text{ nm} + 25\text{ nm} + 50\text{ nm} = 150\text{ nm} \quad (7)$$

The memory cell pitch in the bit line direction is calculated by the following Formula (8):

Memory cell pitch in the bit line direction=gate electrode film width restricted by processing conditions+charge storage layer thickness+semiconductor film diameter+charge storage layer thickness+gate electrode film width restricted by processing conditions+gate electrode film interval restricted by processing conditions=25 nm+25 nm+50 nm+25 nm+25 nm+50 nm=200 nm (8)

When a cell area of the structure in the past is calculated by using Formulas (7) and (8), it is seen that an area of about 30,000 $nm^2$ is necessary.

On the other hand, in the structure of the fourth embodiment, the memory cell pitch in the word line direction is calculated by the following Formula (9):

Memory cell pitch in the word line direction=semiconductor film diameter+total of thicknesses of the tunnel dielectric film and the charge trapping film in the charge storage layer+total of thicknesses of the tunnel dielectric film and the charge trapping film in the charge storage layer+distance between nearest charge trapping films=50 nm+10 nm+10 nm+5 nm=75 nm (9)

The memory cell pitch in the bit line direction is, as in the structure in the past, 200 nanometers calculated from Formula (8). In the fourth embodiment, with the fact that the both the sides of the semiconductor films 131 are used as separate memory cells taken into account, a cell area in the fourth embodiment is calculated by the following Formula (10) using Formulas (8) and (9):

Cell area=pitch in the word line direction×pitch in the bit line direction×½=75 nm×200 nm×½=7,500 $nm^2$ (10)

In this way, with the structure in the fourth embodiment, it is expected that the cell area can be reduced to about a quarter of that in the related art. This indicates that about quadruple bit density can be realized by the number of stacked layers equivalent to that in the related art or bit density equivalent to that of a memory formed by the related art can be attained by the number of stacked layers about a quarter of that in the related art. For example, when stack of twenty-four layers is necessary in the past, with the structure of the fourth embodiment, it is possible to realize bit density equivalent to that in the past with stack of six layers.

In this way, according to the fourth embodiment, it is possible to realize higher bit density with a smaller number of stacked layers, i.e., a lower solid structure. Therefore, it is possible to provide a nonvolatile semiconductor memory device having higher bit density without imposing large load on process integration. Further, the semiconductor films 131 are formed by being filled in the independent through-holes 135 earlier than the formation of the gate electrode films 134. Therefore, the channels are not fused even if the distance between the channels (the semiconductor films 131) is reduced.

In the fourth embodiment, a distance between the channels is strictly restricted to separate the gate electrode films on both the sides in the bit line direction across the semiconductor films. In a fifth embodiment, a nonvolatile semiconductor memory device is requested to have high alignment accuracy compared with the fourth embodiment but is not strictly restricted about a distance between channels. In an example explained below, a nonvolatile semiconductor memory device has a structure in which a pair of memory strings adjacent to each other in a bit line direction as in the second embodiment are connected in lower portions. Charge storage layers and gate electrode films are divided into two by insulating films extending in a word line direction.

Figure 39A:
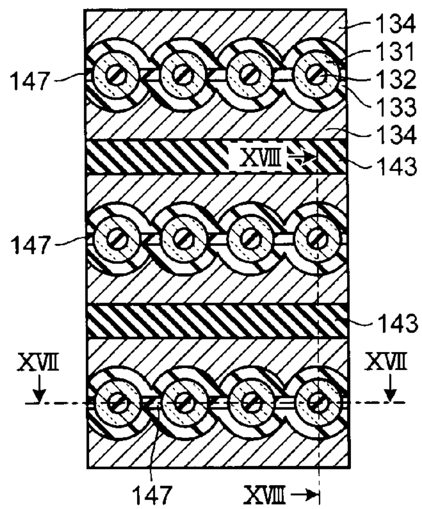
FIGS. 39A to 39D are schematic sectional views of an example of the configuration of a nonvolatile semiconductor memory device according to a fifth embodiment.
Figure 39B:
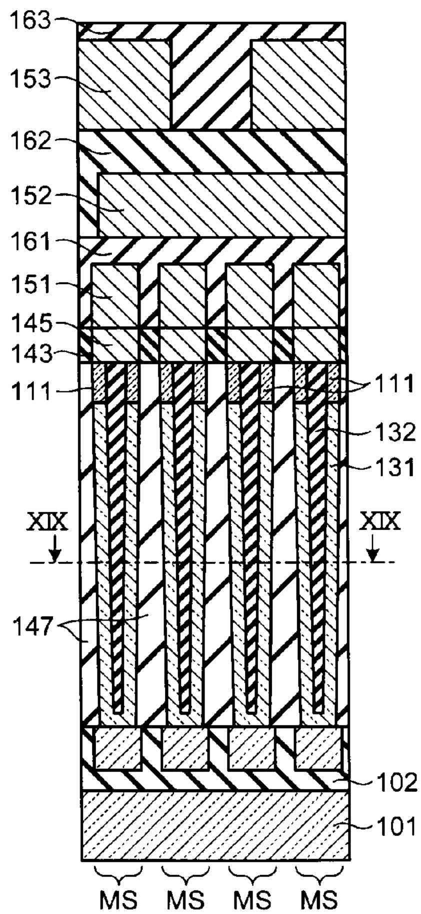
Figure 39C:
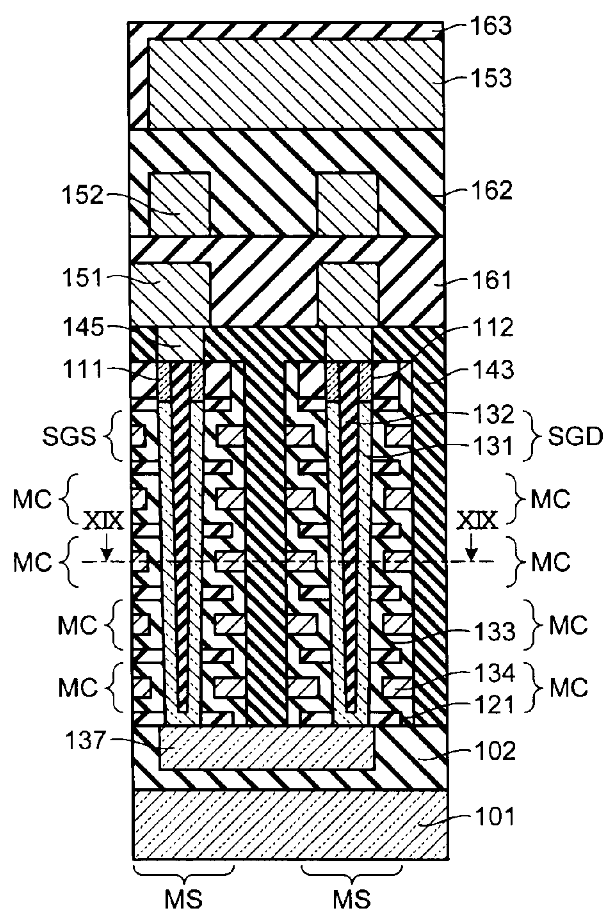
Figure 39D:
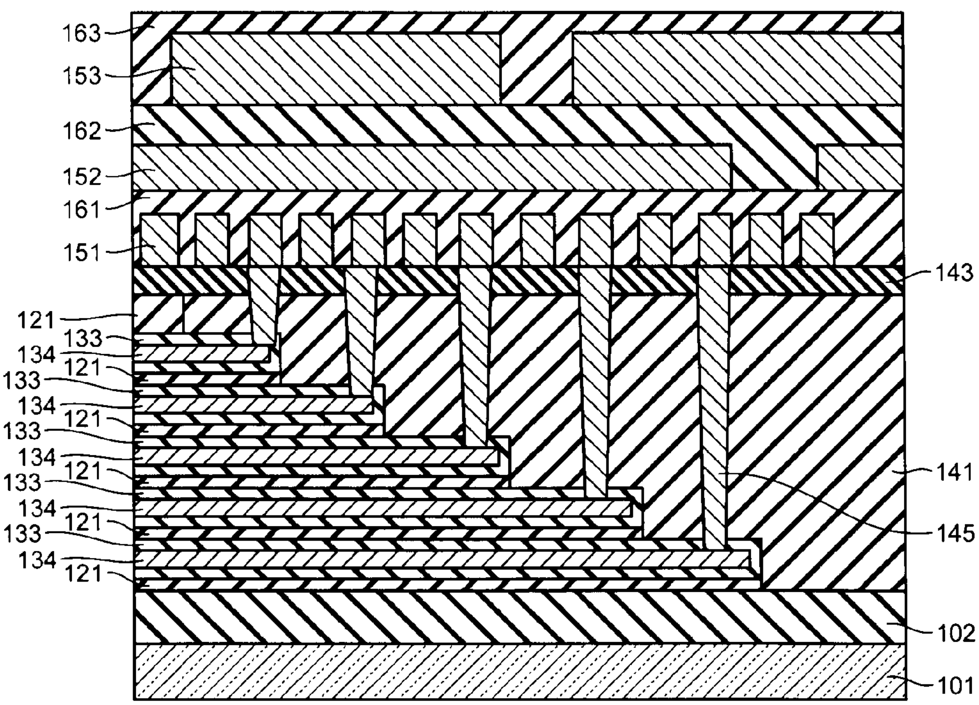
Figure 40A:
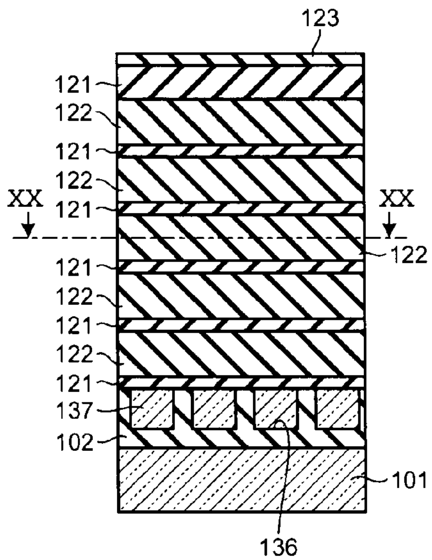
FIGS. 40A to 48E are schematic sectional views of an example of a procedure of a method of manufacturing the nonvolatile semiconductor memory device according to the fifth embodiment.
Figure 40B:
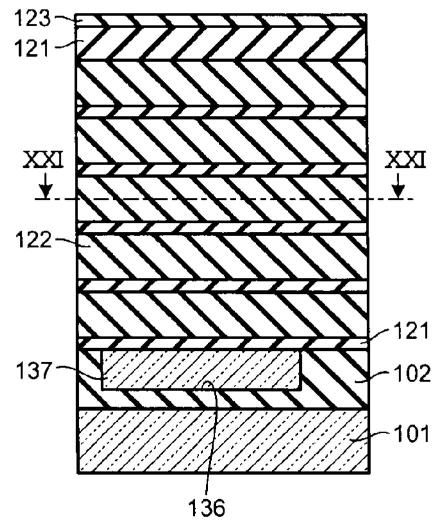
Figure 40C:
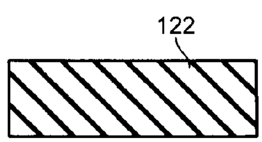
Figure 40D:
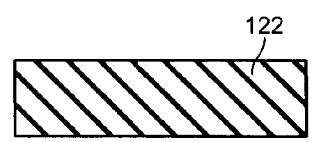
Figure 40E:
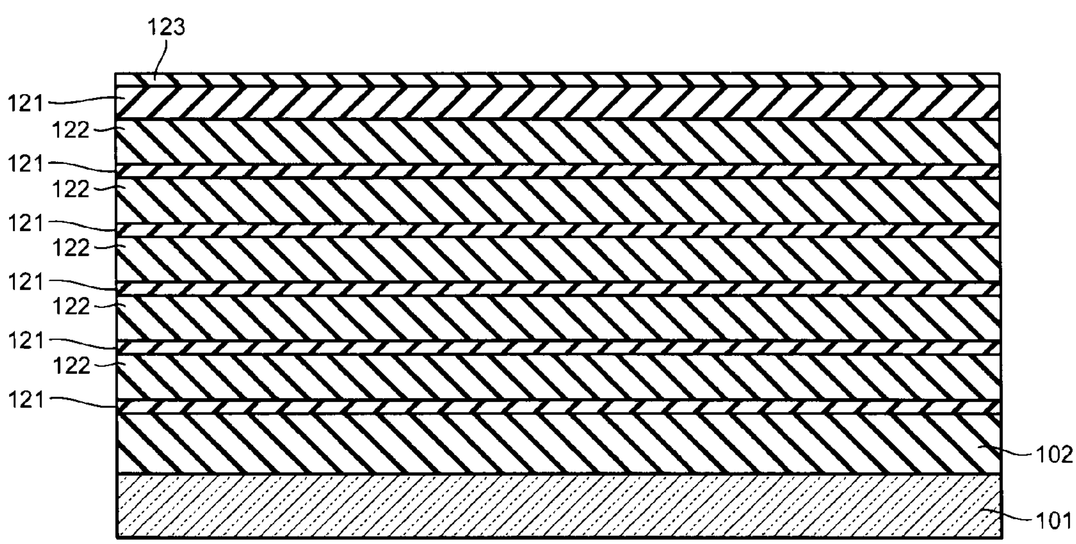
Figure 41A:
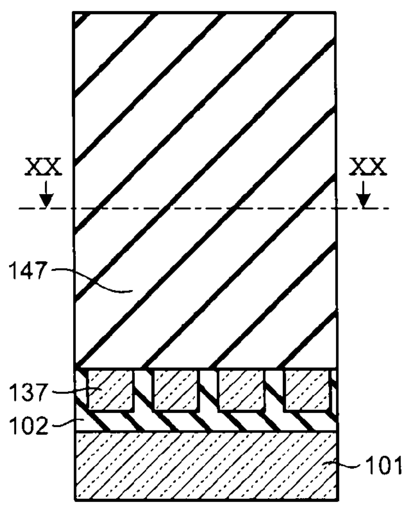
Figure 41B:
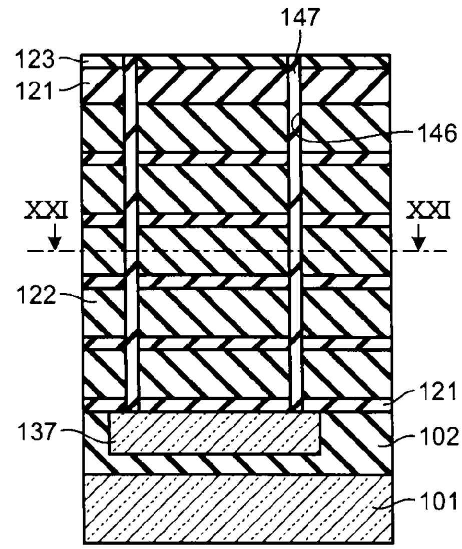
Figure 41C:
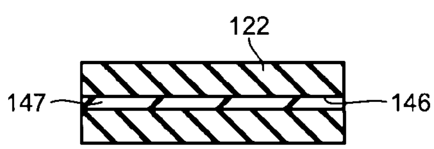
Figure 41D:
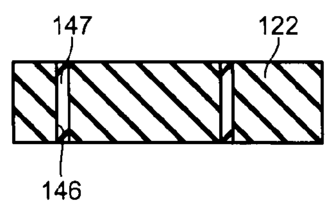
Figure 41E:
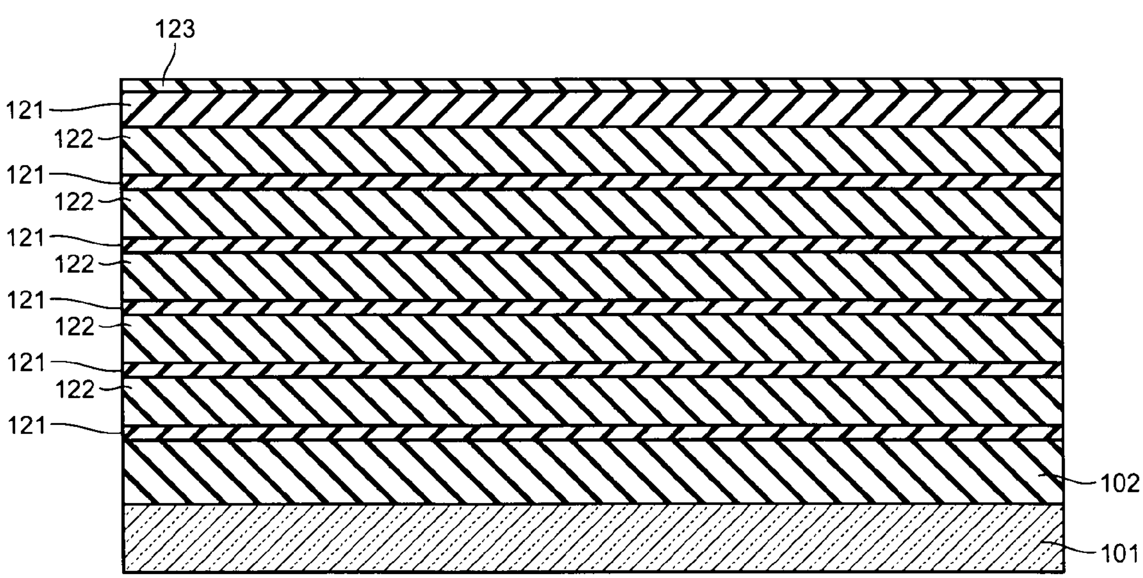
Figure 42A:
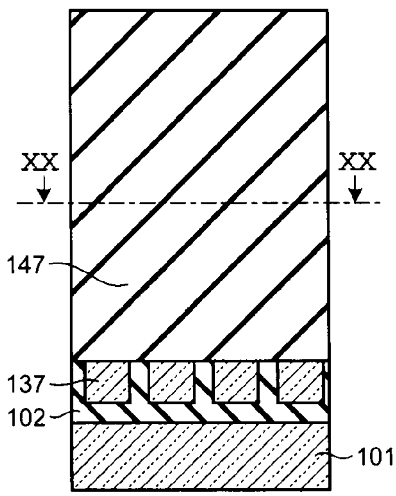
Figure 42B:
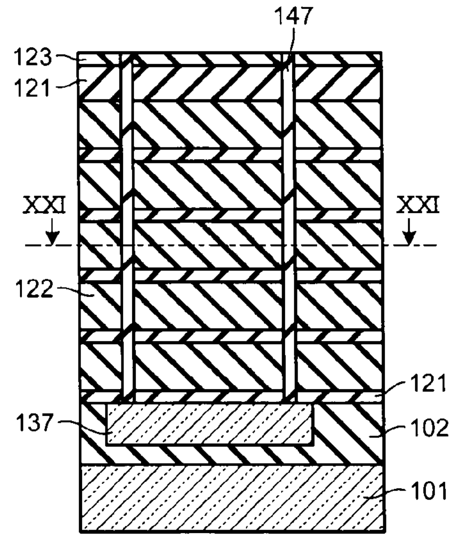
Figure 42C:
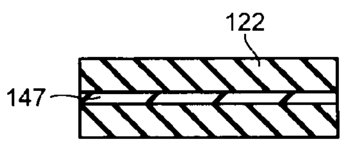
Figure 42D:
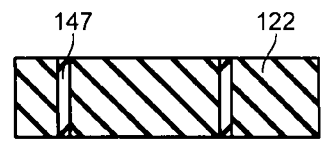
Figure 42E:
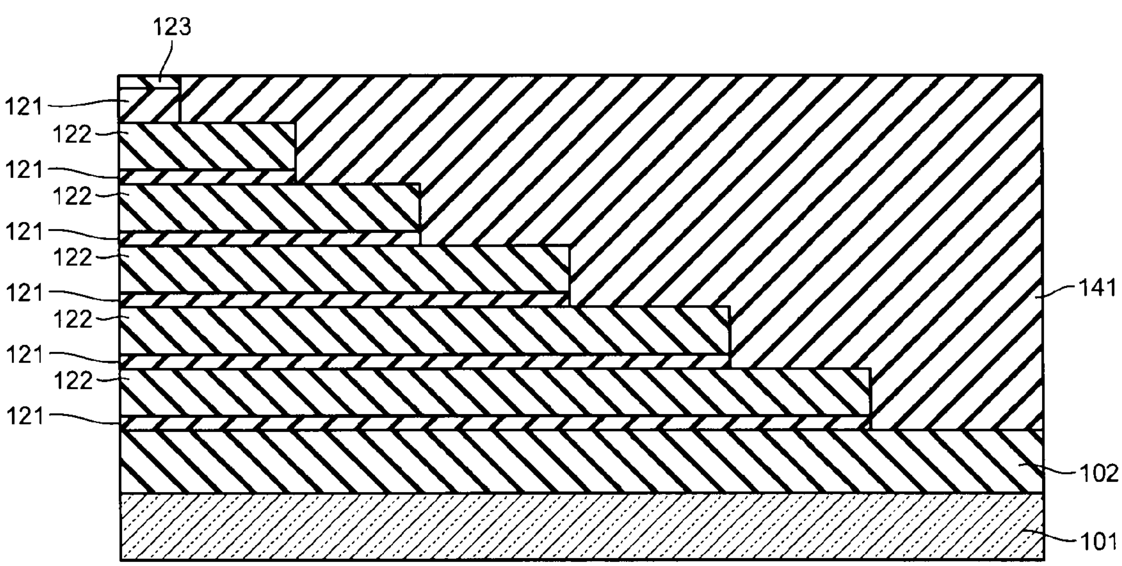
Figure 43A:
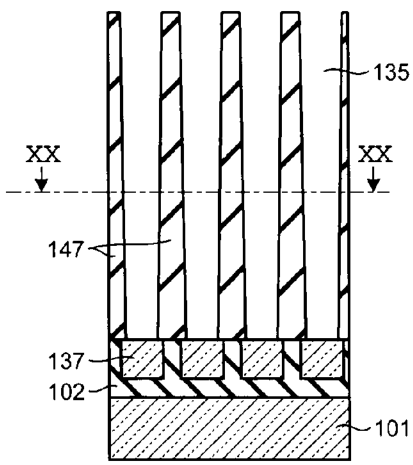
Figure 43B:
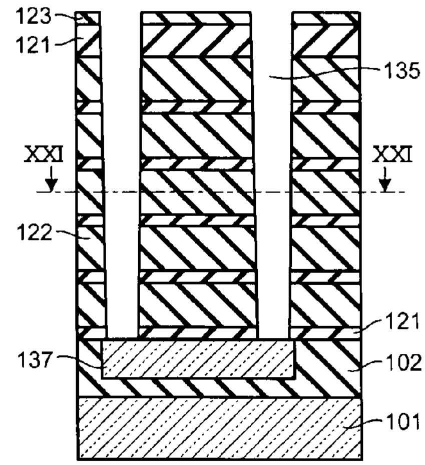
Figure 43C:
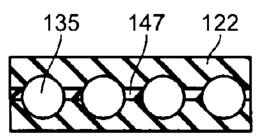
Figure 43D:
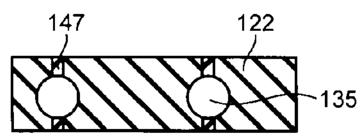
Figure 43E:
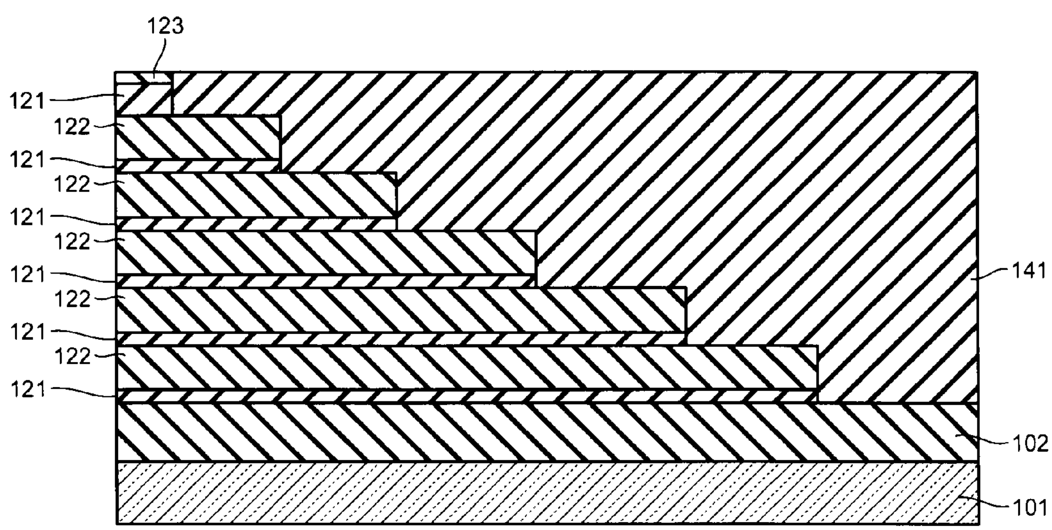
Figure 44A:
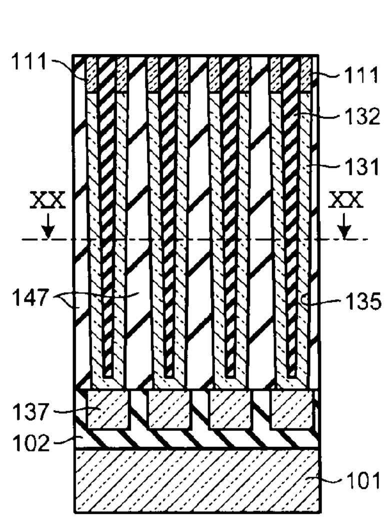
Figure 44B:
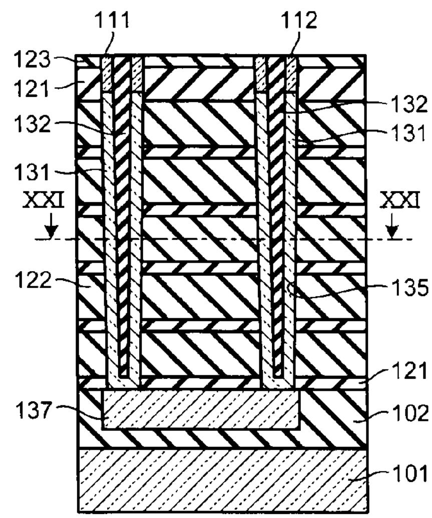
Figure 44C:
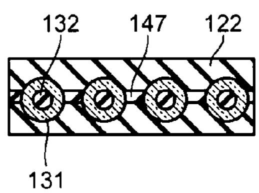
Figure 44D:
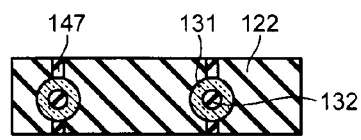
Figure 44E:
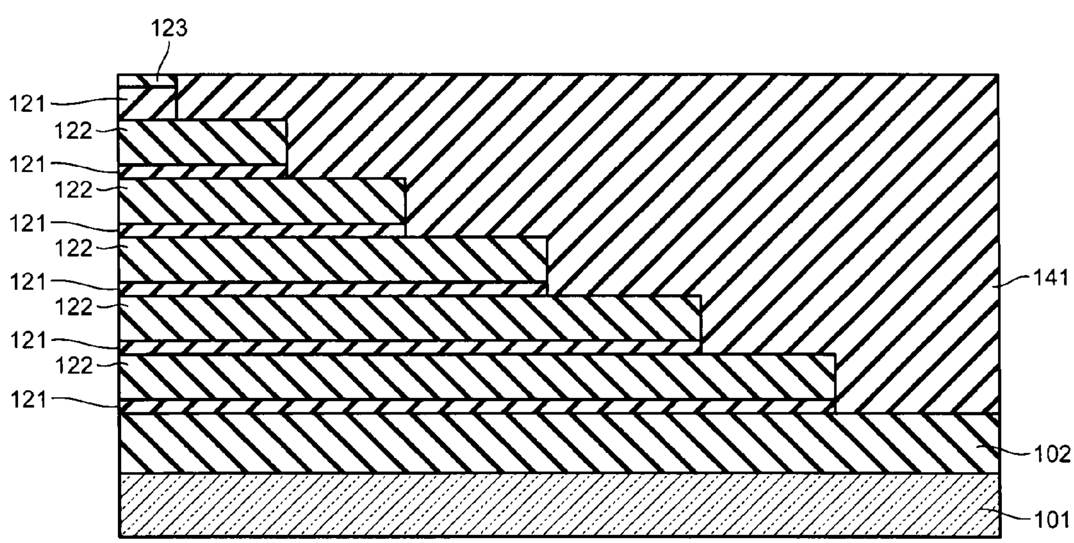
Figure 45A:
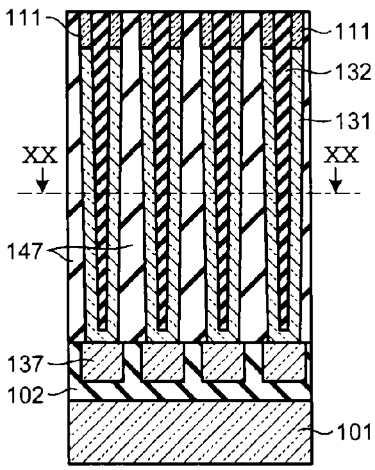
Figure 45B:
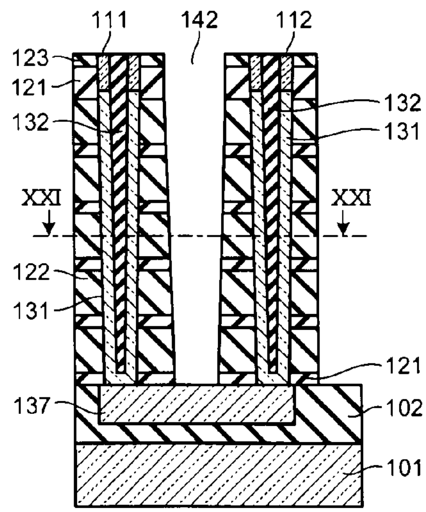
Figure 45C:
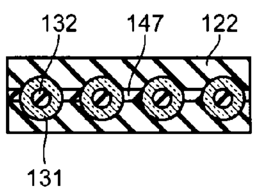
Figure 45D:
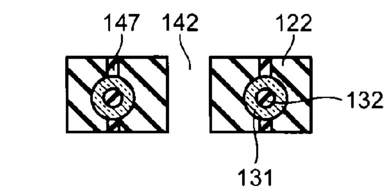
Figure 45E:
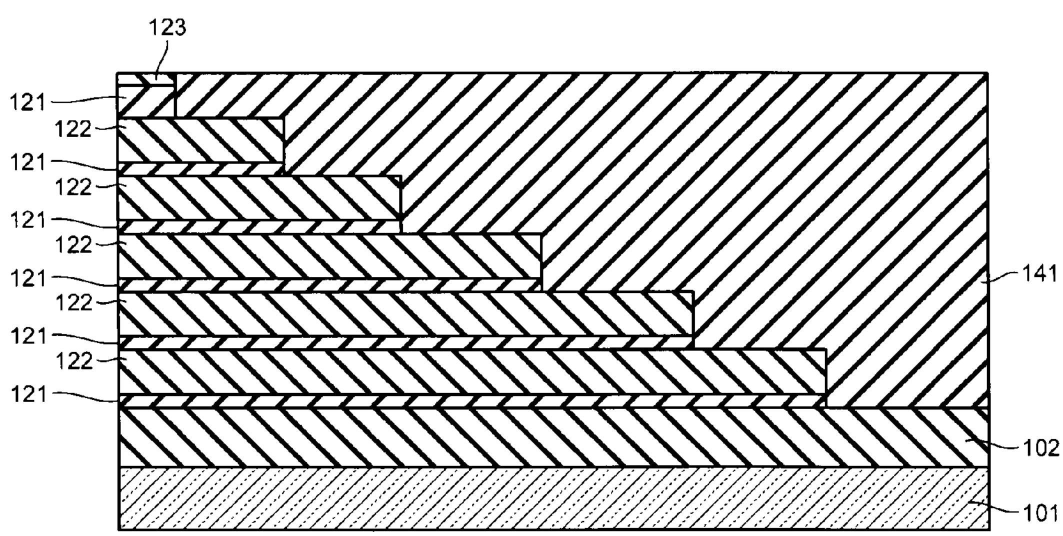
Figure 46A:
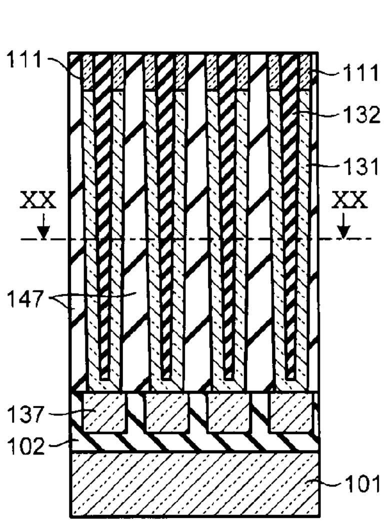
Figure 46B:
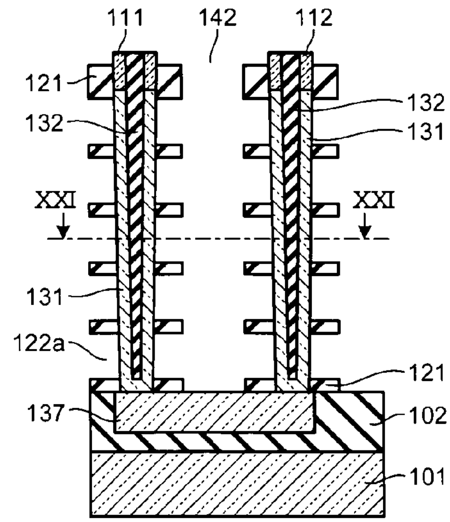
Figure 46C:
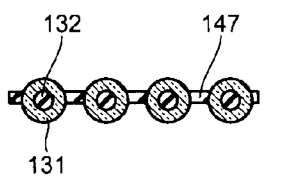
Figure 46D:
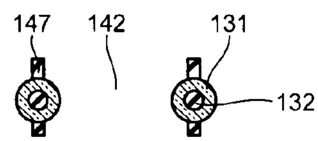
Figure 46E:
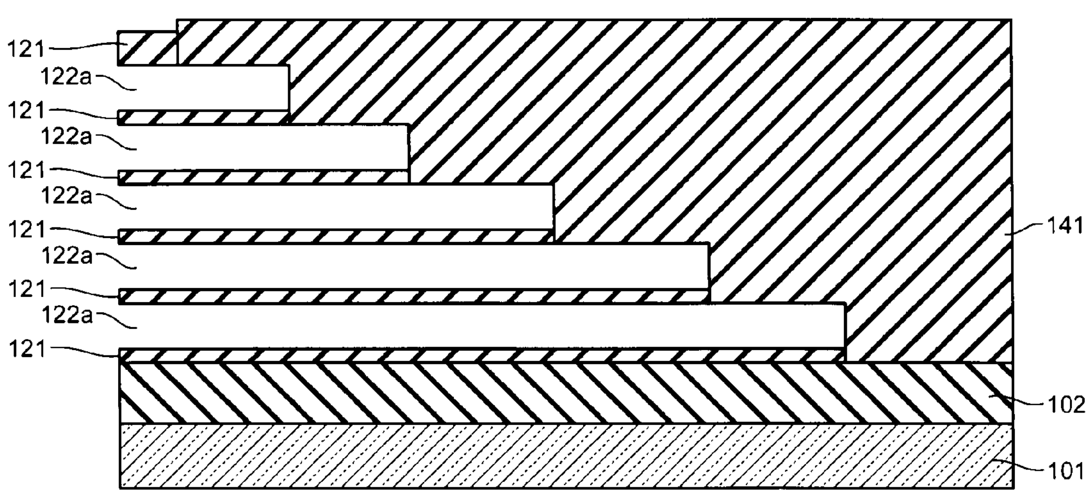
Figure 47A:
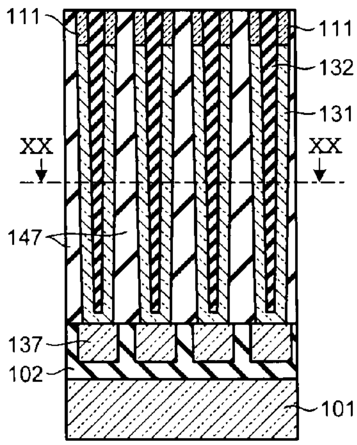
Figure 47B:
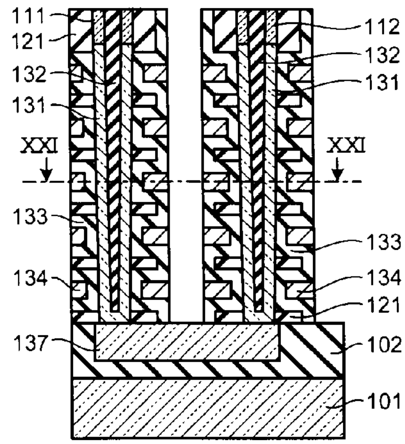
Figure 47C:
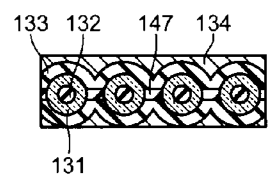
Figure 47D:
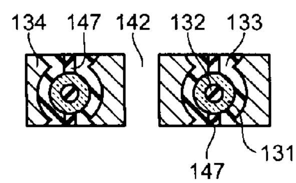
Figure 47E:
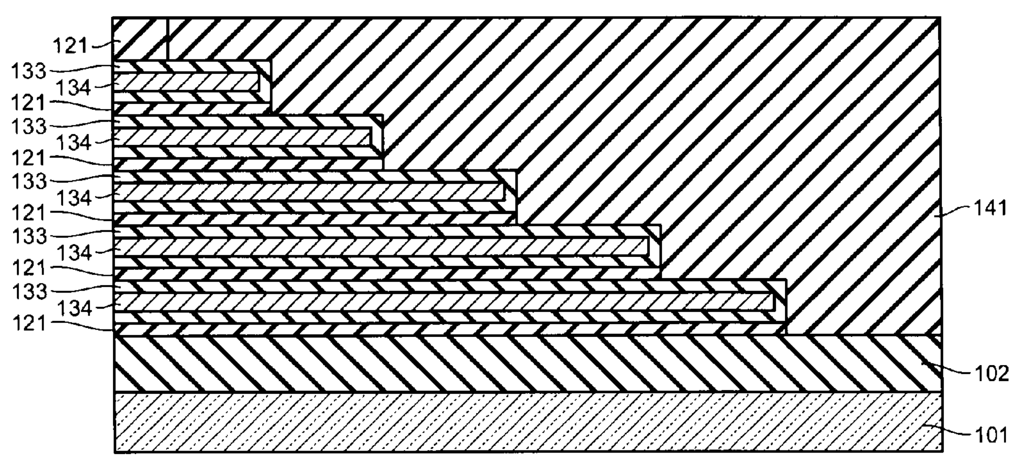
Figure 48A:
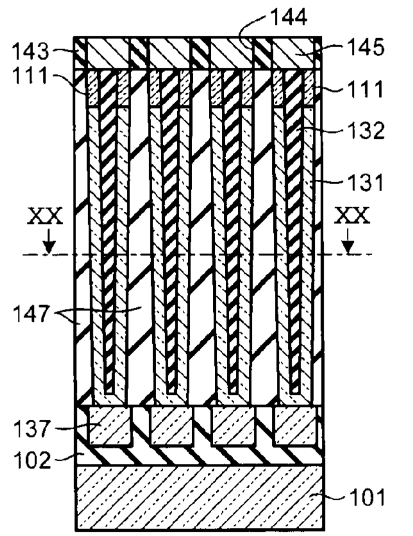
Figure 48B:
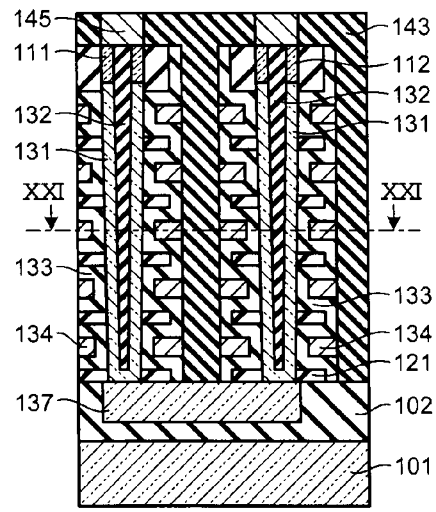
Figure 48C:
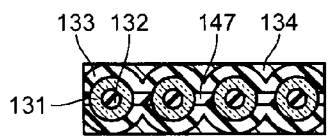
Figure 48D:
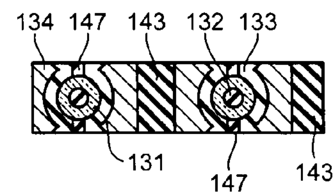
Figure 48E:
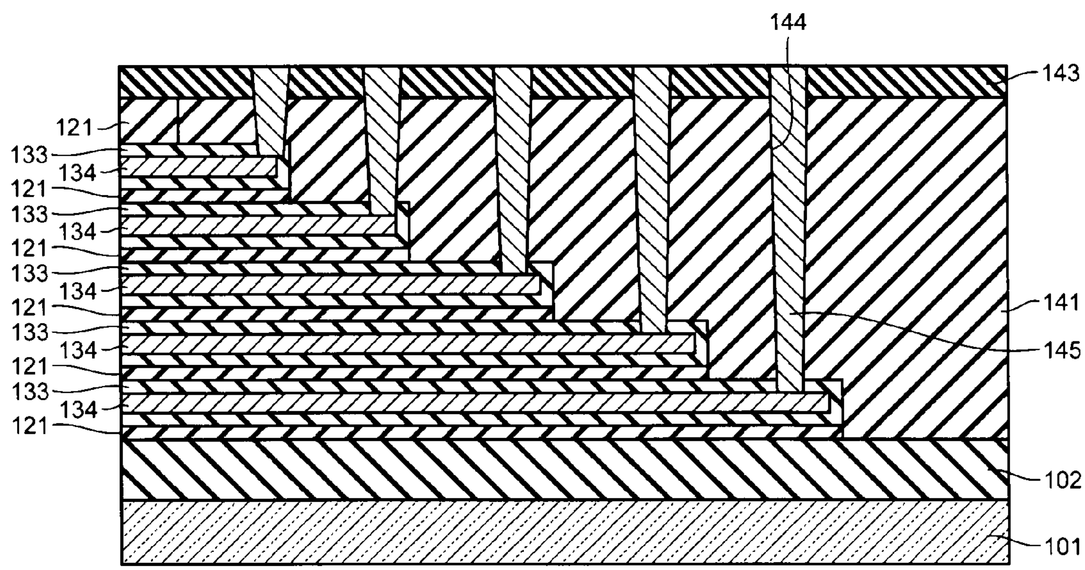

FIGS. 39A to 39D are schematic sectional views of an example of the configuration of a nonvolatile semiconductor memory device according to the fifth embodiment. FIG. 39A is a plan sectional view of a memory cell region. FIG. 39B is a sectional view taken along line XVII-XVII in FIG. 39A. FIG. 39C is a sectional view taken along line XVIII-XVIII in FIG. 39A. FIG. 39D is a sectional view in a direction perpendicular to the bit line direction of a word-line contact region. FIG. 39A is equivalent to a section take along line XIX-XIX in FIGS. 39B and 39C.

As shown in FIGS. 39A to 39C, the memory cell region has a structure substantially the same as that in the second embodiment. However, insulating films 147 passing through near the centers of the memory strings MS and extending in the word line direction are provided such that the charge storage layers 133 and the gate electrode films 134 provided at the respective heights of the memory strings MS are separated on both sides in the bit direction across the memory strings MS. The insulating films 147 are also provided to the word-line contact region. In the fifth embodiment, the semiconductor films 131 adjacent to each other in the word line direction do not have to be formed to meet Formula (1) explained in the first embodiment.

As shown in FIG. 39D, the word-line contact region also has a structure substantially the same as that in the second embodiment. However, the charge storage layers 133 and the gate electrode films 134 are separated by not shown insulating films near the centers in the width direction (the bit line direction). In other words, two gate electrode films 134 are independently drawn out from the semiconductor films 131 at certain height of the memory strings MS. The contacts 145 are provided in the respective gate electrode films 134. In FIG. 39D, a section on the gate electrode films 134 arranged on one side across the memory strings MS is shown. The contacts 145 are also provided on the gate electrode films 134 on the other side across the memory strings MS. However, the positions of the contacts 145 on the word line direction are different from the positions of contacts 145 shown in the figure. The contacts on the word line direction are formed in the positions of the wiring layers 151 not connected to the contacts 145 shown in the figure. Because other components are the same as those in the second embodiment, explanation of the components is omitted.

A method of manufacturing the nonvolatile semiconductor memory device having such a structure is explained below. FIGS. 40A to 48E are schematic sectional views of an example of a procedure of a method of manufacturing the nonvolatile semiconductor memory device according to the fifth embodiment. Among the figures, a section in the word line direction of the memory cell region is shown in FIGS. 40A, 41A, 42A, 43A, 44A, 45A, 46A, 47A, and 48A. A section in a direction perpendicular to the word line direction of the memory cell region is shown in FIGS. 40B, 41B, 42B, 43B, 44B, 45B, 46B, 47B, and 48B. A plan sectional view taken along line XX-XX in FIGS. 40A, 41A, 42A, 43A, 44A, 45A, 46A, 47A, and 48A is shown in FIGS. 40C, 41C, 42C, 43C, 44C, 45C, 46C, 47C, and 48C. A plan sectional view taken along line XXI-XXI in FIGS. 40B, 41B, 42B, 43B, 44B, 45B, 46B, 47B, and 48B is shown in FIGS. 40D, 41D, 42D, 43D, 44D, 45D, 46D, 47D, and 48D. A section in the word line direction of the word-line contact region is shown in FIGS. 40E, 41E, 42E, 43E, 44E, 45E, 46E, 47E, and 48E.

First, a not-shown peripheral circuit of the nonvolatile semiconductor memory device is formed on the semiconductor substrate 101. As shown in FIGS. 40A to 40E, the interlayer dielectric film 102 is formed in a forming area of the memory cell region and the word-line contact region of the semiconductor substrate 101 on which the peripheral circuit is formed. The trenches 136 for forming the channel connection layers 137 are formed by the lithography technique and the RIE method. The trenches 136 are formed at length enough for connecting the two memory strings MS adjacent to each other in the bit line direction. Subsequently, after the channel connection layers 137 formed of an N-type semiconductor material are formed on the interlayer dielectric film 102 in which the trenches 136 are formed, the channel connection layers 137 are recessed by a method such as the CMP method until the interlayer dielectric film 102 is exposed. Consequently, the channel connection layers 137 are formed only in the trenches 136. As the interlayer dielectric film 102, for example, a silicon oxide film can be used. As the channel connection layers 137, a P-doped N-type polysilicon film can be used.

Thereafter, a plurality of layers of the spacer films 121 forming memory cells and the sacrificial films 122 to be removed later are alternately stacked over the entire surface of the semiconductor substrate 101 by a film forming method such as the PECVD method. The stack ends with the spacer film 121 in the uppermost layer. The stopper film 123 functioning as a polishing stopper during CMP processing is formed on the spacer film 121 in the uppermost layer to form a stacked film. Specifically, five sacrificial films 122 are stacked. As the sacrificial films 122, a material having a large etching rate compared with the spacer films 121 in processing by etching performed later is selected. For example, as the spacer films 121, a silicon oxide film can be used. As the sacrificial films 122, a silicon nitride film can be used. As a method of forming the stacked film, besides the PECVD method, it is possible to appropriately combine and use techniques such as the SACVD method, the LPCVD method, the sputtering method, and the SOD.

Subsequently, as shown in FIGS. 41A to 41E, slits 146 for forming the insulating films 147 for dividing the gate electrode films 134, which are formed later, on both the sides in the bit line direction across the memory strings MS are formed by the lithography technique and the RIE method. Separation films formed by the insulating films 147 such as silicon oxide films are formed in the slits 146.

Subsequently, as shown in FIGS. 42A to 42E, processing for forming the stacked film in the word-line contact region in a step shape is performed by using the lithography technique and the RIE method such that the sacrificial films 122 in lower layers are exposed. The processing for forming the stacked film in a step shape can be performed by a method same as the method explained with reference to FIGS. 16A to 18E in the second embodiment. The planarization film 141 is formed over the entire surface of the semiconductor substrate 101. As the planarization film 141, for example a silicon oxide film can be used. Thereafter, the planarization film 141 is planarized by the CMP technique with the stopper film 123 as a polishing stopper.

Thereafter, as shown in FIGS. 43A to 43E, a not-shown mask film is formed over the entire surface of the semiconductor substrate 101. The stacked film in the memory cell region is collectively processed by the lithography technique and the RIE method to form the through holes 135. The through-holes 135 are arranged in a matrix shape on an area including the insulating films 147 formed in FIGS. 41A to 41E in the memory cell region. The bottoms of the through-holes 135 connect with the channel connection layers 137. As the mask layer, for example, a CVD carbon film can be used. After the through-holes 135 are formed, the mask film is removed. Consequently, a mold for forming the semiconductor films 131 functioning as the channels is formed. In the fifth embodiment, because the insulating films 147 are formed, it is unnecessary to form the through-holes 135 to meet Formula (3) between the semiconductor films 131 adjacent to each other in the word line direction of the respective layers in the height direction as explained in the fourth embodiment.

Subsequently, as shown in FIGS. 44A to 44E, the semiconductor films 131 formed of a P-type semiconductor material functioning as the channels are formed by a film forming method such as the LPCVD method. The semiconductor films 131 are deposited in the through-holes 135 and formed such that the lower ends thereof are connected to the channel connection layers 137. As the semiconductor films 131, for example, a B-doped polysilicon film can be used. The concentration of B can be set to, for example, $1\times10^{17}$ to $1\times10^{18}$ $cm^{-3}$. As in the fourth embodiment, the semiconductor films 131 are formed to be deposited in a macaroni shape along the through-holes 135.

Further, the dielectric films 132 formed of a silicon oxide film or the like are formed to fill the inside of the hollow cylindrical semiconductor films 131 by a method such as the ALD method. Thereafter, etch-back is performed by a method such as the RIE method to remove the semiconductor films 131 and the dielectric films 132 above the stopper film 123. Consequently, the hollow cylindrical semiconductor films 131 and the dielectric films 132 remain only in the through-holes 135. Subsequently, an impurity element of a predetermined conduction type is ion-implanted in upper portions of the semiconductor films 131 by using the lithography technique and the ion implantation technique to form the source regions 111 and the drain regions 112. As the impurity element, for example, arsenic can be used.

Subsequently, as shown in FIGS. 45A to 45E, a not-shown mask film is formed over the entire surface of the semiconductor substrate 101. The stacked film and the planarization film 141 are collectively processed by the lithography technique and the RIE method to form the trenches 142. The trenches 142 have a shape extending in the word line direction to separate gate electrodes that will replace sacrificial films 122 adjacent to each other in the bit line direction. As the mask film, for example, a CVD carbon film can be used. After the trenches 142 are formed, the mask film is removed.

Subsequently, as shown in FIGS. 46A to 46E, the sacrificial films 122 are selectively removed by wet etching to form the hollows 122*a* among the upper and lower spacer films 121. Because the semiconductor films 131 function as columns and support the spacer films 121, the hollows 122*a* are not collapsed. When silicon oxide films are used as the spacer films 121 and silicon nitride films are used as the sacrificial films 122, as a chemical for the wet etching, for example, hot phosphoric acid can be used such that the silicon nitride films are more selectively etched compared with the silicon oxide films. The hollows 122*a* after the sacrificial films 122 are removed function as a mold in forming a MONOS structure later.

Thereafter, as shown in FIGS. 47A to 47E, the charge storage layers 133 forming MONOS cells are formed such that the sides of the hollow columnar (hollow cylindrical) semiconductor films 131 partially covered with the spacer films 121 are covered. The charge storage layers 133 have a stacking structure of a tunnel dielectric film/a charge trapping film/a charge blocking film. As the tunnel dielectric film, for example, an ONO film formed by the LPCVD method can be used. As the charge trapping film, a silicon nitride film formed by the ALD method can be used. As the charge blocking film, an alumina film formed by the ALD method can be used. As explained above, because the through-holes 135 do not always meet Formula (3), in the two transistors adjacent to each other in the word line direction in the respective layers in the height direction, the charge storage layers 133 (the charge blocking films) do no have to partially cross.

Further, the gate electrode films 134 are formed on the sides of the hollow cylindrical semiconductor film 131 in which the charge storage layers 133 are formed. Unlike the fourth embodiment, in the fifth embodiment, the insulating films 147 are formed in a slit shape to divide the gate electrode films 134 of the memory strings MS adjacent to one another in the word line direction automatically. Therefore, the divided gate electrode films 134 function as independent electrodes.

Thereafter, the gate electrode films 134 formed on the bottoms of the trenches 142 and the like are recessed by the dry etching method and divided to be electrodes for the stacked transistors. As a material of the gate electrode films 134, for example, a tungsten nitride/tungsten stacked film can be used. As an etching gas for dry etching, for example, diluted $ClF_3$ can be used. In the processing explained above, the gate electrode films 134 for five layers are collectively formed. The gate electrode film 134 in the first layer from the top is a selection gate electrode. The gate electrode films 134 in the second to fifth layers are control gate electrodes functioning as word lines.

Subsequently, as shown in FIGS. 48A to 48E, the interlayer dielectric film 143 is formed over the entire surface of the semiconductor substrate 101 by a film forming method such as the CVD method to fill the trenches 142. Consequently, the interlayer dielectric film 143 is filled in the trenches 142 formed at a predetermined interval in the bit line direction formed in FIGS. 45A to 45E. As the interlayer dielectric film 143, a TEOS/$O_3$ film can be used. The surface of the interlayer dielectric film 143 is planarized by the CMP technique.

Subsequently, the contact holes 144 connecting with the hollow cylindrical semiconductor films 131 in the memory cell region and the gate electrode films 134 in the word-line contact region are formed by the lithography technique and the RIE method. Thereafter, conductive material films are filled in the contact holes 144 by a film forming method such as the CVD method. The conductive material films are planarized by the CMP technique until the interlayer dielectric film 143 is exposed. Consequently, the contacts 145 are formed. As a material of the contacts 145, for example, tungsten can be used.

Thereafter, the wiring layers 151 to 153 and the like connected to the contacts 145 are formed via the interlayer dielectric films 161 to 163 to form a multilayer wiring layer. Consequently, the nonvolatile semiconductor memory device having the structure shown in FIGS. 39A to 39D is obtained.

With the structure in the fifth embodiment, the slit-like insulating films 147 that divide the gate electrode films 134 into two in the bit line direction across the memory strings MS are provided. Therefore, unlike the fourth embodiment, it is possible to divide the gate electrode films 134 even if the semiconductor films 131 functioning as the channels are not set sufficient close in the word line direction. Further, as in the fourth embodiment, it is possible to reduce a cell area to about a quarter of that in the related art by reducing a distance between the semiconductor films 131 adjacent to each other in the word line direction.

In the case of the fourth embodiment, it is conceivable that a distance between the through-holes 135 adjacent to each other in the word line direction in the positions of the transistors formed in the lower layers does not meet Formula (3) and the gate electrode film 134 in the lower layer cannot be satisfactorily divided, for example, when the through-hole 135 as the mold of the semiconductor film 131 is formed in a taper shape. However, according to the fifth embodiment, the slit-like insulating film 147 that divides the semiconductor film 131 of the memory strings MS connected to each other by the gate electrode film 134 to both the sides in the bit line direction from near the center of the memory strings MS are provided. Therefore, it is possible to surely divide the gate electrode film 134 into independent two gate electrode films 134 across the semiconductor film 131.

As a result, it is possible to realize higher bit density with a smaller number of stacked layers, i.e., a lower solid structure. Therefore, it is possible to provide a nonvolatile memory having higher bit density without imposing large load on integration.

Further, the peripheral circuit is provided on the semiconductor substrate 101 and the memory cell portion is provided over the peripheral circuit on the interlayer dielectric film 102. Therefore, there is also an effect that it is possible to further enhance bit density compared with the fourth embodiment.

Figure 49:
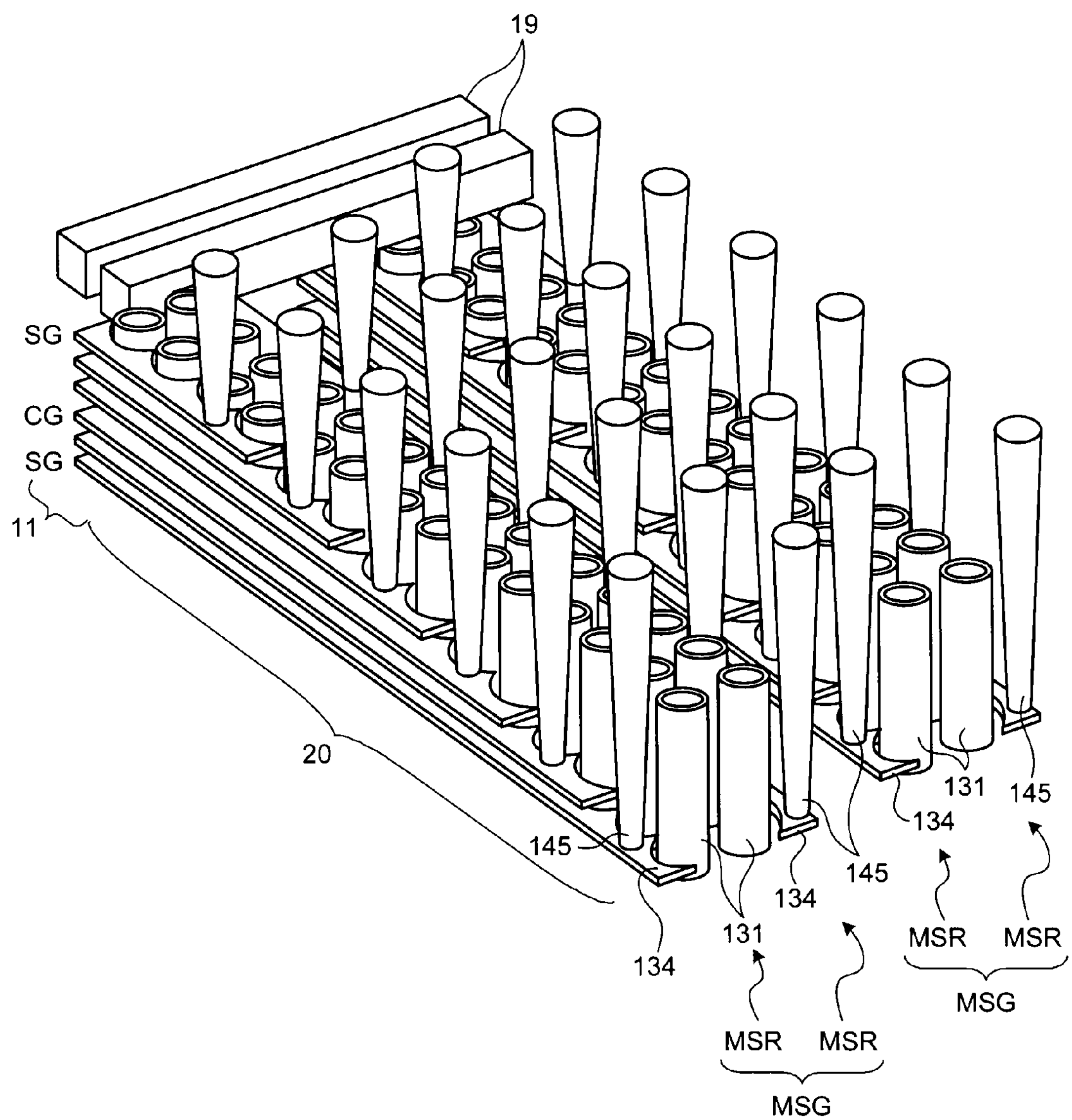
FIG. 49 is a cut-out perspective view of a part of a memory cell region and a word-line contact region of a nonvolatile semiconductor memory device according to a sixth embodiment.
Figure 50A:
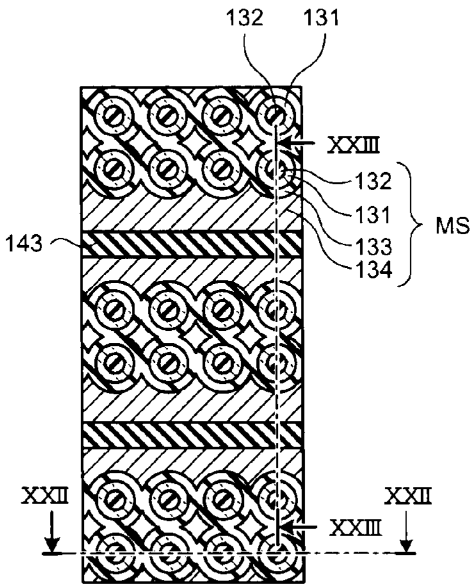
FIGS. 50A to 50E are schematic sectional views of an example of the configuration of the nonvolatile semiconductor memory device according to the sixth embodiment.
Figure 50B:
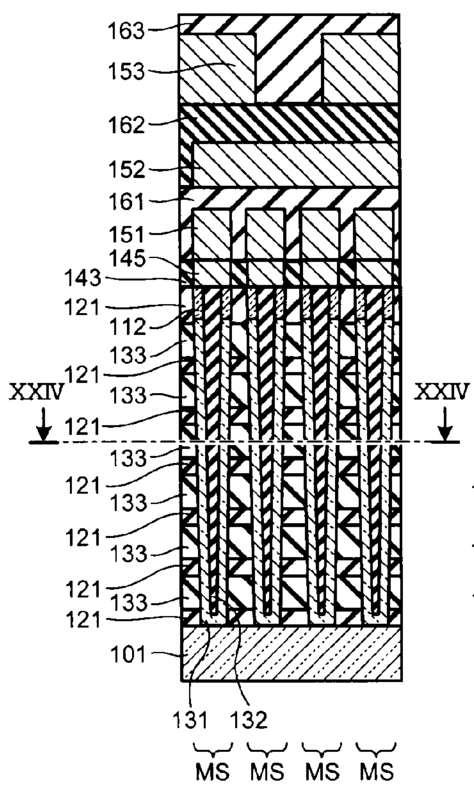
Figure 50C:
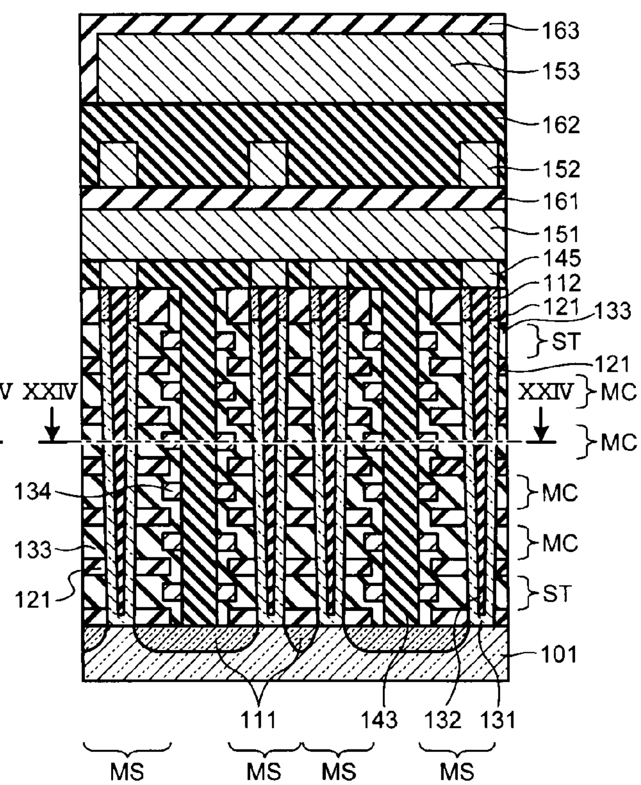
Figure 50D:
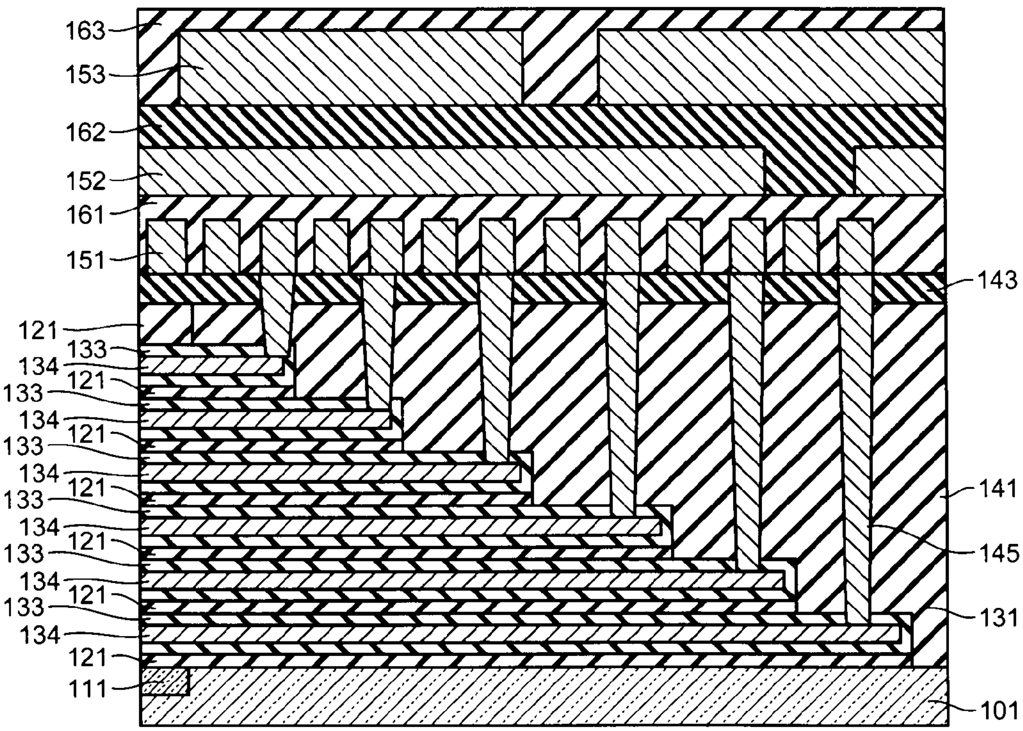
Figure 50E:
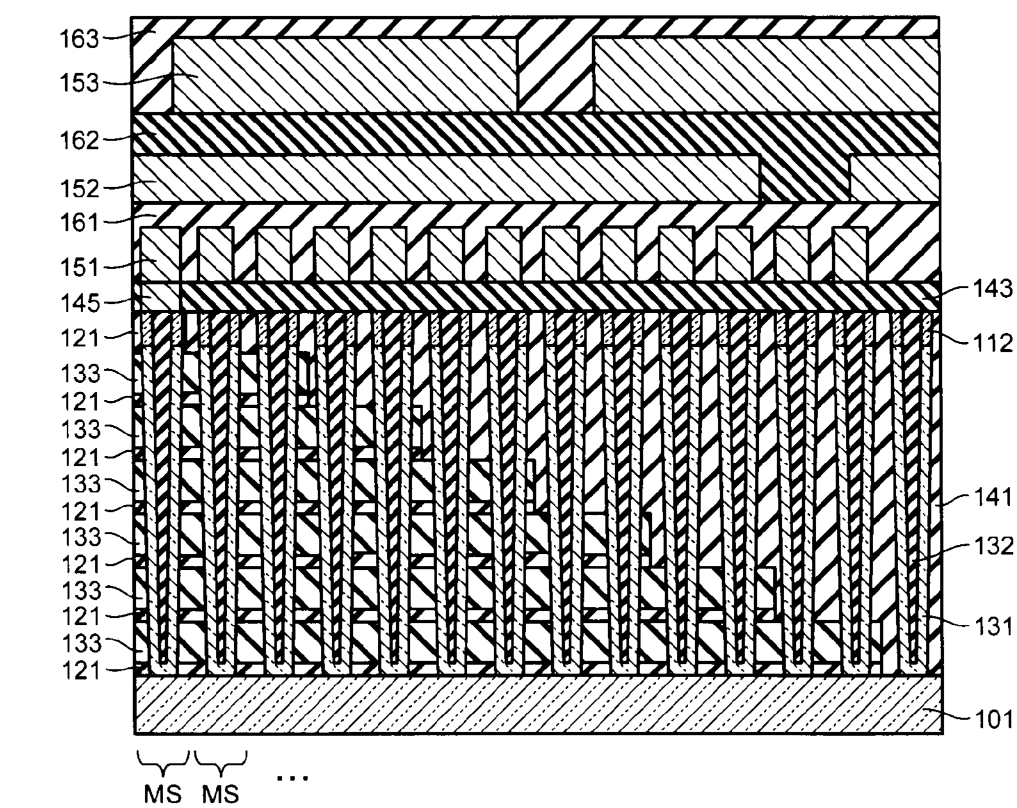
Figure 51A:
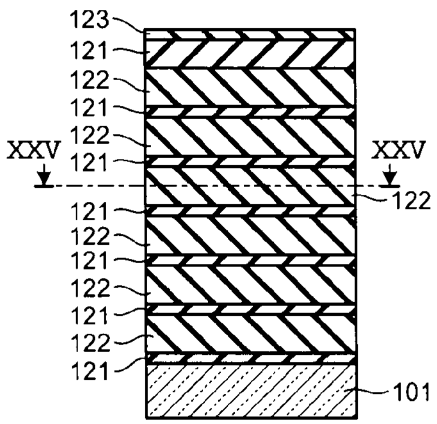
Figure 51B:
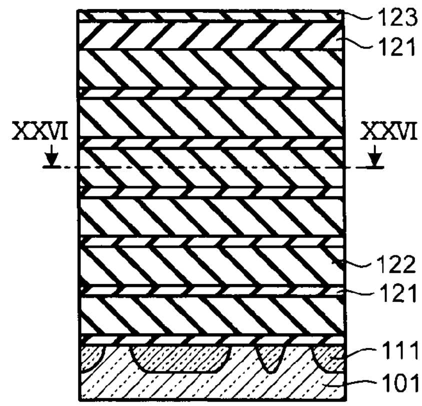
Figure 51C:
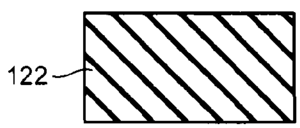
Figure 51D:
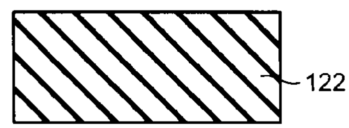
Figure 51E:
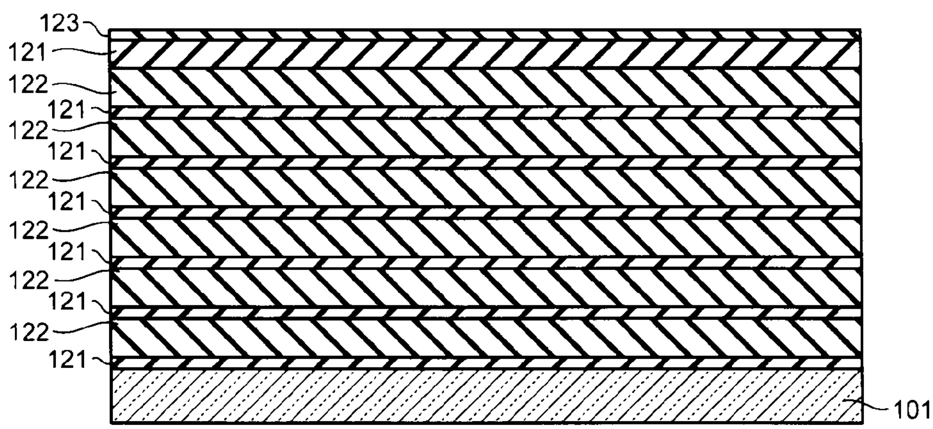
Figure 51F:
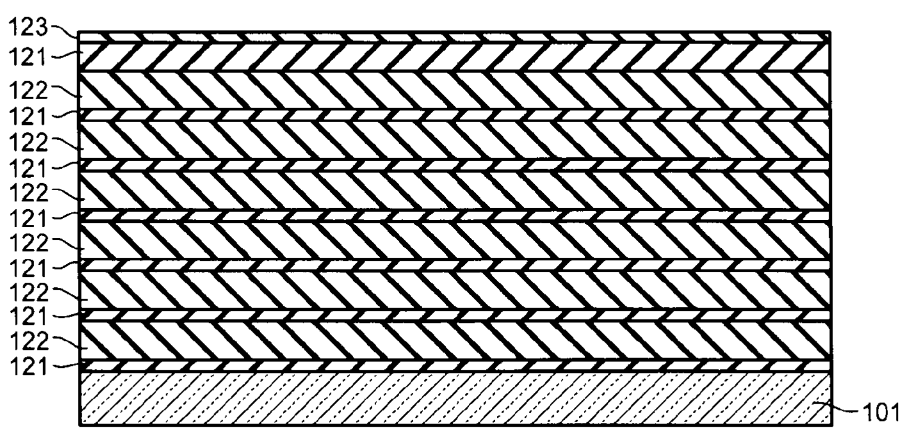
Figure 52A:
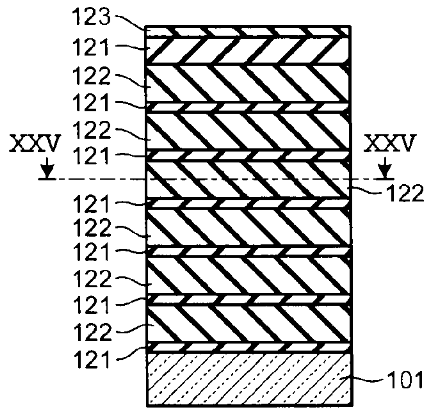
Figure 52B:
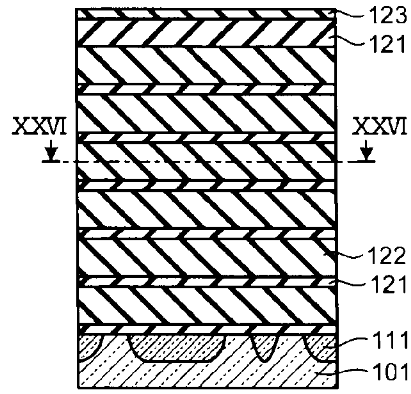
Figure 52C:
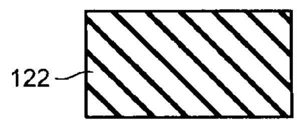
Figure 52D:
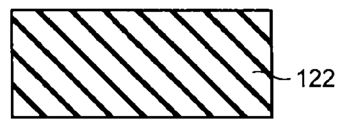
Figure 52E:
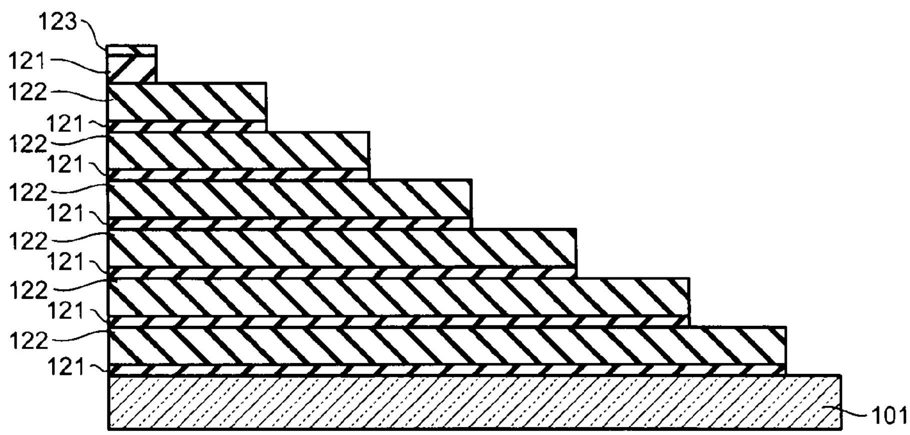
Figure 52F:
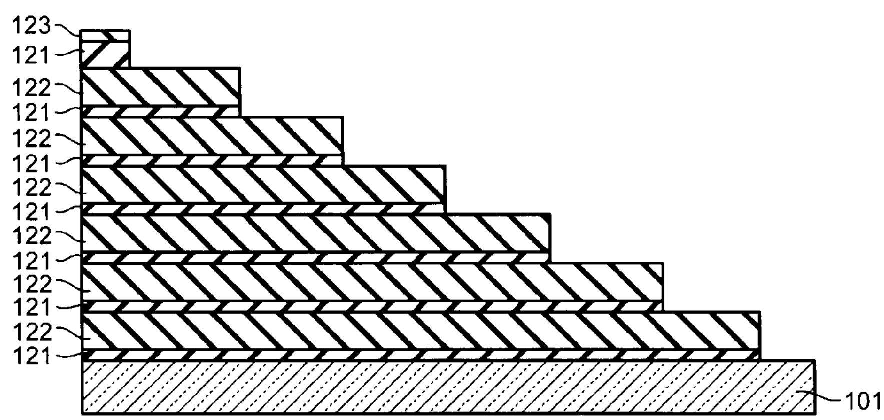
Figure 53A:
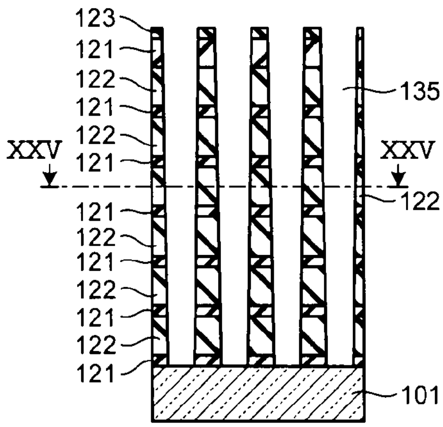
Figure 53B:
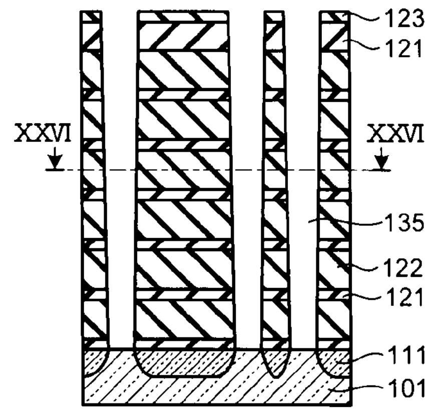
Figure 53C:
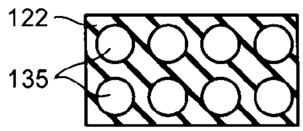
Figure 53D:
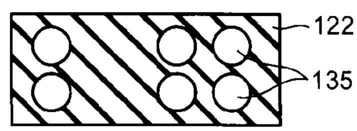
Figure 53E:
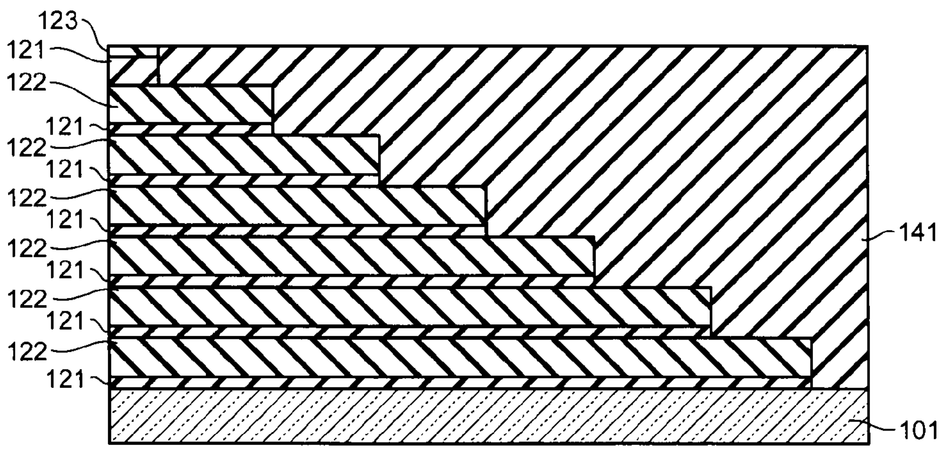
Figure 53F:
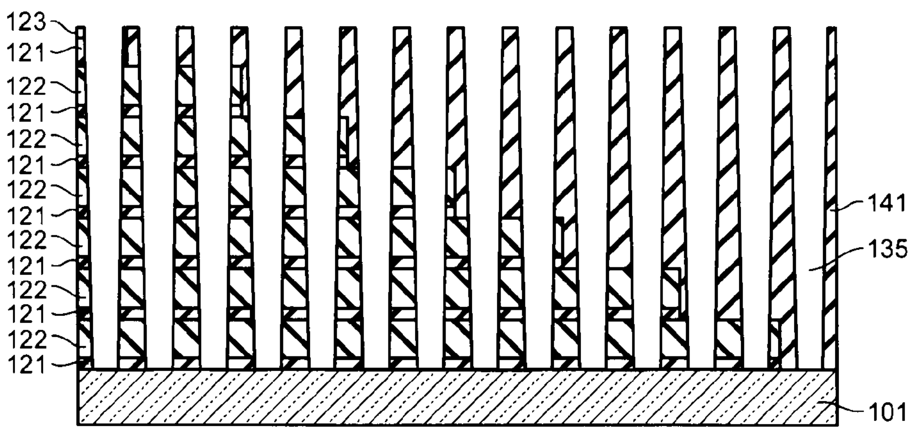
Figure 55A:
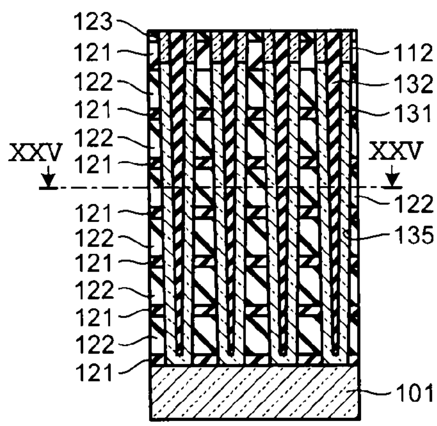
Figure 55B:
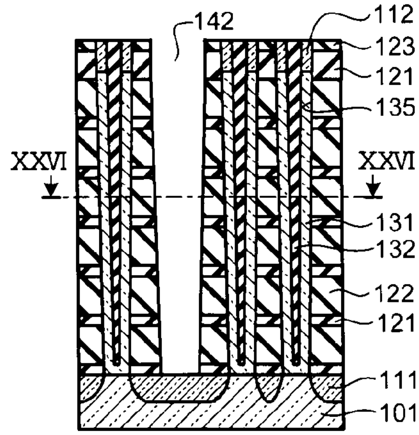
Figure 55C:
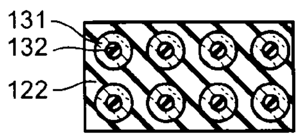
Figure 55D:
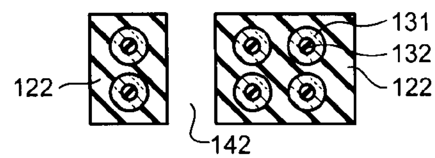
Figure 55E:
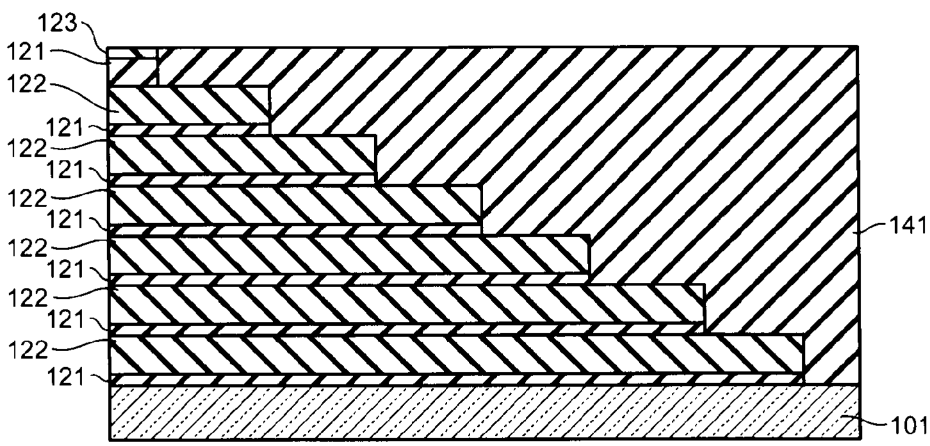
Figure 55F:
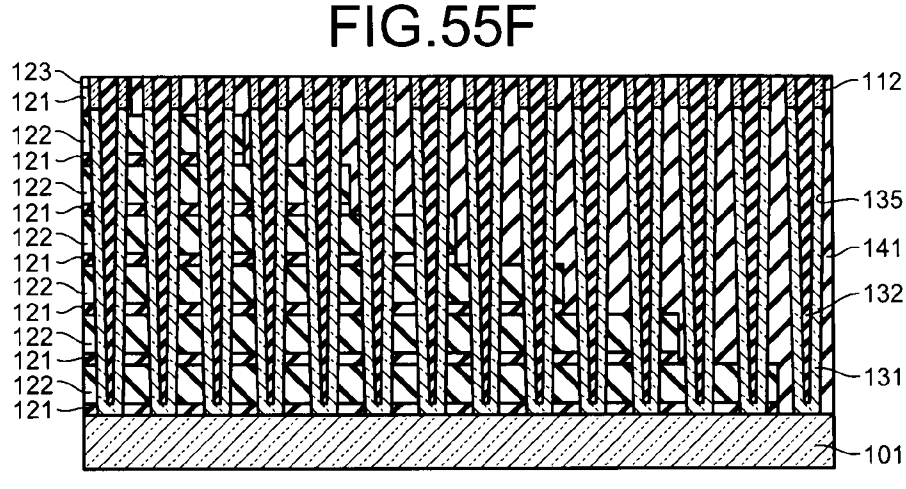
Figure 56A:
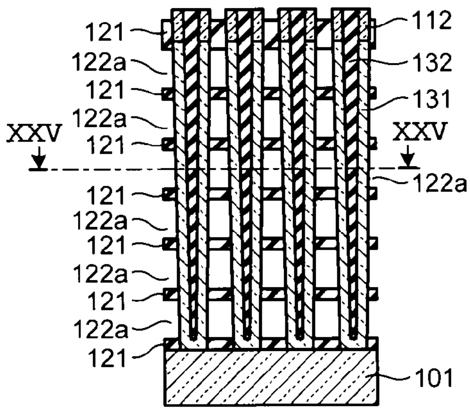
Figure 56B:
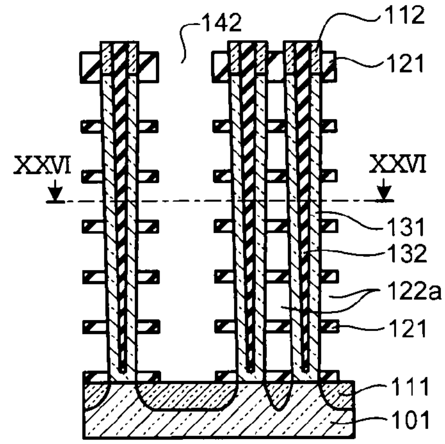
Figure 56C:
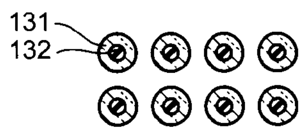
Figure 56D:
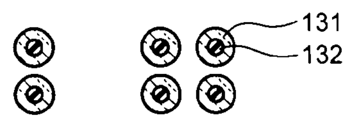
Figure 56E:
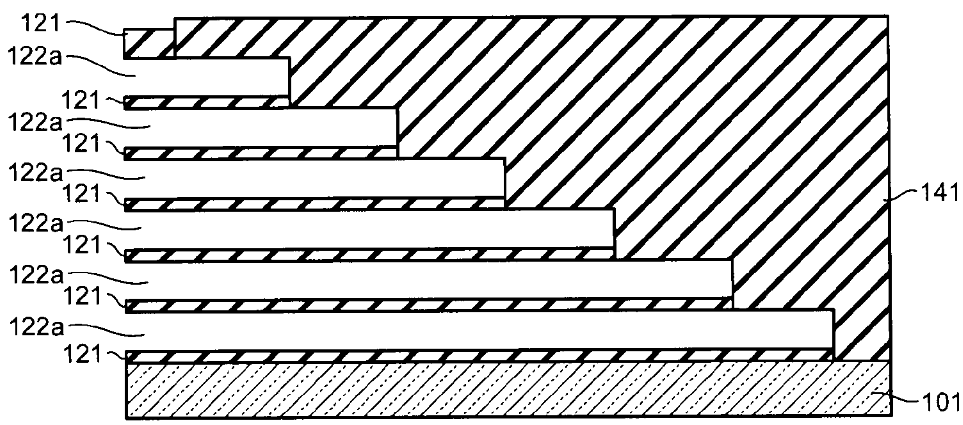
Figure 56F:
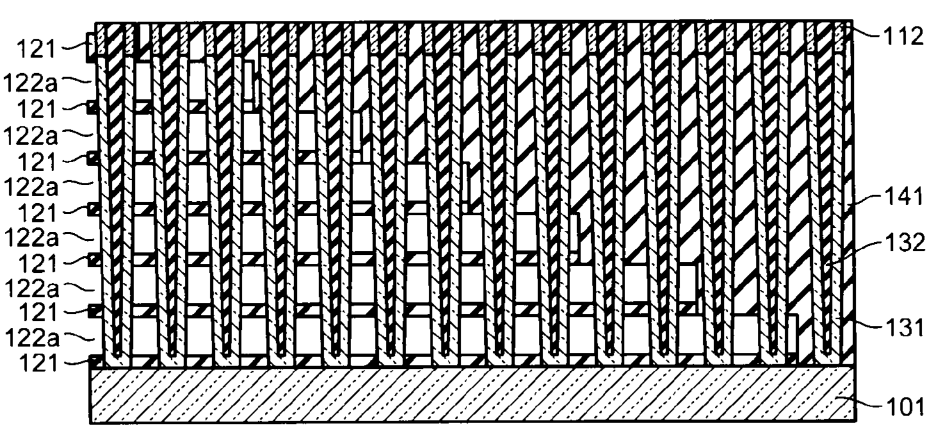
Figure 57A:
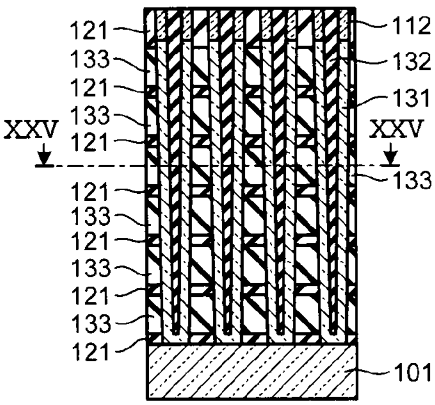
Figure 57B:
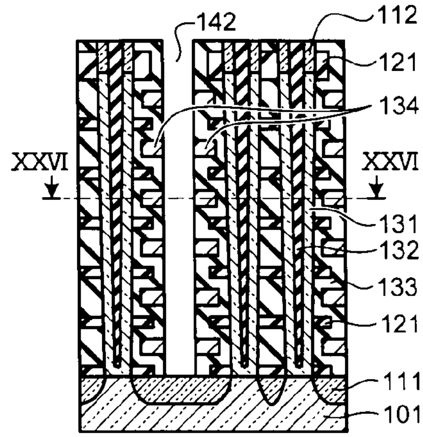
Figure 57C:
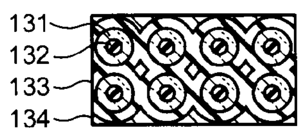
Figure 57D:
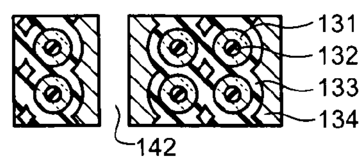
Figure 57E:
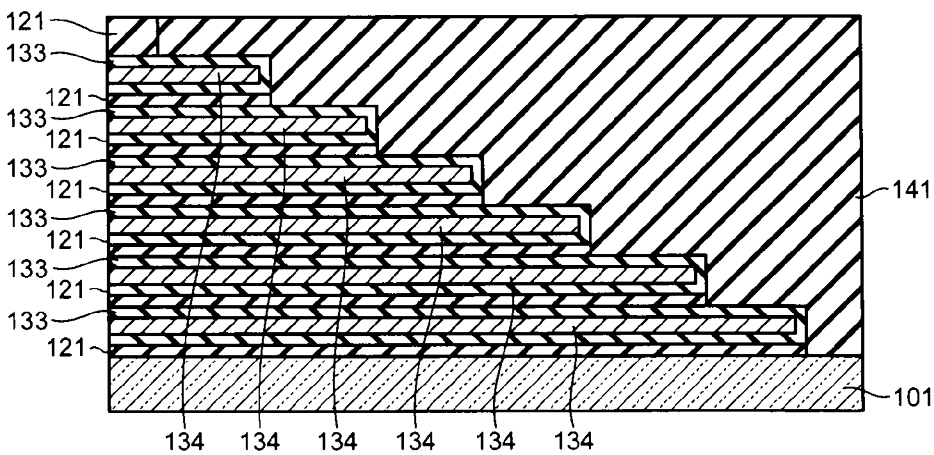
Figure 57F:
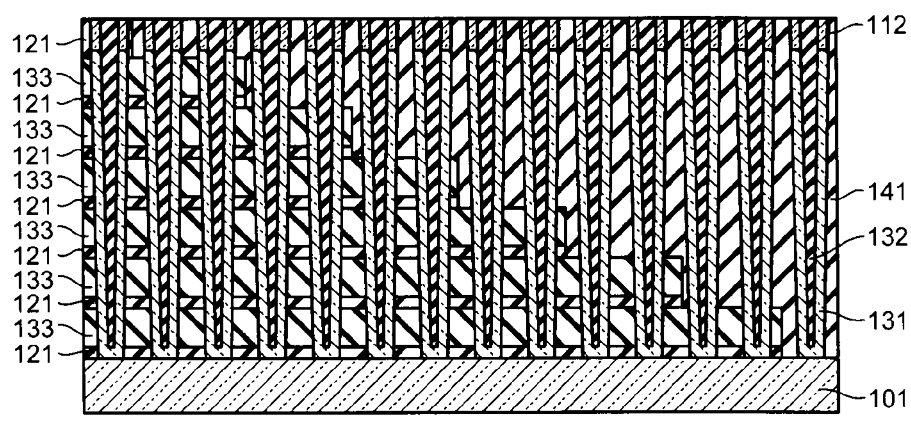
Figure 58A:
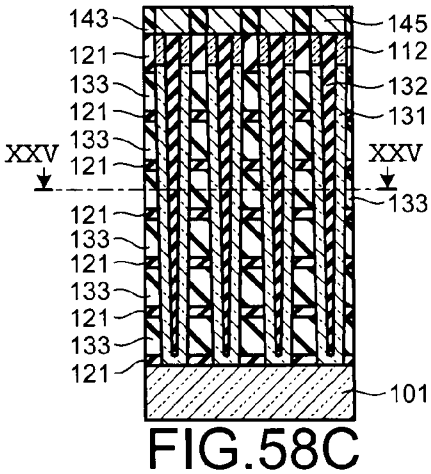
Figure 58B:
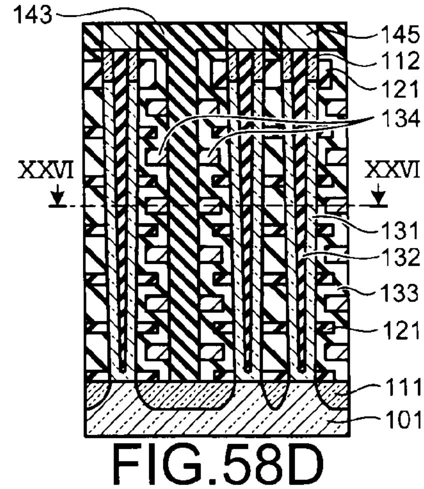
Figure 58C:
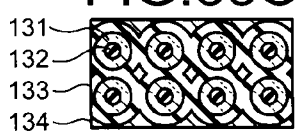
Figure 58D:
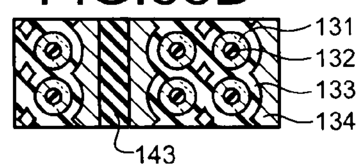
Figure 58E:
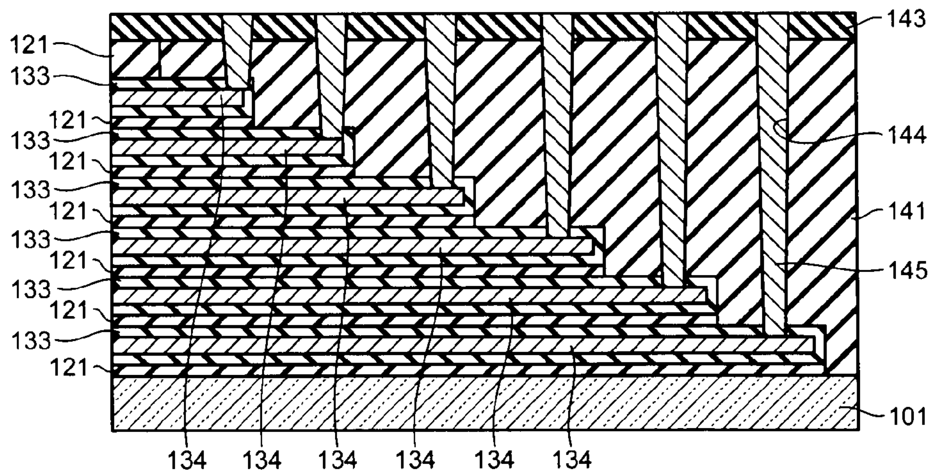
Figure 58F:
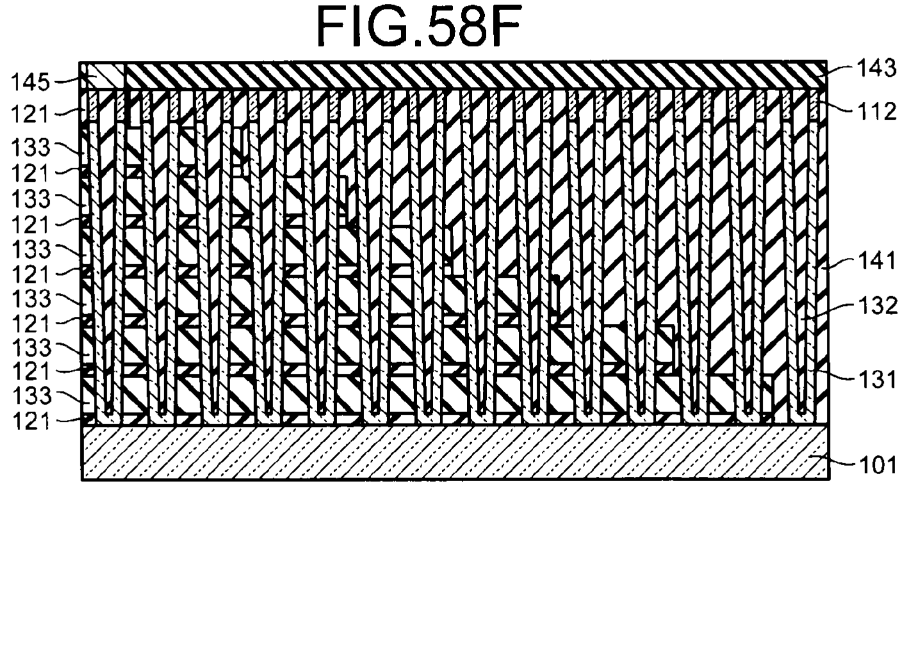

FIG. 49 is a cut-out perspective view of a part of a memory cell region and a word-line contact region of a nonvolatile semiconductor memory device according to a sixth embodiment. FIGS. 50A to 50E are schematic sectional views of an example of the configuration of the nonvolatile semiconductor memory device according to the sixth embodiment. FIG. 50A is a partial plan sectional view of the memory cell region. FIG. 50B is a sectional view taken along line XXII-XXII in FIG. 50A. FIG. 50C is a sectional view taken along line XXIII-XXIII in FIG. 50A. FIG. 50D is a sectional view in a direction perpendicular to a bit line direction in a word-line-contact forming position of the word-line contact region. FIG. 50E is a sectional view in the direction perpendicular to the bit line direction in a position corresponding to a forming position of memory strings of the word-line contact region. FIG. 50A is equivalent to a section taken along line XXIV-XXIV in FIGS. 50B and 50C.

In the memory cell region 11, as shown in FIG. 49 and FIGS. 50A to 50C, the memory strings MS including the memory cells MC having the gate electrode films 134 formed over the sides of the hollow cylindrical semiconductor films 131 on the charge storage layers 133 are two-dimensionally arranged substantially perpendicularly on the semiconductor substrate 101 having the source regions 111. The drain regions 112 are formed in the upper portions of the hollow cylindrical semiconductor films 131. The memory strings MS are arranged at a first interval in the word line direction, arranged at a second interval on one side in the bit line direction, and arranged at a third interval wider than the second interval on the other side. The first to third intervals do not refer to an interval between the centers of the memory strings MS adjacent to each other but refers to an interval between nearest opposed outer circumferential portions of the adjacent memory strings MS.

In the following explanation, a row of the memory strings MS arranged at the first interval in the word line direction is referred to as memory string row MSR. Two memory string rows MSR arranged in the bit line direction at the second interval are referred to as memory string group MSG. Specifically, the memory strings MS are arranged such that memory string groups MSG each formed by the two memory string rows MSR arranged in parallel in the bit line direction at the second interval are arranged in parallel at the third interval in the bit line direction.

The memory strings MS have a structure in which a plurality of transistors having the gate electrode films 134 formed over the sides of the hollow cylindrical semiconductor films 131 on the charge storage layers 133 are connected in series in the height direction. Among the transistors, the transistors at both upper and lower ends are selection transistors. In FIGS. 50B and 50C, selection transistors ST are arranged at both upper and lower ends of a transistor row. One or more memory cell transistors MC are formed at a predetermined interval between the two selection transistors ST. The structure of the selection transistors ST is the same as the structure of the memory cell transistors MC. Further, in the memory cell region 11, in the same memory string row MSR, selection gate electrodes of the selection transistors ST at the same height are connected to one another. Control gate electrodes of the memory cell transistors MC at the same height are also connected to one another.

Specifically, as shown in FIGS. 50B and 50C, on the side of the columnar semiconductor film 131 functioning as a channel, the spacer films 121 surrounding the semiconductor films 131 are formed at a predetermined interval in the height direction. The charge storage layers 133 coat the side of the columnar semiconductor film 131 including the spacer films 121. Each of the gate electrode films 134 is formed over the side of the columnar semiconductor film 131 on the charge storage layer 133 in an area between the upper and lower spacer films 121. An area between the upper and lower spacer films 121 where the gate electrode film 134 is formed over the side of the columnar semiconductor film 131 on the charge storage layer 133 functions as one transistor. The transistors arranged at both the upper and lower ends of the memory string MS are the selection transistors ST. One or more transistors between the two selection transistors ST are the memory cell transistors MC. In the figures, four memory cell transistors MC are formed between the two selection transistors ST.

It is assumed that the hollow cylindrical semiconductor films 131 are formed of a P-type semiconductor material such as P-type polysilicon. The bottoms of the hollow cylindrical semiconductor films 131 have not ring shape but plate-like shape. The dielectric films 132 such as silicon oxide films are formed to fill the inside of the hollow cylindrical semiconductor films 131.

As shown in FIG. 49 and FIGS. 50D and 50E, the word-line contact region 20 has a structure same as the structure of the memory cell region 11. Specifically, in the word-line contact region 20, the memory string groups MSG each formed by the two memory string row MSR arrayed in the bit line direction at the second interval are arranged at the third interval in the bit line direction. The memory strings MS formed in the word-line contact region 20 are dummy memory strings MS that do not function as memories.

In the word-line contact region 20, the gate electrode films 134 extended from the memory cell region 11 are arranged to be stacked. The gate electrode films 134 have step-like configurations such that the gate electrode films 134 in the lower layers are exposed. In the word-line contact region 20, the upper and lower surfaces of the gate electrode films 134 are surrounded by the charge storage layers 133. The spacer films 121 are formed among the gate electrode films 134 adjacent to one another in the vertical direction.

The planarization film 141 is formed on the step-like gate electrode films 134 in the word-line contact region 20. The interlayer dielectric films 143 are formed on the memory strings MS in the memory cell region, on the planarization film 141 in the word-line contact region 20, and among the memory string groups MSG adjacent to one another in the bit line direction. As the planarization film 141, for example, a silicon oxide film can be used. As the interlayer dielectric films 143, for example, a TEOS/$O_3$ can be used.

As materials of the semiconductor substrate 101, the spacer films 121, the semiconductor films 131, the charge storage layers 133, and the gate electrode films 134, materials same as those in the first embodiment can be used. Other components are substantially the same as those in the first to fifth embodiments. Therefore, components same as those in the first to fifth embodiments are denoted by the same reference numerals and signs and explanation of the components is omitted.

In the sixth embodiment, as shown in FIGS. 49 to 50E, in the transistors at all the heights of the memory strings MS in the memory string group MSG, the charge storage layers 133 cross among the transistors adjacent to one another in the word line direction and the bit line direction such that the gate electrode films 134 are not inserted among the transistors at all the heights of the memory strings MS adjacent to one another in the word line direction and the bit line direction. Specifically, in the transistors at all the heights that share the gate electrode films 134 of the memory strings MS arranged in the word line direction in the memory string group MSG, the charge storage layers 133 are partially shared between the transistors and the transistors adjacent thereto. In the transistors at all the heights adjacent to one another in the bit line direction in the memory string group MSG, the charge storage layers 133 are partially shared between the transistors and the transistors adjacent thereto. Specifically, the adjacent four transistors in the same plane in the memory string group MSG, parts of the charge storage layers 133 cross in the word line direction and the bit line direction.

To obtain such a structure, the memory strings MS (the semiconductor films 131) are arranged such that Formula (1) holds in transistor forming positions at all the heights of the memory strings MS adjacent to one another in the word line direction in the memory string group MSG. In addition, the memory strings MS (the semiconductor films 131) are arranged such that Formula (1) holds in transistor forming positions at all the heights of the memory cell strings MS adjacent to one another in the bit line direction in the memory string group MSG.

In the structure that meets the condition of Formula (1), parts of the charge blocking films cross (merge) in the two transistors adjacent to each other at all the heights. Therefore, a distance between the semiconductor films 131 adjacent to each other in the word line direction and a distance between the semiconductor films 131 adjacent to each other in the bit line direction in the memory string group MSG can be reduced. Further downsizing can be realized by crossing even the charge trapping films among the transistors adjacent to one another. However, it is undesirable to cross the charge trapping films because, if the charge trapping films are crossed, it is likely that charges stored in the charge trapping films leak to the adjacent transistors via crossing sections. Therefore, it is desirable to set the distance L between the semiconductor films 131 adjacent to each other in the word line direction and the bit line direction in the memory string group MSG to meet Formula (2).

The first and second intervals are intervals among the memory strings MS that meet Formulas (1) and (2). On the other hand, the third interval, i.e., an interval in the bit line direction among the memory string groups MSG is a sum of an interval at which the gate electrode film 134 enters between the adjacent two transistors at all the heights and the gate electrode film 134 formed between the memory string groups MSG can be removed by etching, i.e., thickness twice as large as the thickness of the charge storage layers 133, the width of the gate electrode films 134 restricted by the processing conditions, and an interval of the gate electrode films 134 restricted by the processing conditions.

With such a structure, the gate electrode film 134 cannot enter between the semiconductor films 131 adjacent to each other in the word line direction and the bit line direction in the memory string group MSG. The gate electrode films 134 are formed only in outer side portions of the memory strings MS adjacent to one another in the bit line direction. This structure is also maintained in the word-line contact region 20. As a result, the two gate electrode films 134 arranged on both the sides in the bit line direction of one memory string group MSG are electrically separated. A positional relation between the memory cells MC and the gate electrode films 134 is a shape substantially mirror symmetrical across the two memory string rows MSR. Therefore, it is possible to suppress occurrence of fluctuation in writing and erasing characteristics due to fluctuation in a shape of the memory cells MC.

The hollow cylindrical semiconductor films 131 arranged in the word-line contact region 20 do not form the memory strings MS to be caused to function as memory devices but are provided to simply separate the gate electrode films 134 arranged on both the side in the bit line direction of one memory string group MSG. Therefore, in the following explanation, the hollow cylindrical semiconductor films 131 (having a structure same as that of the memory strings MS) arranged in the word-line contact region 20 are also referred to as dummy cells.

In this structure, because the charge storage layers 133 are deposited on the sides of the hollow cylindrical semiconductor films 131, curvature radii are different in the tunnel dielectric films and the charge blocking films. Therefore, because an electric field can be more intensely concentrated on the tunnel dielectric films having the smaller curvature radius, it is possible to substantially improve writing and erasing characteristics compared with the plane MONOS structure. This is effective in performing MLC operation.

In the above explanation, the semiconductor films 131 are formed of the P-type polysilicon film to form a stacked memory in which transistors of the inversion type are connected to one another. However, it is also possible to form the semiconductor films 131 with an N-type polysilicon film and drive the semiconductor films 131 as transistors of the depletion type. In this case, to use the selection transistors ST arranged at the upper and lower ends of the memory cell MC row as normally-off selection transistors, channel portions thereof only have to be formed of the P-type polysilicon film and driven as the transistors of the inversion type.

Further, in the structure explained above, the gate electrode films 134 are formed only on one side in the bit line direction of the cylindrical channels. Only the one side of the cylindrical channels is used as a memory. However, because the memory cells are junction-free inversion-type cells, only the one side of cylindrical channel silicon is inverted and used as channels without any problem in transistor operation.

A method of manufacturing the nonvolatile semiconductor memory device having such a structure is explained. FIGS. 51A to 58F are schematic sectional views of an example of a procedure of a method of manufacturing the nonvolatile semiconductor memory device according to the sixth embodiment. Among these figures, a section in the word line direction of the memory cell region is shown in FIGS. 51A, 52A, 53A, 54A, 55A, 56A, 57A, and 58A. A section in a direction perpendicular to the word line direction of the memory cell region is shown in FIGS. 51B, 52B, 53B, 54B, 55B, 56B, 57B, and 58B. A plan sectional view taken along line XXV-XXV in FIGS. 51A, 52A, 53A, 54A, 55A, 56A, 57A, and 58A is shown in FIGS. 51C, 52C, 53C, 54C, 55C, 56C, 57C, and 58C. A plan sectional view taken along line XXVI-XXVI in FIGS. 51B, 52B, 53B, 54B, 55B, 56B, 57B, and 58B is shown in FIGS. 51D, 52D, 53D, 54D, 55D, 56D, 57D, and 58D. A section in the word line direction in a contact forming position of the word-line contact region is shown in FIGS. 51E, 52E, 53E, 54E, 55E, 56E, 57E, and 58E. A section in the word line direction in a dummy cell forming position of the word-line contact region is shown in FIGS. 51F, 52F, 53F, 54F, 55F, 56F, 57F, and 58F.

First, a not-shown peripheral circuit of the nonvolatile semiconductor memory device is formed on the semiconductor substrate 101. As shown in FIGS. 51A to 51F, impurities of a predetermined conduction type are implanted in the memory cell region of the semiconductor substrate 101 by an ion implantation method and activated to form the source regions 111. The source regions 111 can be, for example, an N type.

Subsequently, a plurality of the spacer films 121 forming memory cells and sacrificial films 122 are alternately stacked over the entire surface of the semiconductor substrate 101 by a film forming method such as the PECVD method. The stack ends with the spacer film 121. The stopper film 123 functioning as a polishing stopper during the CMP processing is formed on the spacer film 121 in the uppermost layer to form a stacked film. Specifically, six sacrificial films 122 are stacked. As a material of the sacrificial films 122, a material having a large etching rate compared with the spacer films 121 in processing by wet etching performed later is selected. For example, as the spacer films 121, a silicon oxide film can be used. As the sacrificial films 122, for example, a silicon nitride film can be used. As the stopper film 123, for example, a silicon nitride film can be used. As a method of forming the stacked film, besides the PECVD method, it is also possible to appropriately combine and use techniques such as the SACVD method, the LPCVD method, the sputtering method, and the SOD.

Subsequently, as shown in FIGS. 52A to 52F, processing for forming the stacked film in the word-line contact region in a step shape is performed by using the lithography technique and the RIE method to form the word-line contact region having a structure in which the sacrificial films 122 in the respective layers are exposed in a step shape. The formation of the step-like word-line contact portion is performed by a method same as the method explained with reference to FIGS. 7A to 9E in the first embodiment.

Thereafter, as shown in FIGS. 53A to 53F, the planarization film 141 is formed over the entire surface of the semiconductor substrate 101. As the planarization film 141, for example, a silicon oxide film can be used. Thereafter, the planarization film 141 is planarized by the CMP technique until the stopper film 123 is exposed.

Subsequently, a not-shown mask film is formed over the entire surface of the stopper film 123 and the planarization film 141. The stacked film in the memory cell region and the word-line contact region is collectively processed by the lithography technique and RIE method to form the through-holes 135 connecting with the semiconductor substrate 101. As the mask film, for example, a CVD carbon film can be used. The through-holes 135 are also formed at the same density in the word-line contact region in which it is unnecessary to form channels. Subsequently, the mask film is removed to form a mold of a channel semiconductor.

The mold of the channel semiconductor is formed at a first interval in the word line direction. An interval between the mold and a mold of a channel semiconductor adjacent on one side in the bit line direction is a second interval. An interval between the mold and a mold of a channel semiconductor adjacent on the other side is a third interval longer than the second interval.

Subsequently, as shown in FIGS. 54A to 54F, the semiconductor films 131 functioning as the channels are formed by a film forming method such as the LPCVD method. The semiconductor films 131 are formed to be deposited in a macaroni shape along the inner surfaces of the through-holes 135. When the semiconductor films 131 are deposited in a macaroni shape, the thickness of the semiconductor films 131 controlled by the gate electrode films 134 is equal among the stacked memory cells MC. Therefore, it is possible to reduce fluctuation in transistor characteristics among the memory cells MC. As the semiconductor films 131, for example, a B-doped polysilicon film can be used. The concentration of B can be set to, for example, $1\times10^{17}$ to $1\times10^{18}$ $cm^{-3}$.

Further, the dielectric films 132 formed of a silicon oxide film or the like are formed to fill the inside of the hollow cylindrical semiconductor films 131 by the ALD method. Thereafter, etch-back is performed by a method such as the RIE method to remove the semiconductor films 131 and the dielectric films 132 above the stopper film 123. Consequently, the hollow cylindrical semiconductor films 131 and the dielectric films 132 remain only in the through-holes 135. Subsequently, dopant impurities of a predetermined conduction type is ion-implanted in upper portions of the semiconductor films 131 by using the lithography technique and the ion implantation technique to form the drain regions 112. As the impurity element, for example, arsenic can be used.

Thereafter, as shown in FIGS. 55A to 55F, a not-shown mask film is formed over the entire surface of the semiconductor substrate 101. The stacked film and the planarization film 141 are collectively processed by the lithography technique and the RIE method to form the trenches 142. The trenches 142 have a shape extending in the word line direction to separate the semiconductor films 131 adjacent to each other in the bit line direction. The trenches 142 are formed in every other two memory string rows MSR extending in the word line direction. Consequently, the two memory string rows MSR divided by the trench 142 are formed as the memory string group MSG. As the mask film, for example, a CVD carbon film can be used. After the trenches 142 are formed, the mask film is removed.

Subsequently, as shown in FIGS. 56A to 56F, the sacrificial films 122 and the stopper film 123 are selectively removed by wet etching to form the hollows 122*a* among the upper and lower spacer films 121. Because the semiconductor films 131 function as columns and support the spacer films 121, the hollows 122*a* are not collapsed. When silicon oxide films are used as the spacer films 121 and silicon nitride films are used as the sacrificial films 122, as a chemical for the wet etching, for example, hot phosphoric acid can be used such that the silicon nitride films are more selectively etched compared with the silicon oxide films. The hollows 122*a* after the sacrificial films 122 are removed function as a mold in forming a MONOS structure later.

Thereafter, as shown in FIGS. 57A to 57F, the charge storage layers 133 forming MONOS cells are formed such that the sides of the columnar semiconductor films 131 partially covered with the spacer films 121 are covered. The charge storage layers 133 have a stacking structure of a tunnel dielectric film/a charge trapping film/a charge blocking film. As the tunnel dielectric film, for example, an ONO film formed by the LPCVD method can be used. As the charge trapping film, a silicon nitride film formed by the ALD method can be used. As the charge blocking film, an alumina film formed by the ALD method can be used. In the transistors adjacent to each other in an extending direction of the trenches 142 (the word line direction), parts of the charge storage layers 133 cross in the word line direction. The relation of Formula (1) holds in all the transistors on the memory strings MS. Parts of the charge storage layers 133 cross in the bit line direction in the transistors adjacent to each other at the second interval. The relation of Formula (1) holds in all the transistors on the memory strings MS. However, parts of the charge storage layers 133 do not cross in the bit line direction in the transistors adjacent to each other in the bit line direction at the third interval.

In FIGS. 53A to 53F, this is attained by forming the through-holes 135 adjacent to one another in the word line direction to meet Formula (3) for all depths and forming the through-holes 135 such that the one side in the bit line direction meets Formula (3) in all depths. However, a distance between the adjacent through-holes 135 is not a distance between the centers but is a distance between opposed nearest outer circumferential portions.

In this way, in the four memory cells MC adjacent to one another in the same plane in the memory string group MSG divided by the trenches 142, parts of the charge blocking films cross in the adjacent memory cells MC in the word line direction and the bit line direction. Consequently, it is possible to reduce a distance between the adjacent semiconductor films 131 and realize higher bit density per memory chip area.

Further downsizing is possible by crossing even the charge trapping films among transistors adjacent to one another. However, this is undesirable because, if the charge trapping films are crossed, it is likely that charges stored in the charge trapping films leak to the adjacent transistors via crossing portions. Therefore, when processing accuracy of the through-holes 135 is taken into account, it is possible to more surely cross (share) the charge blocking films among the adjacent transistors by increasing the thickness of the charge blocking films. Therefore, it is desirable to adopt a high dielectric material such as alumina, hafnia, or zirconia as the charge blocking films.

Further, the gate electrode films 134 are formed on the sides of the hollow cylindrical semiconductor films 131, in which the charge storage layers 133 are formed, by a film forming method such as the CVD method. Thereafter, the gate electrode films 134 formed on the bottoms of the trenches 142 and the like are recessed by the dry etching method and divided to be electrodes for the stacked transistors. Consequently, the gate electrode films 134 are symmetrically arranged on the outer side in the bit line direction in the memory string group MSG. The two gate electrode films 134 formed on the outer side in the bit line direction in the memory string group MSG are physically separated. As a material of the gate electrode films 134, for example, tungsten can be used. As an etching gas for dry etching, for example, plasma-excited $CF_4$ can be used.

Figure 59:
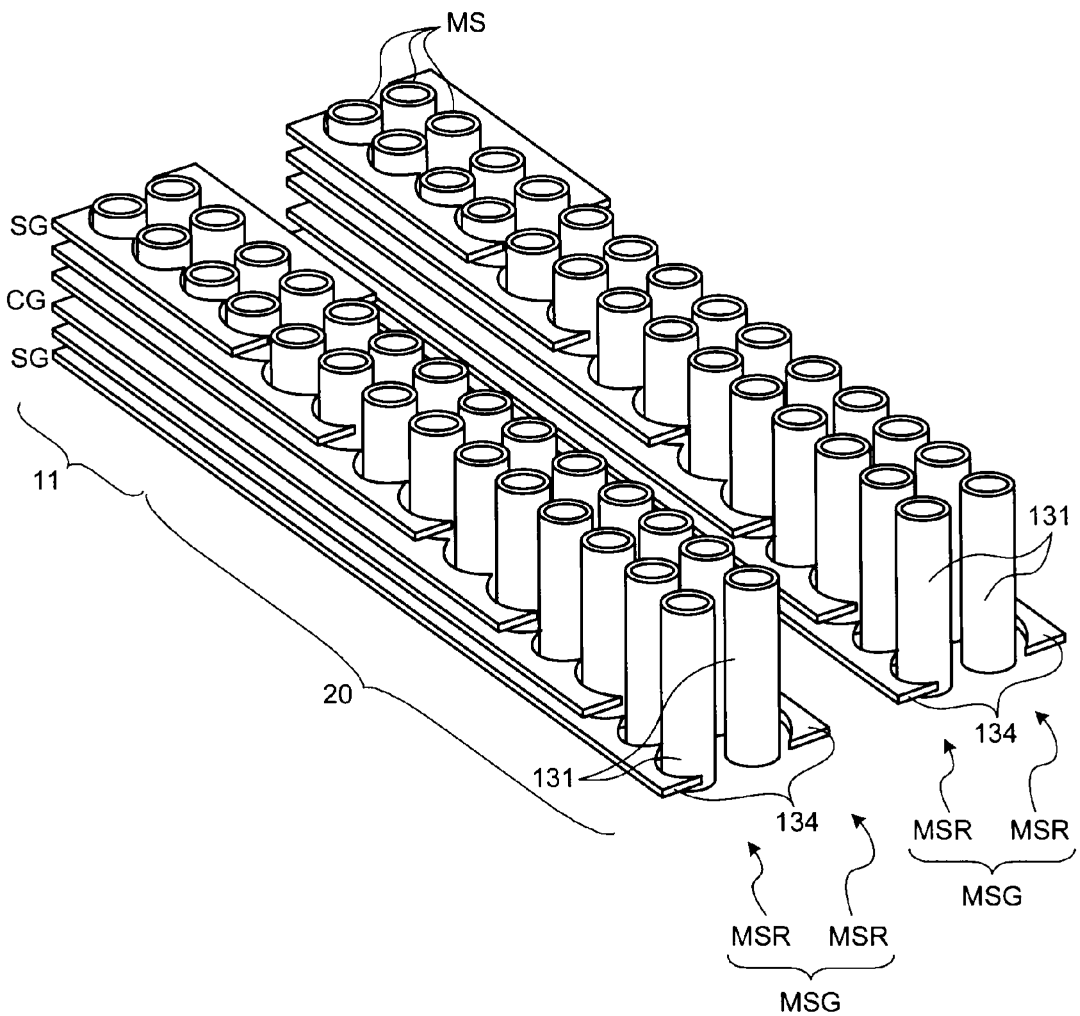
FIG. 59 is a schematic partial perspective view of states of the memory cell region and the word-line contact region in a state in which charge storage layers and gate electrode films are formed in columnar semiconductor films.

FIG. 59 is a schematic partial perspective view of states of the memory cell region and the word-line contact region in a state in which charge storage layers and gate electrode films are formed in columnar semiconductor films. When the gate electrode films 134 are formed, the charge storage layers 133 are formed in spaces among the four adjacent memory strings MS in the memory string group MSG such that a part of the charge storage layers 133 is shared among adjacent four transistors. Therefore, the gate electrode films 134 are not formed in the spaces. Specifically, parts of the charge blocking films cross adjacent transistors among the four transistors adjacent to one another in the same plane at all heights of the memory strings MS in the memory string group MSG. This makes it possible to automatically divide the gate electrode films 134 across the two semiconductor films 131 adjacent to each other at the second interval in the bit line direction, resulting in that the gate electrode films 134 function as independent two electrodes not physically connected. An additional processing step for dividing the gate electrode films 134 formed at the same height of the semiconductor films 131 in the bit line direction is unnecessary. Therefore, the gate electrode films are completely divided in the memory cell region 11 and the word-line contact region 20 in one memory string group MSG by providing dummy cells also in the word-line contact region 20 in which the memory cells MC are not originally provided.

Consequently, the gate electrode films 134 for six layers are collectively formed. The gate electrode films 134 in the first and sixth layers from the top are selection gate electrodes (SG). The gate electrode films 134 in the second to fifth layers from the top are control gate electrodes (CG).

Subsequently, as shown in FIGS. 58A to 58F, the interlayer dielectric film 143 is formed over the entire surface of the semiconductor substrate 101 by a film forming method such as the CVD method to fill the trenches 142. As the interlayer dielectric film 143, a TEOS/$O_3$ film can be used. The surface of the interlayer dielectric film 143 is planarized by the CMP technique.

Subsequently, the contact holes 144 connecting with the columnar semiconductor films 131 in the memory cell region and the gate electrode films 134 in the word-line contact region are formed by the lithography technique and the RIE method. Thereafter, conductive material films are filled in the contact holes 144 by a film forming method such as the CVD method. The conductive material films are planarized by the CMP technique until the interlayer dielectric film 143 is exposed. Consequently, the contacts 145 are formed. As a material of the contacts 145, for example, tungsten can be used.

Thereafter, the wiring layers 151 to 153 and the like connected to the contacts 145 are formed via the interlayer dielectric films 161 to 163 to form a multilayer wiring layer. Consequently, the nonvolatile semiconductor memory device having the structure shown in FIGS. 50A to 50E is obtained.

In the sixth embodiment, the hollow cylindrical semiconductor films 131 are formed in the memory cell region 11 and the word-line contact region 20 such that Formula (1) is met in the forming positions of all the transistors in the height direction of the memory strings MS in the memory string group MSG. Consequently, the gate electrode films 134 cannot penetrate among the transistors adjacent to one another in the word line direction and the bit line direction. The physically (electrically) divided two gate electrode films 134 are formed only on both the sides in the bit line direction of the memory string group MSG. In this way, it is possible to reduce a distance between the memory strings MS adjacent to each other in the word line direction and the bit line direction. Therefore, there is an effect that it is possible to increase memory bit density compared with the structure in the past.

In the structure in the sixth embodiment, it is possible to reduce the distance between the semiconductor films 131 to be close to a processing limit. Therefore, it is possible to substantially reduce pitches of the memory cells MC in the bit line and word line directions compared with the structure in the past in which the gate electrode films 134 are inserted among the adjacent semiconductor films 131. For example, when the diameter of the semiconductor films 131 (the outer diameter of the hollow cylindrical semiconductor films 131) is set 50 nanometers and the thickness of the charge storage layers 133 forming MONOS cells is 25 nanometers, in the structure in the past in which the gate electrode film 134 is inserted between the semiconductor films 131 adjacent to each other in the word line direction, the memory cell pitch in the word line direction is calculated by the following Formula (11):

Memory cell pitch in the word line direction=charge storage layer thickness+semiconductor film diameter+charge storage layer thickness+gate electrode film width restricted by processing conditions=25 nm+50 nm+25 nm+50 nm=150 nm (11)

In the structure in the past in which the gate electrode films 134 are also inserted among the semiconductor films 131 adjacent to each other in the bit line direction, the memory cell pitch in the bit line direction is calculated by the following Formula (12):

Memory cell pitch in the bit line direction=gate electrode film width restricted by processing conditions+charge storage layer thickness+semiconductor film diameter+charge storage layer thickness+gate electrode film width restricted by processing conditions+gate electrode film interval restricted by processing conditions=25 nm+25 nm+50 nm+25 nm+25 nm+50 nm=200 nm (12)

When a cell area of the structure in the past is calculated by using Formulas (11) and (12), it is seen that an area of about 30,000 $nm^2$ is necessary.

On the other hand, in the structure of the sixth embodiment, the memory cell pitch in the word line direction is calculated by the following Formula (13):

Memory cell pitch in the word line direction=semiconductor film diameter+total of thicknesses of the tunnel dielectric film and the charge trapping film in the charge storage layer+total of thicknesses of the tunnel dielectric film and the charge trapping film in the charge storage layer+distance between nearest charge trapping films=50 nm+10 nm+10 nm+5 nm=75 nm (13)

The memory cell pitch in the bit line direction is calculated by the following Formula (14) in average because an interval between the memory cells MC and adjacent one memory string row MSR is the second interval and an interval between the memory cells MC and adjacent the other memory string row MSR is the third interval:

Memory cell pitch in the bit line direction=(gate electrode film width restricted by processing conditions+charge storage layer thickness+semiconductor film thickness+total of thicknesses of the tunnel dielectric film and the charge trapping film in the charge storage layer+total of thicknesses of the tunnel dielectric film and the charge trapping film in the charge storage layer+distance between nearest charge trapping films+semiconductor film diameter+charge storage layer thickness+gate electrode film thickness restricted by processing conditions+gate electrode interval restricted by processing conditions)/2=(25 nm+25 nm+50 nm+10 nm+10 nm+5 nm+50 nm+25 nm+25 nm+50 nm)/2=137.5 nm (14)

A cell area in the sixth embodiment is calculated by the following Formula (15) using Formulas (13) and (14):

Cell area=pitch in the word line direction×pitch in the bit line direction=75 nm×137.5 nm=10,312.5 $nm^2$ (15)

In this way, with the structure in the sixth embodiment, it is expected that the cell area can be reduced to about one third of that in the related art. This indicates that about triple bit density can be realized by the number of stacked layers equivalent to that in the related art or bit density equivalent to that of a memory formed by the related art can be attained by the number of stacked layers about one third of that in the related art. For example, when stack of twenty-four layers is necessary in the past, with the structure of the sixth embodiment, it is possible to realize bit density equivalent to that in the past with stack of eight layers.

According to the sixth embodiment, it is possible to realize higher bit density with a smaller number of stacked layers, i.e., a lower solid structure. Therefore, it is possible to provide a nonvolatile semiconductor memory device having higher bit density without imposing large load on process integration. Further, the semiconductor films 131 are formed by being deposited in the independent through-holes 135 earlier than the formation of the gate electrode films 134. Therefore, the channels are not short-circuited even if the distance between the channels (the semiconductor films 131) is reduced.

In the sixth embodiment, the nonvolatile semiconductor memory device has the structure in which the memory strings having the selection transistors formed at both the upper and lower ends are arranged in a matrix shape substantially perpendicularly on the substrate. In a seventh embodiment, a nonvolatile semiconductor memory device has a structure in which a pair of memory strings adjacent to each other in a bit line direction are connected in a lower portion.

Figure 60:
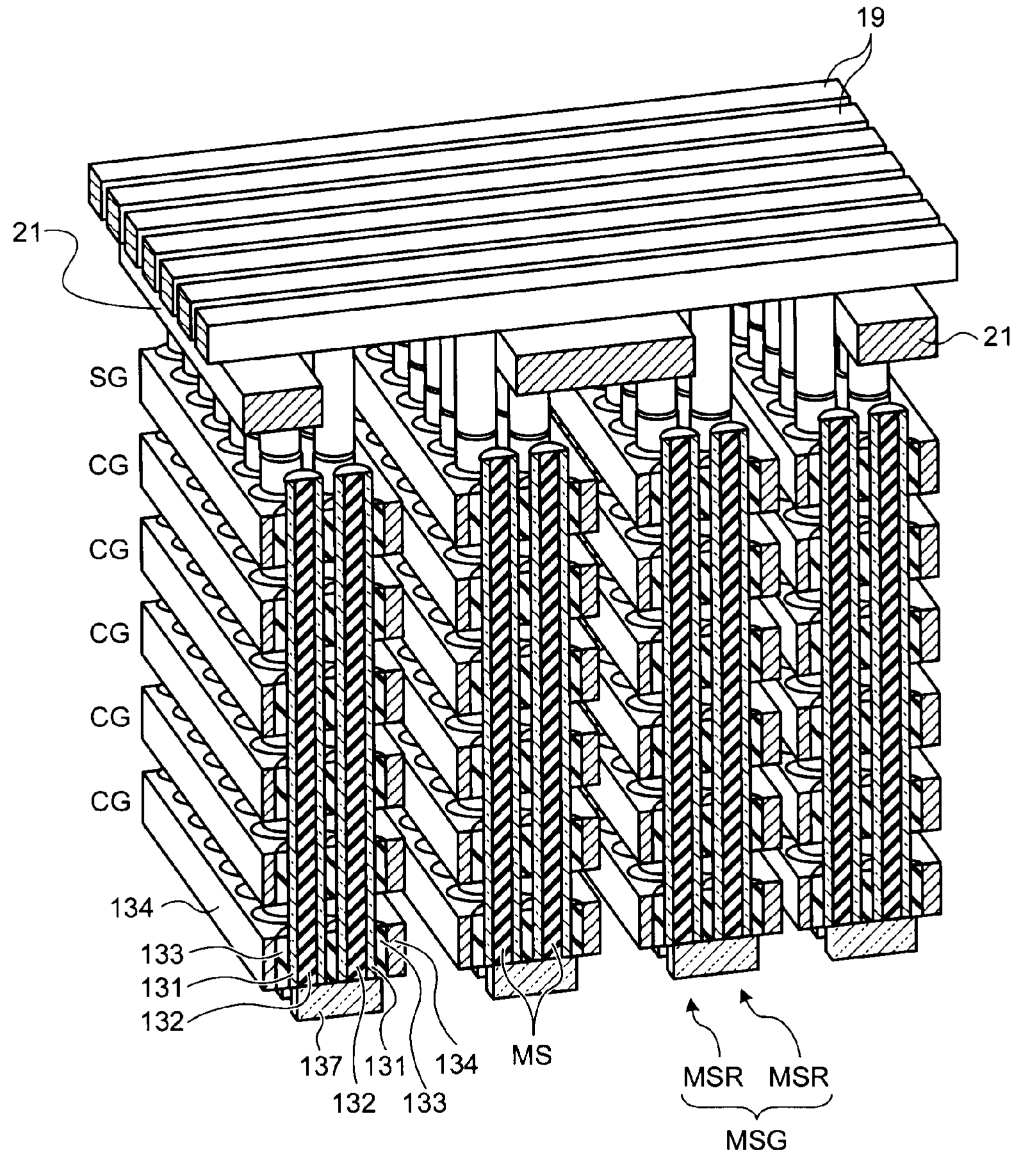
FIG. 60 is a schematic perspective view of an example of a nonvolatile semiconductor memory device according to a seventh embodiment.
Figure 61A:
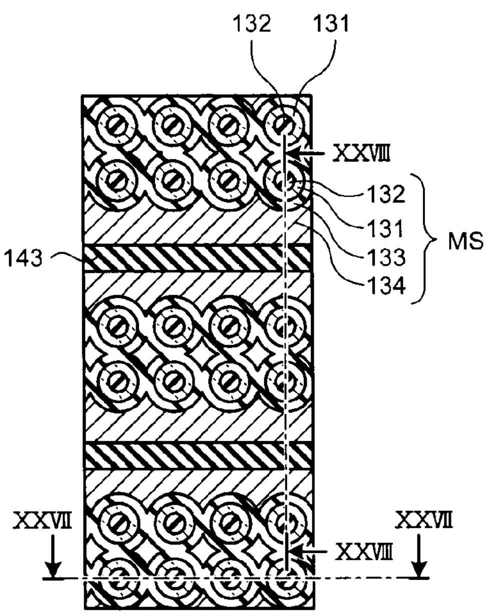
FIGS. 61A to 61E are schematic sectional views of an example of the configuration of the nonvolatile semiconductor memory device according to the seventh embodiment.
Figure 61B:
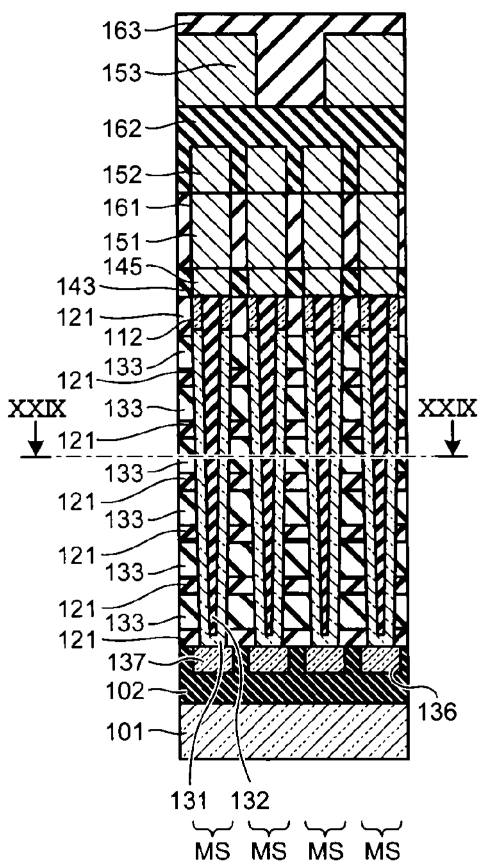
Figure 61C:
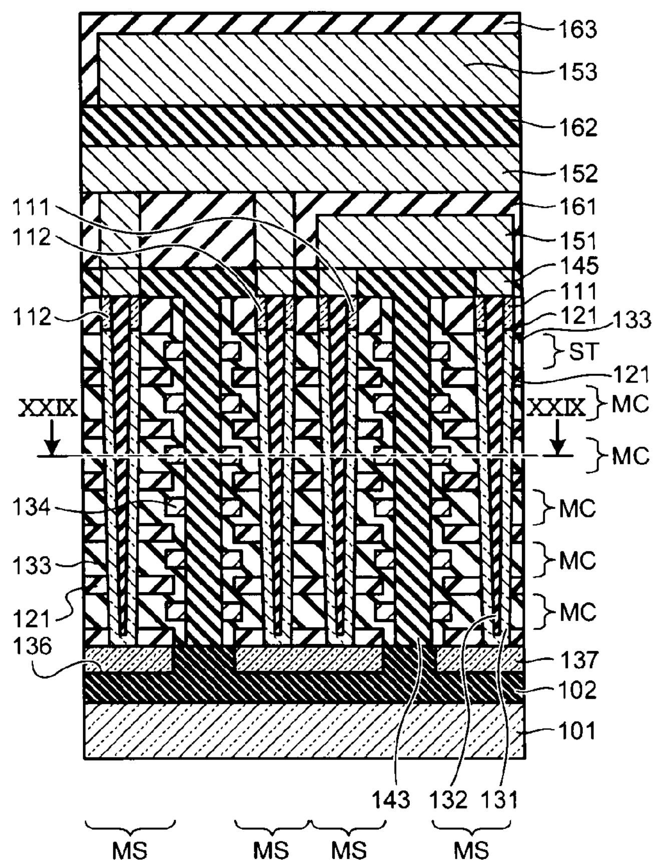
Figure 61D:
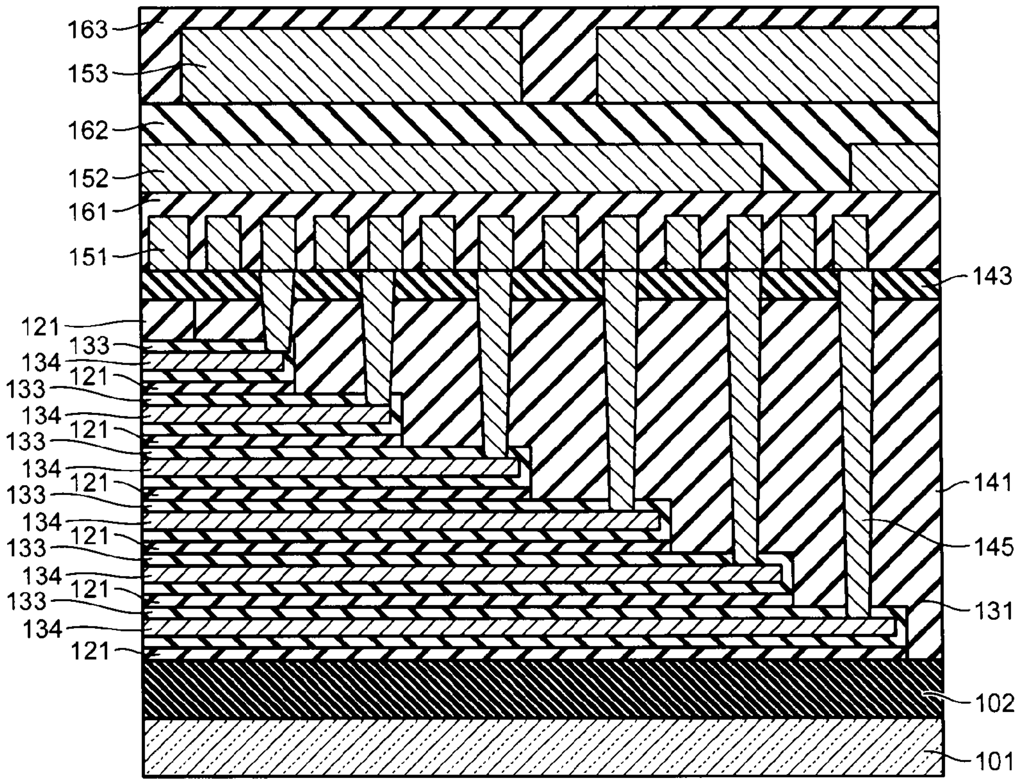
Figure 61E:
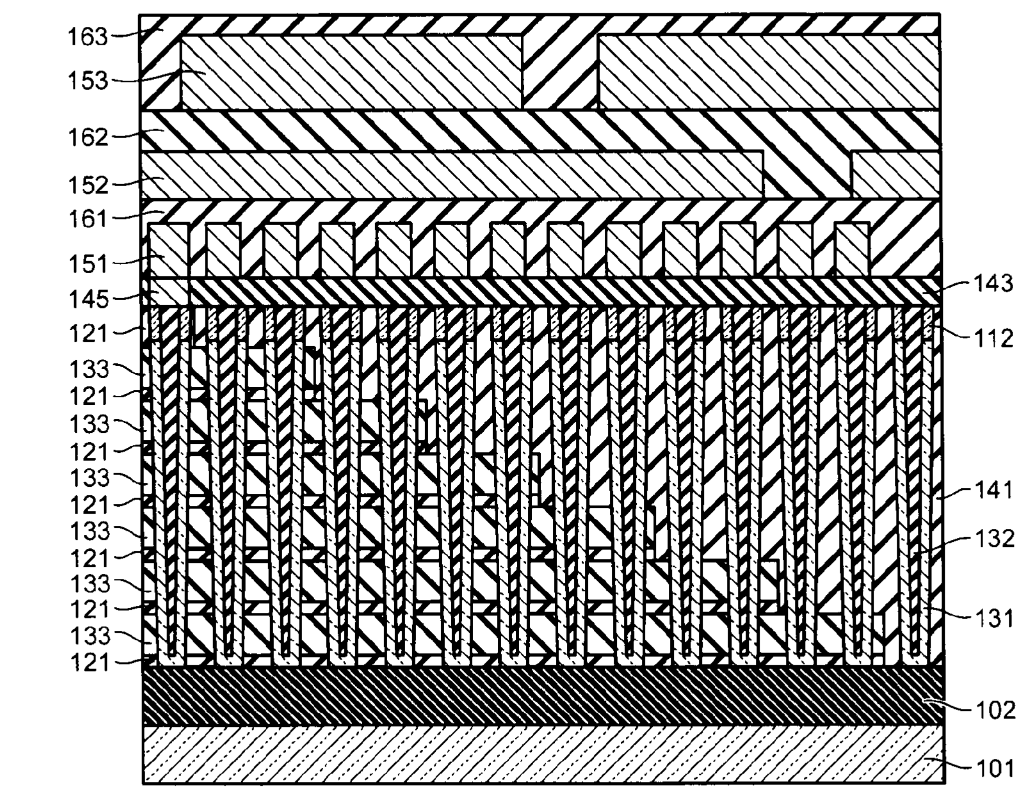

FIG. 60 is a schematic perspective view of an example of the configuration of a nonvolatile semiconductor memory device according to the seventh embodiment. An overview of the structure of a memory cell region is shown in the figure. FIGS. 61A to 61E are schematic sectional views of an example of the configuration of the nonvolatile semiconductor memory device according to the seventh embodiment. FIG. 61A is a plan sectional view of the memory cell region. FIG. 61B is a sectional view taken along line XXVII-XXVII in FIG. 61A. FIG. 61C is a sectional view taken along line XXVIII-XXVIII in FIG. 61A. FIG. 61D is a sectional view in a direction perpendicular to the bit line direction in a word-line-contact forming position of a word-line contact region. FIG. 61E is a sectional view in the direction perpendicular to the bit line direction in a position corresponding to a forming position of memory strings in the word-line contact region. FIG. 61A is equivalent to a section taken along line XXIX-XXIX in FIGS. 61B and 61C.

In the seventh embodiment, a not-shown peripheral circuit section is formed on the semiconductor substrate 101. The memory cell region 11 and the word-line contact region 20 are formed on the peripheral circuit section via the interlayer dielectric film 102. In the memory cell region 11, as shown in FIGS. 60 to 61C, the memory strings MS including the memory cells MC having the gate electrode films 134 formed over the sides of the hollow cylindrical semiconductor films 131 on the charge storage layers 133 are two-dimensionally arranged substantially perpendicularly on the interlayer dielectric film 102. The memory strings MS are arranged at a first interval in the word line direction, arranged at a second interval from one adjacent memory strings MS in the bit line direction, and arranged at a third interval wider than the second interval from the other adjacent memory strings MS. Consequently, the memory string groups MSG each formed by the two memory string rows MSR, in which the memory strings MS are arranged in the word line direction at the first interval, arranged in parallel in the bit line direction at the second interval are arranged in parallel at the third interval in the bit line direction. It is assumed that the hollow cylindrical semiconductor films 131 are formed by a P-type semiconductor material such as P-type polysilicon. The bottoms of the hollow cylindrical semiconductor films 131 have not ring shape but plate-like shape. The dielectric films 132 such as silicon oxide films are formed to fill the inside of the hollow cylindrical semiconductor films 131.

Each of the memory strings MS has a structure in which a plurality of transistors having the gate electrode films 134 formed over the sides of the hollow cylindrical semiconductor films 131 on the charge storage layers 133 are connected in series in the height direction. Among the transistors, the transistor at the upper end is the selection transistor ST. One or more memory cell transistors MC are formed below the selection transistor ST (on the semiconductor substrate 101 side). In the figures, five memory cell transistors MC are formed. In the seventh embodiment, as in the embodiments explained above, the structure of the selection transistors ST is the same as the structure of the memory cell transistors MC. The structure of the selection transistors ST and the memory cell transistors MC forming the memory strings MS is the same as that in the sixth embodiment. Therefore, explanation of the structure is omitted. In the memory cell region 11, selection gate electrodes of the selection transistors ST of the memory strings MS arrayed in a predetermined direction are connected to each other. Control gate electrodes of the memory cell transistors MC at the same height of the memory strings MS arrayed in the predetermined direction are connected to each other.

A pair of memory strings MS adjacent to each other in the bit line direction in the memory string group MSG are connected to each other by channel connection layers 137 formed in the interlayer dielectric film 102. The channel connection layers 137 are formed of a semiconductor material having polarity different from that of the semiconductor films 131, for example, an N-type semiconductor material such as N-type polysilicon.

In this way, in the seventh embodiment, the two memory strings MS connected by the channel connection layers 137 form one memory cell row. Therefore, the selection transistor ST of one memory string MS functions as a source-side selection transistor and the selection transistor ST of the other memory cell string MS functions as a drain-side selection transistor. The source region 111 is formed at the upper end of the semiconductor film 131 of the memory string MS in which the source-side selection transistor is formed. The drain region 112 is formed at the upper end of the semiconductor film 131 of the memory string MS in which the drain-side selection transistor is formed.

Further, as shown in FIG. 60, the memory strings MS of one memory string row MSR of the memory string groups MSG are connected to bit lines 19 above the memory strings MS. The memory strings MS of the other memory string row MSR are connected to source lines 21, which supply voltage, above the memory strings MS. The memory string rows MSR connected to the source lines 21 are arranged to be opposed to each other between the adjacent memory string groups MSG. Consequently, the adjacent two memory string groups MSG can share the source lines 21.

As materials of the semiconductor substrate 101, the spacer films 121, the semiconductor films 131, the charge storage layers 133, and the gate electrode films 134, materials same as those in the first embodiment can be used. Other components are substantially the same as those in the first to sixth embodiments. Therefore, components same as those in the first to sixth embodiments are denoted by the same reference numerals and signs and explanation of the components is omitted.

Further, in the seventh embodiment, the memory strings MS are formed such that a distance between nearest adjacent channels in transistor forming positions at all the heights of the memory strings MS adjacent to each other in the word line direction (the extending direction of the gate electrode films 134) and the bit line direction in the memory string group MSG meets the relation of Formula (1) as in the sixth embodiment.

A method of manufacturing the nonvolatile semiconductor memory device having such a structure is basically the same as that in the sixth embodiment. However, a step of forming the interlayer dielectric film 102 on the semiconductor substrate 101 and forming the channel connection layers 137 is different. Specifically, after a not-shown peripheral circuit of the nonvolatile semiconductor memory device is formed on the semiconductor substrate 101, the interlayer dielectric film 102 is formed in a forming area of the memory cell region and the word-line contact region of the semiconductor substrate 101 on which the peripheral circuit is formed. The trenches 136 for forming the channel connection layers 137 are formed by the lithography technique and the RIE method. The trenches 136 are formed at length enough for connecting the two memory strings MS adjacent to each other in the bit line direction in the memory string group MSG. Subsequently, the channel connection layers 137 are formed on the interlayer dielectric film 102 in which the trenches 136 are formed, then the channel connection layers 137 are recessed by a method such as the CMP method until the interlayer dielectric film 102 is exposed. Consequently, the channel connection layers 137 are formed only in the trenches 136. As the interlayer dielectric film 102, for example, a silicon oxide film can be used. As the channel connection layers 137, a P-doped N-type polysilicon film can be used. Thereafter, it is possible to manufacture the nonvolatile semiconductor memory device shown in FIGS. 60 to 61E by executing a procedure same as the procedure explained in the sixth embodiment.

According to the seventh embodiment, the two memory strings MS adjacent to each other in the bit line direction in the memory string group MSG are connected and used as one memory cell row. Therefore, it is possible to reduce the number of selection gate electrodes compared with the sixth embodiment. As a result, in addition to the effects of the sixth embodiment, an effect can be obtained that it is possible to integrate a large number of memory cells with a small number of stacked layers.

Figure 62:
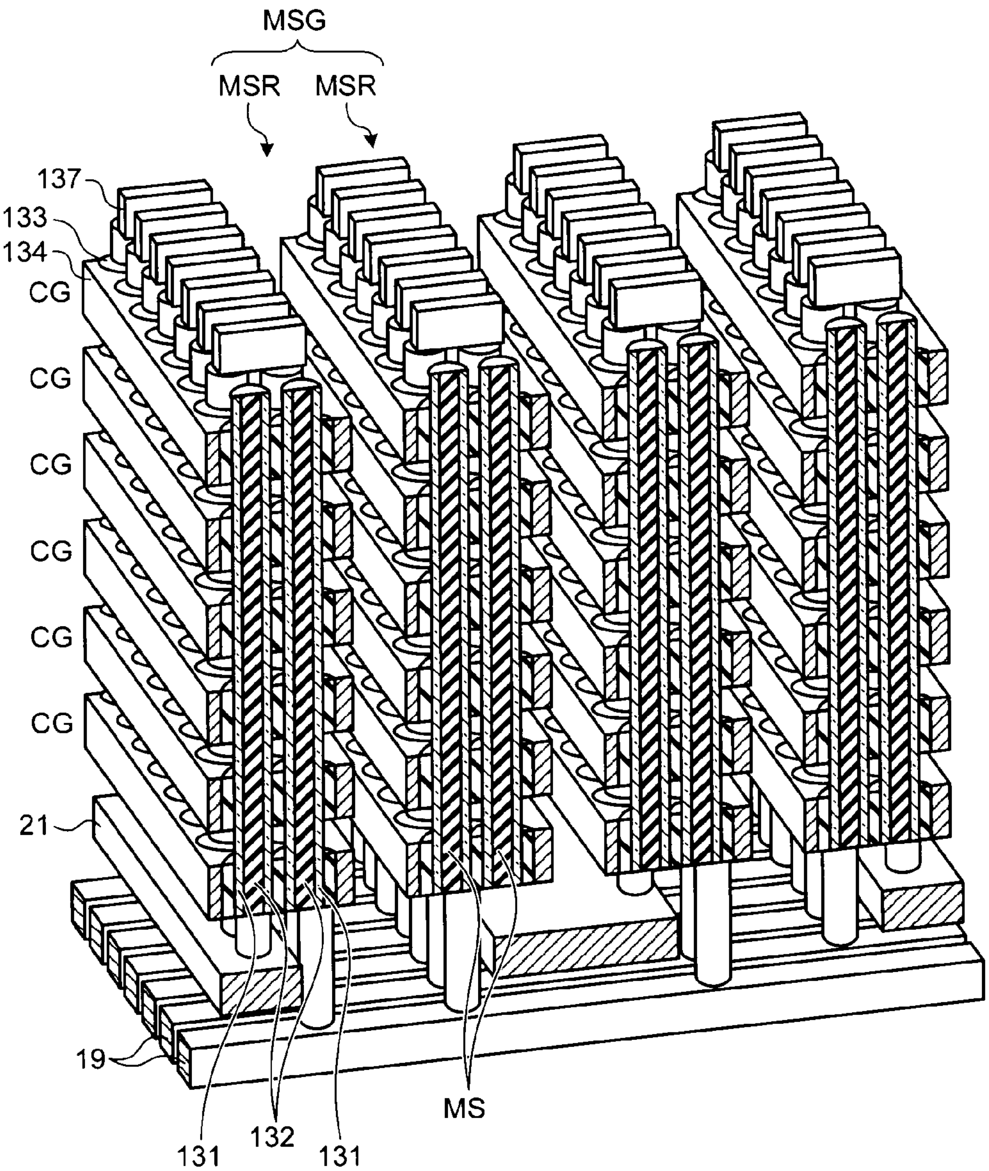
FIG. 62 is a schematic perspective view of the structure of a nonvolatile semiconductor memory device according to an eighth embodiment.

FIG. 62 is a schematic perspective view of the structure of a nonvolatile semiconductor memory device according to an eighth embodiment. In the nonvolatile semiconductor memory device, the structure shown in FIG. 60 is reversed upside down. Specifically, the bit lines 19 are formed on a not-shown first interlayer dielectric film, a not-shown second interlayer dielectric film is formed on the bit lines 19, the source lines 21 are formed on the second interlayer dielectric film, and a not-shown third interlayer dielectric film is formed on the source lines 21. The memory strings MS having the transistors in a plurality of layers are arranged on a forming position of the bit lines 19 and the source line 21 in lower portions. A method of arranging the memory strings MS is the same as that explained in the sixth and seventh embodiments.

Upper portions of the two memory strings MS adjacent to each other in the bit line direction in the memory string group MSG are connected by the channel connection layer 137. As in the embodiments explained above, one memory cell row is formed by the two memory strings MS connected by the channel connection layer 137. The nonvolatile semiconductor memory device according to the eighth embodiment can be manufactured by a method same as the method explained in the sixth and seventh embodiments.

In the structure in the first to seventh embodiments, wires such as the bit lines 19 are formed in upper portions of the memory strings MS via the interlayer dielectric films 143. However, when the wires are drawn out from the upper portions of the memory strings MS, because the wires connected to the peripheral circuit are long, parasitic capacitance increases. As a result, it is likely that an SN ratio is deteriorated or operation speed falls.

However, in the structure in the eighth embodiment, because the wires such as the bit lines 19 are arranged in the lower portions of the memory strings MS, it is possible to reduce the length of the wires connected to the peripheral circuit compared with the first to seventh embodiments and reduce the parasitic capacitance. As a result, it is possible to improve the SN ratio and increase the operation speed compared with the first to seventh embodiments. There is also an effect that it is easy connect the peripheral circuit formed on the semiconductor substrate 101 to the memory strings MS with the wires. As in the eight embodiment, the structure in which the adjacent memory strings MS are connected in the upper portions thereof rather than in the lower portions thereof by the channel connection layers 137 can be applied to the structure explained in the second and fifth embodiments.

Figure 63:
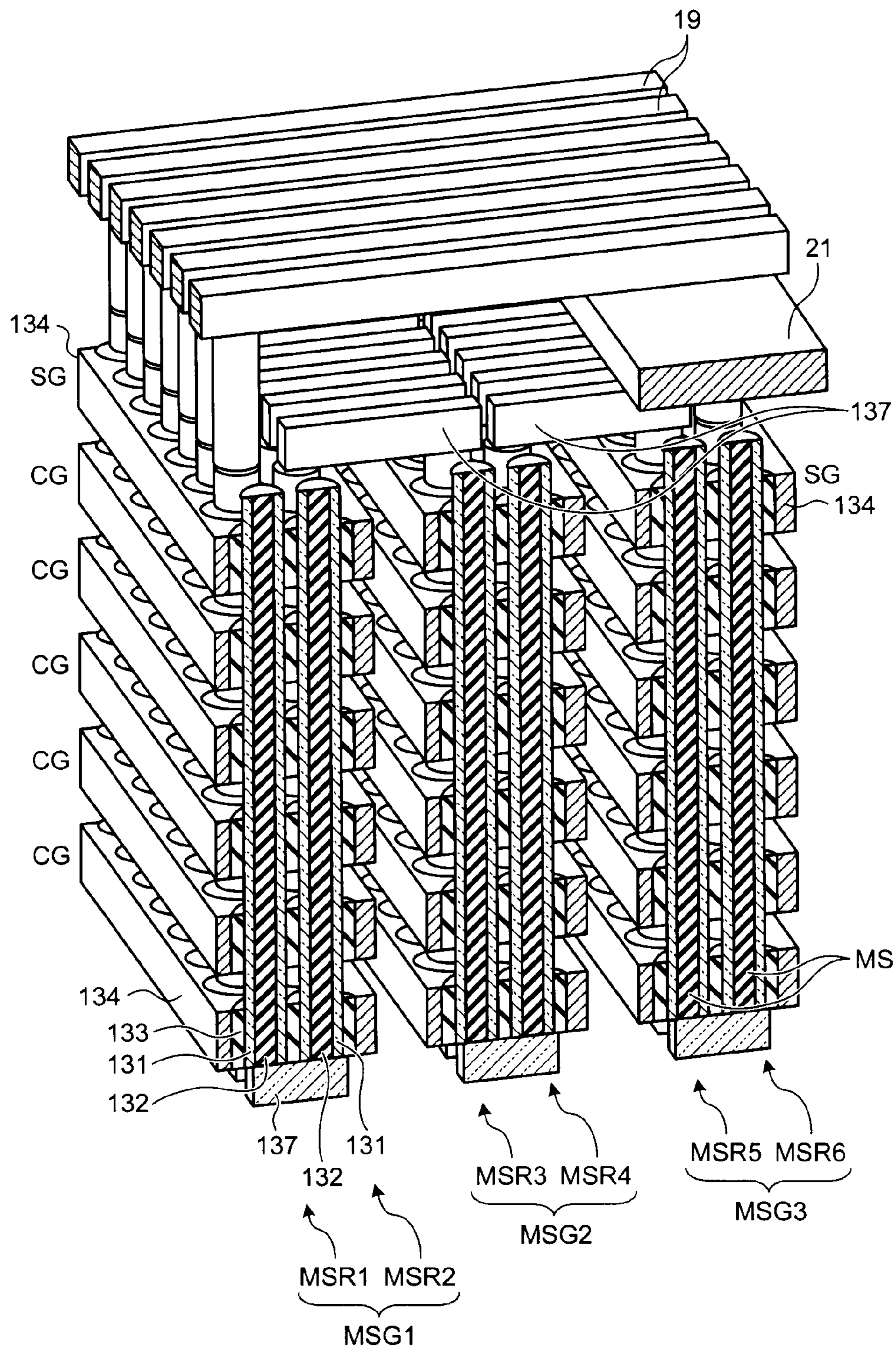
FIG. 63 is a schematic perspective view of the structure of a nonvolatile semiconductor memory device according to a ninth embodiment.

FIG. 63 is a schematic perspective view of the structure of a nonvolatile semiconductor memory device according to a ninth embodiment. In the seventh or eighth embodiment, the lower portions or the upper portions of the memory strings MS adjacent to each other in the bit line direction in one memory string group MSG are connected by the channel connection layer 137. In the ninth embodiment, upper portions or lower portions of the two memory strings MS opposed (adjacent) to each other between different memory string groups adjacent to each other in the bit line direction are connected by the channel connection layer 137.

In FIG. 63, the two memory strings MS adjacent to each other in the bit line direction of a first memory string group MSG1 are connected by the channel connection layer 137 in lower portions of the two memory strings MS. This is the same in second and third memory string groups MSG2 and MSG3. A second memory string row MSR2 of the first memory string group MSG1 and a first memory string row MSR3 of the second memory string group MSG2 are connected by the channel connection layer 137 in upper portions thereof. Similarly, a second memory string row MSR4 of the second memory string groups MSG2 and a first memory string row MSR5 of the third memory string group MSG3 are connected by the channel connection layer 137 in upper portions thereof. The bit lines 19 are connected to upper portions of the memory strings MS forming a first memory string row MSR1 of the first memory string group MSG1. The source lines 21 are connected to upper portions of the memory strings MS forming a second memory string row MSR6 of the third memory string group MSG3. Selection gate electrodes SG are the gate electrode film 134 formed in the uppermost layer of the first memory string row MSR1 of the first memory string group MSG1 and the gate electrode film 134 formed in the uppermost layer of the second memory string row MSR6 of the third memory string group MSG3.

In other words, the memory strings MS adjacent to one another in the bit line direction are connected by the channel connection layers 137 in lower portions thereof in the memory string groups MSG and connected by the channel connection layers 137 in upper portions thereof among the memory string groups MSG. As a result, in FIG. 63, six memory string rows MSR form one memory cell row.

Other components and a manufacturing method are the same as those explained in the sixth to eighth embodiments. Therefore, explanation of the components and the manufacturing method is omitted. In FIG. 63, the bit lines 19 and the source lines 21 are arranged on the upper side. However, as in the eighth embodiment, the bit lines 19 and the source lines 21 can be arranged on the lower side. Further, in FIG. 63, the six memory strings MS are connected in series by the channel connection layers 137. However, an arbitrary number of memory strings MS can be connected in series by the channel connection layers 137. The ninth embodiment can also be applied to the structures explained in the second and fifth embodiment.

According to the ninth embodiment, the memory strings MS adjacent to one another in the bit line direction are alternately connected by the channel connection layers 137 on the upper or lower side. Therefore, it is possible to further reduce the number of selection gate electrodes SG compared with the seventh and eighth embodiments. In other words, it is possible to further lower a ratio of the selection gate electrodes SG in the gate electrode films 134. This makes it possible to reduce the number of wires for connection to the peripheral circuit compared with the first to eighth embodiments. Therefore, it is possible to reduce an area of the peripheral circuit and an area for drawing out the wires from the memory cell region. As a result, it is possible to suppress an overall memory cell area including the peripheral circuit.

In the sixth to ninth embodiments, a distance between the through-holes for memory string formation is appropriately controlled to divide, with the dielectric films forming a MONOS, the two gate electrode films on both the sides of the memory string group. In a tenth embodiment, a nonvolatile semiconductor memory device has a structure in which a trench for dividing two gate electrode films is formed before the through-holes for memory string formation is formed. In the following explanation, as an example, in a nonvolatile semiconductor memory device having a structure same as the structure in the sixth embodiment, gate electrode films among memory string rows in a memory string group are divided.

Figure 64A:
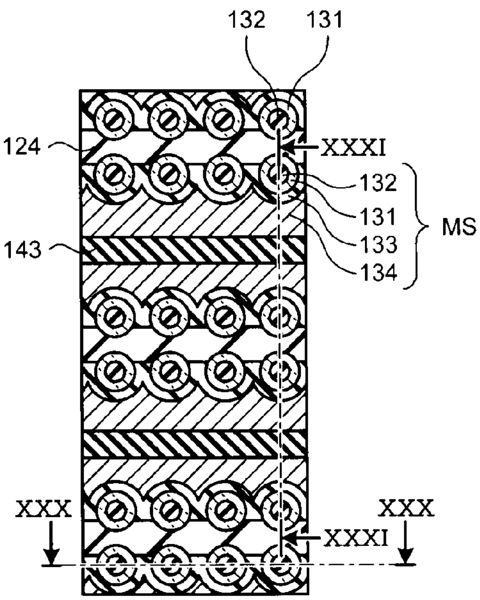
FIGS. 64A to 64D are schematic sectional views of an example of the configuration of a nonvolatile semiconductor memory device according to a tenth embodiment.
Figure 64B:
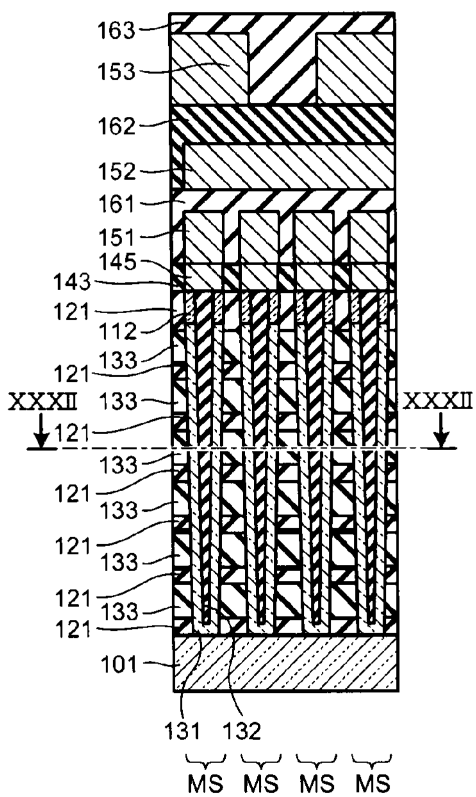
Figure 64C:
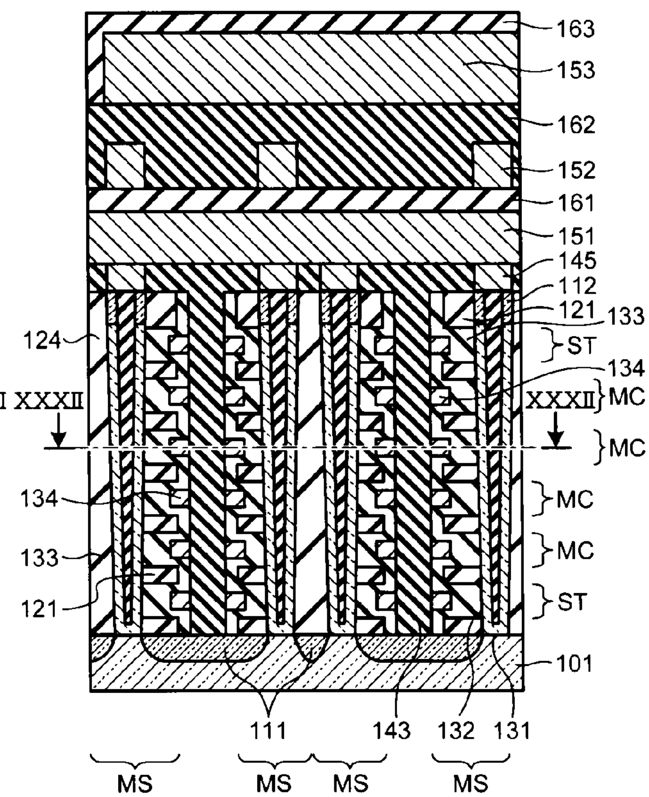

FIGS. 64A to 64D are schematic sectional views of an example of the configuration of a nonvolatile semiconductor memory device according to the tenth embodiment. FIG. 64A is a plan sectional view of a memory cell region. FIG. 64B is a sectional view taken along line XXX-XXX in FIG. 64A. FIG. 64C is a sectional view taken along line XXXI-XXXI in FIG. 64A. FIG. 64 is a sectional view in a direction perpendicular to a bit line direction of a word-line contact region. FIG. 64A is equivalent to a section taken along line XXXII-XXXII in FIGS. 64B and 64C.

As shown in FIGS. 64A to 64C, the memory cell region has a structure substantially the same as the structure in the sixth embodiment. However, the charge storage layers 133 and the gate electrode films 134 provided at the respective heights of the two memory strings MS adjacent to each other in the bit line direction in the memory string group are separated by the insulating film 124 passing near the center between the two memory strings MS adjacent to each other in the bit line direction and extending in the word line direction. The insulating film 124 is provided to be extended to the word-line contact region. In the tenth embodiment, the semiconductor films 131 adjacent to each other in the word line direction do not have to be formed to meet Formula (1) explained in the sixth embodiment.

Figure 64D:
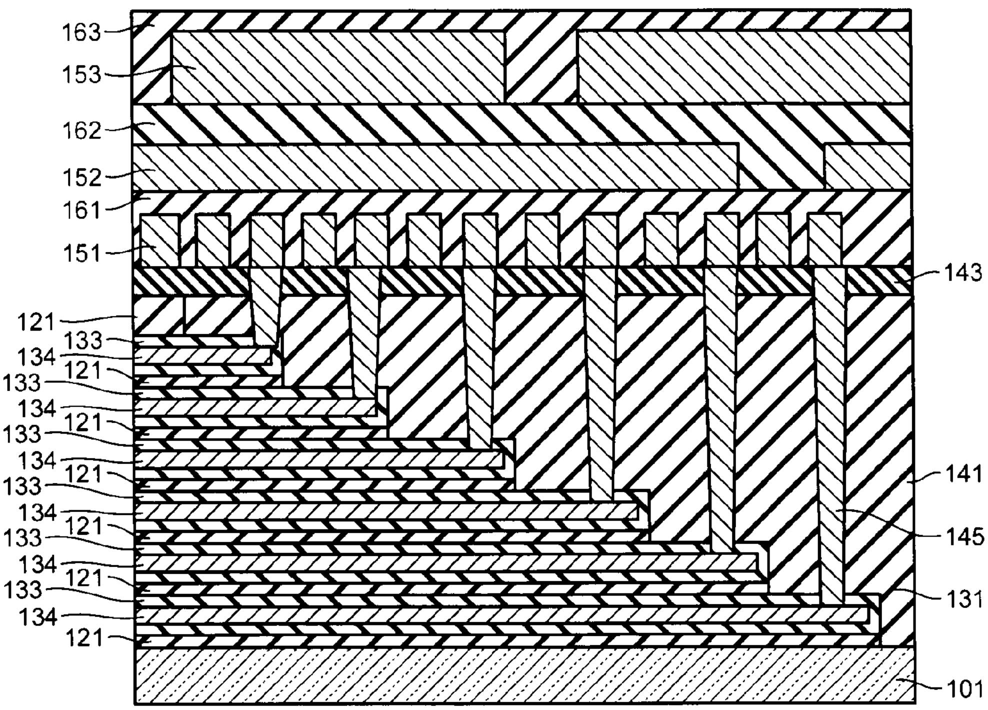
Figure 65A:
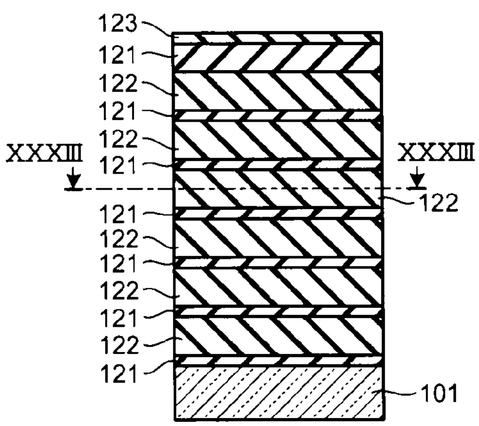
FIGS. 65A to 73E are schematic sectional views of an example of a procedure of a method of manufacturing the nonvolatile semiconductor memory device according to the tenth embodiment.
Figure 65B:
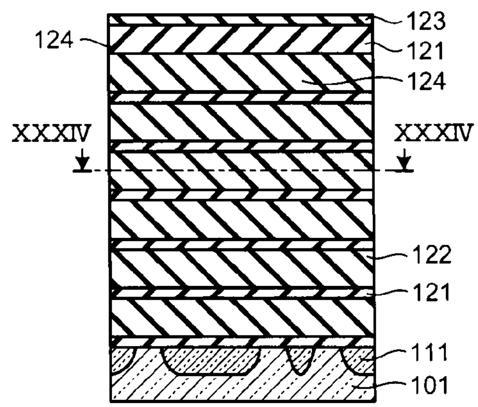
Figure 65C:
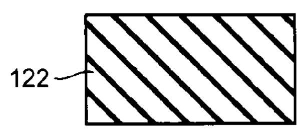
Figure 65D:
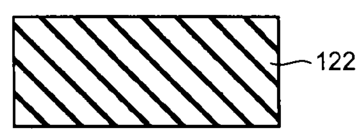
Figure 65E:
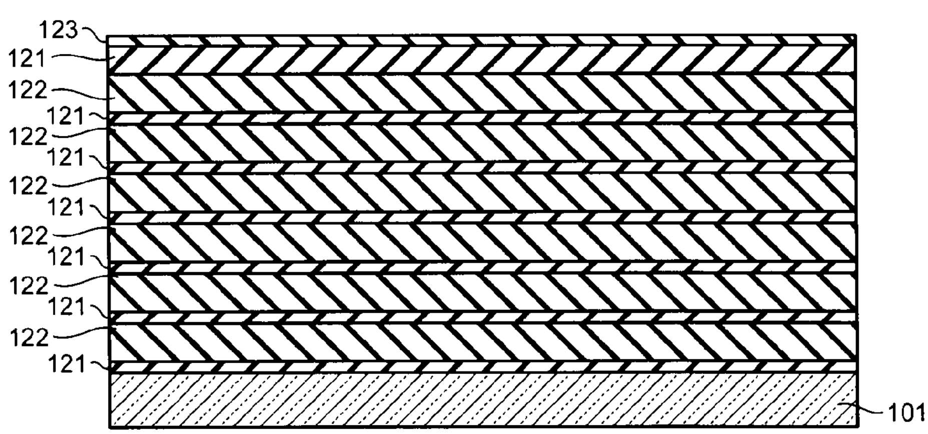
Figure 66A:
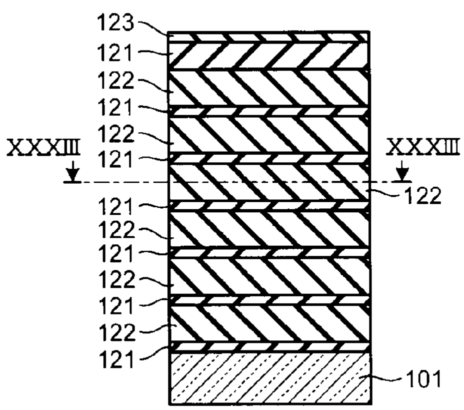
Figure 66B:
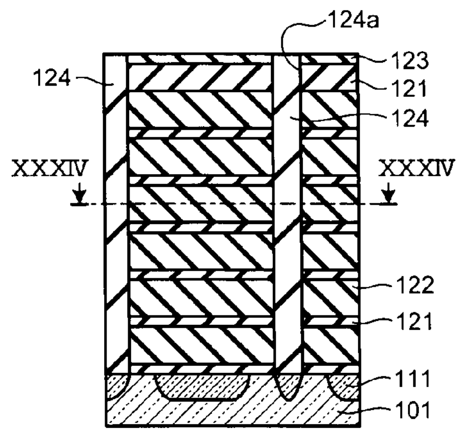
Figure 66C:
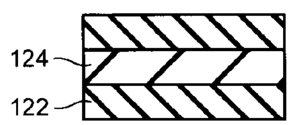
Figure 66D:
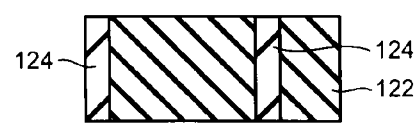
Figure 66E:
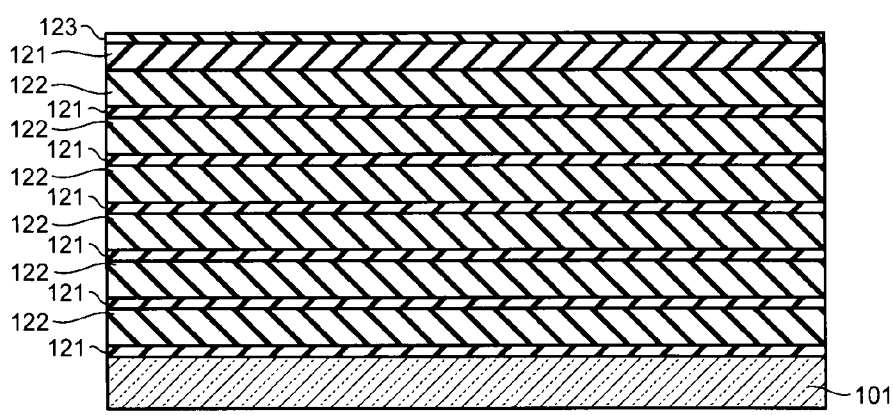
Figure 67A:
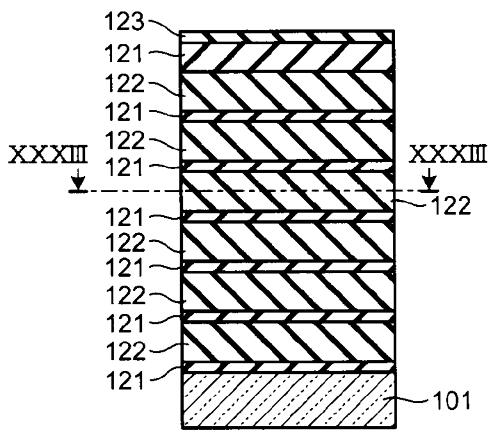
Figure 67B:
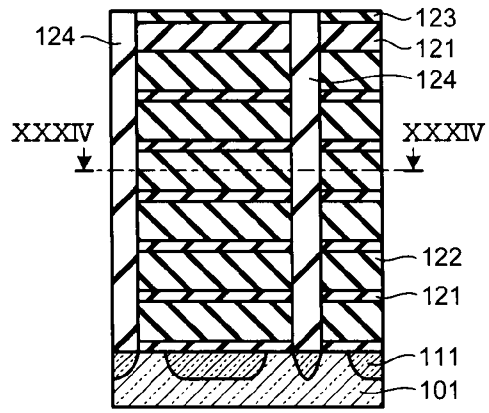
Figure 67C:
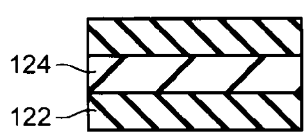
Figure 67D:
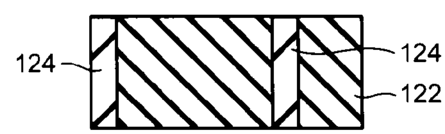
Figure 67E:
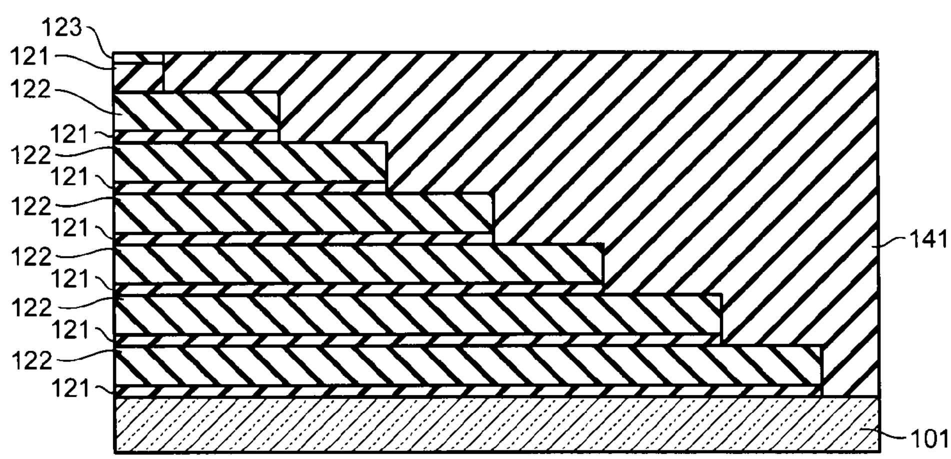
Figure 68A:
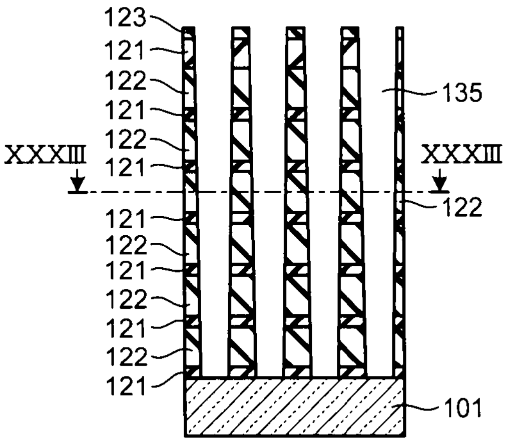
Figure 68B:
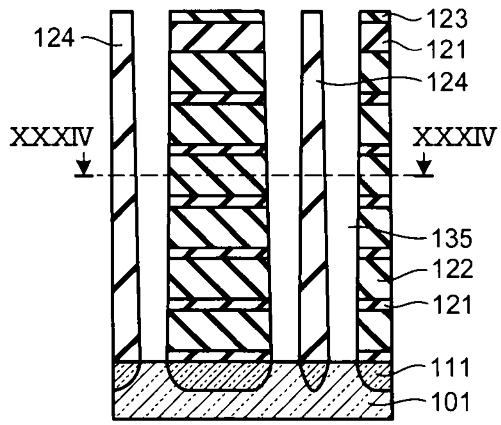
Figure 68C:
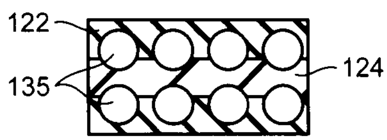
Figure 68D:
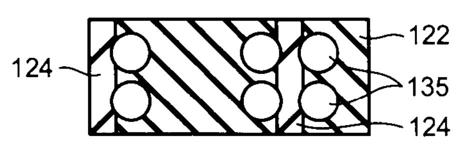
Figure 68E:
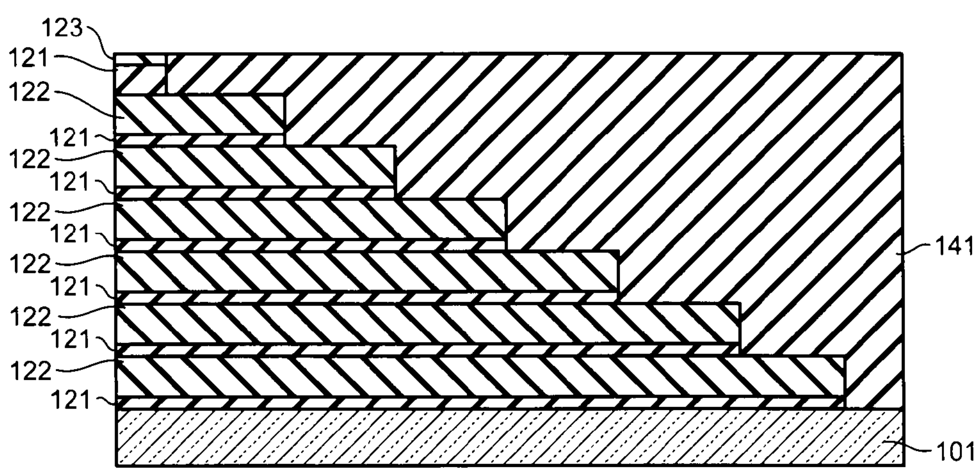
Figure 69A:
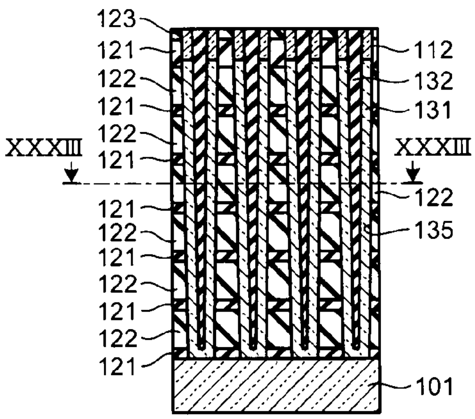
Figure 69B:
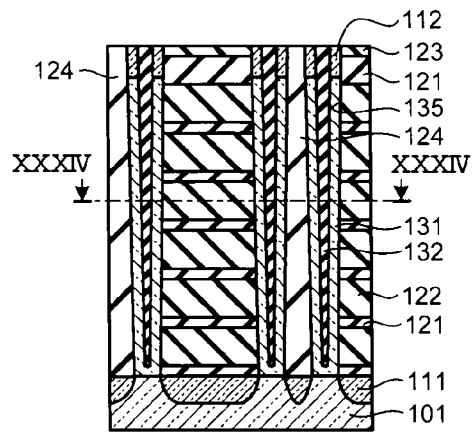
Figure 69C:
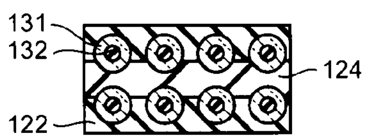
Figure 69D:
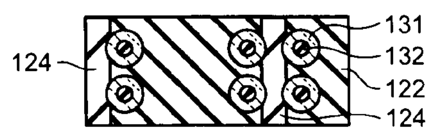
Figure 69E:
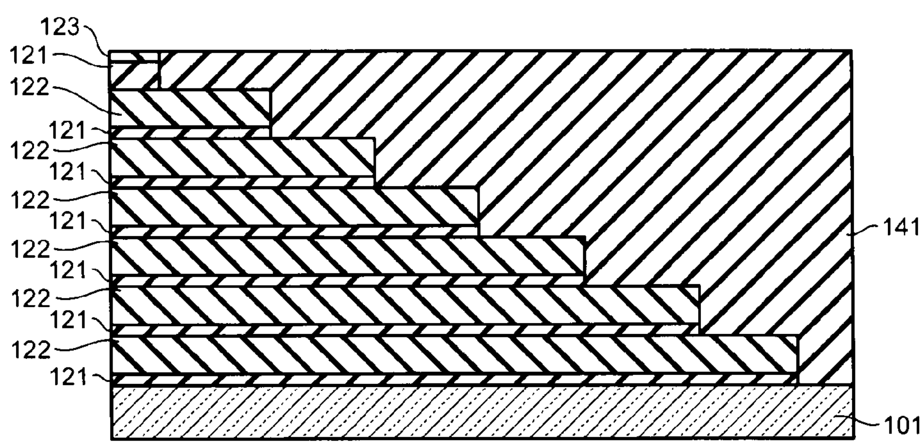
Figure 70A:
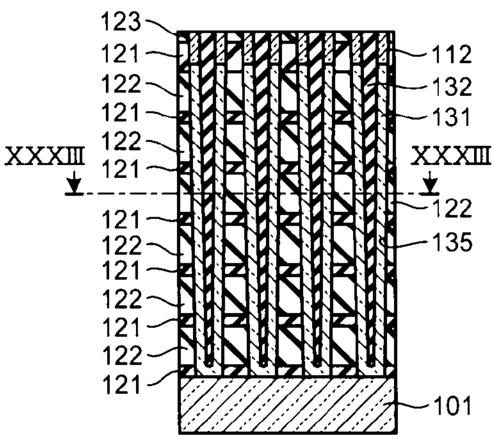
Figure 70B:
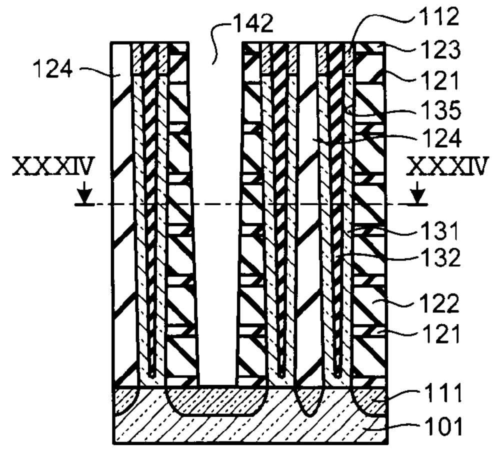
Figure 70C:
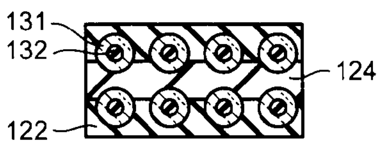
Figure 70D:
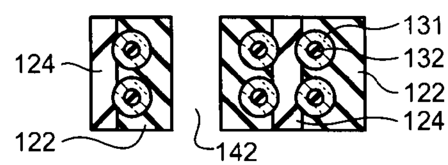
Figure 70E:
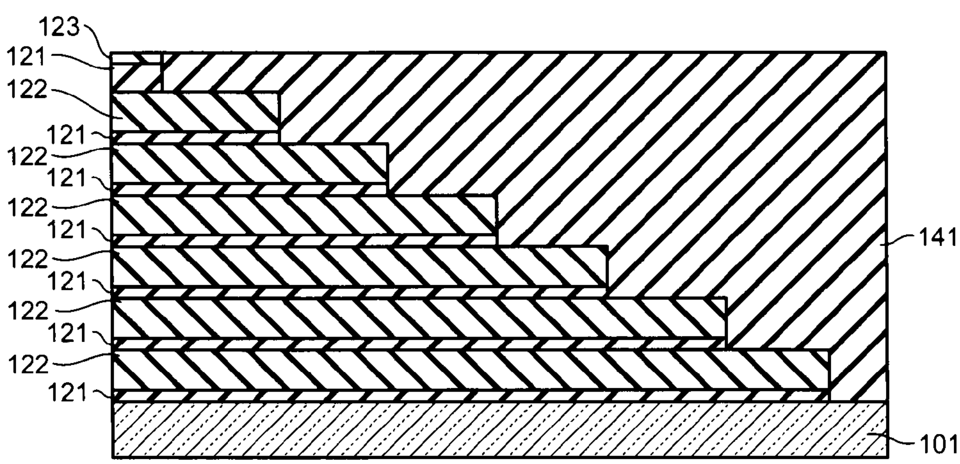
Figure 71A:
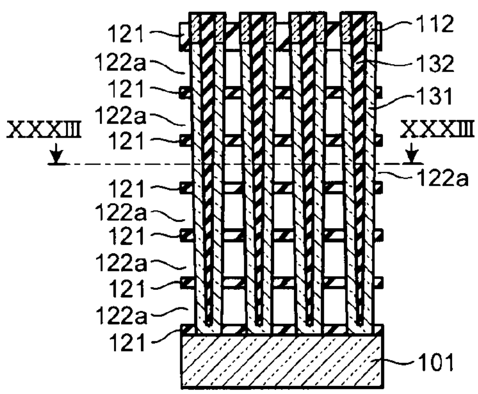
Figure 71B:
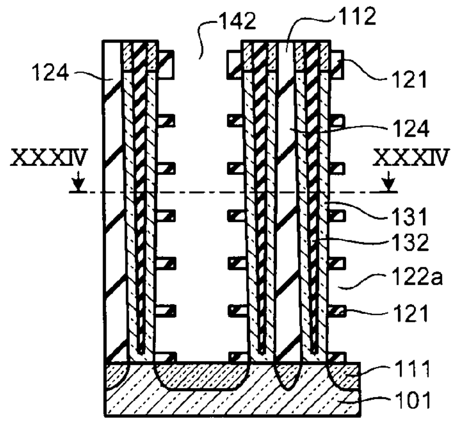
Figure 71C:
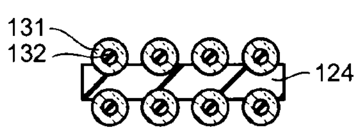
Figure 71D:
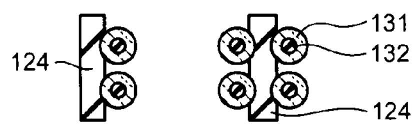
Figure 71E:
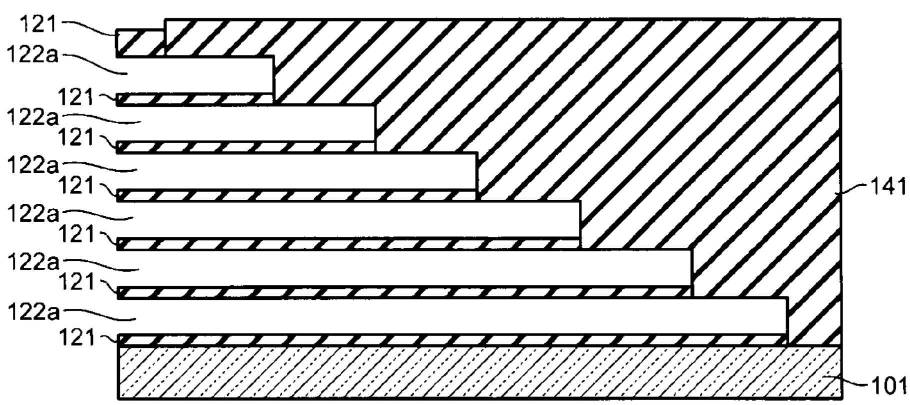
Figure 72A:
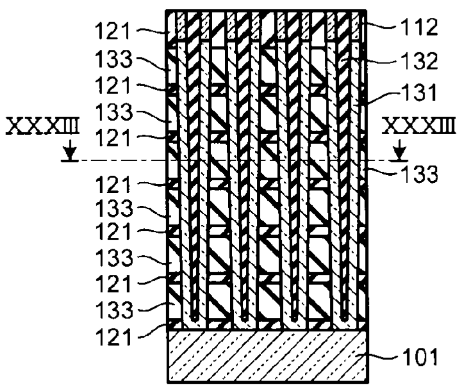
Figure 72B:
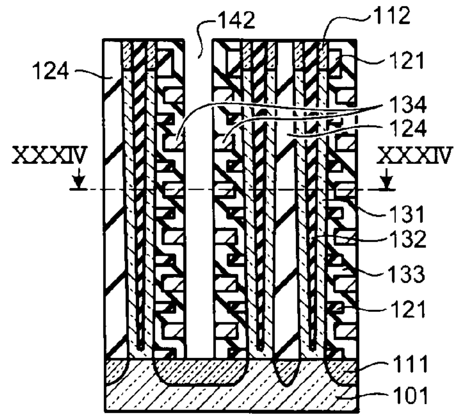
Figure 72C:
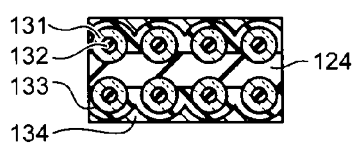
Figure 72D:
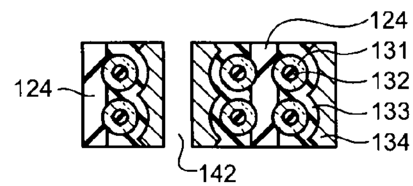
Figure 72E:
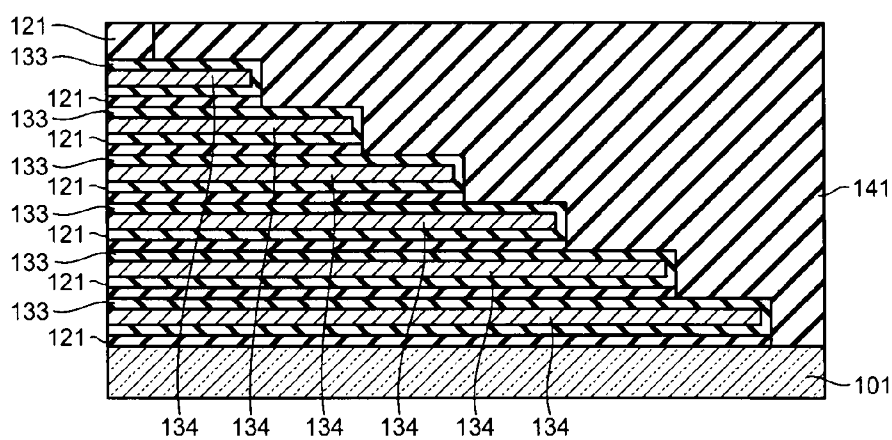
Figure 73A:
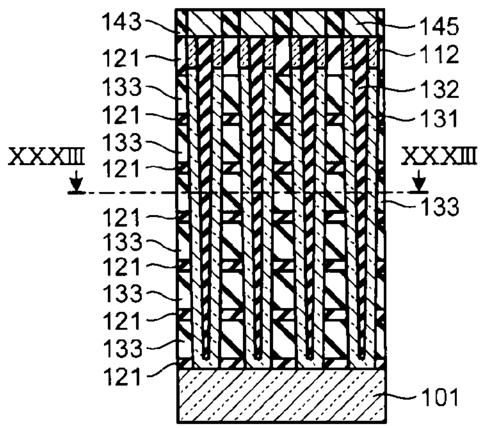
Figure 73B:
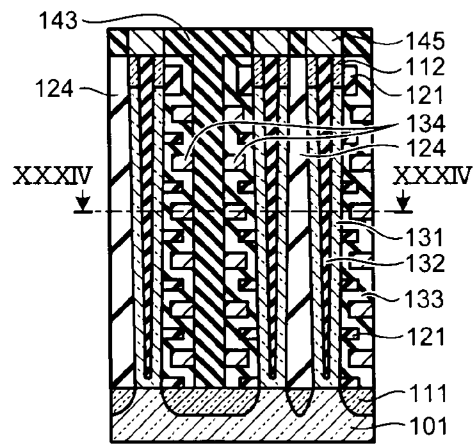
Figure 73C:
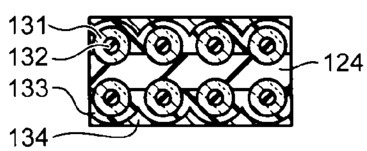
Figure 73D:
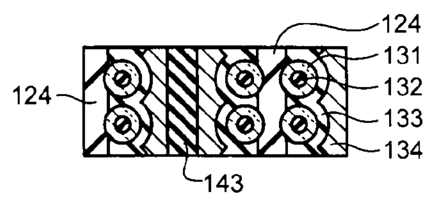
Figure 73E:
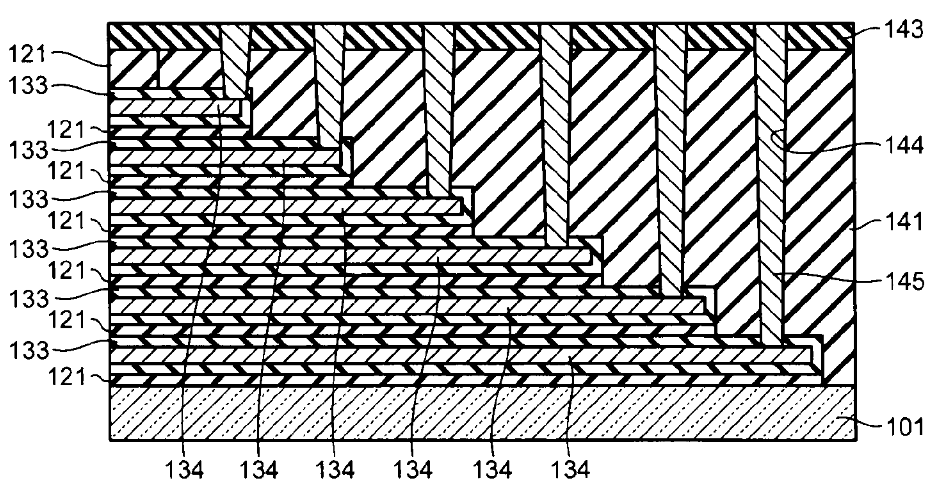

As shown in FIG. 64D, the word-line contact region also has a structure substantially the same as the structure in the sixth embodiment. However, the charge storage layers 133 and the gate electrode films 134 are separated by the insulating film 124 extending from a not-shown memory cell region near the center in the width direction (the bit line direction). In other words, the two gate electrode films 134 are independently drawn out from the semiconductor films 131 formed at respective heights of two memory string rows in the memory string group. The contacts 145 are provided in the respective gate electrode films 134. In FIG. 64D, a section on the gate electrode films 134 arranged on an extension line of one memory string row in the memory string group is shown. The contacts 145 are also provided in the gate electrode films 134 arranged on an extension line of the other memory string row. However, positions on the word line direction are different from the positions of the contacts 145 shown in the figure. The contacts 145 are formed in the positions of the wiring layers 151 not connected to the contacts 145 shown in the figure. Other components are the same as those in the sixth embodiment. Therefore, explanation of the components is omitted.

By adopting such a structure, the restriction indicated by Formula (1) is not applied to the thickness of the charge storage layers 133 (the gate dielectric films) forming a MONOS. It is unnecessary to provide dummy cells in the word-line contact region. The contacts 145 only have to be provided.

A method of manufacturing the nonvolatile semiconductor memory device having such a configuration is explained below. FIGS. 65A to 73E are schematic sectional views of an example of a procedure of a method of manufacturing the nonvolatile semiconductor memory device according to the tenth embodiment. Among the figures, a section in the word line direction of the memory cell region is shown in FIGS. 65A, 66A, 67A, 68A, 69A, 70A, 71A, 72A, and 73A. A section in a direction perpendicular to the word line direction of the memory cell region is shown in FIGS. 65B, 66B, 67B, 68B, 69B, 70B, 71B, 72B, and 73B. A plan sectional view taken along line XXXIII-XXXIII in FIGS. 65A, 66A, 67A, 68A, 69A, 70A, 71A, 72A, and 73A is shown in FIGS. 65C, 66C, 67C, 68C, 69C, 70C, 71C, 72C, and 73C. A plan sectional view taken along line XXXIV-XXXIV in FIGS. 65B, 66B, 67B, 68B, 69B, 70B, 71B, 72B, and 73B is shown in FIGS. 65D, 66D, 67D, 68D, 69D, 70D, 71D, 72D, and 73D. A section in the word line direction in a contact forming position of the word-line contact region is shown in FIGS. 65E, 66E, 67E, 68E, 69E, 70E, 71E, 72E, and 73E.

First, a not-shown peripheral circuit of the nonvolatile semiconductor memory device is formed on the semiconductor substrate 101. As shown in FIGS. 65A to 65E, impurities of a predetermined conduction type are implanted in the memory cell region of the semiconductor substrate 101 by an ion implantation method and activated to form the source regions 111. The source regions 111 can be, for example, an N type.

Subsequently, a plurality of the spacer films 121 forming memory cells and sacrificial films 122 are alternately stacked over the entire surface of the semiconductor substrate 101 by a film forming method such as the PECVD method. The stack ends with the spacer film 121. The stopper film 123 functioning as a polishing stopper during the CMP processing is formed on the spacer film 121 in the uppermost layer to form a stacked film. Specifically, six sacrificial films 122 are stacked. As a material of the sacrificial films 122, a material having a large etching rate compared with the spacer films 121 in processing by wet etching performed later is selected. For example, as the spacer films 121, a silicon oxide film can be used. As the sacrificial films 122, for example, a silicon nitride film can be used. As the stopper film 123, for example, a silicon nitride film can be used. As a method of forming the stacked film, besides the PECVD method, it is also possible to appropriately combine and use techniques such as the SACVD method, the LPCVD method, the sputtering method, and the SOD.

Subsequently, as shown in FIGS. 66A to 66E, trenches 124*a* for insulating film formation for dividing, in the bit line direction, the gate electrode films 134 in the memory string group formed later are formed by using the lithography technique and the RIE method. The insulating film 124 is formed over the entire surface of the semiconductor substrate 101 and left only in the trenches 124*a*. As the insulating film 124, for example, a silicon oxide film formed by the CVD method or the ALD method can be used.

Subsequently, as shown in FIGS. 67A to 67E, as in the first embodiment, processing for forming a stacked film in the word-line contact region in a step shape is performed by using the lithography technique and the RIE method to form the word-line contact region having a structure in which the sacrificial films 122 in the respective layers are exposed in a step shape. Consequently, seven steps are formed and the word-line contact region is formed.

Thereafter, the planarization film 141 is formed over the entire surface of the semiconductor substrate 101. As the planarization film 141, for example, a silicon oxide film can be used. Thereafter, the planarization film 141 is planarized by the CMP technique until the stopper film 123 is exposed in the memory cell region.

Subsequently, as shown in FIGS. 68A to 68E, a not-shown mask film is formed over the entire surface of the stopper film 123 and the planarization film 141. The stacked film in the memory cell region and the word-line contact region is collectively processed by the lithography technique and RIE method to form the through-holes 135 connecting with the semiconductor substrate 101. As the mask film, for example, a CVD carbon film can be used. Thereafter, the mask film is removed to form a mold of a channel semiconductor. In the tenth embodiment, the insulating films 124 for separating the gate electrode films 134 formed later is formed to the word-line contact region. Therefore, unlike the sixth embodiment, it is unnecessary to form the through-holes 135 functioning as the mold of the channel semiconductor to the word-line contact region.

The mold of the channel semiconductor is formed at a first interval in the word line direction as explained later. An interval between the mold and a mold of a channel semiconductor adjacent on one side in the bit line direction is a second interval. An interval between the mold and a mold of a channel semiconductor adjacent on the other side is a third interval longer than the second interval. At this point, the insulating films 124 are filled in areas among rows of the through-holes 135 arranged in the bit line direction that are areas provided at the second interval. In the tenth embodiment, the insulating films 124 for separating the gate electrode films 134 are formed. Therefore, the through-holes 135 do not have to be formed such that the first interval meets Formula (3).

Subsequently, as shown in FIGS. 69A to 69E, the semiconductor films 131 functioning as the channels are formed by a film forming method such as the LPCVD method. The semiconductor films 131 are formed to be deposited in a macaroni shape along the inner surfaces of the through-holes 135. When the semiconductor films 131 are deposited in a macaroni shape, the thickness of the semiconductor films 131 controlled by the gate electrode films 134 is equal among the stacked memory cells MC. Therefore, it is possible to reduce fluctuation in transistor characteristics among the memory cells MC. As the semiconductor films 131, for example, a B-doped polysilicon film can be used. The concentration of B can be set to, for example, $1\times10^{17}$ to $1\times10^{18}$ $cm^{-3}$.

Further, the dielectric films 132 formed of a silicon oxide film or the like are formed to fill the inside of the hollow cylindrical semiconductor films 131 by the ALD method. Thereafter, etch-back is performed by a method such as the RIE method to remove the semiconductor films 131 and the dielectric films 132 above the stopper film 123. Consequently, the hollow cylindrical semiconductor films 131 and the dielectric films 132 remain only in the through-holes 135. Subsequently, dopant impurities of a predetermined conduction type is ion-implanted in upper portions of the semiconductor films 131 by using the lithography technique and the ion implantation technique to form the drain regions 112. As the impurity element, for example, arsenic can be used.

Thereafter, as shown in FIGS. 70A to 70E, a not-shown mask film is formed over the entire surface of the semiconductor substrate 101. The stacked film and the planarization film 141 are collectively processed by the lithography technique and the RIE method to form the trenches 142. The trenches 142 have a shape extending in the word line direction to separate the semiconductor films 131 adjacent to each other in the bit line direction. The trenches 142 are formed in every other two memory string rows extending in the word line direction. Consequently, the two memory string rows divided by the trench 142 are formed as the memory string group. As the mask film, for example, a CVD carbon film can be used. After the trenches 142 are formed, the mask film is removed.

Subsequently, as shown in FIGS. 71A to 71F, the sacrificial films 122 and the stopper film 123 are selectively removed by wet etching to form the hollows 122*a* among the upper and lower spacer films 121. Because the semiconductor films 131 function as columns and support the spacer films 121, the hollows 122*a* are not collapsed. When silicon oxide films are used as the spacer films 121 and silicon nitride films are used as the sacrificial films 122, as a chemical for the wet etching, for example, hot phosphoric acid can be used such that the silicon nitride films are more selectively etched compared with the silicon oxide films. The hollows 122*a* after the sacrificial films 122 are removed function as a mold in forming a MONOS structure later.

Thereafter, as shown in FIGS. 72A to 72E, the charge storage layers 133 forming MONOS cells are formed such that the sides of the cylindrical semiconductor films 131 partially covered with the spacer films 121 are covered. The charge storage layers 133 have a stacking structure of a tunnel dielectric film/a charge trapping film/a charge blocking film. As the tunnel dielectric film, for example, an ONO film formed by the LPCVD method can be used. As the charge trapping film, a silicon nitride film formed by the ALD method can be used. As the charge blocking film, an alumina film formed by the ALD method can be used.

Unlike the sixth embodiment, the transistors on the memory strings MS are separated by the insulating films 124 in the bit line direction. Therefore, the restrictions on the thickness of films forming a MONOS such as the relations indicated by Formulas (1) to (3) are unnecessary.

In this way, in the four memory cells MC adjacent to one another in the same plane in the memory string group divided by the trenches 142, it is possible to reduce a distance between the adjacent semiconductor films 131 by separating the semiconductor films 131 with the insulating films 124 in the bit line direction. Therefore, it is possible to realize higher bit density per memory chip area.

Subsequently, the gate electrode films 134 are formed on the sides of the hollow cylindrical semiconductor films 131, in which the charge storage layers 133 are formed, by a film forming method such as the CVD method. Thereafter, the gate electrode films 134 formed on the bottoms of the trenches 142 and the like are recessed by the dry etching method and divided to be electrodes for the stacked transistors. Consequently, the gate electrode films 134 are symmetrically arranged on the outer side in the bit line direction in the memory string group. The two gate electrode films 134 formed on the outer side in the bit line direction in the memory string group are physically separated. As a material of the gate electrode films 134, for example, tungsten can be used. As an etching gas for dry etching, for example, $NF_3$ can be used.

Consequently, the gate electrode films 134 for six layers are collectively formed. The gate electrode films 134 in the first and sixth layers from the top are selection gate electrodes. The gate electrode films 134 in the second to fifth layers from the top are control gate electrodes functioning as word lines.

Subsequently, as shown in FIGS. 73A to 73E, the interlayer dielectric film 143 is formed over the entire surface of the semiconductor substrate 101 by a film forming method such as the CVD method to fill the trenches 142. As the interlayer dielectric film 143, a TEOS/$O_3$ film can be used. The surface of the interlayer dielectric film 143 is planarized by the CMP technique.

Subsequently, the contact holes 144 connecting with the columnar semiconductor films 131 in the memory cell region and the gate electrode films 134 in the word-line contact region are formed by the lithography technique and the RIE method. Thereafter, conductive material films are filled in the contact holes 144 by a film forming method such as the CVD method. The conductive material films are planarized by the CMP technique until the interlayer dielectric film 143 is exposed. Consequently, the contacts 145 are formed. As a material of the contacts 145, for example, tungsten can be used.

The wiring layers 151 to 153 and the like connected to the contacts 145 are formed via the interlayer dielectric films 161 to 163 to form a multilayer wiring layer. Consequently, the nonvolatile semiconductor memory device having the structure shown in FIGS. 64A to 64D is obtained.

In the tenth embodiment, instead of forming the hollow cylindrical semiconductor films 131 in the memory cell region 11 and the word-line contact region 20, so as to meet Formula (1) in the forming positions of all the transistors in the height direction of the memory strings MS in the memory strings group, the insulating films 124 for electrically separating a memory string row are formed in advance. Consequently, the gate electrode films 134 cannot penetrate among the transistors adjacent to one another in the word line direction and the bit line direction. The physically (electrically) divided two gate electrode films 134 are formed only on both the sides in the bit line direction of the memory string group. In this way, it is possible to reduce a distance between the memory strings MS adjacent to each other in the word line direction and the bit line direction. Therefore, there is an effect that it is possible to increase bit density compared with the structure in the past.

In the structure of the nonvolatile semiconductor memory device according to the tenth embodiment, as explained in the seventh embodiment, a pair of memory strings MS adjacent to each other in the bit line direction in the memory strings group can be connected by the channel connection layers 137 in the lower portions. As explained in the ninth embodiment, the upper portions or the lower portions of the two memory strings MS adjacent to each other between the different memory string groups adjacent in the bit line direction can be connected by the channel connection layers 137. As explained in the eighth embodiment, the bit lines and the source lines can be arranged on the lower side in these structures.

As explained above, in the nonvolatile semiconductor memory device according to the first to tenth embodiments, it is possible to realize high bit density with a small number of stacked layers. Therefore, the nonvolatile semiconductor memory device can be manufactured in a smaller number of manufacturing steps compared with steps for manufacturing a nonvolatile semiconductor memory device having a larger number of stacked memories. As a result, it is also possible to further improve bit density as in a 256 Gb NAND flash memory and a 1 Tb NAND flash memory.

The conduction types of the semiconductor films 131 and the channel connection films 137 in the above explanation are examples. Conduction types in the present invention are not limited to these conduction types.

As explained above, according to the embodiments, there is an effect that it is possible to increase memory bit density while suppressing the number of stacked layers of memory cells compared with the past in a nonvolatile semiconductor memory device having a structure in which memory strings including a plurality of gate electrode films, which cross columnar semiconductor films having gate dielectric films formed on sides thereof, arranged in the height direction are two-dimensionally arranged and the gate electrode films at the same height adjacent to one another in a predetermined direction are connected.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:

memory strings which have a plurality of transistors including gate electrode films formed on gate dielectric films over sides of columnar semiconductor films in a height direction of the semiconductor films, and which are arranged substantially perpendicularly above a substrate, wherein the memory strings are arranged above the substrate such that memory string groups each having two memory string rows, in which the gate electrode films of the transistors at same height of the memory strings arranged in a first direction are connected, arranged in parallel adjacent to each other in a second direction perpendicular to the first direction are arranged at a predetermined interval in the second direction, and the nonvolatile semiconductor memory device further including a film that is formed between the two memory string rows arranged in parallel adjacent to each other in the second direction in the memory string group to electrically separate between the gate electrode films provided to respectively correspond to the two memory string rows.

2. The nonvolatile semiconductor memory device according to claim 1, wherein the film formed between the two memory string rows is the gate dielectric film, and in the memory string group, a distance between the semiconductor films in all forming positions of the transistors of the memory strings adjacent to each other in the first and second directions is smaller than double of thickness of the gate dielectric film.

3. The nonvolatile semiconductor memory device according to claim 1, wherein, in the memory string group, upper portions or lower portions of a pair of the memory strings adjacent to each other in the second direction are connected by a first semiconductor layer.

4. The nonvolatile semiconductor memory device according to claim 3, wherein a lower portion or an upper portion of the memory string not connected by the first semiconductor layer is connected to, by a second semiconductor layer, a lower portion or an upper portion of another memory string opposed the memory string in another memory string group adjacent the memory string group in the second direction.

5. The nonvolatile semiconductor memory device according to claim 1, wherein the gate electrode films connected in the first direction are arranged symmetrically across the two memory string rows in the memory string group.

6. The nonvolatile semiconductor memory device according to claim 1, wherein the semiconductor films operate as channels of transistors of an inversion type.

7. The nonvolatile semiconductor memory device according to claim 1, wherein each of the gate dielectric films has a configuration in which a tunnel dielectric film, a charge trapping film, and a charge blocking film are stacked in order, and a distance between the semiconductor films in all forming positions of the transistors of the memory strings adjacent to each other in the first and second directions is larger than double of sum thickness of the tunnel dielectric film and the charge trapping film.

8. The nonvolatile semiconductor memory device according to claim 1, wherein the columnar semiconductor films are formed by hollow columnar semiconductor films, in inside of which dielectric films are filled.

* * * * *